US008291303B2

(12) United States Patent
Toda

(10) Patent No.: US 8,291,303 B2
(45) Date of Patent: Oct. 16, 2012

(54) MEMORY DEVICE WITH ERROR CORRECTION SYSTEM FOR DETECTION AND CORRECTION ERRORS IN READ OUT DATA

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1064 days.

(21) Appl. No.: 12/190,191

(22) Filed: Aug. 12, 2008

(65) Prior Publication Data

US 2009/0049366 A1 Feb. 19, 2009

(30) Foreign Application Priority Data

Aug. 13, 2007 (JP) ................................ 2007-210659

(51) Int. Cl.
*G06F 11/00* (2006.01)

(52) U.S. Cl. ....................................... 714/782; 714/785

(58) Field of Classification Search .................. 714/782, 714/785

See application file for complete search history.

(56) References Cited

U.S. PATENT DOCUMENTS

| | | | | |
|---|---|---|---|---|
| 5,168,468 | A * | 12/1992 | Magome et al. | 365/200 |
| 6,185,134 | B1 | 2/2001 | Tanaka | |
| 6,651,212 | B1 | 11/2003 | Katayama et al. | |
| 6,957,378 | B2 * | 10/2005 | Koga et al. | 714/763 |
| 7,076,722 | B2 * | 7/2006 | Shibata | 714/763 |
| RE40,252 | E | 4/2008 | Tanaka | |
| 7,644,342 | B2 * | 1/2010 | Shibata | 714/773 |
| 7,836,377 | B2 * | 11/2010 | Toda | 714/763 |
| 7,890,843 | B2 * | 2/2011 | Toda et al. | 714/782 |
| 7,941,733 | B2 * | 5/2011 | Toda | 714/781 |
| 7,962,838 | B2 * | 6/2011 | Toda | 714/781 |
| 8,001,448 | B2 * | 8/2011 | Toda | 714/784 |
| 8,194,434 | B2 * | 6/2012 | Toda | 365/148 |
| 2006/0195766 | A1 * | 8/2006 | Shibata | 714/766 |
| 2007/0198902 | A1 | 8/2007 | Toda | |
| 2007/0220400 | A1 * | 9/2007 | Toda et al. | 714/763 |
| 2007/0266291 | A1 | 11/2007 | Toda et al. | |
| 2008/0082901 | A1 | 4/2008 | Toda | |
| 2009/0154916 | A1 * | 6/2009 | Huang et al. | 398/1 |
| 2010/0332942 | A1 * | 12/2010 | Wezelenburg et al. | 714/763 |

OTHER PUBLICATIONS

U.S. Appl. No. 12/555,507, filed Sep. 8, 2009, Toda.
U.S. Appl. No. 12/607,432, filed Oct. 28, 2009, Toda.
U.S. Appl. No. 13/011,278, filed Jan. 21, 2011, Toda.
U.S. Appl. No. 13/011,318, filed Jan. 21, 2011, Toda.

* cited by examiner

*Primary Examiner* — Scott Baderman
*Assistant Examiner* — Elmira Mehrmanesh
(74) *Attorney, Agent, or Firm* — Oblon, Spivak, McClelland, Maier & Neustadt, L.L.P.

(57) ABSTRACT

There is disclosed a memory device with an error detection and correction system formed therein, the error detection and correction system being configured to detect and correct errors in read out data by use of a BCH code, wherein the error detection and correction system is 4-bit error correctable, and searches error locations in such a way as to: divide an error location searching biquadratic equation into two or more factor equations; convert the factor equations to have unknown parts and syndrome parts separated from each other for solving them; and compare indexes of the solution candidates with those of the syndromes, the corresponding relationships being previously obtained as a table, thereby obtaining error locations.

13 Claims, 125 Drawing Sheets

FIG. 1

$S(=S_1)\quad S_3\quad S_5\quad S_7$

↓ STEP1

$\zeta = S^3+S_3\quad \eta = S^5+S_5\quad \theta = S^7+S_7$

↓ STEP2

$S^3\zeta\quad S\eta\quad S^3\eta\quad S^2\zeta^2\quad S\theta\quad \zeta\eta\quad S^4\eta\quad S^2\theta\quad S^4\zeta^2\quad \zeta\theta\quad \theta/\zeta\quad \eta/\zeta\quad \zeta/S$

↓ STEP3

$\Gamma = S^3\zeta + S\eta + \zeta^2\quad \Gamma D = S^3\eta + S^2\zeta^2 + S\theta + \zeta\eta\quad \Gamma T = S^4\eta + S^2\theta + \zeta^3\quad S^2\zeta\eta$

↓ STEP4

$D\quad T\quad \Gamma Q = S^4\zeta^2 + S^2\zeta\eta + \zeta\theta + \eta^2$

↓ STEP5

$a=D/S\quad ST\quad DT\quad Q$

↓ STEP6

$b=D^2+ST\quad S^2Q\quad SDT\quad Ta(=DT/S)$

↓ STEP7

$c=S^2Q+SDT+T^2\quad B=a^4+Ta+Q$

FIG. 13A

| data bit | i of x**i | information bit |
|---|---|---|
| | | |
| 1 | 0 | |
| 2 | 1 | |
| 3 | 2 | |
| 4 | 3 | |
| 5 | 4 | |
| 6 | 5 | |
| 7 | 6 | |
| 8 | 7 | |
| 9 | 8 | |
| 10 | 9 | |
| 11 | 10 | |
| 12 | 11 | |
| 13 | 12 | |
| 14 | 13 | |
| 15 | 14 | |
| 16 | 15 | |
| 17 | 16 | |
| 18 | 17 | |
| 19 | 18 | |
| 20 | 19 | |
| 21 | 20 | |
| 22 | 21 | |
| 23 | 22 | |
| 24 | 23 | |
| 25 | 24 | |
| 26 | 25 | |
| 27 | 26 | |
| 28 | 27 | |
| 29 | 28 | |
| 30 | 29 | |
| 31 | 30 | |
| 32 | 31 | |
| 33 | 32 | i(1) |
| 34 | 33 | i(2) |
| 35 | 34 | i(3) |
| 36 | 36 | i(4) |
| 37 | 37 | i(5) |
| 38 | 38 | i(6) |
| 39 | 40 | i(7) |
| 40 | 42 | i(8) |

| data bit | i of x**i | information bit |
|---|---|---|
| | | |
| 41 | 44 | i(9) |
| 42 | 45 | i(10) |
| 43 | 46 | i(11) |
| 44 | 47 | i(12) |
| 45 | 48 | i(13) |
| 46 | 50 | i(14) |
| 47 | 51 | i(15) |
| 48 | 52 | i(16) |
| 49 | 53 | i(17) |
| 50 | 54 | i(18) |
| 51 | 55 | i(19) |
| 52 | 57 | i(20) |
| 53 | 58 | i(21) |
| 54 | 60 | i(22) |
| 55 | 66 | i(23) |
| 56 | 71 | i(24) |
| 57 | 72 | i(25) |
| 58 | 73 | i(26) |
| 59 | 74 | i(27) |
| 60 | 75 | i(28) |
| 61 | 77 | i(29) |
| 62 | 79 | i(30) |
| 63 | 80 | i(31) |
| 64 | 84 | i(32) |
| 65 | 87 | i(33) |
| 66 | 91 | i(34) |
| 67 | 93 | i(35) |
| 68 | 94 | i(36) |
| 69 | 95 | i(37) |
| 70 | 99 | i(38) |
| 71 | 100 | i(39) |
| 72 | 101 | i(40) |
| 73 | 102 | i(41) |
| 74 | 103 | i(42) |
| 75 | 104 | i(43) |
| 76 | 105 | i(44) |
| 77 | 107 | i(45) |
| 78 | 108 | i(46) |
| 79 | 110 | i(47) |
| 80 | 111 | i(48) |

FIG. 13B

| data bit | i of x**i | information bit |
|---|---|---|
| | | |
| 81 | 112 | i(49) |
| 82 | 113 | i(50) |
| 83 | 119 | i(51) |
| 84 | 121 | i(52) |
| 85 | 122 | i(53) |
| 86 | 123 | i(54) |
| 87 | 127 | i(55) |
| 88 | 128 | i(56) |
| 89 | 129 | i(57) |
| 90 | 130 | i(58) |
| 91 | 131 | i(59) |
| 92 | 132 | i(60) |
| 93 | 135 | i(61) |
| 94 | 138 | i(62) |
| 95 | 141 | i(63) |
| 96 | 142 | i(64) |
| 97 | 146 | i(65) |
| 98 | 147 | i(66) |
| 99 | 148 | i(67) |
| 100 | 149 | i(68) |
| 101 | 150 | i(69) |
| 102 | 151 | i(70) |
| 103 | 152 | i(71) |
| 104 | 153 | i(72) |
| 105 | 154 | i(73) |
| 106 | 156 | i(74) |
| 107 | 157 | i(75) |
| 108 | 158 | i(76) |
| 109 | 159 | i(77) |
| 110 | 160 | i(78) |
| 111 | 161 | i(79) |
| 112 | 164 | i(80) |
| 113 | 165 | i(81) |
| 114 | 172 | i(82) |
| 115 | 173 | i(83) |
| 116 | 174 | i(84) |
| 117 | 178 | i(85) |
| 118 | 179 | i(86) |
| 119 | 180 | i(87) |
| 120 | 181 | i(88) |

| data bit | i of x**i | information bit |
|---|---|---|
| | | |
| 121 | 182 | i(89) |
| 122 | 183 | i(90) |
| 123 | 184 | i(91) |
| 124 | 185 | i(92) |
| 125 | 186 | i(93) |
| 126 | 189 | i(94) |
| 127 | 191 | i(95) |
| 128 | 192 | i(96) |
| 129 | 193 | i(97) |
| 130 | 198 | i(98) |
| 131 | 201 | i(99) |
| 132 | 202 | i(100) |
| 133 | 203 | i(101) |
| 134 | 204 | i(102) |
| 135 | 205 | i(103) |
| 136 | 207 | i(104) |
| 137 | 208 | i(105) |
| 138 | 209 | i(106) |
| 139 | 210 | i(107) |
| 140 | 211 | i(108) |
| 141 | 212 | i(109) |
| 142 | 213 | i(110) |
| 143 | 214 | i(111) |
| 144 | 216 | i(112) |
| 145 | 218 | i(113) |
| 146 | 219 | i(114) |
| 147 | 221 | i(115) |
| 148 | 223 | i(116) |
| 149 | 224 | i(117) |
| 150 | 225 | i(118) |
| 151 | 226 | i(119) |
| 152 | 227 | i(120) |
| 153 | 234 | i(121) |
| 154 | 237 | i(122) |
| 155 | 240 | i(123) |
| 156 | 242 | i(124) |
| 157 | 249 | i(125) |
| 158 | 250 | i(126) |
| 159 | 253 | i(127) |
| 160 | 254 | i(128) |

FIG. 14A

| total PCL inputs | | 69 | 67 | 65 | 57 | 60 | 65 | 61 | 63 | 66 | 66 | 71 | 65 | 60 | 71 | 73 | 68 |
|---|---|---|---|---|---|---|---|---|---|---|---|---|---|---|---|---|---|
| input number of PCL | m= | 31 | 30 | 29 | 28 | 27 | 26 | 25 | 24 | 23 | 22 | 21 | 20 | 19 | 18 | 17 | 16 |
| 1 | | 32 | 32 | 32 | 33 | 32 | 32 | 32 | 34 | 33 | 32 | 33 | 32 | 32 | 33 | 32 | 32 |
| 2 | | 37 | 34 | 33 | 36 | 36 | 34 | 33 | 36 | 34 | 33 | 36 | 34 | 33 | 36 | 34 | 33 |
| 3 | | 42 | 36 | 34 | 37 | 38 | 45 | 37 | 44 | 38 | 34 | 37 | 36 | 34 | 38 | 37 | 34 |
| 4 | | 44 | 37 | 36 | 44 | 40 | 46 | 38 | 47 | 42 | 37 | 40 | 40 | 37 | 40 | 38 | 36 |
| 5 | | 45 | 45 | 37 | 46 | 42 | 47 | 40 | 50 | 46 | 42 | 42 | 42 | 38 | 42 | 40 | 38 |
| 6 | | 47 | 46 | 40 | 48 | 45 | 48 | 46 | 51 | 48 | 45 | 45 | 44 | 40 | 46 | 42 | 40 |
| 7 | | 50 | 47 | 42 | 50 | 47 | 55 | 50 | 54 | 50 | 47 | 46 | 45 | 42 | 48 | 45 | 42 |
| 8 | | 52 | 50 | 46 | 52 | 51 | 58 | 52 | 55 | 53 | 48 | 48 | 47 | 45 | 50 | 47 | 45 |
| 9 | | 53 | 51 | 47 | 54 | 53 | 66 | 53 | 57 | 54 | 52 | 50 | 50 | 46 | 52 | 48 | 46 |
| 10 | | 55 | 53 | 48 | 55 | 54 | 77 | 54 | 72 | 55 | 53 | 51 | 53 | 47 | 53 | 51 | 48 |
| 11 | | 73 | 54 | 54 | 60 | 60 | 80 | 55 | 74 | 66 | 54 | 54 | 54 | 48 | 54 | 52 | 51 |
| 12 | | 74 | 55 | 55 | 66 | 74 | 84 | 57 | 75 | 71 | 55 | 55 | 71 | 50 | 55 | 53 | 55 |
| 13 | | 77 | 66 | 71 | 75 | 75 | 91 | 58 | 77 | 73 | 66 | 71 | 74 | 55 | 60 | 54 | 58 |
| 14 | | 80 | 72 | 74 | 84 | 87 | 95 | 66 | 80 | 74 | 72 | 72 | 77 | 66 | 66 | 60 | 60 |
| 15 | | 84 | 74 | 75 | 93 | 91 | 104 | 73 | 84 | 75 | 73 | 75 | 79 | 74 | 74 | 66 | 66 |
| 16 | | 87 | 77 | 77 | 94 | 93 | 105 | 74 | 93 | 77 | 74 | 79 | 84 | 84 | 75 | 73 | 72 |
| 17 | | 95 | 79 | 93 | 99 | 99 | 111 | 77 | 94 | 79 | 75 | 80 | 93 | 93 | 80 | 74 | 74 |
| 18 | | 99 | 87 | 94 | 100 | 100 | 112 | 79 | 99 | 80 | 79 | 84 | 94 | 94 | 91 | 79 | 77 |
| 19 | | 103 | 94 | 95 | 101 | 104 | 113 | 87 | 104 | 84 | 80 | 91 | 95 | 95 | 93 | 84 | 84 |
| 20 | | 105 | 95 | 99 | 105 | 105 | 119 | 91 | 105 | 93 | 84 | 94 | 100 | 100 | 94 | 91 | 91 |
| 21 | | 107 | 99 | 101 | 110 | 108 | 121 | 94 | 110 | 103 | 91 | 95 | 101 | 104 | 104 | 93 | 94 |
| 22 | | 108 | 102 | 102 | 111 | 110 | 122 | 95 | 112 | 104 | 95 | 99 | 104 | 105 | 107 | 95 | 99 |
| 23 | | 110 | 103 | 104 | 112 | 111 | 127 | 99 | 121 | 105 | 102 | 101 | 105 | 107 | 108 | 103 | 102 |
| 24 | | 111 | 104 | 107 | 121 | 113 | 129 | 104 | 122 | 108 | 103 | 102 | 107 | 110 | 110 | 105 | 103 |
| 25 | | 113 | 105 | 108 | 123 | 119 | 130 | 105 | 123 | 111 | 104 | 105 | 110 | 113 | 111 | 107 | 104 |
| 26 | | 122 | 111 | 113 | 128 | 122 | 131 | 107 | 127 | 121 | 107 | 108 | 112 | 119 | 112 | 110 | 107 |
| 27 | | 123 | 112 | 119 | 129 | 127 | 132 | 108 | 128 | 122 | 108 | 110 | 121 | 121 | 113 | 111 | 119 |
| 28 | | 131 | 119 | 122 | 131 | 128 | 135 | 112 | 129 | 123 | 110 | 111 | 122 | 122 | 121 | 112 | 121 |
| 29 | | 135 | 121 | 123 | 132 | 130 | 138 | 113 | 135 | 127 | 119 | 113 | 129 | 123 | 123 | 122 | 122 |
| 30 | | 142 | 130 | 129 | 141 | 131 | 146 | 119 | 138 | 128 | 121 | 119 | 131 | 128 | 127 | 128 | 127 |
| 31 | | 148 | 131 | 130 | 142 | 138 | 148 | 121 | 141 | 132 | 122 | 121 | 132 | 130 | 129 | 131 | 130 |
| 32 | | 149 | 132 | 142 | 148 | 141 | 150 | 122 | 142 | 141 | 127 | 122 | 135 | 132 | 132 | 132 | 132 |
| 33 | | 151 | 138 | 146 | 151 | 147 | 151 | 128 | 146 | 146 | 131 | 123 | 141 | 138 | 135 | 135 | 138 |
| 34 | | 153 | 141 | 150 | 152 | 150 | 152 | 129 | 147 | 147 | 132 | 130 | 148 | 142 | 138 | 138 | 146 |
| 35 | | 154 | 147 | 153 | 154 | 151 | 154 | 130 | 148 | 150 | 138 | 132 | 149 | 147 | 141 | 141 | 148 |
| 36 | | 156 | 149 | 154 | 158 | 153 | 157 | 132 | 151 | 152 | 146 | 138 | 150 | 150 | 142 | 147 | 150 |
| 37 | | 158 | 150 | 157 | 159 | 154 | 158 | 142 | 153 | 154 | 149 | 142 | 151 | 153 | 146 | 150 | 153 |

FIG. 14B

| total PCL inputs | | 65 | 67 | 54 | 56 | 50 | 58 | 55 | 60 | 62 | 61 | 68 | 62 | 62 | 71 | 67 | 61 |
|---|---|---|---|---|---|---|---|---|---|---|---|---|---|---|---|---|---|
| input number of PCL | m= | 15 | 14 | 13 | 12 | 11 | 10 | 9 | 8 | 7 | 6 | 5 | 4 | 3 | 2 | 1 | 0 |
| 1 | | 33 | 32 | 36 | 34 | 33 | 32 | 34 | 33 | 32 | 32 | 32 | 32 | 32 | 32 | 33 | 32 |
| 2 | | 34 | 33 | 38 | 37 | 34 | 33 | 38 | 37 | 36 | 36 | 38 | 42 | 34 | 33 | 34 | 33 |
| 3 | | 38 | 37 | 42 | 38 | 36 | 36 | 40 | 38 | 37 | 38 | 40 | 45 | 37 | 34 | 37 | 36 |
| 4 | | 40 | 38 | 44 | 40 | 37 | 38 | 42 | 40 | 38 | 44 | 45 | 46 | 38 | 36 | 44 | 38 |
| 5 | | 52 | 40 | 45 | 42 | 40 | 40 | 44 | 44 | 40 | 45 | 47 | 47 | 46 | 40 | 45 | 44 |
| 6 | | 53 | 42 | 47 | 44 | 42 | 42 | 45 | 53 | 42 | 50 | 51 | 48 | 52 | 44 | 46 | 45 |
| 7 | | 54 | 51 | 51 | 46 | 45 | 44 | 50 | 55 | 48 | 51 | 52 | 51 | 53 | 47 | 47 | 46 |
| 8 | | 55 | 52 | 57 | 50 | 54 | 48 | 54 | 58 | 52 | 52 | 53 | 55 | 54 | 50 | 52 | 48 |
| 9 | | 57 | 53 | 58 | 55 | 55 | 53 | 66 | 66 | 54 | 55 | 54 | 60 | 55 | 51 | 54 | 51 |
| 10 | | 58 | 54 | 60 | 57 | 57 | 54 | 75 | 74 | 57 | 72 | 71 | 71 | 66 | 54 | 55 | 53 |
| 11 | | 60 | 57 | 72 | 58 | 58 | 55 | 77 | 80 | 73 | 73 | 72 | 72 | 71 | 55 | 57 | 54 |
| 12 | | 71 | 58 | 73 | 66 | 71 | 57 | 79 | 84 | 75 | 77 | 73 | 75 | 73 | 58 | 71 | 66 |
| 13 | | 74 | 60 | 77 | 71 | 75 | 60 | 93 | 93 | 77 | 84 | 74 | 77 | 77 | 72 | 72 | 71 |
| 14 | | 80 | 66 | 79 | 72 | 77 | 74 | 94 | 94 | 79 | 87 | 75 | 80 | 79 | 73 | 75 | 74 |
| 15 | | 87 | 73 | 84 | 77 | 95 | 75 | 95 | 95 | 87 | 91 | 87 | 84 | 84 | 74 | 79 | 75 |
| 16 | | 91 | 75 | 87 | 87 | 101 | 80 | 100 | 99 | 91 | 93 | 91 | 91 | 87 | 75 | 87 | 99 |
| 17 | | 93 | 79 | 91 | 99 | 102 | 84 | 102 | 101 | 93 | 100 | 95 | 94 | 93 | 77 | 91 | 100 |
| 18 | | 99 | 80 | 100 | 102 | 104 | 94 | 103 | 102 | 94 | 102 | 101 | 99 | 101 | 80 | 100 | 104 |
| 19 | | 101 | 84 | 103 | 103 | 108 | 95 | 105 | 104 | 100 | 108 | 103 | 100 | 102 | 84 | 101 | 108 |
| 20 | | 102 | 100 | 104 | 105 | 113 | 100 | 108 | 105 | 101 | 110 | 110 | 102 | 103 | 87 | 105 | 110 |
| 21 | | 107 | 101 | 110 | 110 | 123 | 101 | 110 | 107 | 103 | 119 | 111 | 103 | 104 | 99 | 107 | 111 |
| 22 | | 108 | 105 | 111 | 131 | 130 | 103 | 121 | 108 | 104 | 121 | 119 | 105 | 105 | 100 | 110 | 112 |
| 23 | | 110 | 107 | 119 | 135 | 132 | 107 | 122 | 113 | 107 | 123 | 127 | 107 | 108 | 101 | 111 | 121 |
| 24 | | 111 | 108 | 127 | 138 | 135 | 108 | 128 | 119 | 108 | 127 | 128 | 108 | 111 | 102 | 112 | 123 |
| 25 | | 119 | 110 | 132 | 147 | 138 | 112 | 130 | 121 | 112 | 128 | 130 | 111 | 112 | 104 | 113 | 132 |
| 26 | | 121 | 121 | 138 | 149 | 142 | 122 | 131 | 123 | 119 | 129 | 131 | 113 | 119 | 113 | 122 | 135 |
| 27 | | 122 | 123 | 141 | 150 | 146 | 129 | 132 | 127 | 122 | 131 | 132 | 122 | 121 | 119 | 127 | 141 |
| 28 | | 129 | 128 | 146 | 151 | 148 | 131 | 141 | 129 | 123 | 135 | 135 | 127 | 122 | 121 | 135 | 149 |
| 29 | | 135 | 132 | 148 | 152 | 149 | 135 | 146 | 130 | 128 | 138 | 138 | 129 | 123 | 127 | 138 | 150 |
| 30 | | 147 | 138 | 150 | 157 | 150 | 138 | 147 | 131 | 129 | 142 | 141 | 130 | 128 | 128 | 141 | 152 |
| 31 | | 148 | 142 | 151 | 159 | 151 | 141 | 151 | 138 | 130 | 149 | 142 | 132 | 129 | 132 | 142 | 154 |
| 32 | | 151 | 146 | 152 | 164 | 156 | 142 | 153 | 142 | 135 | 150 | 150 | 138 | 132 | 135 | 146 | 156 |
| 33 | | 152 | 147 | 153 | 165 | 158 | 147 | 158 | 146 | 141 | 151 | 152 | 141 | 135 | 138 | 150 | 157 |
| 34 | | 154 | 150 | 158 | 173 | 164 | 148 | 164 | 150 | 149 | 152 | 154 | 148 | 142 | 141 | 151 | 159 |
| 35 | | 156 | 151 | 160 | 174 | 172 | 149 | 165 | 152 | 151 | 153 | 156 | 154 | 147 | 142 | 153 | 161 |
| 36 | | 157 | 153 | 164 | 178 | 173 | 150 | 178 | 154 | 153 | 154 | 157 | 157 | 148 | 146 | 156 | 164 |
| 37 | | 158 | 156 | 165 | 179 | 174 | 157 | 182 | 157 | 156 | 156 | 158 | 158 | 149 | 147 | 157 | 165 |

FIG. 14C

| total PCL inputs | | 69 | 67 | 65 | 57 | 60 | 65 | 61 | 63 | 66 | 66 | 71 | 65 | 60 | 71 | 73 | 68 |
|---|---|---|---|---|---|---|---|---|---|---|---|---|---|---|---|---|---|
| input number of PCL | m= | 31 | 30 | 29 | 28 | 27 | 26 | 25 | 24 | 23 | 22 | 21 | 20 | 19 | 18 | 17 | 16 |
| 38 | | 160 | 151 | 160 | 164 | 157 | 161 | 147 | 157 | 156 | 151 | 149 | 152 | 156 | 148 | 151 | 154 |
| 39 | | 161 | 152 | 161 | 173 | 158 | 164 | 148 | 158 | 157 | 153 | 150 | 158 | 157 | 151 | 152 | 156 |
| 40 | | 164 | 156 | 164 | 174 | 161 | 165 | 150 | 161 | 160 | 156 | 151 | 160 | 158 | 152 | 156 | 158 |
| 41 | | 172 | 157 | 172 | 178 | 172 | 173 | 157 | 172 | 161 | 159 | 152 | 161 | 159 | 153 | 161 | 161 |
| 42 | | 173 | 158 | 173 | 181 | 173 | 174 | 158 | 173 | 165 | 160 | 153 | 164 | 161 | 157 | 165 | 172 |
| 43 | | 174 | 159 | 178 | 182 | 180 | 180 | 161 | 174 | 172 | 161 | 156 | 174 | 164 | 172 | 172 | 178 |
| 44 | | 179 | 164 | 179 | 201 | 181 | 182 | 165 | 179 | 173 | 164 | 159 | 180 | 165 | 173 | 174 | 179 |
| 45 | | 182 | 178 | 180 | 202 | 193 | 183 | 181 | 180 | 178 | 165 | 161 | 182 | 172 | 179 | 178 | 180 |
| 46 | | 183 | 179 | 182 | 205 | 201 | 184 | 184 | 182 | 179 | 172 | 165 | 183 | 181 | 180 | 179 | 181 |
| 47 | | 184 | 181 | 184 | 210 | 204 | 191 | 186 | 184 | 181 | 174 | 172 | 184 | 186 | 182 | 181 | 185 |
| 48 | | 191 | 184 | 185 | 211 | 205 | 198 | 191 | 185 | 183 | 178 | 181 | 185 | 189 | 183 | 182 | 189 |
| 49 | | 192 | 186 | 189 | 213 | 209 | 201 | 192 | 189 | 184 | 180 | 183 | 189 | 193 | 184 | 183 | 191 |
| 50 | | 198 | 192 | 192 | 218 | 210 | 202 | 193 | 193 | 189 | 182 | 184 | 192 | 198 | 185 | 184 | 192 |
| 51 | | 201 | 198 | 193 | 221 | 212 | 203 | 205 | 201 | 192 | 183 | 185 | 193 | 203 | 186 | 185 | 198 |
| 52 | | 202 | 202 | 198 | 224 | 216 | 205 | 207 | 202 | 198 | 186 | 186 | 198 | 209 | 191 | 186 | 201 |
| 53 | | 204 | 203 | 205 | 225 | 219 | 208 | 213 | 205 | 201 | 191 | 191 | 202 | 212 | 201 | 203 | 203 |
| 54 | | 205 | 205 | 207 | 234 | 221 | 210 | 214 | 209 | 204 | 193 | 193 | 203 | 223 | 204 | 204 | 204 |
| 55 | | 209 | 208 | 210 | 237 | 223 | 211 | 218 | 210 | 205 | 203 | 201 | 204 | 237 | 205 | 207 | 205 |
| 56 | | 210 | 210 | 212 | 250 | 224 | 214 | 224 | 212 | 208 | 204 | 203 | 205 | 240 | 208 | 208 | 207 |
| 57 | | 214 | 213 | 214 | 253 | 234 | 221 | 226 | 213 | 209 | 207 | 204 | 211 | 242 | 209 | 209 | 208 |
| 58 | | 216 | 219 | 216 | | 237 | 223 | 234 | 218 | 211 | 208 | 205 | 213 | 249 | 210 | 210 | 210 |
| 59 | | 218 | 221 | 221 | | 249 | 225 | 237 | 223 | 212 | 210 | 207 | 216 | 250 | 211 | 213 | 212 |
| 60 | | 219 | 224 | 223 | | 254 | 226 | 240 | 226 | 214 | 211 | 212 | 218 | 254 | 214 | 214 | 213 |
| 61 | | 221 | 227 | 225 | | | 237 | 249 | 249 | 225 | 213 | 214 | 219 | | 216 | 216 | 218 |
| 62 | | 225 | 237 | 227 | | | 240 | | 250 | 234 | 216 | 216 | 224 | | 218 | 218 | 221 |
| 63 | | 226 | 240 | 234 | | | 242 | | 254 | 237 | 221 | 218 | 226 | | 219 | 221 | 223 |
| 64 | | 227 | 242 | 250 | | | 249 | | | 249 | 224 | 219 | 227 | | 221 | 224 | 224 |
| 65 | | 234 | 249 | 254 | | | 253 | | | 253 | 227 | 221 | 237 | | 225 | 225 | 234 |
| 66 | | 240 | 250 | | | | | | | 254 | 253 | 223 | | | 226 | 226 | 240 |
| 67 | | 242 | 253 | | | | | | | | | 225 | | | 227 | 227 | 242 |
| 68 | | 249 | | | | | | | | | | 227 | | | 240 | 234 | 254 |
| 69 | | 254 | | | | | | | | | | 234 | | | 250 | 240 | |
| 70 | | | | | | | | | | | | 240 | | | 253 | 242 | |
| 71 | | | | | | | | | | | | 249 | | | 254 | 249 | |
| 72 | | | | | | | | | | | | | | | | 250 | |
| 73 | | | | | | | | | | | | | | | | 253 | |
| 74 | | | | | | | | | | | | | | | | | |

FIG. 14D

| total PCL inputs | | 65 | 67 | 54 | 56 | 50 | 58 | 55 | 60 | 62 | 61 | 68 | 62 | 62 | 71 | 67 | 61 |
|---|---|---|---|---|---|---|---|---|---|---|---|---|---|---|---|---|---|
| input number of PCL | m= | 15 | 14 | 13 | 12 | 11 | 10 | 9 | 8 | 7 | 6 | 5 | 4 | 3 | 2 | 1 | 0 |
| 38 | | 164 | 157 | 174 | 180 | 178 | 161 | 184 | 164 | 161 | 158 | 160 | 159 | 151 | 149 | 158 | 173 |
| 39 | | 165 | 164 | 178 | 181 | 179 | 172 | 186 | 181 | 165 | 172 | 161 | 161 | 154 | 150 | 160 | 174 |
| 40 | | 172 | 172 | 179 | 182 | 180 | 173 | 193 | 183 | 174 | 174 | 164 | 164 | 157 | 151 | 164 | 178 |
| 41 | | 173 | 173 | 180 | 186 | 181 | 174 | 201 | 185 | 180 | 181 | 172 | 172 | 161 | 158 | 165 | 180 |
| 42 | | 174 | 174 | 181 | 189 | 185 | 178 | 202 | 186 | 182 | 182 | 174 | 178 | 164 | 174 | 172 | 183 |
| 43 | | 178 | 179 | 182 | 198 | 193 | 179 | 205 | 192 | 184 | 185 | 179 | 180 | 165 | 182 | 174 | 184 |
| 44 | | 180 | 181 | 183 | 201 | 210 | 180 | 208 | 201 | 185 | 191 | 180 | 181 | 172 | 183 | 179 | 185 |
| 45 | | 182 | 182 | 202 | 207 | 211 | 184 | 210 | 204 | 186 | 192 | 181 | 183 | 173 | 184 | 181 | 189 |
| 46 | | 183 | 185 | 208 | 211 | 213 | 192 | 211 | 207 | 191 | 193 | 182 | 184 | 174 | 186 | 184 | 192 |
| 47 | | 186 | 189 | 212 | 212 | 218 | 193 | 213 | 209 | 203 | 201 | 183 | 185 | 180 | 189 | 185 | 193 |
| 48 | | 192 | 191 | 213 | 214 | 221 | 205 | 214 | 210 | 208 | 204 | 186 | 189 | 191 | 191 | 186 | 198 |
| 49 | | 193 | 192 | 223 | 216 | 225 | 209 | 218 | 212 | 209 | 207 | 189 | 191 | 201 | 192 | 189 | 202 |
| 50 | | 201 | 193 | 224 | 219 | 253 | 210 | 221 | 213 | 211 | 208 | 193 | 193 | 204 | 193 | 193 | 203 |
| 51 | | 203 | 202 | 227 | 223 | | 212 | 223 | 214 | 212 | 209 | 201 | 198 | 207 | 201 | 198 | 205 |
| 52 | | 207 | 205 | 240 | 226 | | 214 | 225 | 216 | 213 | 211 | 202 | 203 | 208 | 202 | 203 | 210 |
| 53 | | 210 | 209 | 249 | 234 | | 221 | 227 | 219 | 216 | 212 | 203 | 207 | 209 | 203 | 204 | 211 |
| 54 | | 211 | 210 | 253 | 237 | | 224 | 237 | 224 | 218 | 216 | 204 | 208 | 210 | 204 | 207 | 216 |
| 55 | | 212 | 211 | | 240 | | 227 | 240 | 226 | 219 | 219 | 205 | 209 | 212 | 207 | 211 | 218 |
| 56 | | 214 | 213 | | 254 | | 237 | | 227 | 221 | 221 | 207 | 213 | 213 | 208 | 212 | 219 |
| 57 | | 216 | 214 | | | | 242 | | 234 | 223 | 224 | 208 | 214 | 214 | 210 | 216 | 226 |
| 58 | | 218 | 219 | | | | 250 | | 237 | 225 | 226 | 209 | 218 | 218 | 211 | 218 | 227 |
| 59 | | 221 | 221 | | | | | | 240 | 226 | 237 | 211 | 221 | 219 | 212 | 219 | 237 |
| 60 | | 223 | 224 | | | | | | 242 | 237 | 249 | 214 | 240 | 225 | 213 | 221 | 240 |
| 61 | | 225 | 225 | | | | | | | 242 | 253 | 216 | 250 | 226 | 216 | 223 | 250 |
| 62 | | 226 | 226 | | | | | | | 254 | | 223 | 253 | 240 | 221 | 227 | |
| 63 | | 227 | 227 | | | | | | | | | 226 | | | 224 | 234 | |
| 64 | | 249 | 237 | | | | | | | | | 227 | | | 226 | 237 | |
| 65 | | 253 | 240 | | | | | | | | | 234 | | | 227 | 240 | |
| 66 | | | 242 | | | | | | | | | 249 | | | 234 | 242 | |
| 67 | | | 254 | | | | | | | | | 250 | | | 240 | 253 | |
| 68 | | | | | | | | | | | | 254 | | | 242 | | |
| 69 | | | | | | | | | | | | | | | 249 | | |
| 70 | | | | | | | | | | | | | | | 250 | | |
| 71 | | | | | | | | | | | | | | | 254 | | |
| 72 | | | | | | | | | | | | | | | | | |
| 73 | | | | | | | | | | | | | | | | | |
| 74 | | | | | | | | | | | | | | | | | |

FIG. 19A

| total PCL inputs | | 71 | 71 | 77 | 70 | 69 | 72 | 71 | 74 |
|---|---|---|---|---|---|---|---|---|---|
| input number of PCL | m= | 7 | 6 | 5 | 4 | 3 | 2 | 1 | 0 |
| 1 | | 7 | 6 | 5 | 4 | 3 | 2 | 1 | 0 |
| 2 | | 11 | 10 | 9 | 8 | 8 | 8 | 9 | 8 |
| 3 | | 12 | 11 | 10 | 9 | 9 | 10 | 13 | 12 |
| 4 | | 13 | 12 | 11 | 10 | 11 | 12 | 14 | 13 |
| 5 | | 17 | 16 | 15 | 14 | 12 | 13 | 15 | 14 |
| 6 | | 20 | 19 | 18 | 17 | 16 | 15 | 19 | 18 |
| 7 | | 22 | 21 | 20 | 19 | 17 | 16 | 22 | 21 |
| 8 | | 23 | 22 | 21 | 20 | 18 | 18 | 24 | 23 |
| 9 | | 24 | 23 | 22 | 21 | 19 | 20 | 25 | 24 |
| 10 | | 31 | 30 | 29 | 28 | 22 | 21 | 26 | 25 |
| 11 | | 32 | 31 | 30 | 29 | 23 | 24 | 33 | 32 |
| 12 | | 38 | 34 | 33 | 32 | 24 | 26 | 34 | 33 |
| 13 | | 42 | 37 | 36 | 38 | 27 | 27 | 37 | 36 |
| 14 | | 44 | 40 | 40 | 42 | 28 | 32 | 40 | 42 |
| 15 | | 45 | 44 | 42 | 46 | 32 | 33 | 44 | 45 |
| 16 | | 46 | 45 | 44 | 52 | 34 | 34 | 46 | 46 |
| 17 | | 55 | 48 | 47 | 54 | 37 | 36 | 47 | 47 |
| 18 | | 57 | 54 | 53 | 57 | 40 | 38 | 48 | 50 |
| 19 | | 60 | 58 | 55 | 60 | 44 | 42 | 51 | 58 |
| 20 | | 71 | 66 | 57 | 71 | 46 | 44 | 57 | 60 |
| 21 | | 73 | 72 | 58 | 77 | 51 | 46 | 73 | 66 |
| 22 | | 74 | 73 | 60 | 79 | 53 | 48 | 75 | 72 |
| 23 | | 79 | 79 | 66 | 80 | 57 | 50 | 84 | 74 |
| 24 | | 80 | 80 | 71 | 87 | 58 | 52 | 87 | 75 |
| 25 | | 91 | 84 | 72 | 93 | 60 | 71 | 91 | 80 |
| 26 | | 93 | 87 | 77 | 94 | 71 | 72 | 93 | 84 |
| 27 | | 95 | 94 | 79 | 100 | 73 | 75 | 95 | 87 |
| 28 | | 99 | 95 | 80 | 105 | 74 | 77 | 99 | 91 |
| 29 | | 103 | 102 | 84 | 108 | 75 | 80 | 101 | 94 |
| 30 | | 108 | 107 | 87 | 113 | 77 | 87 | 105 | 100 |
| 31 | | 111 | 108 | 91 | 119 | 80 | 93 | 110 | 104 |

FIG. 19B

| total PCL inputs | | 71 | 71 | 77 | 70 | 69 | 72 | 71 | 74 |
|---|---|---|---|---|---|---|---|---|---|
| input number of PCL | m= | 7 | 6 | 5 | 4 | 3 | 2 | 1 | 0 |
| 32 | | 112 | 110 | 93 | 121 | 84 | 99 | 111 | 110 |
| 33 | | 119 | 111 | 94 | 129 | 87 | 102 | 113 | 112 |
| 34 | | 122 | 121 | 95 | 131 | 103 | 104 | 119 | 113 |
| 35 | | 123 | 122 | 101 | 132 | 104 | 110 | 121 | 119 |
| 36 | | 127 | 123 | 107 | 141 | 105 | 111 | 129 | 123 |
| 37 | | 128 | 127 | 110 | 146 | 107 | 113 | 130 | 128 |
| 38 | | 132 | 131 | 121 | 148 | 111 | 121 | 142 | 129 |
| 39 | | 135 | 148 | 122 | 150 | 113 | 122 | 146 | 135 |
| 40 | | 146 | 150 | 130 | 153 | 122 | 123 | 148 | 138 |
| 41 | | 149 | 152 | 132 | 154 | 127 | 127 | 151 | 141 |
| 42 | | 151 | 156 | 135 | 157 | 130 | 128 | 153 | 147 |
| 43 | | 153 | 157 | 138 | 158 | 131 | 129 | 158 | 150 |
| 44 | | 156 | 159 | 142 | 159 | 132 | 130 | 159 | 152 |
| 45 | | 157 | 160 | 147 | 161 | 135 | 131 | 160 | 154 |
| 46 | | 158 | 161 | 149 | 165 | 142 | 141 | 164 | 157 |
| 47 | | 160 | 164 | 151 | 172 | 146 | 149 | 172 | 158 |
| 48 | | 161 | 172 | 154 | 173 | 147 | 150 | 173 | 159 |
| 49 | | 164 | 173 | 156 | 174 | 151 | 156 | 178 | 161 |
| 50 | | 165 | 174 | 158 | 180 | 152 | 157 | 179 | 165 |
| 51 | | 173 | 179 | 159 | 181 | 154 | 158 | 180 | 172 |
| 52 | | 174 | 182 | 160 | 184 | 172 | 160 | 182 | 174 |
| 53 | | 178 | 183 | 172 | 185 | 178 | 164 | 185 | 178 |
| 54 | | 180 | 186 | 173 | 189 | 179 | 173 | 186 | 179 |
| 55 | | 183 | 189 | 174 | 193 | 186 | 180 | 189 | 181 |
| 56 | | 184 | 191 | 178 | 201 | 193 | 183 | 192 | 184 |
| 57 | | 192 | 202 | 181 | 202 | 201 | 184 | 198 | 185 |
| 58 | | 203 | 203 | 182 | 204 | 204 | 185 | 205 | 189 |
| 59 | | 204 | 204 | 185 | 208 | 210 | 186 | 207 | 191 |
| 60 | | 205 | 208 | 186 | 210 | 212 | 189 | 209 | 193 |
| 61 | | 207 | 210 | 201 | 211 | 214 | 198 | 211 | 198 |
| 62 | | 209 | 212 | 202 | 212 | 218 | 204 | 213 | 204 |

FIG. 19C

| total PCL inputs | | 71 | 71 | 77 | 70 | 69 | 72 | 71 | 74 |
|---|---|---|---|---|---|---|---|---|---|
| input number of PCL | m= | 7 | 6 | 5 | 4 | 3 | 2 | 1 | 0 |
| 63 | | 211 | 213 | 203 | 213 | 223 | 205 | 216 | 205 |
| 64 | | 213 | 214 | 205 | 214 | 226 | 207 | 218 | 208 |
| 65 | | 214 | 216 | 207 | 219 | 234 | 219 | 219 | 210 |
| 66 | | 216 | 219 | 209 | 224 | 237 | 221 | 224 | 212 |
| 67 | | 227 | 221 | 211 | 227 | 240 | 225 | 234 | 214 |
| 68 | | 234 | 226 | 212 | 234 | 250 | 240 | 237 | 216 |
| 69 | | 237 | 234 | 213 | 242 | 254 | 249 | 249 | 218 |
| 70 | | 242 | 250 | 214 | 249 | | 250 | 253 | 221 |
| 71 | | 254 | 253 | 218 | | | 253 | 254 | 223 |
| 72 | | | | 225 | | | 254 | | 234 |
| 73 | | | | 234 | | | | | 237 |
| 74 | | | | 240 | | | | | 253 |
| 75 | | | | 242 | | | | | |
| 76 | | | | 249 | | | | | |
| 77 | | | | 250 | | | | | |
| 78 | | | | | | | | | |
| 79 | | | | | | | | | |
| 80 | | | | | | | | | |
| 81 | | | | | | | | | |
| 82 | | | | | | | | | |
| 83 | | | | | | | | | |
| 84 | | | | | | | | | |
| 85 | | | | | | | | | |
| 86 | | | | | | | | | |
| 87 | | | | | | | | | |
| 88 | | | | | | | | | |
| 89 | | | | | | | | | |
| 90 | | | | | | | | | |
| 91 | | | | | | | | | |
| 92 | | | | | | | | | |
| 93 | | | | | | | | | |

FIG. 20A

| total PCL inputs | | 73 | 68 | 91 | 68 | 72 | 84 | 77 | 85 |
|---|---|---|---|---|---|---|---|---|---|
| input number of PCL | mF | 7 | 6 | 5 | 4 | 3 | 2 | 1 | 0 |
| 1 | | 4 | 2 | 3 | 3 | 1 | 4 | 3 | 0 |
| 2 | | 8 | 4 | 5 | 7 | 3 | 5 | 5 | 4 |
| 3 | | 14 | 7 | 6 | 13 | 4 | 6 | 8 | 6 |
| 4 | | 15 | 10 | 7 | 14 | 6 | 7 | 11 | 7 |
| 5 | | 19 | 15 | 10 | 18 | 8 | 8 | 16 | 8 |
| 6 | | 20 | 16 | 11 | 19 | 9 | 9 | 17 | 11 |
| 7 | | 21 | 18 | 12 | 20 | 17 | 11 | 19 | 12 |
| 8 | | 27 | 22 | 13 | 26 | 19 | 12 | 23 | 13 |
| 9 | | 30 | 24 | 14 | 29 | 20 | 13 | 25 | 14 |
| 10 | | 31 | 26 | 19 | 30 | 23 | 14 | 27 | 15 |
| 11 | | 32 | 27 | 20 | 31 | 25 | 16 | 28 | 20 |
| 12 | | 33 | 28 | 21 | 32 | 26 | 23 | 29 | 21 |
| 13 | | 36 | 29 | 22 | 36 | 28 | 24 | 30 | 22 |
| 14 | | 37 | 30 | 23 | 38 | 29 | 25 | 31 | 23 |
| 15 | | 44 | 32 | 24 | 40 | 30 | 27 | 33 | 24 |
| 16 | | 45 | 34 | 26 | 44 | 32 | 29 | 37 | 25 |
| 17 | | 48 | 36 | 27 | 47 | 37 | 30 | 38 | 27 |
| 18 | | 51 | 37 | 28 | 50 | 38 | 31 | 40 | 28 |
| 19 | | 52 | 42 | 29 | 51 | 40 | 33 | 42 | 29 |
| 20 | | 54 | 50 | 31 | 53 | 44 | 34 | 51 | 30 |
| 21 | | 55 | 52 | 38 | 54 | 45 | 37 | 53 | 32 |
| 22 | | 57 | 53 | 40 | 55 | 48 | 38 | 54 | 40 |
| 23 | | 58 | 58 | 42 | 57 | 54 | 42 | 57 | 45 |
| 24 | | 60 | 71 | 44 | 58 | 74 | 47 | 60 | 46 |
| 25 | | 71 | 72 | 45 | 60 | 79 | 50 | 66 | 47 |
| 26 | | 72 | 73 | 46 | 71 | 80 | 52 | 71 | 50 |
| 27 | | 74 | 77 | 48 | 73 | 84 | 54 | 72 | 53 |
| 28 | | 77 | 87 | 52 | 77 | 91 | 60 | 73 | 54 |
| 29 | | 79 | 95 | 53 | 99 | 93 | 66 | 74 | 55 |
| 30 | | 84 | 100 | 54 | 103 | 94 | 73 | 79 | 57 |
| 31 | | 93 | 101 | 57 | 104 | 102 | 75 | 93 | 58 |

FIG. 20B

| total PCL inputs | | 73 | 68 | 91 | 68 | 72 | 84 | 77 | 85 |
|---|---|---|---|---|---|---|---|---|---|
| input number of PCL | m= | 7 | 6 | 5 | 4 | 3 | 2 | 1 | 0 |
| 32 | | 99 | 103 | 58 | 105 | 104 | 77 | 101 | 66 |
| 33 | | 100 | 107 | 71 | 111 | 105 | 80 | 102 | 72 |
| 34 | | 104 | 111 | 75 | 121 | 108 | 84 | 104 | 77 |
| 35 | | 105 | 112 | 77 | 123 | 110 | 91 | 108 | 79 |
| 36 | | 112 | 113 | 80 | 128 | 111 | 93 | 110 | 84 |
| 37 | | 121 | 119 | 84 | 129 | 113 | 94 | 112 | 91 |
| 38 | | 122 | 121 | 91 | 132 | 122 | 99 | 113 | 93 |
| 39 | | 129 | 122 | 95 | 135 | 123 | 101 | 122 | 99 |
| 40 | | 130 | 127 | 99 | 138 | 129 | 108 | 123 | 100 |
| 41 | | 141 | 135 | 104 | 141 | 130 | 110 | 127 | 105 |
| 42 | | 142 | 138 | 105 | 142 | 141 | 112 | 128 | 107 |
| 43 | | 146 | 141 | 107 | 148 | 147 | 119 | 138 | 108 |
| 44 | | 149 | 146 | 108 | 152 | 152 | 122 | 142 | 110 |
| 45 | | 153 | 147 | 111 | 153 | 153 | 123 | 147 | 112 |
| 46 | | 154 | 148 | 112 | 156 | 159 | 127 | 148 | 113 |
| 47 | | 156 | 150 | 113 | 158 | 161 | 128 | 149 | 128 |
| 48 | | 157 | 153 | 123 | 161 | 164 | 132 | 151 | 130 |
| 49 | | 159 | 156 | 127 | 173 | 165 | 135 | 154 | 131 |
| 50 | | 164 | 157 | 129 | 183 | 173 | 141 | 156 | 132 |
| 51 | | 174 | 158 | 130 | 184 | 174 | 146 | 157 | 135 |
| 52 | | 178 | 172 | 131 | 189 | 178 | 147 | 158 | 138 |
| 53 | | 184 | 174 | 138 | 201 | 179 | 148 | 159 | 142 |
| 54 | | 185 | 180 | 141 | 202 | 189 | 150 | 164 | 148 |
| 55 | | 189 | 185 | 142 | 205 | 193 | 151 | 173 | 151 |
| 56 | | 191 | 186 | 147 | 208 | 198 | 153 | 178 | 153 |
| 57 | | 201 | 192 | 150 | 210 | 202 | 154 | 181 | 157 |
| 58 | | 202 | 198 | 152 | 213 | 205 | 158 | 186 | 161 |
| 59 | | 203 | 202 | 154 | 214 | 207 | 160 | 189 | 164 |
| 60 | | 207 | 204 | 156 | 221 | 208 | 161 | 193 | 174 |
| 61 | | 209 | 207 | 160 | 223 | 209 | 165 | 198 | 178 |
| 62 | | 211 | 209 | 161 | 224 | 210 | 174 | 201 | 181 |

FIG. 20C

| total PCL inputs | | 73 | 68 | 91 | 68 | 72 | 84 | 77 | 85 |
|---|---|---|---|---|---|---|---|---|---|
| input number of PCL | mF | 7 | 6 | 5 | 4 | 3 | 2 | 1 | 0 |
| 63 | | 214 | 211 | 165 | 225 | 214 | 178 | 203 | 182 |
| 64 | | 218 | 212 | 173 | 226 | 218 | 179 | 205 | 183 |
| 65 | | 221 | 223 | 180 | 227 | 219 | 181 | 207 | 184 |
| 66 | | 224 | 226 | 181 | 237 | 224 | 182 | 208 | 185 |
| 67 | | 225 | 240 | 182 | 240 | 226 | 183 | 210 | 191 |
| 68 | | 226 | 242 | 183 | 253 | 237 | 184 | 212 | 192 |
| 69 | | 227 | | 184 | | 240 | 186 | 213 | 193 |
| 70 | | 234 | | 189 | | 249 | 193 | 221 | 198 |
| 71 | | 242 | | 191 | | 250 | 201 | 223 | 202 |
| 72 | | 249 | | 192 | | 254 | 203 | 224 | 209 |
| 73 | | 254 | | 193 | | | 204 | 227 | 210 |
| 74 | | | | 198 | | | 207 | 234 | 211 |
| 75 | | | | 201 | | | 208 | 242 | 213 |
| 76 | | | | 208 | | | 209 | 249 | 216 |
| 77 | | | | 209 | | | 211 | 253 | 219 |
| 78 | | | | 210 | | | 212 | | 223 |
| 79 | | | | 212 | | | 213 | | 224 |
| 80 | | | | 214 | | | 224 | | 225 |
| 81 | | | | 216 | | | 226 | | 227 |
| 82 | | | | 218 | | | 250 | | 240 |
| 83 | | | | 219 | | | 253 | | 242 |
| 84 | | | | 223 | | | 254 | | 249 |
| 85 | | | | 224 | | | | | 254 |
| 86 | | | | 226 | | | | | |
| 87 | | | | 227 | | | | | |
| 88 | | | | 237 | | | | | |
| 89 | | | | 250 | | | | | |
| 90 | | | | 253 | | | | | |
| 91 | | | | 254 | | | | | |
| 92 | | | | | | | | | |
| 93 | | | | | | | | | |

FIG. 21A

| total PCL inputs | | 64 | 65 | 92 | 67 | 68 | 90 | 61 | 64 |
|---|---|---|---|---|---|---|---|---|---|
| input number of PCL | mF | 7 | 6 | 5 | 4 | 3 | 2 | 1 | 0 |
| 1 | | 4 | 2 | 1 | 2 | 7 | 2 | 3 | 0 |
| 2 | | 7 | 6 | 2 | 4 | 8 | 3 | 5 | 5 |
| 3 | | 9 | 8 | 3 | 7 | 12 | 4 | 8 | 9 |
| 4 | | 11 | 9 | 4 | 12 | 13 | 7 | 13 | 10 |
| 5 | | 12 | 14 | 6 | 13 | 14 | 10 | 14 | 12 |
| 6 | | 13 | 16 | 8 | 14 | 15 | 13 | 15 | 15 |
| 7 | | 16 | 17 | 11 | 16 | 16 | 14 | 17 | 16 |
| 8 | | 17 | 18 | 12 | 17 | 18 | 15 | 18 | 18 |
| 9 | | 18 | 19 | 13 | 18 | 21 | 16 | 19 | 20 |
| 10 | | 19 | 22 | 16 | 20 | 23 | 17 | 21 | 22 |
| 11 | | 27 | 23 | 19 | 21 | 24 | 18 | 22 | 24 |
| 12 | | 28 | 29 | 22 | 23 | 26 | 22 | 24 | 25 |
| 13 | | 32 | 30 | 23 | 24 | 27 | 23 | 25 | 27 |
| 14 | | 33 | 31 | 24 | 25 | 29 | 26 | 26 | 29 |
| 15 | | 34 | 32 | 25 | 30 | 38 | 28 | 31 | 30 |
| 16 | | 36 | 34 | 26 | 31 | 40 | 29 | 32 | 33 |
| 17 | | 38 | 42 | 27 | 33 | 42 | 30 | 34 | 34 |
| 18 | | 44 | 46 | 31 | 34 | 44 | 32 | 36 | 37 |
| 19 | | 46 | 47 | 32 | 36 | 47 | 34 | 37 | 42 |
| 20 | | 47 | 50 | 37 | 37 | 48 | 36 | 38 | 47 |
| 21 | | 55 | 53 | 38 | 40 | 50 | 37 | 47 | 51 |
| 22 | | 58 | 57 | 44 | 42 | 58 | 38 | 54 | 60 |
| 23 | | 60 | 60 | 45 | 46 | 66 | 40 | 66 | 66 |
| 24 | | 79 | 73 | 46 | 53 | 72 | 44 | 72 | 71 |
| 25 | | 84 | 74 | 47 | 55 | 74 | 45 | 73 | 73 |
| 26 | | 87 | 80 | 48 | 58 | 75 | 46 | 75 | 75 |
| 27 | | 94 | 93 | 50 | 71 | 77 | 48 | 77 | 80 |
| 28 | | 95 | 94 | 52 | 72 | 80 | 50 | 87 | 84 |
| 29 | | 100 | 100 | 53 | 74 | 91 | 53 | 94 | 93 |
| 30 | | 111 | 101 | 54 | 75 | 93 | 54 | 105 | 94 |
| 31 | | 113 | 104 | 55 | 84 | 94 | 55 | 107 | 100 |

FIG. 21B

| total PCL inputs | | 64 | 65 | 92 | 67 | 68 | 90 | 61 | 64 |
|---|---|---|---|---|---|---|---|---|---|
| input number of PCL | mF | 7 | 6 | 5 | 4 | 3 | 2 | 1 | 0 |
| 32 | | 119 | 108 | 57 | 87 | 95 | 58 | 110 | 102 |
| 33 | | 121 | 110 | 73 | 91 | 99 | 66 | 119 | 107 |
| 34 | | 129 | 111 | 74 | 93 | 100 | 73 | 121 | 111 |
| 35 | | 130 | 119 | 75 | 104 | 101 | 74 | 123 | 112 |
| 36 | | 135 | 121 | 77 | 119 | 110 | 77 | 127 | 122 |
| 37 | | 138 | 131 | 94 | 122 | 123 | 79 | 128 | 127 |
| 38 | | 146 | 132 | 95 | 123 | 128 | 80 | 138 | 129 |
| 39 | | 148 | 141 | 99 | 127 | 129 | 87 | 149 | 131 |
| 40 | | 149 | 148 | 100 | 132 | 131 | 91 | 156 | 132 |
| 41 | | 151 | 149 | 101 | 135 | 142 | 94 | 158 | 135 |
| 42 | | 157 | 151 | 103 | 138 | 146 | 95 | 161 | 149 |
| 43 | | 160 | 152 | 104 | 142 | 149 | 99 | 172 | 151 |
| 44 | | 164 | 159 | 105 | 148 | 150 | 101 | 174 | 153 |
| 45 | | 165 | 161 | 108 | 157 | 151 | 104 | 178 | 158 |
| 46 | | 172 | 172 | 110 | 160 | 152 | 105 | 179 | 165 |
| 47 | | 180 | 182 | 113 | 165 | 160 | 112 | 184 | 173 |
| 48 | | 181 | 183 | 121 | 173 | 161 | 119 | 185 | 178 |
| 49 | | 185 | 184 | 127 | 174 | 165 | 128 | 189 | 180 |
| 50 | | 186 | 185 | 128 | 178 | 174 | 130 | 191 | 182 |
| 51 | | 189 | 192 | 129 | 183 | 179 | 131 | 207 | 183 |
| 52 | | 191 | 202 | 141 | 184 | 180 | 132 | 209 | 186 |
| 53 | | 202 | 203 | 146 | 186 | 182 | 138 | 212 | 202 |
| 54 | | 208 | 210 | 147 | 189 | 191 | 141 | 218 | 204 |
| 55 | | 211 | 212 | 148 | 193 | 193 | 142 | 219 | 209 |
| 56 | | 213 | 213 | 149 | 208 | 201 | 146 | 221 | 213 |
| 57 | | 216 | 218 | 150 | 211 | 202 | 147 | 223 | 214 |
| 58 | | 221 | 221 | 151 | 216 | 203 | 148 | 225 | 216 |
| 59 | | 223 | 223 | 152 | 218 | 211 | 150 | 226 | 219 |
| 60 | | 237 | 226 | 154 | 221 | 212 | 152 | 240 | 224 |
| 61 | | 240 | 227 | 156 | 224 | 216 | 156 | 242 | 226 |
| 62 | | 242 | 234 | 157 | 225 | 218 | 157 | | 234 |

FIG. 21C

| total PCL inputs | | 64 | 65 | 92 | 67 | 68 | 90 | 61 | 64 |
|---|---|---|---|---|---|---|---|---|---|
| input number of PCL | mF | 7 | 6 | 5 | 4 | 3 | 2 | 1 | 0 |
| 63 | | 250 | 250 | 159 | 227 | 219 | 160 | | 237 |
| 64 | | 253 | 253 | 161 | 234 | 225 | 179 | | 253 |
| 65 | | | 254 | 164 | 237 | 227 | 181 | | |
| 66 | | | | 165 | 240 | 242 | 182 | | |
| 67 | | | | 172 | 250 | 253 | 183 | | |
| 68 | | | | 178 | | 254 | 185 | | |
| 69 | | | | 179 | | | 189 | | |
| 70 | | | | 180 | | | 191 | | |
| 71 | | | | 184 | | | 192 | | |
| 72 | | | | 185 | | | 193 | | |
| 73 | | | | 191 | | | 198 | | |
| 74 | | | | 192 | | | 201 | | |
| 75 | | | | 198 | | | 203 | | |
| 76 | | | | 201 | | | 207 | | |
| 77 | | | | 202 | | | 208 | | |
| 78 | | | | 203 | | | 211 | | |
| 79 | | | | 205 | | | 214 | | |
| 80 | | | | 207 | | | 218 | | |
| 81 | | | | 208 | | | 219 | | |
| 82 | | | | 210 | | | 221 | | |
| 83 | | | | 212 | | | 226 | | |
| 84 | | | | 216 | | | 227 | | |
| 85 | | | | 223 | | | 234 | | |
| 86 | | | | 226 | | | 240 | | |
| 87 | | | | 227 | | | 242 | | |
| 88 | | | | 242 | | | 249 | | |
| 89 | | | | 249 | | | 250 | | |
| 90 | | | | 250 | | | 254 | | |
| 91 | | | | 253 | | | | | |
| 92 | | | | 254 | | | | | |
| 93 | | | | | | | | | |

FIG. 22A

| total PCL inputs | | 81 | 72 | 69 | 74 | 72 | 70 | 68 | 72 |
|---|---|---|---|---|---|---|---|---|---|
| input number of PCL | mF | 7 | 6 | 5 | 4 | 3 | 2 | 1 | 0 |
| 1 | | 1 | 3 | 3 | 2 | 4 | 3 | 2 | 0 |
| 2 | | 5 | 8 | 6 | 3 | 5 | 5 | 10 | 2 |
| 3 | | 6 | 10 | 9 | 4 | 7 | 6 | 12 | 3 |
| 4 | | 7 | 12 | 11 | 5 | 8 | 7 | 13 | 6 |
| 5 | | 9 | 14 | 12 | 6 | 10 | 8 | 14 | 8 |
| 6 | | 13 | 18 | 13 | 8 | 11 | 10 | 15 | 9 |
| 7 | | 16 | 19 | 18 | 10 | 12 | 11 | 17 | 12 |
| 8 | | 17 | 23 | 19 | 11 | 15 | 18 | 18 | 13 |
| 9 | | 20 | 24 | 21 | 15 | 19 | 19 | 25 | 14 |
| 10 | | 23 | 25 | 22 | 17 | 21 | 20 | 26 | 16 |
| 11 | | 24 | 26 | 24 | 22 | 22 | 24 | 27 | 17 |
| 12 | | 25 | 27 | 25 | 23 | 24 | 25 | 31 | 19 |
| 13 | | 28 | 28 | 26 | 24 | 25 | 27 | 32 | 21 |
| 14 | | 29 | 29 | 29 | 25 | 28 | 33 | 34 | 22 |
| 15 | | 31 | 30 | 33 | 27 | 30 | 36 | 40 | 23 |
| 16 | | 33 | 33 | 36 | 30 | 31 | 42 | 46 | 25 |
| 17 | | 36 | 38 | 38 | 31 | 34 | 48 | 48 | 27 |
| 18 | | 38 | 46 | 42 | 32 | 36 | 51 | 50 | 30 |
| 19 | | 45 | 48 | 44 | 33 | 38 | 52 | 55 | 31 |
| 20 | | 46 | 50 | 45 | 37 | 44 | 54 | 58 | 33 |
| 21 | | 47 | 51 | 48 | 42 | 45 | 55 | 66 | 34 |
| 22 | | 48 | 53 | 50 | 45 | 47 | 66 | 72 | 36 |
| 23 | | 50 | 54 | 52 | 52 | 52 | 72 | 73 | 40 |
| 24 | | 52 | 79 | 53 | 53 | 53 | 74 | 75 | 42 |
| 25 | | 53 | 84 | 55 | 60 | 55 | 75 | 79 | 45 |
| 26 | | 54 | 91 | 57 | 71 | 57 | 79 | 87 | 47 |
| 27 | | 57 | 94 | 58 | 72 | 58 | 80 | 94 | 48 |
| 28 | | 58 | 95 | 66 | 74 | 74 | 87 | 95 | 52 |
| 29 | | 60 | 99 | 71 | 77 | 84 | 91 | 100 | 54 |
| 30 | | 66 | 102 | 72 | 79 | 91 | 93 | 103 | 60 |
| 31 | | 71 | 108 | 75 | 84 | 100 | 99 | 104 | 74 |

FIG. 22B

| total PCL inputs | | 81 | 72 | 69 | 74 | 72 | 70 | 68 | 72 |
|---|---|---|---|---|---|---|---|---|---|
| input number of PCL | mF | 7 | 6 | 5 | 4 | 3 | 2 | 1 | 0 |
| 32 | | 87 | 111 | 77 | 93 | 101 | 100 | 107 | 79 |
| 33 | | 91 | 112 | 79 | 94 | 102 | 101 | 108 | 80 |
| 34 | | 99 | 121 | 84 | 95 | 104 | 102 | 112 | 93 |
| 35 | | 100 | 122 | 95 | 102 | 108 | 105 | 113 | 101 |
| 36 | | 101 | 123 | 100 | 103 | 111 | 107 | 121 | 102 |
| 37 | | 102 | 128 | 103 | 107 | 112 | 108 | 127 | 104 |
| 38 | | 103 | 130 | 104 | 112 | 119 | 111 | 132 | 108 |
| 39 | | 108 | 131 | 105 | 119 | 123 | 113 | 135 | 111 |
| 40 | | 111 | 132 | 110 | 121 | 128 | 127 | 141 | 119 |
| 41 | | 119 | 142 | 122 | 123 | 130 | 128 | 142 | 121 |
| 42 | | 121 | 148 | 129 | 127 | 131 | 130 | 147 | 122 |
| 43 | | 122 | 149 | 132 | 128 | 138 | 135 | 151 | 123 |
| 44 | | 123 | 150 | 138 | 132 | 141 | 146 | 152 | 127 |
| 45 | | 127 | 151 | 142 | 135 | 142 | 148 | 153 | 129 |
| 46 | | 135 | 152 | 147 | 138 | 147 | 152 | 159 | 130 |
| 47 | | 141 | 154 | 150 | 142 | 148 | 156 | 174 | 131 |
| 48 | | 149 | 156 | 152 | 147 | 149 | 159 | 179 | 132 |
| 49 | | 152 | 157 | 154 | 157 | 151 | 164 | 181 | 149 |
| 50 | | 157 | 161 | 156 | 158 | 152 | 172 | 182 | 154 |
| 51 | | 158 | 173 | 157 | 159 | 153 | 174 | 184 | 156 |
| 52 | | 159 | 178 | 158 | 160 | 154 | 180 | 189 | 158 |
| 53 | | 164 | 179 | 159 | 172 | 161 | 182 | 191 | 160 |
| 54 | | 165 | 183 | 161 | 179 | 165 | 184 | 192 | 164 |
| 55 | | 172 | 189 | 165 | 185 | 178 | 185 | 193 | 165 |
| 56 | | 179 | 191 | 179 | 191 | 180 | 186 | 198 | 172 |
| 57 | | 181 | 198 | 180 | 193 | 182 | 189 | 202 | 173 |
| 58 | | 182 | 202 | 185 | 201 | 186 | 191 | 203 | 174 |
| 59 | | 184 | 205 | 192 | 203 | 191 | 192 | 204 | 179 |
| 60 | | 185 | 207 | 201 | 204 | 192 | 193 | 205 | 181 |
| 61 | | 191 | 210 | 205 | 207 | 193 | 198 | 212 | 184 |
| 62 | | 198 | 211 | 207 | 208 | 198 | 205 | 213 | 192 |

FIG. 22C

| total PCL inputs | | 81 | 72 | 69 | 74 | 72 | 70 | 68 | 72 |
|---|---|---|---|---|---|---|---|---|---|
| input number of PCL | mF | 7 | 6 | 5 | 4 | 3 | 2 | 1 | 0 |
| 63 | | 201 | 213 | 208 | 211 | 201 | 209 | 216 | 207 |
| 64 | | 203 | 218 | 209 | 218 | 203 | 210 | 227 | 208 |
| 65 | | 204 | 223 | 210 | 221 | 214 | 224 | 237 | 209 |
| 66 | | 205 | 225 | 211 | 224 | 216 | 226 | 242 | 213 |
| 67 | | 207 | 227 | 212 | 226 | 218 | 237 | 249 | 214 |
| 68 | | 209 | 234 | 249 | 227 | 219 | 240 | 254 | 216 |
| 69 | | 212 | 240 | 250 | 234 | 221 | 242 | | 225 |
| 70 | | 213 | 242 | | 237 | 250 | 250 | | 237 |
| 71 | | 216 | 249 | | 240 | 253 | | | 240 |
| 72 | | 218 | 253 | | 249 | 254 | | | 254 |
| 73 | | 221 | | | 253 | | | | |
| 74 | | 223 | | | 254 | | | | |
| 75 | | 224 | | | | | | | |
| 76 | | 225 | | | | | | | |
| 77 | | 227 | | | | | | | |
| 78 | | 234 | | | | | | | |
| 79 | | 242 | | | | | | | |
| 80 | | 249 | | | | | | | |
| 81 | | 250 | | | | | | | |
| 82 | | | | | | | | | |
| 83 | | | | | | | | | |
| 84 | | | | | | | | | |
| 85 | | | | | | | | | |
| 86 | | | | | | | | | |
| 87 | | | | | | | | | |
| 88 | | | | | | | | | |
| 89 | | | | | | | | | |
| 90 | | | | | | | | | |
| 91 | | | | | | | | | |
| 92 | | | | | | | | | |
| 93 | | | | | | | | | |

FIG. 28A

| | | | pi(x) | | | | | | | | index | |
|---|---|---|---|---|---|---|---|---|---|---|---|---|
| m= | 7 | 6 | 5 | 4 | 3 | 2 | 1 | 0 | hex | | i | i(17) |
| | 0 | 0 | 0 | 0 | 0 | 0 | 0 | 1 | 0 | 1 | 0 | 0 |
| | 1 | 0 | 0 | 1 | 1 | 0 | 0 | 0 | 9 | 8 | 17 | 0 |
| | 0 | 1 | 0 | 0 | 1 | 1 | 1 | 0 | 4 | E | 34 | 0 |
| | 0 | 0 | 0 | 0 | 1 | 0 | 1 | 0 | 0 | A | 51 | 0 |
| | 1 | 0 | 0 | 1 | 1 | 0 | 0 | 1 | 9 | 9 | 68 | 0 |
| | 1 | 1 | 0 | 1 | 0 | 1 | 1 | 0 | D | 6 | 85 | 0 |
| | 0 | 1 | 0 | 0 | 0 | 1 | 0 | 0 | 4 | 4 | 102 | 0 |
| | 1 | 0 | 0 | 1 | 0 | 0 | 1 | 1 | 9 | 3 | 119 | 0 |
| | 0 | 1 | 0 | 0 | 1 | 1 | 1 | 1 | 4 | F | 136 | 0 |
| | 1 | 0 | 0 | 1 | 0 | 0 | 1 | 0 | 9 | 2 | 153 | 0 |
| | 1 | 1 | 0 | 1 | 0 | 1 | 1 | 1 | D | 7 | 170 | 0 |
| | 1 | 1 | 0 | 1 | 1 | 1 | 0 | 0 | D | C | 187 | 0 |
| | 1 | 1 | 0 | 1 | 1 | 1 | 0 | 1 | D | D | 204 | 0 |
| | 0 | 1 | 0 | 0 | 0 | 1 | 0 | 1 | 4 | 5 | 221 | 0 |
| | 0 | 0 | 0 | 0 | 1 | 0 | 1 | 1 | 0 | B | 238 | 0 |
| | 0 | 0 | 0 | 0 | 0 | 0 | 1 | 0 | 0 | 2 | 1 | 1 |
| | 0 | 0 | 1 | 0 | 1 | 1 | 0 | 1 | 2 | D | 18 | 1 |
| | 1 | 0 | 0 | 1 | 1 | 1 | 0 | 0 | 9 | C | 35 | 1 |
| | 0 | 0 | 0 | 1 | 0 | 1 | 0 | 0 | 1 | 4 | 52 | 1 |
| | 0 | 0 | 1 | 0 | 1 | 1 | 1 | 1 | 2 | F | 69 | 1 |
| | 1 | 0 | 1 | 1 | 0 | 0 | 0 | 1 | B | 1 | 86 | 1 |
| | 1 | 0 | 0 | 0 | 1 | 0 | 0 | 0 | 8 | 8 | 103 | 1 |
| | 0 | 0 | 1 | 1 | 1 | 0 | 1 | 1 | 3 | B | 120 | 1 |
| | 1 | 0 | 0 | 1 | 1 | 1 | 1 | 0 | 9 | E | 137 | 1 |
| | 0 | 0 | 1 | 1 | 1 | 0 | 0 | 1 | 3 | 9 | 154 | 1 |
| | 1 | 0 | 1 | 1 | 0 | 0 | 1 | 1 | B | 3 | 171 | 1 |
| | 1 | 0 | 1 | 0 | 0 | 1 | 0 | 1 | A | 5 | 188 | 1 |
| | 1 | 0 | 1 | 0 | 0 | 1 | 1 | 1 | A | 7 | 205 | 1 |
| | 1 | 0 | 0 | 0 | 1 | 0 | 1 | 0 | 8 | A | 222 | 1 |
| | 0 | 0 | 0 | 1 | 0 | 1 | 1 | 0 | 1 | 6 | 239 | 1 |
| | 0 | 0 | 0 | 0 | 0 | 1 | 0 | 0 | 0 | 4 | 2 | 2 |
| | 0 | 1 | 0 | 1 | 1 | 0 | 1 | 0 | 5 | A | 19 | 2 |
| | 0 | 0 | 1 | 0 | 0 | 1 | 0 | 1 | 2 | 5 | 36 | 2 |
| | 0 | 0 | 1 | 0 | 1 | 0 | 0 | 0 | 2 | 8 | 53 | 2 |
| | 0 | 1 | 0 | 1 | 1 | 1 | 1 | 0 | 5 | E | 70 | 2 |
| | 0 | 1 | 1 | 1 | 1 | 1 | 1 | 1 | 7 | F | 87 | 2 |
| | 0 | 0 | 0 | 0 | 1 | 1 | 0 | 1 | 0 | D | 104 | 2 |
| | 0 | 1 | 1 | 1 | 0 | 1 | 1 | 0 | 7 | 6 | 121 | 2 |
| | 0 | 0 | 1 | 0 | 0 | 0 | 0 | 1 | 2 | 1 | 138 | 2 |
| | 0 | 1 | 1 | 1 | 0 | 0 | 1 | 0 | 7 | 2 | 155 | 2 |
| | 0 | 1 | 1 | 1 | 1 | 0 | 1 | 1 | 7 | B | 172 | 2 |
| | 0 | 1 | 0 | 1 | 0 | 1 | 1 | 1 | 5 | 7 | 189 | 2 |
| | 0 | 1 | 0 | 1 | 0 | 0 | 1 | 1 | 5 | 3 | 206 | 2 |
| | 0 | 0 | 0 | 0 | 1 | 0 | 0 | 1 | 0 | 9 | 223 | 2 |
| | 0 | 0 | 1 | 0 | 1 | 1 | 0 | 0 | 2 | C | 240 | 2 |
| | 0 | 0 | 0 | 0 | 1 | 0 | 0 | 0 | 0 | 8 | 3 | 3 |
| | 1 | 0 | 1 | 1 | 0 | 1 | 0 | 0 | B | 4 | 20 | 3 |
| | 0 | 1 | 0 | 0 | 1 | 0 | 1 | 0 | 4 | A | 37 | 3 |
| | 0 | 1 | 0 | 1 | 0 | 0 | 0 | 0 | 5 | 0 | 54 | 3 |
| | 1 | 0 | 1 | 1 | 1 | 1 | 0 | 0 | B | C | 71 | 3 |
| | 1 | 1 | 1 | 1 | 1 | 1 | 1 | 0 | F | E | 88 | 3 |
| | 0 | 0 | 0 | 1 | 1 | 0 | 1 | 0 | 1 | A | 105 | 3 |
| | 1 | 1 | 1 | 0 | 1 | 1 | 0 | 0 | E | C | 122 | 3 |
| | 0 | 1 | 0 | 0 | 0 | 0 | 1 | 0 | 4 | 2 | 139 | 3 |
| | 1 | 1 | 1 | 0 | 0 | 1 | 0 | 0 | E | 4 | 156 | 3 |
| | 1 | 1 | 1 | 1 | 0 | 1 | 1 | 0 | F | 6 | 173 | 3 |
| | 1 | 0 | 1 | 0 | 1 | 1 | 1 | 0 | A | E | 190 | 3 |
| | 1 | 0 | 1 | 0 | 0 | 1 | 1 | 0 | A | 6 | 207 | 3 |
| | 0 | 0 | 0 | 1 | 0 | 0 | 1 | 0 | 1 | 2 | 224 | 3 |
| | 0 | 1 | 0 | 1 | 1 | 0 | 0 | 0 | 5 | 8 | 241 | 3 |

| | | | pi(x) | | | | | | | | index | |
|---|---|---|---|---|---|---|---|---|---|---|---|---|
| m= | 7 | 6 | 5 | 4 | 3 | 2 | 1 | 0 | hex | | i | i(17) |
| | 0 | 0 | 0 | 1 | 0 | 0 | 0 | 0 | 1 | 0 | 4 | 4 |
| | 0 | 1 | 1 | 1 | 0 | 1 | 0 | 1 | 7 | 5 | 21 | 4 |
| | 1 | 0 | 0 | 1 | 0 | 1 | 0 | 0 | 9 | 4 | 38 | 4 |
| | 1 | 0 | 1 | 0 | 0 | 0 | 0 | 0 | A | 0 | 55 | 4 |
| | 0 | 1 | 1 | 0 | 0 | 1 | 0 | 1 | 6 | 5 | 72 | 4 |
| | 1 | 1 | 1 | 0 | 0 | 0 | 0 | 1 | E | 1 | 89 | 4 |
| | 0 | 0 | 1 | 1 | 0 | 1 | 0 | 0 | 3 | 4 | 106 | 4 |
| | 1 | 1 | 0 | 0 | 0 | 1 | 0 | 1 | C | 5 | 123 | 4 |
| | 1 | 0 | 0 | 0 | 0 | 1 | 0 | 0 | 8 | 4 | 140 | 4 |
| | 1 | 1 | 0 | 1 | 0 | 1 | 0 | 1 | D | 5 | 157 | 4 |
| | 1 | 1 | 1 | 1 | 0 | 0 | 0 | 1 | F | 1 | 174 | 4 |
| | 0 | 1 | 0 | 0 | 0 | 0 | 0 | 1 | 4 | 1 | 191 | 4 |
| | 0 | 1 | 0 | 1 | 0 | 0 | 0 | 1 | 5 | 1 | 208 | 4 |
| | 0 | 0 | 1 | 0 | 0 | 1 | 0 | 0 | 2 | 4 | 225 | 4 |
| | 1 | 0 | 1 | 1 | 0 | 0 | 0 | 0 | B | 0 | 242 | 4 |
| | 0 | 0 | 1 | 0 | 0 | 0 | 0 | 0 | 2 | 0 | 5 | 5 |
| | 1 | 1 | 1 | 0 | 1 | 0 | 1 | 0 | E | A | 22 | 5 |
| | 0 | 0 | 1 | 1 | 0 | 1 | 0 | 1 | 3 | 5 | 39 | 5 |
| | 0 | 1 | 0 | 1 | 1 | 1 | 0 | 1 | 5 | D | 56 | 5 |
| | 1 | 1 | 0 | 0 | 1 | 0 | 1 | 0 | C | A | 73 | 5 |
| | 1 | 1 | 0 | 1 | 1 | 1 | 1 | 1 | D | F | 90 | 5 |
| | 0 | 1 | 1 | 0 | 1 | 0 | 0 | 0 | 6 | 8 | 107 | 5 |
| | 1 | 0 | 0 | 1 | 0 | 1 | 1 | 1 | 9 | 7 | 124 | 5 |
| | 0 | 0 | 0 | 1 | 0 | 1 | 0 | 1 | 1 | 5 | 141 | 5 |
| | 1 | 0 | 1 | 1 | 0 | 1 | 1 | 1 | B | 7 | 158 | 5 |
| | 1 | 1 | 1 | 1 | 1 | 1 | 1 | 1 | F | F | 175 | 5 |
| | 1 | 0 | 0 | 0 | 0 | 0 | 1 | 0 | 8 | 2 | 192 | 5 |
| | 1 | 0 | 1 | 0 | 0 | 0 | 1 | 0 | A | 2 | 209 | 5 |
| | 0 | 1 | 0 | 0 | 1 | 0 | 0 | 0 | 4 | 8 | 226 | 5 |
| | 0 | 1 | 1 | 1 | 1 | 1 | 0 | 1 | 7 | D | 243 | 5 |
| | 0 | 1 | 0 | 0 | 0 | 0 | 0 | 0 | 4 | 0 | 6 | 6 |
| | 1 | 1 | 0 | 0 | 1 | 0 | 0 | 1 | C | 9 | 23 | 6 |
| | 0 | 1 | 1 | 0 | 1 | 0 | 1 | 0 | 6 | A | 40 | 6 |
| | 1 | 0 | 1 | 1 | 1 | 0 | 1 | 0 | B | A | 57 | 6 |
| | 1 | 0 | 0 | 0 | 1 | 0 | 0 | 1 | 8 | 9 | 74 | 6 |
| | 1 | 0 | 1 | 0 | 0 | 0 | 1 | 1 | A | 3 | 91 | 6 |
| | 1 | 1 | 0 | 1 | 0 | 0 | 0 | 0 | D | 0 | 108 | 6 |
| | 0 | 0 | 1 | 1 | 0 | 0 | 1 | 1 | 3 | 3 | 125 | 6 |
| | 0 | 0 | 1 | 0 | 1 | 0 | 1 | 0 | 2 | A | 142 | 6 |
| | 0 | 1 | 1 | 1 | 0 | 0 | 1 | 1 | 7 | 3 | 159 | 6 |
| | 1 | 1 | 1 | 0 | 0 | 0 | 1 | 1 | E | 3 | 176 | 6 |
| | 0 | 0 | 0 | 1 | 1 | 0 | 0 | 1 | 1 | 9 | 193 | 6 |
| | 0 | 1 | 0 | 1 | 1 | 0 | 0 | 1 | 5 | 9 | 210 | 6 |
| | 1 | 0 | 0 | 1 | 0 | 0 | 0 | 0 | 9 | 0 | 227 | 6 |
| | 1 | 1 | 1 | 1 | 1 | 0 | 1 | 0 | F | A | 244 | 6 |
| | 1 | 0 | 0 | 0 | 0 | 0 | 0 | 0 | 8 | 0 | 7 | 7 |
| | 1 | 0 | 0 | 0 | 1 | 1 | 1 | 1 | 8 | F | 24 | 7 |
| | 1 | 1 | 0 | 1 | 0 | 1 | 0 | 0 | D | 4 | 41 | 7 |
| | 0 | 1 | 1 | 0 | 1 | 0 | 0 | 1 | 6 | 9 | 58 | 7 |
| | 0 | 0 | 0 | 0 | 1 | 1 | 1 | 1 | 0 | F | 75 | 7 |
| | 0 | 1 | 0 | 1 | 1 | 0 | 1 | 1 | 5 | B | 92 | 7 |
| | 1 | 0 | 1 | 1 | 1 | 1 | 0 | 1 | B | D | 109 | 7 |
| | 0 | 1 | 1 | 0 | 0 | 1 | 1 | 0 | 6 | 6 | 126 | 7 |
| | 0 | 1 | 0 | 1 | 0 | 1 | 0 | 0 | 5 | 4 | 143 | 7 |
| | 1 | 1 | 1 | 0 | 0 | 1 | 1 | 0 | E | 6 | 160 | 7 |
| | 1 | 1 | 0 | 1 | 1 | 0 | 1 | 1 | D | B | 177 | 7 |
| | 0 | 0 | 1 | 1 | 0 | 0 | 1 | 0 | 3 | 2 | 194 | 7 |
| | 1 | 0 | 1 | 1 | 0 | 0 | 1 | 0 | B | 2 | 211 | 7 |
| | 0 | 0 | 1 | 1 | 1 | 1 | 0 | 1 | 3 | D | 228 | 7 |
| | 1 | 1 | 1 | 0 | 1 | 0 | 0 | 1 | E | 9 | 245 | 7 |

FIG. 28B

| | | | pi(x) | | | | | | | | index | |
|---|---|---|---|---|---|---|---|---|---|---|---|---|
| m= | 7 | 6 | 5 | 4 | 3 | 2 | 1 | 0 | hex | | i | i(17) |
| | 0 | 0 | 0 | 1 | 1 | 1 | 0 | 1 | 1 | D | 8 | 8 |
| | 0 | 0 | 0 | 0 | 0 | 0 | 1 | 1 | 0 | 3 | 25 | 8 |
| | 1 | 0 | 1 | 1 | 0 | 1 | 0 | 1 | B | 5 | 42 | 8 |
| | 1 | 1 | 0 | 1 | 0 | 0 | 1 | 0 | D | 2 | 59 | 8 |
| | 0 | 0 | 0 | 1 | 1 | 1 | 1 | 0 | 1 | E | 76 | 8 |
| | 1 | 0 | 1 | 1 | 0 | 1 | 1 | 0 | B | 6 | 93 | 8 |
| | 0 | 1 | 1 | 0 | 0 | 1 | 1 | 1 | 6 | 7 | 110 | 8 |
| | 1 | 1 | 0 | 0 | 1 | 1 | 0 | 0 | C | C | 127 | 8 |
| | 1 | 0 | 1 | 0 | 1 | 0 | 0 | 0 | A | 8 | 144 | 8 |
| | 1 | 1 | 0 | 1 | 0 | 0 | 0 | 1 | D | 1 | 161 | 8 |
| | 1 | 0 | 1 | 0 | 1 | 0 | 1 | 1 | A | B | 178 | 8 |
| | 0 | 1 | 1 | 0 | 0 | 1 | 0 | 0 | 6 | 4 | 195 | 8 |
| | 0 | 1 | 1 | 1 | 1 | 0 | 0 | 1 | 7 | 9 | 212 | 8 |
| | 0 | 1 | 1 | 1 | 1 | 0 | 1 | 0 | 7 | A | 229 | 8 |
| | 1 | 1 | 0 | 0 | 1 | 1 | 1 | 1 | C | F | 246 | 8 |
| | 0 | 0 | 1 | 1 | 1 | 0 | 1 | 0 | 3 | A | 9 | 9 |
| | 0 | 0 | 0 | 0 | 0 | 1 | 1 | 0 | 0 | 6 | 26 | 9 |
| | 0 | 1 | 1 | 1 | 0 | 1 | 1 | 1 | 7 | 7 | 43 | 9 |
| | 1 | 0 | 1 | 1 | 1 | 0 | 0 | 1 | B | 9 | 60 | 9 |
| | 0 | 0 | 1 | 1 | 1 | 1 | 0 | 0 | 3 | C | 77 | 9 |
| | 0 | 1 | 1 | 1 | 0 | 0 | 0 | 1 | 7 | 1 | 94 | 9 |
| | 1 | 1 | 0 | 0 | 1 | 1 | 1 | 0 | C | E | 111 | 9 |
| | 1 | 0 | 0 | 0 | 0 | 1 | 0 | 1 | 8 | 5 | 128 | 9 |
| | 0 | 1 | 0 | 0 | 1 | 1 | 0 | 1 | 4 | D | 145 | 9 |
| | 1 | 0 | 1 | 1 | 1 | 1 | 1 | 1 | B | F | 162 | 9 |
| | 0 | 1 | 0 | 0 | 1 | 0 | 1 | 1 | 4 | B | 179 | 9 |
| | 1 | 1 | 0 | 0 | 1 | 0 | 0 | 0 | C | 8 | 196 | 9 |
| | 1 | 1 | 1 | 1 | 0 | 0 | 1 | 0 | F | 2 | 213 | 9 |
| | 1 | 1 | 1 | 1 | 0 | 1 | 0 | 0 | F | 4 | 230 | 9 |
| | 1 | 0 | 0 | 0 | 0 | 0 | 1 | 1 | 8 | 3 | 247 | 9 |
| | 0 | 1 | 1 | 1 | 0 | 1 | 0 | 0 | 7 | 4 | 10 | 10 |
| | 0 | 0 | 0 | 0 | 1 | 1 | 0 | 0 | 0 | C | 27 | 10 |
| | 1 | 1 | 1 | 0 | 1 | 1 | 1 | 0 | E | E | 44 | 10 |
| | 0 | 1 | 1 | 0 | 1 | 1 | 1 | 1 | 6 | F | 61 | 10 |
| | 0 | 1 | 1 | 1 | 1 | 0 | 0 | 0 | 7 | 8 | 78 | 10 |
| | 1 | 1 | 1 | 0 | 0 | 0 | 1 | 0 | E | 2 | 95 | 10 |
| | 1 | 0 | 0 | 0 | 0 | 0 | 0 | 1 | 8 | 1 | 112 | 10 |
| | 0 | 0 | 0 | 1 | 0 | 1 | 1 | 1 | 1 | 7 | 129 | 10 |
| | 1 | 0 | 0 | 1 | 1 | 0 | 1 | 0 | 9 | A | 146 | 10 |
| | 0 | 1 | 1 | 0 | 0 | 0 | 1 | 1 | 6 | 3 | 163 | 10 |
| | 1 | 0 | 0 | 1 | 0 | 1 | 1 | 0 | 9 | 6 | 180 | 10 |
| | 1 | 0 | 0 | 0 | 1 | 1 | 0 | 1 | 8 | D | 197 | 10 |
| | 1 | 1 | 1 | 1 | 1 | 0 | 0 | 1 | F | 9 | 214 | 10 |
| | 1 | 1 | 1 | 1 | 0 | 1 | 0 | 1 | F | 5 | 231 | 10 |
| | 0 | 0 | 0 | 1 | 1 | 0 | 1 | 1 | 1 | B | 248 | 10 |
| | 1 | 1 | 1 | 0 | 1 | 0 | 0 | 0 | E | 8 | 11 | 11 |
| | 0 | 0 | 0 | 1 | 1 | 0 | 0 | 0 | 1 | 8 | 28 | 11 |
| | 1 | 1 | 0 | 0 | 0 | 0 | 0 | 1 | C | 1 | 45 | 11 |
| | 1 | 1 | 0 | 1 | 1 | 1 | 1 | 0 | D | E | 62 | 11 |
| | 1 | 1 | 1 | 1 | 0 | 0 | 0 | 0 | F | 0 | 79 | 11 |
| | 1 | 1 | 0 | 1 | 1 | 0 | 0 | 1 | D | 9 | 96 | 11 |
| | 0 | 0 | 0 | 1 | 1 | 1 | 1 | 1 | 1 | F | 113 | 11 |
| | 0 | 0 | 1 | 0 | 1 | 1 | 1 | 0 | 2 | E | 130 | 11 |
| | 0 | 0 | 1 | 0 | 1 | 0 | 0 | 1 | 2 | 9 | 147 | 11 |
| | 1 | 1 | 0 | 0 | 0 | 1 | 1 | 0 | C | 6 | 164 | 11 |
| | 0 | 0 | 1 | 1 | 0 | 0 | 0 | 1 | 3 | 1 | 181 | 11 |
| | 0 | 0 | 0 | 0 | 0 | 1 | 1 | 1 | 0 | 7 | 198 | 11 |
| | 1 | 1 | 1 | 0 | 1 | 1 | 1 | 1 | E | F | 215 | 11 |
| | 1 | 1 | 1 | 1 | 0 | 1 | 1 | 1 | F | 7 | 232 | 11 |
| | 0 | 0 | 1 | 1 | 0 | 1 | 1 | 0 | 3 | 6 | 249 | 11 |

| | | | pi(x) | | | | | | | | index | |
|---|---|---|---|---|---|---|---|---|---|---|---|---|
| m= | 7 | 6 | 5 | 4 | 3 | 2 | 1 | 0 | hex | | i | i(17) |
| | 1 | 1 | 0 | 0 | 1 | 1 | 0 | 1 | C | D | 12 | 12 |
| | 0 | 0 | 1 | 1 | 0 | 0 | 0 | 0 | 3 | 0 | 29 | 12 |
| | 1 | 0 | 0 | 1 | 1 | 1 | 1 | 1 | 9 | F | 46 | 12 |
| | 1 | 0 | 1 | 0 | 0 | 0 | 0 | 1 | A | 1 | 63 | 12 |
| | 1 | 1 | 1 | 1 | 1 | 1 | 0 | 1 | F | D | 80 | 12 |
| | 1 | 0 | 1 | 0 | 1 | 1 | 1 | 1 | A | F | 97 | 12 |
| | 0 | 0 | 1 | 1 | 1 | 1 | 1 | 0 | 3 | E | 114 | 12 |
| | 0 | 1 | 0 | 1 | 1 | 1 | 0 | 0 | 5 | C | 131 | 12 |
| | 0 | 1 | 0 | 1 | 0 | 0 | 1 | 0 | 5 | 2 | 148 | 12 |
| | 1 | 0 | 0 | 1 | 0 | 0 | 0 | 1 | 9 | 1 | 165 | 12 |
| | 0 | 1 | 1 | 0 | 0 | 0 | 1 | 0 | 6 | 2 | 182 | 12 |
| | 0 | 0 | 0 | 0 | 1 | 1 | 1 | 0 | 0 | E | 199 | 12 |
| | 1 | 1 | 0 | 0 | 0 | 0 | 1 | 1 | C | 3 | 216 | 12 |
| | 1 | 1 | 1 | 1 | 0 | 0 | 1 | 1 | F | 3 | 233 | 12 |
| | 0 | 1 | 1 | 0 | 1 | 1 | 0 | 0 | 6 | C | 250 | 12 |
| | 1 | 0 | 0 | 0 | 0 | 1 | 1 | 1 | 8 | 7 | 13 | 13 |
| | 0 | 1 | 1 | 0 | 0 | 0 | 0 | 0 | 6 | 0 | 30 | 13 |
| | 0 | 0 | 1 | 0 | 0 | 0 | 1 | 1 | 2 | 3 | 47 | 13 |
| | 0 | 1 | 0 | 1 | 1 | 1 | 1 | 1 | 5 | F | 64 | 13 |
| | 1 | 1 | 1 | 0 | 0 | 1 | 1 | 1 | E | 7 | 81 | 13 |
| | 0 | 1 | 0 | 0 | 0 | 0 | 1 | 1 | 4 | 3 | 98 | 13 |
| | 0 | 1 | 1 | 1 | 1 | 1 | 0 | 0 | 7 | C | 115 | 13 |
| | 1 | 0 | 1 | 1 | 1 | 0 | 0 | 0 | B | 8 | 132 | 13 |
| | 1 | 0 | 1 | 0 | 0 | 1 | 0 | 0 | A | 4 | 149 | 13 |
| | 0 | 0 | 1 | 1 | 1 | 1 | 1 | 1 | 3 | F | 166 | 13 |
| | 1 | 1 | 0 | 0 | 0 | 1 | 0 | 0 | C | 4 | 183 | 13 |
| | 0 | 0 | 0 | 1 | 1 | 1 | 0 | 0 | 1 | C | 200 | 13 |
| | 1 | 0 | 0 | 1 | 1 | 0 | 1 | 1 | 9 | B | 217 | 13 |
| | 1 | 1 | 1 | 1 | 1 | 0 | 1 | 1 | F | B | 234 | 13 |
| | 1 | 1 | 0 | 1 | 1 | 0 | 0 | 0 | D | 8 | 251 | 13 |
| | 0 | 0 | 0 | 1 | 0 | 0 | 1 | 1 | 1 | 3 | 14 | 14 |
| | 1 | 1 | 0 | 0 | 0 | 0 | 0 | 0 | C | 0 | 31 | 14 |
| | 0 | 1 | 0 | 0 | 0 | 1 | 1 | 0 | 4 | 6 | 48 | 14 |
| | 1 | 0 | 1 | 1 | 1 | 1 | 1 | 0 | B | E | 65 | 14 |
| | 1 | 1 | 0 | 1 | 0 | 0 | 1 | 1 | D | 3 | 82 | 14 |
| | 1 | 0 | 0 | 0 | 0 | 1 | 1 | 0 | 8 | 6 | 99 | 14 |
| | 1 | 1 | 1 | 1 | 1 | 0 | 0 | 0 | F | 8 | 116 | 14 |
| | 0 | 1 | 1 | 0 | 1 | 1 | 0 | 1 | 6 | D | 133 | 14 |
| | 0 | 1 | 0 | 1 | 0 | 1 | 0 | 1 | 5 | 5 | 150 | 14 |
| | 0 | 1 | 1 | 1 | 1 | 1 | 1 | 0 | 7 | E | 167 | 14 |
| | 1 | 0 | 0 | 1 | 0 | 1 | 0 | 1 | 9 | 5 | 184 | 14 |
| | 0 | 0 | 1 | 1 | 1 | 0 | 0 | 0 | 3 | 8 | 201 | 14 |
| | 0 | 0 | 1 | 0 | 1 | 0 | 1 | 1 | 2 | B | 218 | 14 |
| | 1 | 1 | 1 | 0 | 1 | 0 | 1 | 1 | E | B | 235 | 14 |
| | 1 | 0 | 1 | 0 | 1 | 1 | 0 | 1 | A | D | 252 | 14 |
| | 0 | 0 | 1 | 0 | 0 | 1 | 1 | 0 | 2 | 6 | 15 | 15 |
| | 1 | 0 | 0 | 1 | 1 | 1 | 0 | 1 | 9 | D | 32 | 15 |
| | 1 | 0 | 0 | 0 | 1 | 1 | 0 | 0 | 8 | C | 49 | 15 |
| | 0 | 1 | 1 | 0 | 0 | 0 | 0 | 1 | 6 | 1 | 66 | 15 |
| | 1 | 0 | 1 | 1 | 1 | 0 | 1 | 1 | B | B | 83 | 15 |
| | 0 | 0 | 0 | 1 | 0 | 0 | 0 | 1 | 1 | 1 | 100 | 15 |
| | 1 | 1 | 1 | 0 | 1 | 1 | 0 | 1 | E | D | 117 | 15 |
| | 1 | 1 | 0 | 1 | 1 | 0 | 1 | 0 | D | A | 134 | 15 |
| | 1 | 0 | 1 | 0 | 1 | 0 | 1 | 0 | A | A | 151 | 15 |
| | 1 | 1 | 1 | 1 | 1 | 1 | 0 | 0 | F | C | 168 | 15 |
| | 0 | 0 | 1 | 1 | 0 | 1 | 1 | 1 | 3 | 7 | 185 | 15 |
| | 0 | 1 | 1 | 1 | 0 | 0 | 0 | 0 | 7 | 0 | 202 | 15 |
| | 0 | 1 | 0 | 1 | 0 | 1 | 1 | 0 | 5 | 6 | 219 | 15 |
| | 1 | 1 | 0 | 0 | 1 | 0 | 1 | 1 | C | B | 236 | 15 |
| | 0 | 1 | 0 | 0 | 0 | 1 | 1 | 1 | 4 | 7 | 253 | 15 |

FIG. 28C

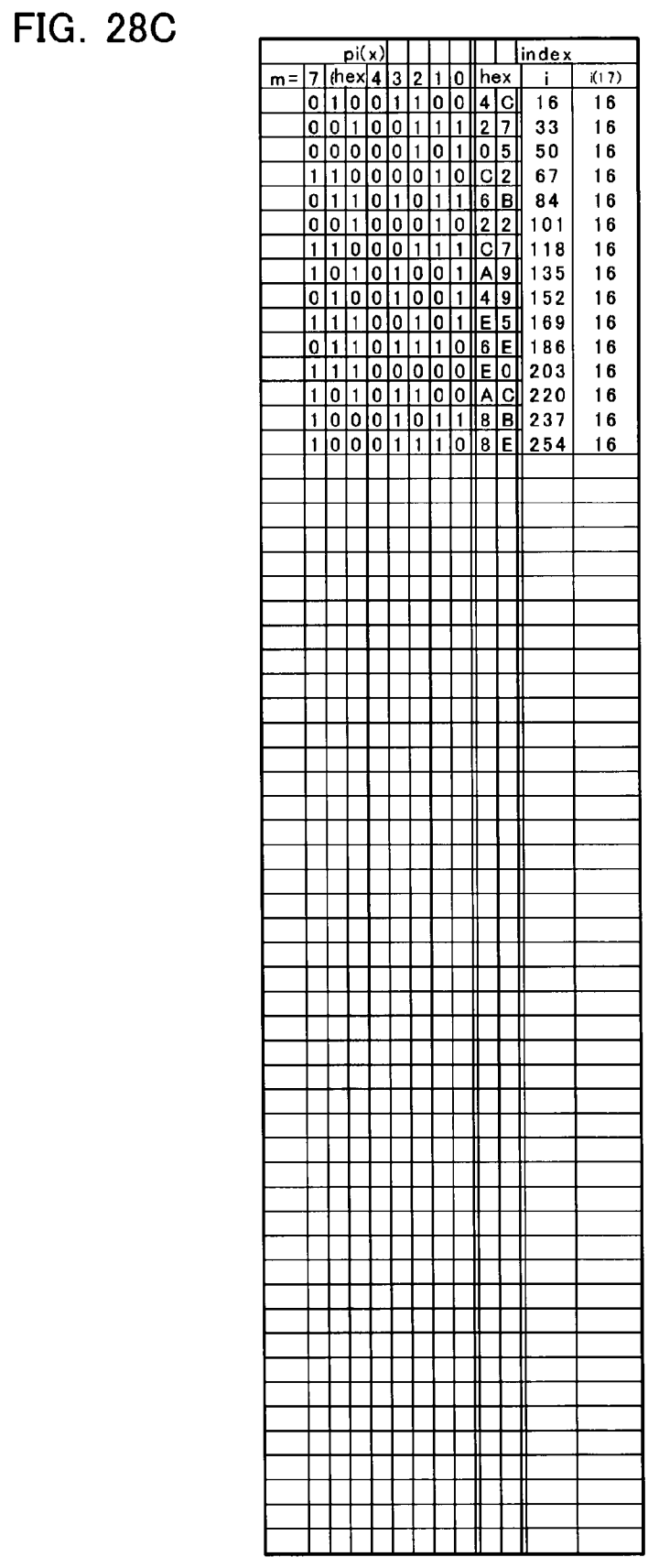

| pi(x) | | | | | | | | | | | index | |
|---|---|---|---|---|---|---|---|---|---|---|---|---|
| m= | 7 | (hex | | 4 | 3 | 2 | 1 | 0 | hex | | i | i(17) |
| | 0 | 1 | 0 | 0 | 1 | 1 | 0 | 0 | 4 | C | 16 | 16 |
| | 0 | 0 | 1 | 0 | 0 | 1 | 1 | 1 | 2 | 7 | 33 | 16 |
| | 0 | 0 | 0 | 0 | 0 | 1 | 0 | 1 | 0 | 5 | 50 | 16 |
| | 1 | 1 | 0 | 0 | 0 | 0 | 1 | 0 | C | 2 | 67 | 16 |
| | 0 | 1 | 1 | 0 | 1 | 0 | 1 | 1 | 6 | B | 84 | 16 |
| | 0 | 0 | 1 | 0 | 0 | 0 | 1 | 0 | 2 | 2 | 101 | 16 |
| | 1 | 1 | 0 | 0 | 0 | 1 | 1 | 1 | C | 7 | 118 | 16 |
| | 1 | 0 | 1 | 0 | 1 | 0 | 0 | 1 | A | 9 | 135 | 16 |
| | 0 | 1 | 0 | 0 | 1 | 0 | 0 | 1 | 4 | 9 | 152 | 16 |
| | 1 | 1 | 1 | 0 | 0 | 1 | 0 | 1 | E | 5 | 169 | 16 |
| | 0 | 1 | 1 | 0 | 1 | 1 | 1 | 0 | 6 | E | 186 | 16 |
| | 1 | 1 | 1 | 0 | 0 | 0 | 0 | 0 | E | 0 | 203 | 16 |
| | 1 | 0 | 1 | 0 | 1 | 1 | 0 | 0 | A | C | 220 | 16 |
| | 1 | 0 | 0 | 0 | 1 | 0 | 1 | 1 | 8 | B | 237 | 16 |
| | 1 | 0 | 0 | 0 | 1 | 1 | 1 | 0 | 8 | E | 254 | 16 |

FIG. 29A

| | pi(x) | | | | | | | | | | index | |
|---|---|---|---|---|---|---|---|---|---|---|---|---|
| m= | 7 | 6 | 5 | 4 | 3 | 2 | 1 | 0 | hex | | i | i(15) |
| | 0 | 0 | 0 | 0 | 0 | 0 | 0 | 1 | 0 | 1 | 0 | 0 |
| | 0 | 0 | 1 | 0 | 0 | 1 | 1 | 0 | 2 | 6 | 15 | 0 |
| | 0 | 1 | 1 | 0 | 0 | 0 | 0 | 0 | 6 | 0 | 30 | 0 |
| | 1 | 1 | 0 | 0 | 0 | 0 | 0 | 1 | C | 1 | 45 | 0 |
| | 1 | 0 | 1 | 1 | 1 | 0 | 0 | 1 | B | 9 | 60 | 0 |
| | 0 | 0 | 0 | 0 | 1 | 1 | 1 | 1 | 0 | F | 75 | 0 |
| | 1 | 1 | 0 | 1 | 1 | 1 | 1 | 1 | D | F | 90 | 0 |
| | 0 | 0 | 0 | 1 | 1 | 0 | 1 | 0 | 1 | A | 105 | 0 |
| | 0 | 0 | 1 | 1 | 1 | 0 | 1 | 1 | 3 | B | 120 | 0 |
| | 1 | 0 | 1 | 0 | 1 | 0 | 0 | 1 | A | 9 | 135 | 0 |
| | 0 | 1 | 0 | 1 | 0 | 1 | 0 | 1 | 5 | 5 | 150 | 0 |
| | 1 | 0 | 0 | 1 | 0 | 0 | 0 | 1 | 9 | 1 | 165 | 0 |
| | 1 | 0 | 0 | 1 | 0 | 1 | 1 | 0 | 9 | 6 | 180 | 0 |
| | 0 | 1 | 1 | 0 | 0 | 1 | 0 | 0 | 6 | 4 | 195 | 0 |
| | 0 | 1 | 0 | 1 | 1 | 0 | 0 | 1 | 5 | 9 | 210 | 0 |
| | 0 | 0 | 1 | 0 | 0 | 1 | 0 | 0 | 2 | 4 | 225 | 0 |
| | 0 | 0 | 1 | 0 | 1 | 1 | 0 | 0 | 2 | C | 240 | 0 |
| | 0 | 0 | 0 | 0 | 0 | 0 | 1 | 0 | 0 | 2 | 1 | 1 |
| | 0 | 1 | 0 | 0 | 1 | 1 | 0 | 0 | 4 | C | 16 | 1 |
| | 1 | 1 | 0 | 0 | 0 | 0 | 0 | 0 | C | 0 | 31 | 1 |
| | 1 | 0 | 0 | 1 | 1 | 1 | 1 | 1 | 9 | F | 46 | 1 |
| | 0 | 1 | 1 | 0 | 1 | 1 | 1 | 1 | 6 | F | 61 | 1 |
| | 0 | 0 | 0 | 1 | 1 | 1 | 1 | 0 | 1 | E | 76 | 1 |
| | 1 | 0 | 1 | 0 | 0 | 0 | 1 | 1 | A | 3 | 91 | 1 |
| | 0 | 0 | 1 | 1 | 0 | 1 | 0 | 0 | 3 | 4 | 106 | 1 |
| | 0 | 1 | 1 | 1 | 0 | 1 | 1 | 0 | 7 | 6 | 121 | 1 |
| | 0 | 1 | 0 | 0 | 1 | 1 | 1 | 1 | 4 | F | 136 | 1 |
| | 1 | 0 | 1 | 0 | 1 | 0 | 1 | 0 | A | A | 151 | 1 |
| | 0 | 0 | 1 | 1 | 1 | 1 | 1 | 1 | 3 | F | 166 | 1 |
| | 0 | 0 | 1 | 1 | 0 | 0 | 0 | 1 | 3 | 1 | 181 | 1 |
| | 1 | 1 | 0 | 0 | 1 | 0 | 0 | 0 | C | 8 | 196 | 1 |
| | 1 | 0 | 1 | 1 | 0 | 0 | 1 | 0 | B | 2 | 211 | 1 |
| | 0 | 1 | 0 | 0 | 1 | 0 | 0 | 0 | 4 | 8 | 226 | 1 |
| | 0 | 1 | 0 | 1 | 1 | 0 | 0 | 0 | 5 | 8 | 241 | 1 |
| | 0 | 0 | 0 | 0 | 0 | 1 | 0 | 0 | 0 | 4 | 2 | 2 |
| | 1 | 0 | 0 | 1 | 1 | 0 | 0 | 0 | 9 | 8 | 17 | 2 |
| | 1 | 0 | 0 | 1 | 1 | 1 | 0 | 1 | 9 | D | 32 | 2 |
| | 0 | 0 | 1 | 0 | 0 | 0 | 1 | 1 | 2 | 3 | 47 | 2 |
| | 1 | 1 | 0 | 1 | 1 | 1 | 1 | 0 | D | E | 62 | 2 |
| | 0 | 0 | 1 | 1 | 1 | 1 | 0 | 0 | 3 | C | 77 | 2 |
| | 0 | 1 | 0 | 1 | 1 | 0 | 1 | 1 | 5 | B | 92 | 2 |
| | 0 | 1 | 1 | 0 | 1 | 0 | 0 | 0 | 6 | 8 | 107 | 2 |
| | 1 | 1 | 1 | 0 | 1 | 1 | 0 | 0 | E | C | 122 | 2 |
| | 1 | 0 | 0 | 1 | 1 | 1 | 1 | 0 | 9 | E | 137 | 2 |
| | 0 | 1 | 0 | 0 | 1 | 0 | 0 | 1 | 4 | 9 | 152 | 2 |
| | 0 | 1 | 1 | 1 | 1 | 1 | 1 | 0 | 7 | E | 167 | 2 |
| | 0 | 1 | 1 | 0 | 0 | 0 | 1 | 0 | 6 | 2 | 182 | 2 |
| | 1 | 0 | 0 | 0 | 1 | 1 | 0 | 1 | 8 | D | 197 | 2 |
| | 0 | 1 | 1 | 1 | 1 | 0 | 0 | 1 | 7 | 9 | 212 | 2 |
| | 1 | 0 | 0 | 1 | 0 | 0 | 0 | 0 | 9 | 0 | 227 | 2 |
| | 1 | 0 | 1 | 1 | 0 | 0 | 0 | 0 | B | 0 | 242 | 2 |

| | pi(x) | | | | | | | | | | index | |
|---|---|---|---|---|---|---|---|---|---|---|---|---|
| m= | 7 | 6 | 5 | 4 | 3 | 2 | 1 | 0 | hex | | i | i(15) |
| | 0 | 0 | 0 | 0 | 1 | 0 | 0 | 0 | 0 | 8 | 3 | 3 |
| | 0 | 0 | 1 | 0 | 1 | 1 | 0 | 1 | 2 | D | 18 | 3 |
| | 0 | 0 | 1 | 0 | 0 | 1 | 1 | 1 | 2 | 7 | 33 | 3 |
| | 0 | 1 | 0 | 0 | 0 | 1 | 1 | 0 | 4 | 6 | 48 | 3 |
| | 1 | 0 | 1 | 0 | 0 | 0 | 0 | 1 | A | 1 | 63 | 3 |
| | 0 | 1 | 1 | 1 | 1 | 0 | 0 | 0 | 7 | 8 | 78 | 3 |
| | 1 | 0 | 1 | 1 | 0 | 1 | 1 | 0 | B | 6 | 93 | 3 |
| | 1 | 1 | 0 | 1 | 0 | 0 | 0 | 0 | D | 0 | 108 | 3 |
| | 1 | 1 | 0 | 0 | 0 | 1 | 0 | 1 | C | 5 | 123 | 3 |
| | 0 | 0 | 1 | 0 | 0 | 0 | 0 | 1 | 2 | 1 | 138 | 3 |
| | 1 | 0 | 0 | 1 | 0 | 0 | 1 | 0 | 9 | 2 | 153 | 3 |
| | 1 | 1 | 1 | 1 | 1 | 1 | 0 | 0 | F | C | 168 | 3 |
| | 1 | 1 | 0 | 0 | 0 | 1 | 0 | 0 | C | 4 | 183 | 3 |
| | 0 | 0 | 0 | 0 | 0 | 1 | 1 | 1 | 0 | 7 | 198 | 3 |
| | 1 | 1 | 1 | 1 | 0 | 0 | 1 | 0 | F | 2 | 213 | 3 |
| | 0 | 0 | 1 | 1 | 1 | 1 | 0 | 1 | 3 | D | 228 | 3 |
| | 0 | 1 | 1 | 1 | 1 | 1 | 0 | 1 | 7 | D | 243 | 3 |
| | 0 | 0 | 0 | 1 | 0 | 0 | 0 | 0 | 1 | 0 | 4 | 4 |
| | 0 | 1 | 0 | 1 | 1 | 0 | 1 | 0 | 5 | A | 19 | 4 |
| | 0 | 1 | 0 | 0 | 1 | 1 | 1 | 0 | 4 | E | 34 | 4 |
| | 1 | 0 | 0 | 0 | 1 | 1 | 0 | 0 | 8 | C | 49 | 4 |
| | 0 | 1 | 0 | 1 | 1 | 1 | 1 | 1 | 5 | F | 64 | 4 |
| | 1 | 1 | 1 | 1 | 0 | 0 | 0 | 0 | F | 0 | 79 | 4 |
| | 0 | 1 | 1 | 1 | 0 | 0 | 0 | 1 | 7 | 1 | 94 | 4 |
| | 1 | 0 | 1 | 1 | 1 | 1 | 0 | 1 | B | D | 109 | 4 |
| | 1 | 0 | 0 | 1 | 0 | 1 | 1 | 1 | 9 | 7 | 124 | 4 |
| | 0 | 1 | 0 | 0 | 0 | 0 | 1 | 0 | 4 | 2 | 139 | 4 |
| | 0 | 0 | 1 | 1 | 1 | 0 | 0 | 1 | 3 | 9 | 154 | 4 |
| | 1 | 1 | 1 | 0 | 0 | 1 | 0 | 1 | E | 5 | 169 | 4 |
| | 1 | 0 | 0 | 1 | 0 | 1 | 0 | 1 | 9 | 5 | 184 | 4 |
| | 0 | 0 | 0 | 0 | 1 | 1 | 1 | 0 | 0 | E | 199 | 4 |
| | 1 | 1 | 1 | 1 | 1 | 0 | 0 | 1 | F | 9 | 214 | 4 |
| | 0 | 1 | 1 | 1 | 1 | 0 | 1 | 0 | 7 | A | 229 | 4 |
| | 1 | 1 | 1 | 1 | 1 | 0 | 1 | 0 | F | A | 244 | 4 |
| | 0 | 0 | 1 | 0 | 0 | 0 | 0 | 0 | 2 | 0 | 5 | 5 |
| | 1 | 0 | 1 | 1 | 0 | 1 | 0 | 0 | B | 4 | 20 | 5 |
| | 1 | 0 | 0 | 1 | 1 | 1 | 0 | 0 | 9 | C | 35 | 5 |
| | 0 | 0 | 0 | 0 | 0 | 1 | 0 | 1 | 0 | 5 | 50 | 5 |
| | 1 | 0 | 1 | 1 | 1 | 1 | 1 | 0 | B | E | 65 | 5 |
| | 1 | 1 | 1 | 1 | 1 | 1 | 0 | 1 | F | D | 80 | 5 |
| | 1 | 1 | 1 | 0 | 0 | 0 | 1 | 0 | E | 2 | 95 | 5 |
| | 0 | 1 | 1 | 0 | 0 | 1 | 1 | 1 | 6 | 7 | 110 | 5 |
| | 0 | 0 | 1 | 1 | 0 | 0 | 1 | 1 | 3 | 3 | 125 | 5 |
| | 1 | 0 | 0 | 0 | 0 | 1 | 0 | 0 | 8 | 4 | 140 | 5 |
| | 0 | 1 | 1 | 1 | 0 | 0 | 1 | 0 | 7 | 2 | 155 | 5 |
| | 1 | 1 | 0 | 1 | 0 | 1 | 1 | 1 | D | 7 | 170 | 5 |
| | 0 | 0 | 1 | 1 | 0 | 1 | 1 | 1 | 3 | 7 | 185 | 5 |
| | 0 | 0 | 0 | 1 | 1 | 1 | 0 | 0 | 1 | C | 200 | 5 |
| | 1 | 1 | 1 | 0 | 1 | 1 | 1 | 1 | E | F | 215 | 5 |
| | 1 | 1 | 1 | 1 | 0 | 1 | 0 | 0 | F | 4 | 230 | 5 |
| | 1 | 1 | 1 | 0 | 1 | 0 | 0 | 1 | E | 9 | 245 | 5 |

FIG. 29B

| | pi(x) | | | | | | | | index | | | |
|---|---|---|---|---|---|---|---|---|---|---|---|---|
| m= | 7 | 6 | 5 | 4 | 3 | 2 | 1 | 0 | hex | | i | i(15) |
| | 0 | 1 | 0 | 0 | 0 | 0 | 0 | 0 | 4 | 0 | 6 | 6 |
| | 0 | 1 | 1 | 1 | 0 | 1 | 0 | 1 | 7 | 5 | 21 | 6 |
| | 0 | 0 | 1 | 0 | 0 | 1 | 0 | 1 | 2 | 5 | 36 | 6 |
| | 0 | 0 | 0 | 0 | 1 | 0 | 1 | 0 | 0 | A | 51 | 6 |
| | 0 | 1 | 1 | 0 | 0 | 0 | 0 | 1 | 6 | 1 | 66 | 6 |
| | 1 | 1 | 1 | 0 | 0 | 1 | 1 | 1 | E | 7 | 81 | 6 |
| | 1 | 1 | 0 | 1 | 1 | 0 | 0 | 1 | D | 9 | 96 | 6 |
| | 1 | 1 | 0 | 0 | 1 | 1 | 1 | 0 | C | E | 111 | 6 |
| | 0 | 1 | 1 | 0 | 0 | 1 | 1 | 0 | 6 | 6 | 126 | 6 |
| | 0 | 0 | 0 | 1 | 0 | 1 | 0 | 1 | 1 | 5 | 141 | 6 |
| | 1 | 1 | 1 | 0 | 0 | 1 | 0 | 0 | E | 4 | 156 | 6 |
| | 1 | 0 | 1 | 1 | 0 | 0 | 1 | 1 | B | 3 | 171 | 6 |
| | 0 | 1 | 1 | 0 | 1 | 1 | 1 | 0 | 6 | E | 186 | 6 |
| | 0 | 0 | 1 | 1 | 1 | 0 | 0 | 0 | 3 | 8 | 201 | 6 |
| | 1 | 1 | 0 | 0 | 0 | 0 | 1 | 1 | C | 3 | 216 | 6 |
| | 1 | 1 | 1 | 1 | 0 | 1 | 0 | 1 | F | 5 | 231 | 6 |
| | 1 | 1 | 0 | 0 | 1 | 1 | 1 | 1 | C | F | 246 | 6 |
| | 1 | 0 | 0 | 0 | 0 | 0 | 0 | 0 | 8 | 0 | 7 | 7 |
| | 1 | 1 | 1 | 0 | 1 | 0 | 1 | 0 | E | A | 22 | 7 |
| | 0 | 1 | 0 | 0 | 1 | 0 | 1 | 0 | 4 | A | 37 | 7 |
| | 0 | 0 | 0 | 1 | 0 | 1 | 0 | 0 | 1 | 4 | 52 | 7 |
| | 1 | 1 | 0 | 0 | 0 | 0 | 1 | 0 | C | 2 | 67 | 7 |
| | 1 | 1 | 0 | 1 | 0 | 0 | 1 | 1 | D | 3 | 82 | 7 |
| | 1 | 0 | 1 | 0 | 1 | 1 | 1 | 1 | A | F | 97 | 7 |
| | 1 | 0 | 0 | 0 | 0 | 0 | 0 | 1 | 8 | 1 | 112 | 7 |
| | 1 | 1 | 0 | 0 | 1 | 1 | 0 | 0 | C | C | 127 | 7 |
| | 0 | 0 | 1 | 0 | 1 | 0 | 1 | 0 | 2 | A | 142 | 7 |
| | 1 | 1 | 0 | 1 | 0 | 1 | 0 | 1 | D | 5 | 157 | 7 |
| | 0 | 1 | 1 | 1 | 1 | 0 | 1 | 1 | 7 | B | 172 | 7 |
| | 1 | 1 | 0 | 1 | 1 | 1 | 0 | 0 | D | C | 187 | 7 |
| | 0 | 1 | 1 | 1 | 0 | 0 | 0 | 0 | 7 | 0 | 202 | 7 |
| | 1 | 0 | 0 | 1 | 1 | 0 | 1 | 1 | 9 | B | 217 | 7 |
| | 1 | 1 | 1 | 1 | 0 | 1 | 1 | 1 | F | 7 | 232 | 7 |
| | 1 | 0 | 0 | 0 | 0 | 0 | 1 | 1 | 8 | 3 | 247 | 7 |
| | 0 | 0 | 0 | 1 | 1 | 1 | 0 | 1 | 1 | D | 8 | 8 |
| | 1 | 1 | 0 | 0 | 1 | 0 | 0 | 1 | C | 9 | 23 | 8 |
| | 1 | 0 | 0 | 1 | 0 | 1 | 0 | 0 | 9 | 4 | 38 | 8 |
| | 0 | 0 | 1 | 0 | 1 | 0 | 0 | 0 | 2 | 8 | 53 | 8 |
| | 1 | 0 | 0 | 1 | 1 | 0 | 0 | 1 | 9 | 9 | 68 | 8 |
| | 1 | 0 | 1 | 1 | 1 | 0 | 1 | 1 | B | B | 83 | 8 |
| | 0 | 1 | 0 | 0 | 0 | 0 | 1 | 1 | 4 | 3 | 98 | 8 |
| | 0 | 0 | 0 | 1 | 1 | 1 | 1 | 1 | 1 | F | 113 | 8 |
| | 1 | 0 | 0 | 0 | 0 | 1 | 0 | 1 | 8 | 5 | 128 | 8 |
| | 0 | 1 | 0 | 1 | 0 | 1 | 0 | 0 | 5 | 4 | 143 | 8 |
| | 1 | 0 | 1 | 1 | 0 | 1 | 1 | 1 | B | 7 | 158 | 8 |
| | 1 | 1 | 1 | 1 | 0 | 1 | 1 | 0 | F | 6 | 173 | 8 |
| | 1 | 0 | 1 | 0 | 0 | 1 | 0 | 1 | A | 5 | 188 | 8 |
| | 1 | 1 | 1 | 0 | 0 | 0 | 0 | 0 | E | 0 | 203 | 8 |
| | 0 | 0 | 1 | 0 | 1 | 0 | 1 | 1 | 2 | B | 218 | 8 |
| | 1 | 1 | 1 | 1 | 0 | 0 | 1 | 1 | F | 3 | 233 | 8 |
| | 0 | 0 | 0 | 1 | 1 | 0 | 1 | 1 | 1 | B | 248 | 8 |

| | pi(x) | | | | | | | | index | | | |
|---|---|---|---|---|---|---|---|---|---|---|---|---|
| m= | 7 | 6 | 5 | 4 | 3 | 2 | 1 | 0 | hex | | i | i(15) |
| | 0 | 0 | 1 | 1 | 1 | 0 | 1 | 0 | 3 | A | 9 | 9 |
| | 1 | 0 | 0 | 0 | 1 | 1 | 1 | 1 | 8 | F | 24 | 9 |
| | 0 | 0 | 1 | 1 | 0 | 1 | 0 | 1 | 3 | 5 | 39 | 9 |
| | 0 | 1 | 0 | 1 | 0 | 0 | 0 | 0 | 5 | 0 | 54 | 9 |
| | 0 | 0 | 1 | 0 | 1 | 1 | 1 | 1 | 2 | F | 69 | 9 |
| | 0 | 1 | 1 | 0 | 1 | 0 | 1 | 1 | 6 | B | 84 | 9 |
| | 1 | 0 | 0 | 0 | 0 | 1 | 1 | 0 | 8 | 6 | 99 | 9 |
| | 0 | 0 | 1 | 1 | 1 | 1 | 1 | 0 | 3 | E | 114 | 9 |
| | 0 | 0 | 0 | 1 | 0 | 1 | 1 | 1 | 1 | 7 | 129 | 9 |
| | 1 | 0 | 1 | 0 | 1 | 0 | 0 | 0 | A | 8 | 144 | 9 |
| | 0 | 1 | 1 | 1 | 0 | 0 | 1 | 1 | 7 | 3 | 159 | 9 |
| | 1 | 1 | 1 | 1 | 0 | 0 | 0 | 1 | F | 1 | 174 | 9 |
| | 0 | 1 | 0 | 1 | 0 | 1 | 1 | 1 | 5 | 7 | 189 | 9 |
| | 1 | 1 | 0 | 1 | 1 | 1 | 0 | 1 | D | D | 204 | 9 |
| | 0 | 1 | 0 | 1 | 0 | 1 | 1 | 0 | 5 | 6 | 219 | 9 |
| | 1 | 1 | 1 | 1 | 1 | 0 | 1 | 1 | F | B | 234 | 9 |
| | 0 | 0 | 1 | 1 | 0 | 1 | 1 | 0 | 3 | 6 | 249 | 9 |
| | 0 | 1 | 1 | 1 | 0 | 1 | 0 | 0 | 7 | 4 | 10 | 10 |
| | 0 | 0 | 0 | 0 | 0 | 0 | 1 | 1 | 0 | 3 | 25 | 10 |
| | 0 | 1 | 1 | 0 | 1 | 0 | 1 | 0 | 6 | A | 40 | 10 |
| | 1 | 0 | 1 | 0 | 0 | 0 | 0 | 0 | A | 0 | 55 | 10 |
| | 0 | 1 | 0 | 1 | 1 | 1 | 1 | 0 | 5 | E | 70 | 10 |
| | 1 | 1 | 0 | 1 | 0 | 1 | 1 | 0 | D | 6 | 85 | 10 |
| | 0 | 0 | 0 | 1 | 0 | 0 | 0 | 1 | 1 | 1 | 100 | 10 |
| | 0 | 1 | 1 | 1 | 1 | 1 | 0 | 0 | 7 | C | 115 | 10 |
| | 0 | 0 | 1 | 0 | 1 | 1 | 1 | 0 | 2 | E | 130 | 10 |
| | 0 | 1 | 0 | 0 | 1 | 1 | 0 | 1 | 4 | D | 145 | 10 |
| | 1 | 1 | 1 | 0 | 0 | 1 | 1 | 0 | E | 6 | 160 | 10 |
| | 1 | 1 | 1 | 1 | 1 | 1 | 1 | 1 | F | F | 175 | 10 |
| | 1 | 0 | 1 | 0 | 1 | 1 | 1 | 0 | A | E | 190 | 10 |
| | 1 | 0 | 1 | 0 | 0 | 1 | 1 | 1 | A | 7 | 205 | 10 |
| | 1 | 0 | 1 | 0 | 1 | 1 | 0 | 0 | A | C | 220 | 10 |
| | 1 | 1 | 1 | 0 | 1 | 0 | 1 | 1 | E | B | 235 | 10 |
| | 0 | 1 | 1 | 0 | 1 | 1 | 0 | 0 | 6 | C | 250 | 10 |
| | 1 | 1 | 1 | 0 | 1 | 0 | 0 | 0 | E | 8 | 11 | 11 |
| | 0 | 0 | 0 | 0 | 0 | 1 | 1 | 0 | 0 | 6 | 26 | 11 |
| | 1 | 1 | 0 | 1 | 0 | 1 | 0 | 0 | D | 4 | 41 | 11 |
| | 0 | 1 | 0 | 1 | 1 | 1 | 0 | 1 | 5 | D | 56 | 11 |
| | 1 | 0 | 1 | 1 | 1 | 1 | 0 | 0 | B | C | 71 | 11 |
| | 1 | 0 | 1 | 1 | 0 | 0 | 0 | 1 | B | 1 | 86 | 11 |
| | 0 | 0 | 1 | 0 | 0 | 0 | 1 | 0 | 2 | 2 | 101 | 11 |
| | 1 | 1 | 1 | 1 | 1 | 0 | 0 | 0 | F | 8 | 116 | 11 |
| | 0 | 1 | 0 | 1 | 1 | 1 | 0 | 0 | 5 | C | 131 | 11 |
| | 1 | 0 | 0 | 1 | 1 | 0 | 1 | 0 | 9 | A | 146 | 11 |
| | 1 | 1 | 0 | 1 | 0 | 0 | 0 | 1 | D | 1 | 161 | 11 |
| | 1 | 1 | 1 | 0 | 0 | 0 | 1 | 1 | E | 3 | 176 | 11 |
| | 0 | 1 | 0 | 0 | 0 | 0 | 0 | 1 | 4 | 1 | 191 | 11 |
| | 0 | 1 | 0 | 1 | 0 | 0 | 1 | 1 | 5 | 3 | 206 | 11 |
| | 0 | 1 | 0 | 0 | 0 | 1 | 0 | 1 | 4 | 5 | 221 | 11 |
| | 1 | 1 | 0 | 0 | 1 | 0 | 1 | 1 | C | B | 236 | 11 |
| | 1 | 1 | 0 | 1 | 1 | 0 | 0 | 0 | D | 8 | 251 | 11 |

FIG. 29C

| | pi(x) | | | | | | | | | | index | |
|---|---|---|---|---|---|---|---|---|---|---|---|---|
| m= | 7 | 6 | 5 | 4 | 3 | 2 | 1 | 0 | hex | | i | i(15) |
| | 1 | 1 | 0 | 0 | 1 | 1 | 0 | 1 | C | D | 12 | 12 |
| | 0 | 0 | 0 | 0 | 1 | 1 | 0 | 0 | 0 | C | 27 | 12 |
| | 1 | 0 | 1 | 1 | 0 | 1 | 0 | 1 | B | 5 | 42 | 12 |
| | 1 | 0 | 1 | 1 | 1 | 0 | 1 | 0 | B | A | 57 | 12 |
| | 0 | 1 | 1 | 0 | 0 | 1 | 0 | 1 | 6 | 5 | 72 | 12 |
| | 0 | 1 | 1 | 1 | 1 | 1 | 1 | 1 | 7 | F | 87 | 12 |
| | 0 | 1 | 0 | 0 | 0 | 1 | 0 | 0 | 4 | 4 | 102 | 12 |
| | 1 | 1 | 1 | 0 | 1 | 1 | 0 | 1 | E | D | 117 | 12 |
| | 1 | 0 | 1 | 1 | 1 | 0 | 0 | 0 | B | 8 | 132 | 12 |
| | 0 | 0 | 1 | 0 | 1 | 0 | 0 | 1 | 2 | 9 | 147 | 12 |
| | 1 | 0 | 1 | 1 | 1 | 1 | 1 | 1 | B | F | 162 | 12 |
| | 1 | 1 | 0 | 1 | 1 | 0 | 1 | 1 | D | B | 177 | 12 |
| | 1 | 0 | 0 | 0 | 0 | 0 | 1 | 0 | 8 | 2 | 192 | 12 |
| | 1 | 0 | 1 | 0 | 0 | 1 | 1 | 0 | A | 6 | 207 | 12 |
| | 1 | 0 | 0 | 0 | 1 | 0 | 1 | 0 | 8 | A | 222 | 12 |
| | 1 | 0 | 0 | 0 | 1 | 0 | 1 | 1 | 8 | B | 237 | 12 |
| | 1 | 0 | 1 | 0 | 1 | 1 | 0 | 1 | A | D | 252 | 12 |
| | 1 | 0 | 0 | 0 | 0 | 1 | 1 | 1 | 8 | 7 | 13 | 13 |
| | 0 | 0 | 0 | 1 | 1 | 0 | 0 | 0 | 1 | 8 | 28 | 13 |
| | 0 | 1 | 1 | 1 | 0 | 1 | 1 | 1 | 7 | 7 | 43 | 13 |
| | 0 | 1 | 1 | 0 | 1 | 0 | 0 | 1 | 6 | 9 | 58 | 13 |
| | 1 | 1 | 0 | 0 | 1 | 0 | 1 | 0 | C | A | 73 | 13 |
| | 1 | 1 | 1 | 1 | 1 | 1 | 1 | 0 | F | E | 88 | 13 |
| | 1 | 0 | 0 | 0 | 1 | 0 | 0 | 0 | 8 | 8 | 103 | 13 |
| | 1 | 1 | 0 | 0 | 0 | 1 | 1 | 1 | C | 7 | 118 | 13 |
| | 0 | 1 | 1 | 0 | 1 | 1 | 0 | 1 | 6 | D | 133 | 13 |
| | 0 | 1 | 0 | 1 | 0 | 0 | 1 | 0 | 5 | 2 | 148 | 13 |
| | 0 | 1 | 1 | 0 | 0 | 0 | 1 | 1 | 6 | 3 | 163 | 13 |
| | 1 | 0 | 1 | 0 | 1 | 0 | 1 | 1 | A | B | 178 | 13 |
| | 0 | 0 | 0 | 1 | 1 | 0 | 0 | 1 | 1 | 9 | 193 | 13 |
| | 0 | 1 | 0 | 1 | 0 | 0 | 0 | 1 | 5 | 1 | 208 | 13 |
| | 0 | 0 | 0 | 0 | 1 | 0 | 0 | 1 | 0 | 9 | 223 | 13 |
| | 0 | 0 | 0 | 0 | 1 | 0 | 1 | 1 | 0 | B | 238 | 13 |
| | 0 | 1 | 0 | 0 | 0 | 1 | 1 | 1 | 4 | 7 | 253 | 13 |
| | 0 | 0 | 0 | 1 | 0 | 0 | 1 | 1 | 1 | 3 | 14 | 14 |
| | 0 | 0 | 1 | 1 | 0 | 0 | 0 | 0 | 3 | 0 | 29 | 14 |
| | 1 | 1 | 1 | 0 | 1 | 1 | 1 | 0 | E | E | 44 | 14 |
| | 1 | 1 | 0 | 1 | 0 | 0 | 1 | 0 | D | 2 | 59 | 14 |
| | 1 | 0 | 0 | 0 | 1 | 0 | 0 | 1 | 8 | 9 | 74 | 14 |
| | 1 | 1 | 1 | 0 | 0 | 0 | 0 | 1 | E | 1 | 89 | 14 |
| | 0 | 0 | 0 | 0 | 1 | 1 | 0 | 1 | 0 | D | 104 | 14 |
| | 1 | 0 | 0 | 1 | 0 | 0 | 1 | 1 | 9 | 3 | 119 | 14 |
| | 1 | 1 | 0 | 1 | 1 | 0 | 1 | 0 | D | A | 134 | 14 |
| | 1 | 0 | 1 | 0 | 0 | 1 | 0 | 0 | A | 4 | 149 | 14 |
| | 1 | 1 | 0 | 0 | 0 | 1 | 1 | 0 | C | 6 | 164 | 14 |
| | 0 | 1 | 0 | 0 | 1 | 0 | 1 | 1 | 4 | B | 179 | 14 |
| | 0 | 0 | 1 | 1 | 0 | 0 | 1 | 0 | 3 | 2 | 194 | 14 |
| | 1 | 0 | 1 | 0 | 0 | 0 | 1 | 0 | A | 2 | 209 | 14 |
| | 0 | 0 | 0 | 1 | 0 | 0 | 1 | 0 | 1 | 2 | 224 | 14 |
| | 0 | 0 | 0 | 1 | 0 | 1 | 1 | 0 | 1 | 6 | 239 | 14 |
| | 1 | 0 | 0 | 0 | 1 | 1 | 1 | 0 | 8 | E | 254 | 14 |

FIG. 30

| | | x(−1) | | x(1/3) | | x(1/2) | | x2 | | x3 | | x5 | | x7 | |
|---|---|---|---|---|---|---|---|---|---|---|---|---|---|---|---|
| i(17) | i(15) | −i(17) | −i(15) | i/3(17) | i/3(15) | i/2(17) | i/2(15) | 2i(17) | 2i(15) | 3i(17) | 3i(15) | 5i(17) | 5i(15) | 7i(17) | 7i(15) |
| 0 | 0 | 0 | 0 | 0 | 0 | 0 | 0 | 0 | 0 | 0 | 0 | 0 | 0 | 0 | 0 |
| 1 | 1 | 16 | 14 | 6 | none | 9 | 8 | 2 | 2 | 3 | 3 | 5 | 5 | 7 | 7 |
| 2 | 2 | 15 | 13 | 12 | none | 1 | 1 | 4 | 4 | 6 | 6 | 10 | 10 | 14 | 14 |
| 3 | 3 | 14 | 12 | 1 | 1 | 10 | 9 | 6 | 6 | 9 | 9 | 15 | 0 | 4 | 6 |
| 4 | 4 | 13 | 11 | 7 | none | 2 | 2 | 8 | 8 | 12 | 12 | 3 | 5 | 11 | 13 |
| 5 | 5 | 12 | 10 | 13 | none | 11 | 10 | 10 | 10 | 15 | 0 | 8 | 10 | 1 | 5 |
| 6 | 6 | 11 | 9 | 2 | 2 | 3 | 3 | 12 | 12 | 1 | 3 | 13 | 0 | 8 | 12 |
| 7 | 7 | 10 | 8 | 8 | none | 12 | 11 | 14 | 14 | 4 | 6 | 1 | 5 | 15 | 4 |
| 8 | 8 | 9 | 7 | 14 | none | 4 | 4 | 16 | 1 | 7 | 9 | 6 | 10 | 5 | 11 |
| 9 | 9 | 8 | 6 | 3 | 3 | 13 | 12 | 1 | 3 | 10 | 12 | 11 | 0 | 12 | 3 |
| 10 | 10 | 7 | 5 | 9 | none | 5 | 5 | 3 | 5 | 13 | 0 | 16 | 5 | 2 | 10 |
| 11 | 11 | 6 | 4 | 15 | none | 14 | 13 | 5 | 7 | 16 | 3 | 4 | 10 | 9 | 2 |
| 12 | 12 | 5 | 3 | 4 | 4 | 6 | 6 | 7 | 9 | 2 | 6 | 9 | 0 | 16 | 9 |
| 13 | 13 | 4 | 2 | 10 | none | 15 | 14 | 9 | 11 | 5 | 9 | 14 | 5 | 6 | 1 |
| 14 | 14 | 3 | 1 | 16 | none | 7 | 7 | 11 | 13 | 8 | 12 | 2 | 10 | 13 | 8 |
| 15 | | 2 | | 5 | | 16 | | 13 | | 11 | | 7 | | 3 | |
| 16 | | 1 | | 11 | | 8 | | 15 | | 14 | | 12 | | 10 | |

FIG. 32A

| pi(x) | | | | | | | | | index | | | | input i(17) | | | | | | | |
|---|---|---|---|---|---|---|---|---|---|---|---|---|---|---|---|---|---|---|---|---|
| m= | 7 | 6 | 5 | 4 | 3 | 2 | 1 | 0 | i | i(17) | i(15) | m= | 7 | 6 | 5 | 4 | 3 | 2 | 1 | 0 |
| | 0 | 0 | 0 | 0 | 0 | 0 | 0 | 1 | 0 | 0 | 0 | | | | | | | | | 0 |
| | 0 | 0 | 1 | 1 | 1 | 0 | 1 | 1 | 120 | 1 | 0 | | | | 1 | 1 | 1 | | 1 | 1 |
| | 0 | 0 | 1 | 0 | 1 | 1 | 0 | 0 | 240 | 2 | 0 | | | | 2 | | 2 | 2 | | |
| | 0 | 0 | 0 | 1 | 1 | 0 | 1 | 0 | 105 | 3 | 0 | | | | | 3 | 3 | | 3 | |
| | 0 | 0 | 1 | 0 | 0 | 1 | 0 | 0 | 225 | 4 | 0 | | | | 4 | | | 4 | | |
| | 1 | 1 | 0 | 1 | 1 | 1 | 1 | 1 | 90 | 5 | 0 | | 5 | 5 | | 5 | 5 | 5 | 5 | 5 |
| | 0 | 1 | 0 | 1 | 1 | 0 | 0 | 1 | 210 | 6 | 0 | | | 6 | | 6 | 6 | | | 6 |
| | 0 | 0 | 0 | 0 | 1 | 1 | 1 | 1 | 75 | 7 | 0 | | | | | | 7 | 7 | 7 | 7 |
| | 0 | 1 | 1 | 0 | 0 | 1 | 0 | 0 | 195 | 8 | 0 | | | 8 | 8 | | | 8 | | |
| | 1 | 0 | 1 | 1 | 1 | 0 | 0 | 1 | 60 | 9 | 0 | | 9 | | 9 | 9 | 9 | | | 9 |
| | 1 | 0 | 0 | 1 | 0 | 1 | 1 | 0 | 180 | 10 | 0 | | 10 | | | 10 | | 10 | 10 | |
| | 1 | 1 | 0 | 0 | 0 | 0 | 0 | 1 | 45 | 11 | 0 | | 11 | 11 | | | | | | 11 |
| | 1 | 0 | 0 | 1 | 0 | 0 | 0 | 1 | 165 | 12 | 0 | | 12 | | | 12 | | | | 12 |
| | 0 | 1 | 1 | 0 | 0 | 0 | 0 | 0 | 30 | 13 | 0 | | | 13 | 13 | | | | | |
| | 0 | 1 | 0 | 1 | 0 | 1 | 0 | 1 | 150 | 14 | 0 | | | 14 | | 14 | | 14 | | 14 |
| | 0 | 0 | 1 | 0 | 0 | 1 | 1 | 0 | 15 | 15 | 0 | | | | 15 | | | 15 | 15 | |
| | 1 | 0 | 1 | 0 | 1 | 0 | 0 | 1 | 135 | 16 | 0 | | 16 | | 16 | | 16 | | | 16 |
| | 0 | 1 | 0 | 0 | 1 | 1 | 1 | 1 | 136 | 0 | 1 | | | 0 | | | 0 | 0 | 0 | 0 |
| | 0 | 0 | 0 | 0 | 0 | 0 | 1 | 0 | 1 | 1 | 1 | | | | | | | | 1 | |
| | 0 | 1 | 1 | 1 | 0 | 1 | 1 | 0 | 121 | 2 | 1 | | | 2 | 2 | 2 | | 2 | 2 | |
| | 0 | 1 | 0 | 1 | 1 | 0 | 0 | 0 | 241 | 3 | 1 | | | 3 | | 3 | 3 | | | |
| | 0 | 0 | 1 | 1 | 0 | 1 | 0 | 0 | 106 | 4 | 1 | | | | 4 | 4 | | 4 | | |
| | 0 | 1 | 0 | 0 | 1 | 0 | 0 | 0 | 226 | 5 | 1 | | | 5 | | | 5 | | | |
| | 1 | 0 | 1 | 0 | 0 | 0 | 1 | 1 | 91 | 6 | 1 | | 6 | | 6 | | | | 6 | 6 |
| | 1 | 0 | 1 | 1 | 0 | 0 | 1 | 0 | 211 | 7 | 1 | | 7 | | 7 | 7 | | | 7 | |
| | 0 | 0 | 0 | 1 | 1 | 1 | 1 | 0 | 76 | 8 | 1 | | | | | 8 | 8 | 8 | 8 | |
| | 1 | 1 | 0 | 0 | 1 | 0 | 0 | 0 | 196 | 9 | 1 | | 9 | 9 | | | 9 | | | |
| | 0 | 1 | 1 | 0 | 1 | 1 | 1 | 1 | 61 | 10 | 1 | | | 10 | 10 | | 10 | 10 | 10 | 10 |
| | 0 | 0 | 1 | 1 | 0 | 0 | 0 | 1 | 181 | 11 | 1 | | | | 11 | 11 | | | | 11 |
| | 1 | 0 | 0 | 1 | 1 | 1 | 1 | 1 | 46 | 12 | 1 | | 12 | | | 12 | 12 | 12 | 12 | 12 |
| | 0 | 0 | 1 | 1 | 1 | 1 | 1 | 1 | 166 | 13 | 1 | | | | 13 | 13 | 13 | 13 | 13 | 13 |
| | 1 | 1 | 0 | 0 | 0 | 0 | 0 | 0 | 31 | 14 | 1 | | 14 | 14 | | | | | | |
| | 1 | 0 | 1 | 0 | 1 | 0 | 1 | 0 | 151 | 15 | 1 | | 15 | | 15 | | 15 | | 15 | |
| | 0 | 1 | 0 | 0 | 1 | 1 | 0 | 0 | 16 | 16 | 1 | | | 16 | | | 16 | 16 | | |
| | 1 | 0 | 0 | 1 | 1 | 0 | 0 | 0 | 17 | 0 | 2 | | 0 | | | 0 | 0 | | | |
| | 1 | 0 | 0 | 1 | 1 | 1 | 1 | 0 | 137 | 1 | 2 | | 1 | | | 1 | 1 | 1 | 1 | |
| | 0 | 0 | 0 | 0 | 0 | 1 | 0 | 0 | 2 | 2 | 2 | | | | | | | 2 | | |
| | 1 | 1 | 1 | 0 | 1 | 1 | 0 | 0 | 122 | 3 | 2 | | 3 | 3 | 3 | | 3 | 3 | | |
| | 1 | 0 | 1 | 1 | 0 | 0 | 0 | 0 | 242 | 4 | 2 | | 4 | | 4 | 4 | | | | |
| | 0 | 1 | 1 | 0 | 1 | 0 | 0 | 0 | 107 | 5 | 2 | | | 5 | 5 | | 5 | | | |
| | 1 | 0 | 0 | 1 | 0 | 0 | 0 | 0 | 227 | 6 | 2 | | 6 | | | 6 | | | | |
| | 0 | 1 | 0 | 1 | 1 | 0 | 1 | 1 | 92 | 7 | 2 | | | 7 | | 7 | 7 | | 7 | 7 |
| | 0 | 1 | 1 | 1 | 1 | 0 | 0 | 1 | 212 | 8 | 2 | | | 8 | 8 | 8 | 8 | | | 8 |
| | 0 | 0 | 1 | 1 | 1 | 1 | 0 | 0 | 77 | 9 | 2 | | | | 9 | 9 | 9 | 9 | | |
| | 1 | 0 | 0 | 0 | 1 | 1 | 0 | 1 | 197 | 10 | 2 | | 10 | | | | 10 | 10 | | 10 |
| | 1 | 1 | 0 | 1 | 1 | 1 | 1 | 0 | 62 | 11 | 2 | | 11 | 11 | | 11 | 11 | 11 | 11 | |
| | 0 | 1 | 1 | 0 | 0 | 0 | 1 | 0 | 182 | 12 | 2 | | | 12 | 12 | | | | 12 | |
| | 0 | 0 | 1 | 0 | 0 | 0 | 1 | 1 | 47 | 13 | 2 | | | | 13 | | | | 13 | 13 |
| | 0 | 1 | 1 | 1 | 1 | 1 | 1 | 0 | 167 | 14 | 2 | | | 14 | 14 | 14 | 14 | 14 | 14 | |
| | 1 | 0 | 0 | 1 | 1 | 1 | 0 | 1 | 32 | 15 | 2 | | 15 | | | 15 | 15 | 15 | | 15 |
| | 0 | 1 | 0 | 0 | 1 | 0 | 0 | 1 | 152 | 16 | 2 | | | 16 | | | 16 | | | 16 |

FIG. 32B

| pi(x) | | | | | | | | | index | | | input i(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | i | i(17) | i(15) | m= | 7 | 6 | 5 | 4 | 3 | 2 | 1 | 0 |
| | 1 | 0 | 0 | 1 | 0 | 0 | 1 | 0 | 153 | 0 | 3 | | 0 | | | 0 | | | 0 | |
| | 0 | 0 | 1 | 0 | 1 | 1 | 0 | 1 | 18 | 1 | 3 | | | | 1 | | 1 | 1 | | 1 |
| | 0 | 0 | 1 | 0 | 0 | 0 | 0 | 1 | 138 | 2 | 3 | | | | 2 | | | | | 2 |
| | 0 | 0 | 0 | 0 | 1 | 0 | 0 | 0 | 3 | 3 | 3 | | | | | | 3 | | | |
| | 1 | 1 | 0 | 0 | 0 | 1 | 0 | 1 | 123 | 4 | 3 | | 4 | 4 | | | | 4 | | 4 |
| | 0 | 1 | 1 | 1 | 1 | 1 | 0 | 1 | 243 | 5 | 3 | | | 5 | 5 | 5 | 5 | 5 | | 5 |
| | 1 | 1 | 0 | 1 | 0 | 0 | 0 | 0 | 108 | 6 | 3 | | 6 | 6 | | 6 | | | | |
| | 0 | 0 | 1 | 1 | 1 | 1 | 0 | 1 | 228 | 7 | 3 | | | | 7 | 7 | 7 | 7 | | 7 |
| | 1 | 0 | 1 | 1 | 0 | 1 | 1 | 0 | 93 | 8 | 3 | | 8 | | 8 | 8 | | 8 | 8 | |
| | 1 | 1 | 1 | 1 | 0 | 0 | 1 | 0 | 213 | 9 | 3 | | 9 | 9 | 9 | 9 | | | 9 | |
| | 0 | 1 | 1 | 1 | 1 | 0 | 0 | 0 | 78 | 10 | 3 | | | 10 | 10 | 10 | 10 | | | |
| | 0 | 0 | 0 | 0 | 0 | 1 | 1 | 1 | 198 | 11 | 3 | | | | | | | 11 | 11 | 11 |
| | 1 | 0 | 1 | 0 | 0 | 0 | 0 | 1 | 63 | 12 | 3 | | 12 | | 12 | | | | | 12 |
| | 1 | 1 | 0 | 0 | 0 | 1 | 0 | 0 | 183 | 13 | 3 | | 13 | 13 | | | | 13 | | |
| | 0 | 1 | 0 | 0 | 0 | 1 | 1 | 0 | 48 | 14 | 3 | | | 14 | | | | 14 | 14 | |
| | 1 | 1 | 1 | 1 | 1 | 1 | 0 | 0 | 168 | 15 | 3 | | 15 | 15 | 15 | 15 | 15 | 15 | | |
| | 0 | 0 | 1 | 0 | 0 | 1 | 1 | 1 | 33 | 16 | 3 | | | | 16 | | | 16 | 16 | 16 |
| | 0 | 1 | 0 | 0 | 1 | 1 | 1 | 0 | 34 | 0 | 4 | | | 0 | | | 0 | 0 | 0 | |
| | 0 | 0 | 1 | 1 | 1 | 0 | 0 | 1 | 154 | 1 | 4 | | | | 1 | 1 | 1 | | | 1 |
| | 0 | 1 | 0 | 1 | 1 | 0 | 1 | 0 | 19 | 2 | 4 | | | 2 | | 2 | 2 | | 2 | |
| | 0 | 1 | 0 | 0 | 0 | 0 | 1 | 0 | 139 | 3 | 4 | | | 3 | | | | | 3 | |
| | 0 | 0 | 0 | 1 | 0 | 0 | 0 | 0 | 4 | 4 | 4 | | | | | 4 | | | | |
| | 1 | 0 | 0 | 1 | 0 | 1 | 1 | 1 | 124 | 5 | 4 | | 5 | | | 5 | | 5 | 5 | 5 |
| | 1 | 1 | 1 | 1 | 1 | 0 | 1 | 0 | 244 | 6 | 4 | | 6 | 6 | 6 | 6 | 6 | | 6 | |
| | 1 | 0 | 1 | 1 | 1 | 1 | 0 | 1 | 109 | 7 | 4 | | 7 | | 7 | 7 | 7 | 7 | | 7 |
| | 0 | 1 | 1 | 1 | 1 | 0 | 1 | 0 | 229 | 8 | 4 | | | 8 | 8 | 8 | 8 | | 8 | |
| | 0 | 1 | 1 | 1 | 0 | 0 | 0 | 1 | 94 | 9 | 4 | | | 9 | 9 | 9 | | | | 9 |
| | 1 | 1 | 1 | 1 | 1 | 0 | 0 | 1 | 214 | 10 | 4 | | 10 | 10 | 10 | 10 | 10 | | | 10 |
| | 1 | 1 | 1 | 1 | 0 | 0 | 0 | 0 | 79 | 11 | 4 | | 11 | 11 | 11 | 11 | | | | |
| | 0 | 0 | 0 | 0 | 1 | 1 | 1 | 0 | 199 | 12 | 4 | | | | | | 12 | 12 | 12 | |
| | 0 | 1 | 0 | 1 | 1 | 1 | 1 | 1 | 64 | 13 | 4 | | | 13 | | 13 | 13 | 13 | 13 | 13 |
| | 1 | 0 | 0 | 1 | 0 | 1 | 0 | 1 | 184 | 14 | 4 | | 14 | | | 14 | | 14 | | 14 |
| | 1 | 0 | 0 | 0 | 1 | 1 | 0 | 0 | 49 | 15 | 4 | | 15 | | | | 15 | 15 | | |
| | 1 | 1 | 1 | 0 | 0 | 1 | 0 | 1 | 169 | 16 | 4 | | 16 | 16 | 16 | | | 16 | | 16 |
| | 1 | 1 | 0 | 1 | 0 | 1 | 1 | 1 | 170 | 0 | 5 | | 0 | 0 | | 0 | | 0 | 0 | 0 |
| | 1 | 0 | 0 | 1 | 1 | 1 | 0 | 0 | 35 | 1 | 5 | | 1 | | | 1 | 1 | 1 | | |
| | 0 | 1 | 1 | 1 | 0 | 0 | 1 | 0 | 155 | 2 | 5 | | | 2 | 2 | 2 | | | 2 | |
| | 1 | 0 | 1 | 1 | 0 | 1 | 0 | 0 | 20 | 3 | 5 | | 3 | | 3 | 3 | | 3 | | |
| | 1 | 0 | 0 | 0 | 0 | 1 | 0 | 0 | 140 | 4 | 5 | | 4 | | | | | 4 | | |
| | 0 | 0 | 1 | 0 | 0 | 0 | 0 | 0 | 5 | 5 | 5 | | | | 5 | | | | | |
| | 0 | 0 | 1 | 1 | 0 | 0 | 1 | 1 | 125 | 6 | 5 | | | | 6 | 6 | | | 6 | 6 |
| | 1 | 1 | 1 | 0 | 1 | 0 | 0 | 1 | 245 | 7 | 5 | | 7 | 7 | 7 | | 7 | | | 7 |
| | 0 | 1 | 1 | 0 | 0 | 1 | 1 | 1 | 110 | 8 | 5 | | | 8 | 8 | | | 8 | 8 | 8 |
| | 1 | 1 | 1 | 1 | 0 | 1 | 0 | 0 | 230 | 9 | 5 | | 9 | 9 | 9 | 9 | | 9 | | |
| | 1 | 1 | 1 | 0 | 0 | 0 | 1 | 0 | 95 | 10 | 5 | | 10 | 10 | 10 | | | | 10 | |
| | 1 | 1 | 1 | 0 | 1 | 1 | 1 | 1 | 215 | 11 | 5 | | 11 | 11 | 11 | | 11 | 11 | 11 | 11 |
| | 1 | 1 | 1 | 1 | 1 | 1 | 0 | 1 | 80 | 12 | 5 | | 12 | 12 | 12 | 12 | 12 | 12 | | 12 |
| | 0 | 0 | 0 | 1 | 1 | 1 | 0 | 0 | 200 | 13 | 5 | | | | | 13 | 13 | 13 | | |
| | 1 | 0 | 1 | 1 | 1 | 1 | 1 | 0 | 65 | 14 | 5 | | 14 | | 14 | 14 | 14 | 14 | 14 | |
| | 0 | 0 | 1 | 1 | 0 | 1 | 1 | 1 | 185 | 15 | 5 | | | | 15 | 15 | | 15 | 15 | 15 |
| | 0 | 0 | 0 | 0 | 0 | 1 | 0 | 1 | 50 | 16 | 5 | | | | | | | 16 | | 16 |

FIG. 32C

| pi(x) | | | | | | | | | index | | | input i(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | i | i(17) | i(15) | m= | 7 | 6 | 5 | 4 | 3 | 2 | 1 | 0 |
| | 0 | 0 | 0 | 0 | 1 | 0 | 1 | 0 | 51 | 0 | 6 | | | | | | 0 | | 0 | |
| | 1 | 0 | 1 | 1 | 0 | 0 | 1 | 1 | 171 | 1 | 6 | | 1 | | 1 | 1 | | | 1 | 1 |
| | 0 | 0 | 1 | 0 | 0 | 1 | 0 | 1 | 36 | 2 | 6 | | | | 2 | | | 2 | | 2 |
| | 1 | 1 | 1 | 0 | 0 | 1 | 0 | 0 | 156 | 3 | 6 | | 3 | 3 | 3 | | | 3 | | |
| | 0 | 1 | 1 | 1 | 0 | 1 | 0 | 1 | 21 | 4 | 6 | | | 4 | 4 | 4 | | 4 | | 4 |
| | 0 | 0 | 0 | 1 | 0 | 1 | 0 | 1 | 141 | 5 | 6 | | | | | 5 | | 5 | | 5 |
| | 0 | 1 | 0 | 0 | 0 | 0 | 0 | 0 | 6 | 6 | 6 | | | 6 | | | | | | |
| | 0 | 1 | 1 | 0 | 0 | 1 | 1 | 0 | 126 | 7 | 6 | | | 7 | 7 | | | 7 | 7 | |
| | 1 | 1 | 0 | 0 | 1 | 1 | 1 | 1 | 246 | 8 | 6 | | 8 | 8 | | | 8 | 8 | 8 | 8 |
| | 1 | 1 | 0 | 0 | 1 | 1 | 1 | 0 | 111 | 9 | 6 | | 9 | 9 | | | 9 | 9 | 9 | |
| | 1 | 1 | 1 | 1 | 0 | 1 | 0 | 1 | 231 | 10 | 6 | | 10 | 10 | 10 | 10 | | 10 | | 10 |
| | 1 | 1 | 0 | 1 | 1 | 0 | 0 | 1 | 96 | 11 | 6 | | 11 | 11 | | 11 | 11 | | | 11 |
| | 1 | 1 | 0 | 0 | 0 | 0 | 1 | 1 | 216 | 12 | 6 | | 12 | 12 | | | | | 12 | 12 |
| | 1 | 1 | 1 | 0 | 0 | 1 | 1 | 1 | 81 | 13 | 6 | | 13 | 13 | 13 | | | 13 | 13 | 13 |
| | 0 | 0 | 1 | 1 | 1 | 0 | 0 | 0 | 201 | 14 | 6 | | | | 14 | 14 | 14 | | | |
| | 0 | 1 | 1 | 0 | 0 | 0 | 0 | 1 | 66 | 15 | 6 | | | 15 | 15 | | | | | 15 |
| | 0 | 1 | 1 | 0 | 1 | 1 | 1 | 0 | 186 | 16 | 6 | | | 16 | 16 | | 16 | 16 | 16 | |
| | 1 | 1 | 0 | 1 | 1 | 1 | 0 | 0 | 187 | 0 | 7 | | 0 | 0 | | 0 | 0 | 0 | | |
| | 0 | 0 | 0 | 1 | 0 | 1 | 0 | 0 | 52 | 1 | 7 | | | | | 1 | | 1 | | |
| | 0 | 1 | 1 | 1 | 1 | 0 | 1 | 1 | 172 | 2 | 7 | | | 2 | 2 | 2 | 2 | | 2 | 2 |
| | 0 | 1 | 0 | 0 | 1 | 0 | 1 | 0 | 37 | 3 | 7 | | | 3 | | | 3 | | 3 | |
| | 1 | 1 | 0 | 1 | 0 | 1 | 0 | 1 | 157 | 4 | 7 | | 4 | 4 | | 4 | | 4 | | 4 |
| | 1 | 1 | 1 | 0 | 1 | 0 | 1 | 0 | 22 | 5 | 7 | | 5 | 5 | 5 | | 5 | | 5 | |
| | 0 | 0 | 1 | 0 | 1 | 0 | 1 | 0 | 142 | 6 | 7 | | | | 6 | | 6 | | 6 | |
| | 1 | 0 | 0 | 0 | 0 | 0 | 0 | 0 | 7 | 7 | 7 | | 7 | | | | | | | |
| | 1 | 1 | 0 | 0 | 1 | 1 | 0 | 0 | 127 | 8 | 7 | | 8 | 8 | | | 8 | 8 | | |
| | 1 | 0 | 0 | 0 | 0 | 0 | 1 | 1 | 247 | 9 | 7 | | 9 | | | | | | 9 | 9 |
| | 1 | 0 | 0 | 0 | 0 | 0 | 0 | 1 | 112 | 10 | 7 | | 10 | | | | | | | 10 |
| | 1 | 1 | 1 | 1 | 0 | 1 | 1 | 1 | 232 | 11 | 7 | | 11 | 11 | 11 | 11 | | 11 | 11 | 11 |
| | 1 | 0 | 1 | 0 | 1 | 1 | 1 | 1 | 97 | 12 | 7 | | 12 | | 12 | | 12 | 12 | 12 | 12 |
| | 1 | 0 | 0 | 1 | 1 | 0 | 1 | 1 | 217 | 13 | 7 | | 13 | | | 13 | 13 | | 13 | 13 |
| | 1 | 1 | 0 | 1 | 0 | 0 | 1 | 1 | 82 | 14 | 7 | | 14 | 14 | | 14 | | | 14 | 14 |
| | 0 | 1 | 1 | 1 | 0 | 0 | 0 | 0 | 202 | 15 | 7 | | | 15 | 15 | 15 | | | | |
| | 1 | 1 | 0 | 0 | 0 | 0 | 1 | 0 | 67 | 16 | 7 | | 16 | 16 | | | | | 16 | |
| | 1 | 0 | 0 | 1 | 1 | 0 | 0 | 1 | 68 | 0 | 8 | | 0 | | | 0 | 0 | | | 0 |
| | 1 | 0 | 1 | 0 | 0 | 1 | 0 | 1 | 188 | 1 | 8 | | 1 | | 1 | | | 1 | | 1 |
| | 0 | 0 | 1 | 0 | 1 | 0 | 0 | 0 | 53 | 2 | 8 | | | | 2 | | 2 | | | |
| | 1 | 1 | 1 | 1 | 0 | 1 | 1 | 0 | 173 | 3 | 8 | | 3 | 3 | 3 | 3 | | 3 | 3 | |
| | 1 | 0 | 0 | 1 | 0 | 1 | 0 | 0 | 38 | 4 | 8 | | 4 | | | 4 | | 4 | | |
| | 1 | 0 | 1 | 1 | 0 | 1 | 1 | 1 | 158 | 5 | 8 | | 5 | | 5 | 5 | | 5 | 5 | 5 |
| | 1 | 1 | 0 | 0 | 1 | 0 | 0 | 1 | 23 | 6 | 8 | | 6 | 6 | | | 6 | | | 6 |
| | 0 | 1 | 0 | 1 | 0 | 1 | 0 | 0 | 143 | 7 | 8 | | | 7 | | 7 | | 7 | | |
| | 0 | 0 | 0 | 1 | 1 | 1 | 0 | 1 | 8 | 8 | 8 | | | | | 8 | 8 | 8 | | 8 |
| | 1 | 0 | 0 | 0 | 0 | 1 | 0 | 1 | 128 | 9 | 8 | | 9 | | | | | 9 | | 9 |
| | 0 | 0 | 0 | 1 | 1 | 0 | 1 | 1 | 248 | 10 | 8 | | | | | 10 | 10 | | 10 | 10 |
| | 0 | 0 | 0 | 1 | 1 | 1 | 1 | 1 | 113 | 11 | 8 | | | | | 11 | 11 | 11 | 11 | 11 |
| | 1 | 1 | 1 | 1 | 0 | 0 | 1 | 1 | 233 | 12 | 8 | | 12 | 12 | 12 | 12 | | | 12 | 12 |
| | 0 | 1 | 0 | 0 | 0 | 0 | 1 | 1 | 98 | 13 | 8 | | | 13 | | | | | 13 | 13 |
| | 0 | 0 | 1 | 0 | 1 | 0 | 1 | 1 | 218 | 14 | 8 | | | | 14 | | 14 | | 14 | 14 |
| | 1 | 0 | 1 | 1 | 1 | 0 | 1 | 1 | 83 | 15 | 8 | | 15 | | 15 | 15 | 15 | | 15 | 15 |
| | 1 | 1 | 1 | 0 | 0 | 0 | 0 | 0 | 203 | 16 | 8 | | 16 | 16 | 16 | | | | | |

FIG. 32D

| pi(x) | | | | | | | | | index | | | input i(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | i | i(17) | i(15) | m= | 7 | 6 | 5 | 4 | 3 | 2 | 1 | 0 |
| | 1 | 1 | 0 | 1 | 1 | 1 | 0 | 1 | 204 | 0 | 9 | | 0 | 0 | | 0 | 0 | 0 | | 0 |
| | 0 | 0 | 1 | 0 | 1 | 1 | 1 | 1 | 69 | 1 | 9 | | | | 1 | | 1 | 1 | 1 | 1 |
| | 0 | 1 | 0 | 1 | 0 | 1 | 1 | 1 | 189 | 2 | 9 | | | 2 | | 2 | | 2 | 2 | 2 |
| | 0 | 1 | 0 | 1 | 0 | 0 | 0 | 0 | 54 | 3 | 9 | | | 3 | | 3 | | | | |
| | 1 | 1 | 1 | 1 | 0 | 0 | 0 | 1 | 174 | 4 | 9 | | 4 | 4 | 4 | 4 | | | | 4 |
| | 0 | 0 | 1 | 1 | 0 | 1 | 0 | 1 | 39 | 5 | 9 | | | | 5 | 5 | | 5 | | 5 |
| | 0 | 1 | 1 | 1 | 0 | 0 | 1 | 1 | 159 | 6 | 9 | | | 6 | 6 | 6 | | | 6 | 6 |
| | 1 | 0 | 0 | 0 | 1 | 1 | 1 | 1 | 24 | 7 | 9 | | 7 | | | | 7 | 7 | 7 | 7 |
| | 1 | 0 | 1 | 0 | 1 | 0 | 0 | 0 | 144 | 8 | 9 | | 8 | | 8 | | 8 | | | |
| | 0 | 0 | 1 | 1 | 1 | 0 | 1 | 0 | 9 | 9 | 9 | | | | 9 | 9 | 9 | | 9 | |
| | 0 | 0 | 0 | 1 | 0 | 1 | 1 | 1 | 129 | 10 | 9 | | | | | 10 | | 10 | 10 | 10 |
| | 0 | 0 | 1 | 1 | 0 | 1 | 1 | 0 | 249 | 11 | 9 | | | | 11 | 11 | | 11 | 11 | |
| | 0 | 0 | 1 | 1 | 1 | 1 | 1 | 0 | 114 | 12 | 9 | | | | 12 | 12 | 12 | 12 | 12 | |
| | 1 | 1 | 1 | 1 | 1 | 0 | 1 | 1 | 234 | 13 | 9 | | 13 | 13 | 13 | 13 | 13 | | 13 | 13 |
| | 1 | 0 | 0 | 0 | 0 | 1 | 1 | 0 | 99 | 14 | 9 | | 14 | | | | | 14 | 14 | |
| | 0 | 1 | 0 | 1 | 0 | 1 | 1 | 0 | 219 | 15 | 9 | | | 15 | | 15 | | 15 | 15 | |
| | 0 | 1 | 1 | 0 | 1 | 0 | 1 | 1 | 84 | 16 | 9 | | | 16 | 16 | | 16 | | 16 | 16 |
| | 1 | 1 | 0 | 1 | 0 | 1 | 1 | 0 | 85 | 0 | 10 | | 0 | 0 | | 0 | | 0 | 0 | |
| | 1 | 0 | 1 | 0 | 0 | 1 | 1 | 1 | 205 | 1 | 10 | | 1 | | 1 | | | 1 | 1 | 1 |
| | 0 | 1 | 0 | 1 | 1 | 1 | 1 | 0 | 70 | 2 | 10 | | | 2 | | 2 | 2 | 2 | 2 | |
| | 1 | 0 | 1 | 0 | 1 | 1 | 1 | 0 | 190 | 3 | 10 | | 3 | | 3 | | 3 | 3 | 3 | |
| | 1 | 0 | 1 | 0 | 0 | 0 | 0 | 0 | 55 | 4 | 10 | | 4 | | 4 | | | | | |
| | 1 | 1 | 1 | 1 | 1 | 1 | 1 | 1 | 175 | 5 | 10 | | 5 | 5 | 5 | 5 | 5 | 5 | 5 | 5 |
| | 0 | 1 | 1 | 0 | 1 | 0 | 1 | 0 | 40 | 6 | 10 | | | 6 | 6 | | 6 | | 6 | |
| | 1 | 1 | 1 | 0 | 0 | 1 | 1 | 0 | 160 | 7 | 10 | | 7 | 7 | 7 | | | 7 | 7 | |
| | 0 | 0 | 0 | 0 | 0 | 0 | 1 | 1 | 25 | 8 | 10 | | | | | | | | 8 | 8 |
| | 0 | 1 | 0 | 0 | 1 | 1 | 0 | 1 | 145 | 9 | 10 | | | 9 | | | 9 | 9 | | 9 |
| | 0 | 1 | 1 | 1 | 0 | 1 | 0 | 0 | 10 | 10 | 10 | | | 10 | 10 | 10 | | 10 | | |
| | 0 | 0 | 1 | 0 | 1 | 1 | 1 | 0 | 130 | 11 | 10 | | | | 11 | | 11 | 11 | 11 | |
| | 0 | 1 | 1 | 0 | 1 | 1 | 0 | 0 | 250 | 12 | 10 | | | 12 | 12 | | 12 | 12 | | |
| | 0 | 1 | 1 | 1 | 1 | 1 | 0 | 0 | 115 | 13 | 10 | | | 13 | 13 | 13 | 13 | 13 | | |
| | 1 | 1 | 1 | 0 | 1 | 0 | 1 | 1 | 235 | 14 | 10 | | 14 | 14 | 14 | | 14 | | 14 | 14 |
| | 0 | 0 | 0 | 1 | 0 | 0 | 0 | 1 | 100 | 15 | 10 | | | | | 15 | | | | 15 |
| | 1 | 0 | 1 | 0 | 1 | 1 | 0 | 0 | 220 | 16 | 10 | | 16 | | 16 | | 16 | 16 | | |
| | 0 | 1 | 0 | 0 | 0 | 1 | 0 | 1 | 221 | 0 | 11 | | | 0 | | | | 0 | | 0 |
| | 1 | 0 | 1 | 1 | 0 | 0 | 0 | 1 | 86 | 1 | 11 | | 1 | | 1 | 1 | | | | 1 |
| | 0 | 1 | 0 | 1 | 0 | 0 | 1 | 1 | 206 | 2 | 11 | | | 2 | | 2 | | | 2 | 2 |
| | 1 | 0 | 1 | 1 | 1 | 1 | 0 | 0 | 71 | 3 | 11 | | 3 | | 3 | 3 | 3 | 3 | | |
| | 0 | 1 | 0 | 0 | 0 | 0 | 0 | 1 | 191 | 4 | 11 | | | 4 | | | | | | 4 |
| | 0 | 1 | 0 | 1 | 1 | 1 | 0 | 1 | 56 | 5 | 11 | | | 5 | | 5 | 5 | 5 | | 5 |
| | 1 | 1 | 1 | 0 | 0 | 0 | 1 | 1 | 176 | 6 | 11 | | 6 | 6 | 6 | | | | 6 | 6 |
| | 1 | 1 | 0 | 1 | 0 | 1 | 0 | 0 | 41 | 7 | 11 | | 7 | 7 | | 7 | | 7 | | |
| | 1 | 1 | 0 | 1 | 0 | 0 | 0 | 1 | 161 | 8 | 11 | | 8 | 8 | | 8 | | | | 8 |
| | 0 | 0 | 0 | 0 | 0 | 1 | 1 | 0 | 26 | 9 | 11 | | | | | | | 9 | 9 | |
| | 1 | 0 | 0 | 1 | 1 | 0 | 1 | 0 | 146 | 10 | 11 | | 10 | | | 10 | 10 | | 10 | |
| | 1 | 1 | 1 | 0 | 1 | 0 | 0 | 0 | 11 | 11 | 11 | | 11 | 11 | 11 | | 11 | | | |
| | 0 | 1 | 0 | 1 | 1 | 1 | 0 | 0 | 131 | 12 | 11 | | | 12 | | 12 | 12 | 12 | | |
| | 1 | 1 | 0 | 1 | 1 | 0 | 0 | 0 | 251 | 13 | 11 | | 13 | 13 | | 13 | 13 | | | |
| | 1 | 1 | 1 | 1 | 1 | 0 | 0 | 0 | 116 | 14 | 11 | | 14 | 14 | 14 | 14 | 14 | | | |
| | 1 | 1 | 0 | 0 | 1 | 0 | 1 | 1 | 236 | 15 | 11 | | 15 | 15 | | | 15 | | 15 | 15 |
| | 0 | 0 | 1 | 0 | 0 | 0 | 1 | 0 | 101 | 16 | 11 | | | | 16 | | | | 16 | |

FIG. 32E

| pi(x) | | | | | | | | | index | | | | input i(17) | | | | | | | |
|---|---|---|---|---|---|---|---|---|---|---|---|---|---|---|---|---|---|---|---|---|
| m= | 7 | 6 | 5 | 4 | 3 | 2 | 1 | 0 | i | i(17) | i(15) | m= | 7 | 6 | 5 | 4 | 3 | 2 | 1 | 0 |
| | 0 | 1 | 0 | 0 | 0 | 1 | 0 | 0 | 102 | 0 | 12 | | | 0 | | | | 0 | | |
| | 1 | 0 | 0 | 0 | 1 | 0 | 1 | 0 | 222 | 1 | 12 | | 1 | | | | 1 | | 1 | |
| | 0 | 1 | 1 | 1 | 1 | 1 | 1 | 1 | 87 | 2 | 12 | | | 2 | 2 | 2 | 2 | 2 | 2 | 2 |
| | 1 | 0 | 1 | 0 | 0 | 1 | 1 | 0 | 207 | 3 | 12 | | 3 | | 3 | | | 3 | 3 | |
| | 0 | 1 | 1 | 0 | 0 | 1 | 0 | 1 | 72 | 4 | 12 | | | 4 | 4 | | | 4 | | 4 |
| | 1 | 0 | 0 | 0 | 0 | 0 | 1 | 0 | 192 | 5 | 12 | | 5 | | | | | | 5 | |
| | 1 | 0 | 1 | 1 | 1 | 0 | 1 | 0 | 57 | 6 | 12 | | 6 | | 6 | 6 | 6 | | 6 | |
| | 1 | 1 | 0 | 1 | 1 | 0 | 1 | 1 | 177 | 7 | 12 | | 7 | 7 | | 7 | 7 | | 7 | 7 |
| | 1 | 0 | 1 | 1 | 0 | 1 | 0 | 1 | 42 | 8 | 12 | | 8 | | 8 | 8 | | 8 | | 8 |
| | 1 | 0 | 1 | 1 | 1 | 1 | 1 | 1 | 162 | 9 | 12 | | 9 | | 9 | 9 | 9 | 9 | 9 | 9 |
| | 0 | 0 | 0 | 0 | 1 | 1 | 0 | 0 | 27 | 10 | 12 | | | | | | 10 | 10 | | |
| | 0 | 0 | 1 | 0 | 1 | 0 | 0 | 1 | 147 | 11 | 12 | | | | 11 | | 11 | | | 11 |
| | 1 | 1 | 0 | 0 | 1 | 1 | 0 | 1 | 12 | 12 | 12 | | 12 | 12 | | | 12 | 12 | | 12 |
| | 1 | 0 | 1 | 1 | 1 | 0 | 0 | 0 | 132 | 13 | 12 | | 13 | | 13 | 13 | 13 | | | |
| | 1 | 0 | 1 | 0 | 1 | 1 | 0 | 1 | 252 | 14 | 12 | | 14 | | 14 | | 14 | 14 | | 14 |
| | 1 | 1 | 1 | 0 | 1 | 1 | 0 | 1 | 117 | 15 | 12 | | 15 | 15 | 15 | | 15 | 15 | | 15 |
| | 1 | 0 | 0 | 0 | 1 | 0 | 1 | 1 | 237 | 16 | 12 | | 16 | | | | 16 | | 16 | 16 |
| | 0 | 0 | 0 | 0 | 1 | 0 | 1 | 1 | 238 | 0 | 13 | | | | | | 0 | | 0 | 0 |
| | 1 | 0 | 0 | 0 | 1 | 0 | 0 | 0 | 103 | 1 | 13 | | 1 | | | | 1 | | | |
| | 0 | 0 | 0 | 0 | 1 | 0 | 0 | 1 | 223 | 2 | 13 | | | | | | 2 | | | 2 |
| | 1 | 1 | 1 | 1 | 1 | 1 | 1 | 0 | 88 | 3 | 13 | | 3 | 3 | 3 | 3 | 3 | 3 | 3 | |
| | 0 | 1 | 0 | 1 | 0 | 0 | 0 | 1 | 208 | 4 | 13 | | | 4 | | 4 | | | | 4 |
| | 1 | 1 | 0 | 0 | 1 | 0 | 1 | 0 | 73 | 5 | 13 | | 5 | 5 | | | 5 | | 5 | |
| | 0 | 0 | 0 | 1 | 1 | 0 | 0 | 1 | 193 | 6 | 13 | | | | | 6 | 6 | | | 6 |
| | 0 | 1 | 1 | 0 | 1 | 0 | 0 | 1 | 58 | 7 | 13 | | | 7 | 7 | | 7 | | | 7 |
| | 1 | 0 | 1 | 0 | 1 | 0 | 1 | 1 | 178 | 8 | 13 | | 8 | | 8 | | 8 | | 8 | 8 |
| | 0 | 1 | 1 | 1 | 0 | 1 | 1 | 1 | 43 | 9 | 13 | | | 9 | 9 | 9 | | 9 | 9 | 9 |
| | 0 | 1 | 1 | 0 | 0 | 0 | 1 | 1 | 163 | 10 | 13 | | | 10 | 10 | | | | 10 | 10 |
| | 0 | 0 | 0 | 1 | 1 | 0 | 0 | 0 | 28 | 11 | 13 | | | | | 11 | 11 | | | |
| | 0 | 1 | 0 | 1 | 0 | 0 | 1 | 0 | 148 | 12 | 13 | | | 12 | | 12 | | | 12 | |
| | 1 | 0 | 0 | 0 | 0 | 1 | 1 | 1 | 13 | 13 | 13 | | 13 | | | | | 13 | 13 | 13 |
| | 0 | 1 | 1 | 0 | 1 | 1 | 0 | 1 | 133 | 14 | 13 | | | 14 | 14 | | 14 | 14 | | 14 |
| | 0 | 1 | 0 | 0 | 0 | 1 | 1 | 1 | 253 | 15 | 13 | | | 15 | | | | 15 | 15 | 15 |
| | 1 | 1 | 0 | 0 | 0 | 1 | 1 | 1 | 118 | 16 | 13 | | 16 | 16 | | | | 16 | 16 | 16 |
| | 1 | 0 | 0 | 1 | 0 | 0 | 1 | 1 | 119 | 0 | 14 | | 0 | | | 0 | | | 0 | 0 |
| | 0 | 0 | 0 | 1 | 0 | 1 | 1 | 0 | 239 | 1 | 14 | | | | | 1 | | 1 | 1 | |
| | 0 | 0 | 0 | 0 | 1 | 1 | 0 | 1 | 104 | 2 | 14 | | | | | | 2 | 2 | | 2 |
| | 0 | 0 | 0 | 1 | 0 | 0 | 1 | 0 | 224 | 3 | 14 | | | | | 3 | | | 3 | |
| | 1 | 1 | 1 | 0 | 0 | 0 | 0 | 1 | 89 | 4 | 14 | | 4 | 4 | 4 | | | | | 4 |
| | 1 | 0 | 1 | 0 | 0 | 0 | 1 | 0 | 209 | 5 | 14 | | 5 | | 5 | | | | 5 | |
| | 1 | 0 | 0 | 0 | 1 | 0 | 0 | 1 | 74 | 6 | 14 | | 6 | | | | 6 | | | 6 |
| | 0 | 0 | 1 | 1 | 0 | 0 | 1 | 0 | 194 | 7 | 14 | | | | 7 | 7 | | | 7 | |
| | 1 | 1 | 0 | 1 | 0 | 0 | 1 | 0 | 59 | 8 | 14 | | 8 | 8 | | 8 | | | 8 | |
| | 0 | 1 | 0 | 0 | 1 | 0 | 1 | 1 | 179 | 9 | 14 | | | 9 | | | 9 | | 9 | 9 |
| | 1 | 1 | 1 | 0 | 1 | 1 | 1 | 0 | 44 | 10 | 14 | | 10 | 10 | 10 | | 10 | 10 | 10 | |
| | 1 | 1 | 0 | 0 | 0 | 1 | 1 | 0 | 164 | 11 | 14 | | 11 | 11 | | | | 11 | 11 | |
| | 0 | 0 | 1 | 1 | 0 | 0 | 0 | 0 | 29 | 12 | 14 | | | | 12 | 12 | | | | |
| | 1 | 0 | 1 | 0 | 0 | 1 | 0 | 0 | 149 | 13 | 14 | | 13 | | 13 | | | 13 | | |
| | 0 | 0 | 0 | 1 | 0 | 0 | 1 | 1 | 14 | 14 | 14 | | | | | 14 | | | 14 | 14 |
| | 1 | 1 | 0 | 1 | 1 | 0 | 1 | 0 | 134 | 15 | 14 | | 15 | 15 | | 15 | 15 | | 15 | |
| | 1 | 0 | 0 | 0 | 1 | 1 | 1 | 0 | 254 | 16 | 14 | | 16 | | | | 16 | 16 | 16 | |

5bit (17) adder 371

4bit (15) adder 381 index(17),(15) & Latch index (17)

| i | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |

index (15)

| i | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |

index(17),(15) & Latch index (17)

| i | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |

index (15)

| i | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |

index(17),(15) & Latch index (17)

| | | | | | | | | | | | | | | | | | |
|---|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 | 16 |
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |

index (15)

| | | | | | | | | | | | | | | | |
|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 |
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |

index(17),(15) & Latch index (17)

| | | | | | | | | | | | | | | | | | |
|---|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 | 16 |
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |

index (15)

| | | | | | | | | | | | | | | | |
|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 |
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |

FIG. 65
index(17),(15) & Latch
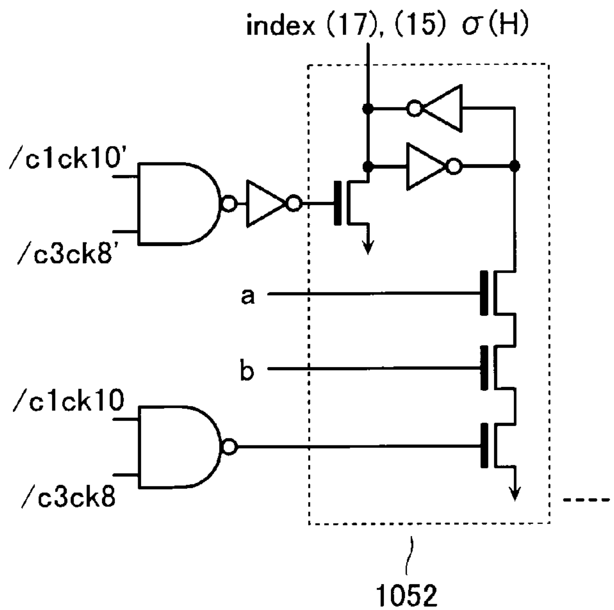
index (17)
| i | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |
index (15)
| i | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |
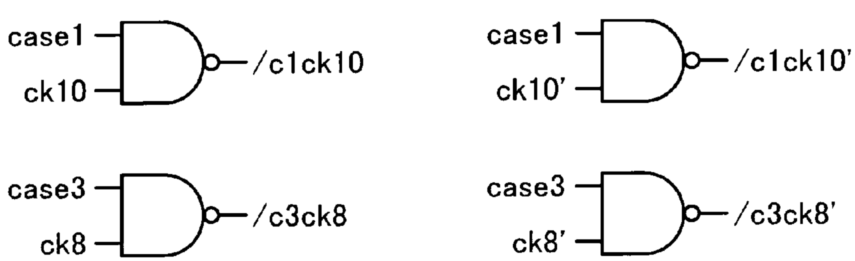

FIG. 66A

| σ (H) | σ (w) | σ (w+1) |
|---|---|---|
| 3 | 125 | 194 |
| 5 | 184 | 38 |
| 6 | 250 | 133 |
| 10 | 113 | 76 |
| 11 | 12 | 127 |
| 12 | 245 | 11 |
| 13 | 130 | 69 |
| 15 | 149 | 188 |
| 17 | 51 | 107 |
| | 58 | 182 |
| | 163 | 238 |
| 20 | 226 | 152 |
| 21 | 240 | 18 |
| 22 | 24 | 254 |
| 23 | 77 | 228 |
| 24 | 235 | 22 |
| 25 | 74 | 103 |
| 26 | 5 | 138 |
| 27 | 25 | 1 |
| 30 | 43 | 121 |
| 34 | 71 | 109 |
| | 102 | 214 |
| | 116 | 221 |
| 35 | 73 | 236 |
| 37 | 162 | 65 |
| 40 | 197 | 49 |
| 41 | 21 | 10 |
| 42 | 225 | 36 |
| 43 | 211 | 171 |
| 44 | 48 | 253 |
| 46 | 154 | 201 |
| 47 | 76 | 24 |
| | 227 | 113 |
| | 254 | 165 |
| 48 | 215 | 44 |
| 50 | 148 | 206 |
| 51 | 1 | 25 |
| | 16 | 136 |
| | 34 | 145 |
| 52 | 10 | 21 |
| 53 | 186 | 61 |
| 54 | 50 | 2 |
| 60 | 86 | 242 |
| 61 | 208 | 54 |
| 63 | 33 | 15 |
| | 56 | 131 |
| | 229 | 172 |
| 65 | 46 | 137 |
| 67 | 160 | 81 |
| 68 | 142 | 173 |
| | 204 | 187 |
| | 232 | 218 |
| 69 | 60 | 132 |

| σ (H) | σ (w) | σ (w+1) |
|---|---|---|
| 70 | 146 | 217 |
| 73 | 168 | 80 |
| 74 | 69 | 130 |
| 77 | 174 | 79 |
| 79 | 52 | 141 |
| 80 | 139 | 98 |
| 81 | 15 | 33 |
| 82 | 42 | 20 |
| 83 | 171 | 211 |
| 84 | 195 | 72 |
| 85 | 170 | 51 |
| | 187 | 85 |
| | 238 | 204 |
| 86 | 167 | 87 |
| 87 | 219 | 189 |
| 88 | 96 | 251 |
| 89 | 158 | 93 |
| 91 | 105 | 110 |
| | 115 | 243 |
| | 126 | 248 |
| 92 | 53 | 147 |
| 93 | 111 | 246 |
| 94 | 152 | 48 |
| | 199 | 75 |
| | 253 | 226 |
| 95 | 216 | 67 |
| 96 | 175 | 88 |
| 97 | 129 | 239 |
| 99 | 35 | 32 |
| 100 | 41 | 157 |
| 101 | 122 | 117 |
| 102 | 2 | 17 |
| | 32 | 35 |
| | 68 | 50 |
| 104 | 20 | 42 |
| 106 | 117 | 122 |
| 107 | 45 | 31 |
| | 110 | 126 |
| | 207 | 205 |
| 108 | 100 | 4 |
| 109 | 165 | 185 |
| | 205 | 207 |
| | 249 | 227 |
| 111 | 176 | 95 |
| 113 | 212 | 78 |
| 117 | 189 | 219 |
| 120 | 172 | 229 |
| 121 | 31 | 45 |
| | 98 | 139 |
| | 247 | 192 |
| 122 | 161 | 108 |
| 123 | 133 | 250 |
| 125 | 99 | 13 |

FIG. 66B

| σ(H) | σ(w) | σ(w+1) |
|---|---|---|
| 126 | 66 | 7 |
| | 112 | 30 |
| | 203 | 89 |
| 127 | 173 | 73 |
| | 228 | 77 |
| | 236 | 232 |
| 129 | 190 | 97 |
| 130 | 92 | 19 |
| 133 | 6 | 191 |
| 134 | 65 | 162 |
| 135 | 202 | 94 |
| 136 | 29 | 91 |
| | 153 | 119 |
| | 209 | 181 |
| 138 | 120 | 9 |
| 139 | 166 | 114 |
| 140 | 37 | 179 |
| 141 | 140 | 128 |
| 145 | 164 | 118 |
| 146 | 81 | 160 |
| 148 | 138 | 5 |
| 149 | 233 | 213 |
| 151 | 38 | 12 |
| | 127 | 184 |
| | 241 | 210 |
| 153 | 8 | 68 |
| | 17 | 140 |
| | 128 | 200 |
| 154 | 93 | 158 |
| 158 | 104 | 27 |
| 159 | 28 | 86 |
| | 144 | 135 |
| | 242 | 193 |
| 160 | 23 | 196 |
| 161 | 80 | 168 |
| 162 | 30 | 66 |
| 164 | 84 | 40 |
| 166 | 87 | 167 |
| 167 | 26 | 198 |
| 168 | 135 | 144 |
| 169 | 213 | 233 |
| 170 | 85 | 102 |
| | 119 | 153 |
| | 221 | 170 |
| 171 | 237 | 222 |
| 172 | 79 | 174 |
| 173 | 63 | 55 |
| | 180 | 124 |
| | 185 | 249 |
| 174 | 183 | 123 |
| 175 | 108 | 161 |
| 176 | 192 | 247 |
| 177 | 145 | 16 |

| σ(H) | σ(w) | σ(w+1) |
|---|---|---|
| 178 | 61 | 186 |
| 181 | 55 | 63 |
| | 150 | 143 |
| | 231 | 230 |
| 182 | 210 | 220 |
| | 230 | 231 |
| | 252 | 241 |
| 183 | 88 | 175 |
| 184 | 106 | 39 |
| 186 | 222 | 237 |
| 188 | 49 | 96 |
| | 143 | 150 |
| | 251 | 197 |
| 189 | 194 | 125 |
| 190 | 177 | 134 |
| 191 | 114 | 116 |
| | 118 | 164 |
| | 214 | 166 |
| 192 | 95 | 176 |
| 194 | 3 | 223 |
| 195 | 101 | 47 |
| 197 | 83 | 57 |
| 198 | 70 | 64 |
| 200 | 82 | 59 |
| 202 | 244 | 234 |
| 203 | 19 | 6 |
| | 191 | 92 |
| | 248 | 105 |
| 204 | 4 | 34 |
| | 64 | 70 |
| | 136 | 100 |
| 207 | 14 | 43 |
| | 72 | 195 |
| | 121 | 224 |
| 208 | 40 | 84 |
| 211 | 13 | 99 |
| 212 | 234 | 244 |
| 213 | 246 | 111 |
| 214 | 90 | 62 |
| | 159 | 155 |
| | 220 | 252 |
| 215 | 54 | 208 |
| 216 | 200 | 8 |
| 218 | 75 | 115 |
| | 155 | 159 |
| | 243 | 199 |
| 219 | 44 | 215 |
| 222 | 97 | 190 |
| 223 | 57 | 58 |
| | 59 | 82 |
| | 107 | 83 |
| 225 | 178 | 151 |
| 226 | 169 | 156 |

FIG. 66C

| σ (H) | σ (w) | σ (w+1) |
|---|---|---|
| 229 | 124 | 3 |
| | 137 | 46 |
| | 223 | 180 |
| 231 | 7 | 112 |
| | 36 | 149 |
| | 188 | 225 |
| 233 | 134 | 177 |
| 234 | 123 | 183 |
| 235 | 27 | 104 |
| 237 | 22 | 235 |
| 239 | 156 | 29 |
| | 157 | 41 |
| | 181 | 169 |
| 240 | 89 | 203 |
| 242 | 62 | 23 |
| | 196 | 90 |
| | 239 | 129 |
| 243 | 18 | 56 |
| | 94 | 202 |
| | 131 | 240 |
| 244 | 67 | 216 |
| 245 | 141 | 52 |
| 246 | 11 | 245 |
| 247 | 78 | 142 |
| | 206 | 148 |
| | 218 | 212 |
| 249 | 9 | 28 |
| | 47 | 101 |
| | 193 | 120 |
| 250 | 198 | 26 |
| 251 | 39 | 71 |
| | 103 | 74 |
| | 109 | 106 |
| 252 | 132 | 14 |
| | 151 | 60 |
| | 224 | 178 |
| 253 | 147 | 37 |
| | 179 | 53 |
| | 182 | 163 |
| 254 | 91 | 146 |
| | 201 | 154 |
| | 217 | 209 |
| Zero | 0 | Zero |
| | Zero | 0 |

Zero: Zero element

FIG. 67A

| σ(H) | σ(w) | σ(w+1) |
|---|---|---|
| 3 | 125 | 194 |
| 5 | 184 | 38 |
| 6 | 250 | 133 |
| 10 | 113 | 76 |
| 11 | 12 | 127 |
| 12 | 245 | 11 |
| 13 | 130 | 69 |
| 15 | 149 | 188 |
| 17 | 51 | 107 |
| 20 | 226 | 152 |
| 21 | 240 | 18 |
| 22 | 24 | 254 |
| 23 | 77 | 228 |
| 24 | 235 | 22 |
| 25 | 74 | 103 |
| 26 | 5 | 138 |
| 27 | 25 | 1 |
| 30 | 43 | 121 |
| 34 | 71 | 109 |
| 35 | 73 | 236 |
| 37 | 162 | 65 |
| 40 | 197 | 49 |
| 41 | 21 | 10 |
| 42 | 225 | 36 |
| 43 | 211 | 171 |
| 44 | 48 | 253 |
| 46 | 154 | 201 |
| 47 | 76 | 24 |
| 48 | 215 | 44 |
| 50 | 148 | 206 |
| 51 | 1 | 25 |
| 52 | 10 | 21 |
| 53 | 186 | 61 |
| 54 | 50 | 2 |
| 60 | 86 | 242 |
| 61 | 208 | 54 |
| 63 | 33 | 15 |
| 65 | 46 | 137 |
| 67 | 160 | 81 |
| 68 | 142 | 173 |
| 69 | 60 | 132 |
| 70 | 146 | 217 |
| 73 | 168 | 80 |
| 74 | 69 | 130 |
| 77 | 174 | 79 |
| 79 | 52 | 141 |
| 80 | 139 | 98 |
| 81 | 15 | 33 |
| 82 | 42 | 20 |
| 83 | 171 | 211 |
| 84 | 195 | 72 |
| 85 | 170 | 51 |
| 86 | 167 | 87 |

| σ(H) | σ(w) | σ(w+1) |
|---|---|---|
| 87 | 219 | 189 |
| 88 | 96 | 251 |
| 89 | 158 | 93 |
| 91 | 105 | 110 |
| 92 | 53 | 147 |
| 93 | 111 | 246 |
| 94 | 152 | 48 |
| 95 | 216 | 67 |
| 96 | 175 | 88 |
| 97 | 129 | 239 |
| 99 | 35 | 32 |
| 100 | 41 | 157 |
| 101 | 122 | 117 |
| 102 | 2 | 17 |
| 104 | 20 | 42 |
| 106 | 117 | 122 |
| 107 | 45 | 31 |
| 108 | 100 | 4 |
| 109 | 165 | 185 |
| 111 | 176 | 95 |
| 113 | 212 | 78 |
| 117 | 189 | 219 |
| 120 | 172 | 229 |
| 121 | 31 | 45 |
| 122 | 161 | 108 |
| 123 | 133 | 250 |
| 125 | 99 | 13 |
| 126 | 66 | 7 |
| 127 | 173 | 73 |
| 129 | 190 | 97 |
| 130 | 92 | 19 |
| 133 | 6 | 191 |
| 134 | 65 | 162 |
| 135 | 202 | 94 |
| 136 | 29 | 91 |
| 138 | 120 | 9 |
| 139 | 166 | 114 |
| 140 | 37 | 179 |
| 141 | 140 | 128 |
| 145 | 164 | 118 |
| 146 | 81 | 160 |
| 148 | 138 | 5 |
| 149 | 233 | 213 |
| 151 | 38 | 12 |
| 153 | 8 | 68 |
| 154 | 93 | 158 |
| 158 | 104 | 27 |
| 159 | 28 | 86 |
| 160 | 23 | 196 |
| 161 | 80 | 168 |
| 162 | 30 | 66 |
| 164 | 84 | 40 |
| 166 | 87 | 167 |

FIG. 67B

| σ (H) | σ (w) | σ (w+1) |
|---|---|---|
| 167 | 26 | 198 |
| 168 | 135 | 144 |
| 169 | 213 | 233 |
| 170 | 85 | 102 |
| 171 | 237 | 222 |
| 172 | 79 | 174 |
| 173 | 63 | 55 |
| 174 | 183 | 123 |
| 175 | 108 | 161 |
| 176 | 192 | 247 |
| 177 | 145 | 16 |
| 178 | 61 | 186 |
| 181 | 55 | 63 |
| 182 | 210 | 220 |
| 183 | 88 | 175 |
| 184 | 106 | 39 |
| 186 | 222 | 237 |
| 188 | 49 | 96 |
| 189 | 194 | 125 |
| 190 | 177 | 134 |
| 191 | 114 | 116 |
| 192 | 95 | 176 |
| 194 | 3 | 223 |
| 195 | 101 | 47 |
| 197 | 83 | 57 |
| 198 | 70 | 64 |
| 200 | 82 | 59 |
| 202 | 244 | 234 |
| 203 | 19 | 6 |
| 204 | 4 | 34 |
| 207 | 14 | 43 |
| 208 | 40 | 84 |
| 211 | 13 | 99 |
| 212 | 234 | 244 |
| 213 | 246 | 111 |
| 214 | 90 | 62 |
| 215 | 54 | 208 |
| 216 | 200 | 8 |
| 218 | 75 | 115 |
| 219 | 44 | 215 |
| 222 | 97 | 190 |
| 223 | 57 | 58 |
| 225 | 178 | 151 |
| 226 | 169 | 156 |
| 229 | 124 | 3 |
| 231 | 7 | 112 |
| 233 | 134 | 177 |
| 234 | 123 | 183 |
| 235 | 27 | 104 |
| 237 | 22 | 235 |
| 239 | 158 | 29 |
| 240 | 89 | 203 |
| 242 | 62 | 23 |

| σ (H) | σ (w) | σ (w+1) |
|---|---|---|
| 243 | 18 | 56 |
| 244 | 67 | 216 |
| 245 | 141 | 52 |
| 246 | 11 | 245 |
| 247 | 78 | 142 |
| 249 | 9 | 28 |
| 250 | 198 | 26 |
| 251 | 39 | 71 |
| 252 | 132 | 14 |
| 253 | 147 | 37 |
| 254 | 91 | 146 |

FIG. 68A

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 0 | 51 | 17 | 0 | 2 | 5 | 107 |
| 0 | 170 | 85 | 0 | 10 | 0 | 51 |
| 0 | 85 | 170 | 0 | 5 | 0 | 102 |
| 1 | 154 | 46 | 12 | 1 | 14 | 201 |
| 1 | 1 | 51 | 0 | 6 | 8 | 25 |
| 1 | 86 | 60 | 9 | 0 | 4 | 242 |
| 1 | 69 | 74 | 6 | 14 | 11 | 130 |
| 1 | 52 | 79 | 11 | 4 | 5 | 141 |
| 1 | 171 | 83 | 15 | 8 | 7 | 211 |
| 1 | 35 | 99 | 14 | 9 | 15 | 32 |
| 1 | 120 | 138 | 2 | 3 | 9 | 9 |
| 1 | 222 | 186 | 16 | 6 | 16 | 237 |
| 1 | 18 | 243 | 5 | 3 | 5 | 56 |
| 2 | 240 | 21 | 4 | 6 | 1 | 18 |
| 2 | 53 | 92 | 7 | 2 | 11 | 147 |
| 2 | 2 | 102 | 0 | 12 | 0 | 17 |
| 2 | 189 | 117 | 15 | 12 | 15 | 219 |
| 2 | 172 | 120 | 1 | 0 | 8 | 229 |
| 2 | 138 | 148 | 12 | 13 | 5 | 5 |
| 2 | 104 | 158 | 5 | 8 | 10 | 27 |
| 2 | 87 | 166 | 13 | 1 | 14 | 167 |
| 2 | 70 | 198 | 11 | 3 | 13 | 64 |
| 2 | 19 | 203 | 16 | 8 | 6 | 6 |
| 3 | 71 | 34 | 0 | 4 | 7 | 109 |
| 3 | 139 | 80 | 12 | 5 | 13 | 98 |
| 3 | 105 | 91 | 6 | 1 | 8 | 110 |
| 3 | 122 | 101 | 16 | 11 | 15 | 117 |
| 3 | 20 | 104 | 2 | 14 | 8 | 42 |
| 3 | 173 | 127 | 8 | 7 | 5 | 73 |
| 3 | 190 | 129 | 10 | 9 | 12 | 97 |
| 3 | 37 | 140 | 4 | 5 | 9 | 179 |
| 3 | 88 | 183 | 13 | 3 | 5 | 175 |
| 3 | 3 | 194 | 7 | 14 | 2 | 223 |
| 3 | 54 | 215 | 11 | 5 | 4 | 208 |
| 3 | 156 | 239 | 1 | 14 | 12 | 29 |
| 4 | 21 | 41 | 7 | 11 | 10 | 10 |
| 4 | 225 | 42 | 8 | 12 | 2 | 36 |
| 4 | 208 | 61 | 10 | 1 | 3 | 54 |
| 4 | 174 | 77 | 9 | 2 | 11 | 79 |
| 4 | 140 | 141 | 5 | 6 | 9 | 128 |
| 4 | 38 | 151 | 15 | 1 | 12 | 12 |
| 4 | 55 | 181 | 11 | 1 | 12 | 63 |
| 4 | 106 | 184 | 14 | 4 | 5 | 39 |
| 4 | 4 | 204 | 0 | 9 | 0 | 34 |
| 4 | 123 | 234 | 13 | 9 | 13 | 183 |
| 4 | 89 | 240 | 2 | 0 | 16 | 203 |

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 5 | 226 | 20 | 3 | 5 | 16 | 152 |
| 5 | 5 | 26 | 9 | 11 | 2 | 138 |
| 5 | 73 | 35 | 1 | 5 | 15 | 236 |
| 5 | 158 | 89 | 4 | 14 | 8 | 93 |
| 5 | 175 | 96 | 11 | 6 | 3 | 88 |
| 5 | 192 | 176 | 6 | 11 | 9 | 247 |
| 5 | 90 | 214 | 10 | 4 | 11 | 62 |
| 5 | 124 | 229 | 8 | 4 | 3 | 3 |
| 5 | 22 | 237 | 16 | 12 | 14 | 235 |
| 5 | 141 | 245 | 7 | 5 | 1 | 52 |
| 5 | 39 | 251 | 13 | 11 | 3 | 71 |
| 6 | 125 | 3 | 3 | 3 | 7 | 194 |
| 6 | 74 | 25 | 8 | 10 | 1 | 103 |
| 6 | 142 | 68 | 0 | 8 | 3 | 173 |
| 6 | 176 | 111 | 9 | 6 | 10 | 95 |
| 6 | 6 | 133 | 14 | 13 | 4 | 191 |
| 6 | 23 | 160 | 7 | 10 | 9 | 196 |
| 6 | 108 | 175 | 5 | 10 | 8 | 161 |
| 6 | 210 | 182 | 12 | 2 | 16 | 220 |
| 6 | 244 | 202 | 15 | 7 | 13 | 234 |
| 6 | 40 | 208 | 4 | 13 | 16 | 84 |
| 6 | 57 | 223 | 2 | 13 | 7 | 58 |
| 6 | 91 | 254 | 16 | 14 | 10 | 146 |
| 7 | 245 | 12 | 12 | 12 | 11 | 11 |
| 7 | 24 | 22 | 5 | 7 | 16 | 254 |
| 7 | 211 | 43 | 9 | 13 | 1 | 171 |
| 7 | 160 | 67 | 16 | 7 | 13 | 81 |
| 7 | 41 | 100 | 15 | 10 | 4 | 157 |
| 7 | 92 | 130 | 11 | 10 | 2 | 19 |
| 7 | 194 | 189 | 2 | 9 | 6 | 125 |
| 7 | 177 | 190 | 3 | 10 | 15 | 134 |
| 7 | 75 | 218 | 14 | 8 | 13 | 115 |
| 7 | 7 | 231 | 10 | 6 | 10 | 112 |
| 8 | 25 | 27 | 10 | 12 | 1 | 1 |
| 8 | 76 | 47 | 13 | 2 | 7 | 24 |
| 8 | 42 | 82 | 14 | 7 | 3 | 20 |
| 8 | 195 | 84 | 16 | 9 | 4 | 72 |
| 8 | 212 | 113 | 11 | 8 | 10 | 78 |
| 8 | 161 | 122 | 3 | 2 | 6 | 108 |
| 8 | 8 | 153 | 0 | 3 | 0 | 68 |
| 8 | 93 | 154 | 1 | 4 | 5 | 158 |
| 8 | 246 | 213 | 9 | 3 | 9 | 111 |
| 8 | 178 | 225 | 4 | 0 | 15 | 151 |

FIG. 68B

| index | | | | | index | |
|---|---|---|---|---|---|---|
| σ(wX17) | σ(w) | σ(H) | σ(HX17) | σ(HX15) | σ(w+1X17) | σ(w+1) |
| 9 | 77 | 23 | 6 | 8 | 7 | 228 |
| 9 | 43 | 30 | 13 | 0 | 2 | 121 |
| 9 | 162 | 37 | 3 | 7 | 14 | 65 |
| 9 | 60 | 69 | 1 | 9 | 13 | 132 |
| 9 | 111 | 93 | 8 | 3 | 8 | 246 |
| 9 | 26 | 167 | 14 | 2 | 11 | 198 |
| 9 | 213 | 169 | 16 | 4 | 12 | 233 |
| 9 | 145 | 177 | 7 | 12 | 16 | 16 |
| 9 | 9 | 249 | 11 | 9 | 11 | 28 |
| 10 | 197 | 40 | 6 | 10 | 15 | 49 |
| 10 | 10 | 52 | 1 | 7 | 4 | 21 |
| 10 | 146 | 70 | 2 | 10 | 13 | 217 |
| 10 | 129 | 97 | 12 | 7 | 1 | 239 |
| 10 | 61 | 178 | 8 | 13 | 16 | 186 |
| 10 | 95 | 192 | 5 | 12 | 6 | 176 |
| 10 | 44 | 219 | 15 | 9 | 11 | 215 |
| 10 | 27 | 235 | 14 | 10 | 2 | 104 |
| 10 | 78 | 247 | 9 | 7 | 6 | 142 |
| 11 | 113 | 10 | 10 | 10 | 8 | 76 |
| 11 | 130 | 13 | 13 | 13 | 1 | 69 |
| 11 | 215 | 48 | 14 | 3 | 10 | 44 |
| 11 | 96 | 88 | 3 | 13 | 13 | 251 |
| 11 | 45 | 107 | 5 | 2 | 14 | 31 |
| 11 | 164 | 145 | 9 | 10 | 16 | 118 |
| 11 | 28 | 159 | 6 | 9 | 1 | 86 |
| 11 | 79 | 172 | 2 | 7 | 4 | 174 |
| 11 | 62 | 242 | 4 | 2 | 6 | 23 |
| 11 | 11 | 246 | 8 | 6 | 7 | 245 |
| 11 | 198 | 250 | 12 | 10 | 9 | 26 |
| 11 | 147 | 253 | 15 | 13 | 3 | 37 |
| 12 | 250 | 6 | 6 | 6 | 14 | 133 |
| 12 | 12 | 11 | 11 | 11 | 8 | 127 |
| 12 | 148 | 50 | 16 | 5 | 2 | 206 |
| 12 | 46 | 65 | 14 | 5 | 1 | 137 |
| 12 | 216 | 95 | 10 | 5 | 16 | 67 |
| 12 | 165 | 109 | 7 | 4 | 15 | 185 |
| 12 | 29 | 136 | 0 | 1 | 6 | 91 |
| 12 | 233 | 149 | 13 | 14 | 9 | 213 |
| 12 | 80 | 161 | 8 | 11 | 15 | 168 |
| 12 | 63 | 173 | 3 | 8 | 4 | 55 |
| 12 | 114 | 191 | 4 | 11 | 14 | 116 |
| 12 | 97 | 222 | 1 | 12 | 3 | 190 |

| σ(wX17) | σ(w) | σ(H) | σ(H)(17) | σ(HX15) | σ(w+1X17) | σ(w+1) |
|---|---|---|---|---|---|---|
| 13 | 149 | 15 | 15 | 0 | 1 | 188 |
| 13 | 166 | 139 | 3 | 4 | 12 | 114 |
| 13 | 81 | 146 | 10 | 11 | 7 | 160 |
| 13 | 30 | 162 | 9 | 12 | 15 | 66 |
| 13 | 183 | 174 | 4 | 9 | 4 | 123 |
| 13 | 13 | 211 | 7 | 1 | 14 | 99 |
| 13 | 234 | 212 | 8 | 2 | 6 | 244 |
| 13 | 200 | 216 | 12 | 6 | 8 | 8 |
| 13 | 132 | 252 | 14 | 12 | 14 | 14 |
| 14 | 184 | 5 | 5 | 5 | 4 | 38 |
| 14 | 235 | 24 | 7 | 9 | 5 | 22 |
| 14 | 48 | 44 | 10 | 14 | 15 | 253 |
| 14 | 167 | 86 | 1 | 11 | 2 | 87 |
| 14 | 31 | 121 | 2 | 1 | 11 | 45 |
| 14 | 133 | 123 | 4 | 3 | 12 | 250 |
| 14 | 99 | 125 | 6 | 5 | 13 | 13 |
| 14 | 65 | 134 | 15 | 14 | 9 | 162 |
| 14 | 82 | 200 | 13 | 5 | 8 | 59 |
| 14 | 14 | 207 | 3 | 12 | 9 | 43 |
| 15 | 168 | 73 | 5 | 13 | 12 | 80 |
| 15 | 15 | 81 | 13 | 6 | 16 | 33 |
| 15 | 219 | 87 | 2 | 12 | 2 | 189 |
| 15 | 117 | 106 | 4 | 1 | 3 | 122 |
| 15 | 100 | 108 | 6 | 3 | 4 | 4 |
| 15 | 66 | 126 | 7 | 6 | 7 | 7 |
| 15 | 202 | 135 | 16 | 0 | 9 | 94 |
| 15 | 49 | 188 | 1 | 8 | 11 | 96 |
| 15 | 83 | 197 | 10 | 2 | 6 | 57 |
| 15 | 134 | 233 | 12 | 8 | 7 | 177 |
| 16 | 186 | 53 | 2 | 8 | 10 | 61 |
| 16 | 50 | 54 | 3 | 9 | 2 | 2 |
| 16 | 33 | 63 | 12 | 3 | 15 | 15 |
| 16 | 152 | 94 | 9 | 4 | 14 | 48 |
| 16 | 84 | 164 | 11 | 14 | 6 | 40 |
| 16 | 135 | 168 | 15 | 3 | 8 | 144 |
| 16 | 237 | 171 | 1 | 6 | 1 | 222 |
| 16 | 101 | 195 | 8 | 0 | 13 | 47 |
| 16 | 169 | 226 | 5 | 1 | 3 | 156 |
| 16 | 67 | 244 | 6 | 4 | 12 | 216 |
| | | | | | | |
| | | | | | | |
| | | | | | | |
| | | | | | | |

FIG. 69A

| index | | | | | index | |
|---|---|---|---|---|---|---|
| σ(wX15) | σ(w) | σ(H) | σ(HX17) | σ(HX15) | σ(w+1X15) | σ(w+1) |
| 0 | 240 | 21 | 4 | 6 | 3 | 18 |
| 0 | 225 | 42 | 8 | 12 | 6 | 36 |
| 0 | 60 | 69 | 1 | 9 | 12 | 132 |
| 0 | 15 | 81 | 13 | 6 | 3 | 33 |
| 0 | 195 | 84 | 16 | 9 | 12 | 72 |
| 0 | 105 | 91 | 6 | 1 | 5 | 110 |
| 0 | 45 | 107 | 5 | 2 | 1 | 31 |
| 0 | 165 | 109 | 7 | 4 | 5 | 185 |
| 0 | 120 | 138 | 2 | 3 | 9 | 9 |
| 0 | 30 | 162 | 9 | 12 | 6 | 66 |
| 0 | 135 | 168 | 15 | 3 | 9 | 144 |
| 0 | 210 | 182 | 12 | 2 | 10 | 220 |
| 0 | 90 | 214 | 10 | 4 | 2 | 62 |
| 0 | 75 | 218 | 14 | 8 | 10 | 115 |
| 1 | 226 | 20 | 3 | 5 | 2 | 152 |
| 1 | 211 | 43 | 9 | 13 | 6 | 171 |
| 1 | 76 | 47 | 13 | 2 | 9 | 24 |
| 1 | 1 | 51 | 0 | 6 | 10 | 25 |
| 1 | 46 | 65 | 14 | 5 | 2 | 137 |
| 1 | 31 | 121 | 2 | 1 | 0 | 45 |
| 1 | 166 | 139 | 3 | 4 | 9 | 114 |
| 1 | 61 | 178 | 8 | 13 | 6 | 186 |
| 1 | 106 | 184 | 14 | 4 | 9 | 39 |
| 1 | 91 | 254 | 16 | 14 | 11 | 146 |
| 2 | 77 | 23 | 6 | 8 | 3 | 228 |
| 2 | 197 | 40 | 6 | 10 | 4 | 49 |
| 2 | 167 | 86 | 1 | 11 | 12 | 87 |
| 2 | 152 | 94 | 9 | 4 | 3 | 48 |
| 2 | 122 | 101 | 16 | 11 | 12 | 117 |
| 2 | 2 | 102 | 0 | 12 | 2 | 17 |
| 2 | 212 | 113 | 11 | 8 | 3 | 78 |
| 2 | 92 | 130 | 11 | 10 | 4 | 19 |
| 2 | 62 | 242 | 4 | 2 | 8 | 23 |
| 3 | 48 | 44 | 10 | 14 | 13 | 253 |
| 3 | 33 | 63 | 12 | 3 | 0 | 15 |
| 3 | 168 | 73 | 5 | 13 | 5 | 80 |
| 3 | 138 | 148 | 12 | 13 | 5 | 5 |
| 3 | 93 | 154 | 1 | 4 | 8 | 158 |
| 3 | 213 | 169 | 16 | 4 | 8 | 233 |
| 3 | 63 | 173 | 3 | 8 | 10 | 55 |
| 3 | 183 | 174 | 4 | 9 | 3 | 123 |
| 3 | 108 | 175 | 5 | 10 | 11 | 161 |
| 3 | 3 | 194 | 7 | 14 | 13 | 223 |
| 3 | 123 | 234 | 13 | 9 | 3 | 183 |
| 3 | 18 | 243 | 5 | 3 | 11 | 56 |
| 3 | 78 | 247 | 9 | 7 | 7 | 142 |
| 3 | 198 | 250 | 12 | 10 | 11 | 26 |

| index | | | | | index | |
|---|---|---|---|---|---|---|
| σ(wX15) | σ(w) | σ(H) | σ(HX17) | σ(HX15) | σ(w+1X15) | σ(w+1) |
| 4 | 184 | 5 | 5 | 5 | 8 | 38 |
| 4 | 154 | 46 | 12 | 1 | 6 | 201 |
| 4 | 139 | 80 | 12 | 5 | 8 | 98 |
| 4 | 79 | 172 | 2 | 7 | 9 | 174 |
| 4 | 49 | 188 | 1 | 8 | 6 | 96 |
| 4 | 244 | 202 | 15 | 7 | 9 | 234 |
| 4 | 19 | 203 | 16 | 8 | 6 | 6 |
| 4 | 4 | 204 | 0 | 9 | 4 | 34 |
| 4 | 169 | 226 | 5 | 1 | 6 | 156 |
| 4 | 124 | 229 | 8 | 4 | 3 | 3 |
| 5 | 125 | 3 | 3 | 3 | 14 | 194 |
| 5 | 245 | 12 | 12 | 12 | 11 | 11 |
| 5 | 5 | 26 | 9 | 11 | 3 | 138 |
| 5 | 215 | 48 | 14 | 3 | 14 | 44 |
| 5 | 50 | 54 | 3 | 9 | 2 | 2 |
| 5 | 170 | 85 | 0 | 10 | 6 | 51 |
| 5 | 35 | 99 | 14 | 9 | 2 | 32 |
| 5 | 20 | 104 | 2 | 14 | 12 | 42 |
| 5 | 65 | 134 | 15 | 14 | 12 | 162 |
| 5 | 140 | 141 | 5 | 6 | 8 | 128 |
| 5 | 80 | 161 | 8 | 11 | 3 | 168 |
| 5 | 95 | 192 | 5 | 12 | 11 | 176 |
| 5 | 200 | 216 | 12 | 6 | 8 | 8 |
| 6 | 51 | 17 | 0 | 2 | 2 | 107 |
| 6 | 21 | 41 | 7 | 11 | 10 | 10 |
| 6 | 186 | 53 | 2 | 8 | 1 | 61 |
| 6 | 171 | 83 | 15 | 8 | 1 | 211 |
| 6 | 96 | 88 | 3 | 13 | 11 | 251 |
| 6 | 111 | 93 | 8 | 3 | 6 | 246 |
| 6 | 216 | 95 | 10 | 5 | 7 | 67 |
| 6 | 66 | 126 | 7 | 6 | 7 | 7 |
| 6 | 6 | 133 | 14 | 13 | 11 | 191 |
| 6 | 81 | 146 | 10 | 11 | 10 | 160 |
| 6 | 246 | 213 | 9 | 3 | 6 | 111 |
| 6 | 156 | 239 | 1 | 14 | 14 | 29 |
| 6 | 141 | 245 | 7 | 5 | 7 | 52 |
| 7 | 142 | 68 | 0 | 8 | 8 | 173 |
| 7 | 52 | 79 | 11 | 4 | 6 | 141 |
| 7 | 172 | 120 | 1 | 0 | 4 | 229 |
| 7 | 202 | 135 | 16 | 0 | 4 | 94 |
| 7 | 37 | 140 | 4 | 5 | 14 | 179 |
| 7 | 82 | 200 | 13 | 5 | 14 | 59 |
| 7 | 97 | 222 | 1 | 12 | 10 | 190 |
| 7 | 7 | 231 | 10 | 6 | 7 | 112 |
| 7 | 22 | 237 | 16 | 12 | 10 | 235 |
| 7 | 67 | 244 | 6 | 4 | 6 | 216 |

FIG. 69B

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 8 | 113 | 10 | 10 | 10 | 1 | 76 |
| 8 | 158 | 89 | 4 | 14 | 3 | 93 |
| 8 | 53 | 92 | 7 | 2 | 12 | 147 |
| 8 | 173 | 127 | 8 | 7 | 13 | 73 |
| 8 | 233 | 149 | 13 | 14 | 3 | 213 |
| 8 | 38 | 151 | 15 | 1 | 12 | 12 |
| 8 | 8 | 153 | 0 | 3 | 8 | 68 |
| 8 | 23 | 160 | 7 | 10 | 1 | 196 |
| 8 | 83 | 197 | 10 | 2 | 12 | 57 |
| 9 | 24 | 22 | 5 | 7 | 14 | 254 |
| 9 | 69 | 74 | 6 | 14 | 10 | 130 |
| 9 | 174 | 77 | 9 | 2 | 4 | 79 |
| 9 | 219 | 87 | 2 | 12 | 9 | 189 |
| 9 | 129 | 97 | 12 | 7 | 14 | 239 |
| 9 | 189 | 117 | 15 | 12 | 9 | 219 |
| 9 | 99 | 125 | 6 | 5 | 13 | 13 |
| 9 | 84 | 164 | 11 | 14 | 10 | 40 |
| 9 | 114 | 191 | 4 | 11 | 11 | 116 |
| 9 | 234 | 212 | 8 | 2 | 4 | 244 |
| 9 | 54 | 215 | 11 | 5 | 13 | 208 |
| 9 | 9 | 249 | 11 | 9 | 13 | 28 |
| 9 | 39 | 251 | 13 | 11 | 11 | 71 |
| 10 | 250 | 6 | 6 | 6 | 13 | 133 |
| 10 | 130 | 13 | 13 | 13 | 9 | 69 |
| 10 | 235 | 24 | 7 | 9 | 7 | 22 |
| 10 | 25 | 27 | 10 | 12 | 1 | 1 |
| 10 | 10 | 52 | 1 | 7 | 6 | 21 |
| 10 | 160 | 67 | 16 | 7 | 6 | 81 |
| 10 | 175 | 96 | 11 | 6 | 13 | 88 |
| 10 | 100 | 108 | 6 | 3 | 4 | 4 |
| 10 | 190 | 129 | 10 | 9 | 7 | 97 |
| 10 | 85 | 170 | 0 | 5 | 12 | 102 |
| 10 | 145 | 177 | 7 | 12 | 1 | 16 |
| 10 | 55 | 181 | 11 | 1 | 3 | 63 |
| 10 | 70 | 198 | 11 | 3 | 4 | 64 |
| 10 | 40 | 208 | 4 | 13 | 9 | 84 |
| 11 | 71 | 34 | 0 | 4 | 4 | 109 |
| 11 | 86 | 60 | 9 | 0 | 2 | 242 |
| 11 | 146 | 70 | 2 | 10 | 7 | 217 |
| 11 | 41 | 100 | 15 | 10 | 7 | 157 |
| 11 | 176 | 111 | 9 | 6 | 5 | 95 |
| 11 | 161 | 122 | 3 | 2 | 3 | 108 |
| 11 | 26 | 167 | 14 | 2 | 3 | 198 |
| 11 | 101 | 195 | 8 | 0 | 2 | 47 |
| 11 | 11 | 246 | 8 | 6 | 5 | 245 |

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 12 | 12 | 11 | 11 | 11 | 7 | 127 |
| 12 | 162 | 37 | 3 | 7 | 5 | 65 |
| 12 | 42 | 82 | 14 | 7 | 5 | 20 |
| 12 | 117 | 106 | 4 | 1 | 2 | 122 |
| 12 | 87 | 166 | 13 | 1 | 2 | 167 |
| 12 | 237 | 171 | 1 | 6 | 12 | 222 |
| 12 | 192 | 176 | 6 | 11 | 7 | 247 |
| 12 | 222 | 186 | 16 | 6 | 12 | 237 |
| 12 | 177 | 190 | 3 | 10 | 14 | 134 |
| 12 | 57 | 223 | 2 | 13 | 13 | 58 |
| 12 | 27 | 235 | 14 | 10 | 14 | 104 |
| 12 | 132 | 252 | 14 | 12 | 14 | 14 |
| 12 | 147 | 253 | 15 | 13 | 7 | 37 |
| 13 | 43 | 30 | 13 | 0 | 1 | 121 |
| 13 | 73 | 35 | 1 | 5 | 11 | 236 |
| 13 | 148 | 50 | 16 | 5 | 11 | 206 |
| 13 | 208 | 61 | 10 | 1 | 9 | 54 |
| 13 | 133 | 123 | 4 | 3 | 10 | 250 |
| 13 | 28 | 159 | 6 | 9 | 11 | 86 |
| 13 | 88 | 183 | 13 | 3 | 10 | 175 |
| 13 | 13 | 211 | 7 | 1 | 9 | 99 |
| 13 | 178 | 225 | 4 | 0 | 1 | 151 |
| 14 | 149 | 15 | 15 | 0 | 8 | 188 |
| 14 | 74 | 25 | 8 | 10 | 13 | 103 |
| 14 | 29 | 136 | 0 | 1 | 1 | 91 |
| 14 | 164 | 145 | 9 | 10 | 13 | 118 |
| 14 | 104 | 158 | 5 | 8 | 12 | 27 |
| 14 | 194 | 189 | 2 | 9 | 5 | 125 |
| 14 | 14 | 207 | 3 | 12 | 13 | 43 |
| 14 | 44 | 219 | 15 | 9 | 5 | 215 |
| 14 | 134 | 233 | 12 | 8 | 12 | 177 |
| 14 | 89 | 240 | 2 | 0 | 8 | 203 |

FIG. 70A

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 0 | 170 | 85 | 0 | 10 | 0 | 51 |
| 2 | 2 | 102 | 0 | 12 | 0 | 17 |
| 8 | 8 | 153 | 0 | 3 | 0 | 68 |
| 0 | 85 | 170 | 0 | 5 | 0 | 102 |
| 4 | 4 | 204 | 0 | 9 | 0 | 34 |
| 11 | 130 | 13 | 13 | 13 | 1 | 69 |
| 13 | 149 | 15 | 15 | 0 | 1 | 188 |
| 2 | 240 | 21 | 4 | 6 | 1 | 18 |
| 6 | 74 | 25 | 8 | 10 | 1 | 103 |
| 8 | 25 | 27 | 10 | 12 | 1 | 1 |
| 7 | 211 | 43 | 9 | 13 | 1 | 171 |
| 12 | 46 | 65 | 14 | 5 | 1 | 137 |
| 10 | 129 | 97 | 12 | 7 | 1 | 239 |
| 11 | 28 | 159 | 6 | 9 | 1 | 86 |
| 16 | 237 | 171 | 1 | 6 | 1 | 222 |
| 5 | 141 | 245 | 7 | 5 | 1 | 52 |
| 5 | 5 | 26 | 9 | 11 | 2 | 138 |
| 9 | 43 | 30 | 13 | 0 | 2 | 121 |
| 4 | 225 | 42 | 8 | 12 | 2 | 36 |
| 12 | 148 | 50 | 16 | 5 | 2 | 206 |
| 16 | 50 | 54 | 3 | 9 | 2 | 2 |
| 14 | 167 | 86 | 1 | 11 | 2 | 87 |
| 15 | 219 | 87 | 2 | 12 | 2 | 189 |
| 7 | 92 | 130 | 11 | 10 | 2 | 19 |
| 3 | 3 | 194 | 7 | 14 | 2 | 223 |
| 10 | 27 | 235 | 14 | 10 | 2 | 104 |
| 4 | 208 | 61 | 10 | 1 | 3 | 54 |
| 6 | 142 | 68 | 0 | 8 | 3 | 173 |
| 8 | 42 | 82 | 14 | 7 | 3 | 20 |
| 5 | 175 | 96 | 11 | 6 | 3 | 88 |
| 15 | 117 | 106 | 4 | 1 | 3 | 122 |
| 12 | 97 | 222 | 1 | 12 | 3 | 190 |
| 16 | 169 | 226 | 5 | 1 | 3 | 156 |
| 5 | 124 | 229 | 8 | 4 | 3 | 3 |
| 5 | 39 | 251 | 13 | 11 | 3 | 71 |
| 11 | 147 | 253 | 15 | 13 | 3 | 37 |
| 14 | 184 | 5 | 5 | 5 | 4 | 38 |
| 10 | 10 | 52 | 1 | 7 | 4 | 21 |
| 1 | 86 | 60 | 9 | 0 | 4 | 242 |
| 8 | 195 | 84 | 16 | 9 | 4 | 72 |
| 7 | 41 | 100 | 15 | 10 | 4 | 157 |
| 15 | 100 | 108 | 6 | 3 | 4 | 4 |
| 6 | 6 | 133 | 14 | 13 | 4 | 191 |
| 11 | 79 | 172 | 2 | 7 | 4 | 174 |
| 12 | 63 | 173 | 3 | 8 | 4 | 55 |
| 13 | 183 | 174 | 4 | 9 | 4 | 123 |
| 3 | 54 | 215 | 11 | 5 | 4 | 208 |

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 0 | 51 | 17 | 0 | 2 | 5 | 107 |
| 14 | 235 | 24 | 7 | 9 | 5 | 22 |
| 1 | 52 | 79 | 11 | 4 | 5 | 141 |
| 3 | 173 | 127 | 8 | 7 | 5 | 73 |
| 2 | 138 | 148 | 12 | 13 | 5 | 5 |
| 8 | 93 | 154 | 1 | 4 | 5 | 158 |
| 3 | 88 | 183 | 13 | 3 | 5 | 175 |
| 4 | 106 | 184 | 14 | 4 | 5 | 39 |
| 1 | 18 | 243 | 5 | 3 | 5 | 56 |
| 8 | 161 | 122 | 3 | 2 | 6 | 108 |
| 12 | 29 | 136 | 0 | 1 | 6 | 91 |
| 16 | 84 | 164 | 11 | 14 | 6 | 40 |
| 7 | 194 | 189 | 2 | 9 | 6 | 125 |
| 10 | 95 | 192 | 5 | 12 | 6 | 176 |
| 15 | 83 | 197 | 10 | 2 | 6 | 57 |
| 2 | 19 | 203 | 16 | 8 | 6 | 6 |
| 13 | 234 | 212 | 8 | 2 | 6 | 244 |
| 11 | 62 | 242 | 4 | 2 | 6 | 23 |
| 10 | 78 | 247 | 9 | 7 | 6 | 142 |
| 6 | 125 | 3 | 3 | 3 | 7 | 194 |
| 9 | 77 | 23 | 6 | 8 | 7 | 228 |
| 3 | 71 | 34 | 0 | 4 | 7 | 109 |
| 8 | 76 | 47 | 13 | 2 | 7 | 24 |
| 1 | 171 | 83 | 15 | 8 | 7 | 211 |
| 15 | 66 | 126 | 7 | 6 | 7 | 7 |
| 13 | 81 | 146 | 10 | 11 | 7 | 160 |
| 6 | 57 | 223 | 2 | 13 | 7 | 58 |
| 15 | 134 | 233 | 12 | 8 | 7 | 177 |
| 11 | 11 | 246 | 8 | 6 | 7 | 245 |
| 11 | 113 | 10 | 10 | 10 | 8 | 76 |
| 12 | 12 | 11 | 11 | 11 | 8 | 127 |
| 1 | 1 | 51 | 0 | 6 | 8 | 25 |
| 5 | 158 | 89 | 4 | 14 | 8 | 93 |
| 3 | 105 | 91 | 6 | 1 | 8 | 110 |
| 9 | 111 | 93 | 8 | 3 | 8 | 246 |
| 3 | 20 | 104 | 2 | 14 | 8 | 42 |
| 2 | 172 | 120 | 1 | 0 | 8 | 229 |
| 16 | 135 | 168 | 15 | 3 | 8 | 144 |
| 6 | 108 | 175 | 5 | 10 | 8 | 161 |
| 14 | 82 | 200 | 13 | 5 | 8 | 59 |
| 13 | 200 | 216 | 12 | 6 | 8 | 8 |

FIG. 70B

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 14 | 65 | 134 | 15 | 14 | 9 | 162 |
| 15 | 202 | 135 | 16 | 0 | 9 | 94 |
| 1 | 120 | 138 | 2 | 3 | 9 | 9 |
| 3 | 37 | 140 | 4 | 5 | 9 | 179 |
| 4 | 140 | 141 | 5 | 6 | 9 | 128 |
| 12 | 233 | 149 | 13 | 14 | 9 | 213 |
| 6 | 23 | 160 | 7 | 10 | 9 | 196 |
| 5 | 192 | 176 | 6 | 11 | 9 | 247 |
| 14 | 14 | 207 | 3 | 12 | 9 | 43 |
| 8 | 246 | 213 | 9 | 3 | 9 | 111 |
| 11 | 198 | 250 | 12 | 10 | 9 | 26 |
| 4 | 21 | 41 | 7 | 11 | 10 | 10 |
| 11 | 215 | 48 | 14 | 3 | 10 | 44 |
| 16 | 186 | 53 | 2 | 8 | 10 | 61 |
| 6 | 176 | 111 | 9 | 6 | 10 | 95 |
| 8 | 212 | 113 | 11 | 8 | 10 | 78 |
| 2 | 104 | 158 | 5 | 8 | 10 | 27 |
| 7 | 7 | 231 | 10 | 6 | 10 | 112 |
| 6 | 91 | 254 | 16 | 14 | 10 | 146 |
| 7 | 245 | 12 | 12 | 12 | 11 | 11 |
| 1 | 69 | 74 | 6 | 14 | 11 | 130 |
| 4 | 174 | 77 | 9 | 2 | 11 | 79 |
| 2 | 53 | 92 | 7 | 2 | 11 | 147 |
| 14 | 31 | 121 | 2 | 1 | 11 | 45 |
| 9 | 26 | 167 | 14 | 2 | 11 | 198 |
| 15 | 49 | 188 | 1 | 8 | 11 | 96 |
| 5 | 90 | 214 | 10 | 4 | 11 | 62 |
| 10 | 44 | 219 | 15 | 9 | 11 | 215 |
| 9 | 9 | 249 | 11 | 9 | 11 | 28 |
| 15 | 168 | 73 | 5 | 13 | 12 | 80 |
| 14 | 133 | 123 | 4 | 3 | 12 | 250 |
| 3 | 190 | 129 | 10 | 9 | 12 | 97 |
| 13 | 166 | 139 | 3 | 4 | 12 | 114 |
| 4 | 38 | 151 | 15 | 1 | 12 | 12 |
| 9 | 213 | 169 | 16 | 4 | 12 | 233 |
| 4 | 55 | 181 | 11 | 1 | 12 | 63 |
| 3 | 156 | 239 | 1 | 14 | 12 | 29 |
| 16 | 67 | 244 | 6 | 4 | 12 | 216 |

| index | | | | | index | |
|---|---|---|---|---|---|---|
| σ(w)(17) | σ(w) | σ(H) | σ(H)(17) | σ(H)(15) | σ(w+1)(17) | σ(w+1) |
| 7 | 160 | 67 | 16 | 7 | 13 | 81 |
| 9 | 60 | 69 | 1 | 9 | 13 | 132 |
| 10 | 146 | 70 | 2 | 10 | 13 | 217 |
| 3 | 139 | 80 | 12 | 5 | 13 | 98 |
| 11 | 96 | 88 | 3 | 13 | 13 | 251 |
| 14 | 99 | 125 | 6 | 5 | 13 | 13 |
| 16 | 101 | 195 | 8 | 0 | 13 | 47 |
| 2 | 70 | 198 | 11 | 3 | 13 | 64 |
| 6 | 244 | 202 | 15 | 7 | 13 | 234 |
| 7 | 75 | 218 | 14 | 8 | 13 | 115 |
| 4 | 123 | 234 | 13 | 9 | 13 | 183 |
| 12 | 250 | 6 | 6 | 6 | 14 | 133 |
| 9 | 162 | 37 | 3 | 7 | 14 | 65 |
| 1 | 154 | 46 | 12 | 1 | 14 | 201 |
| 16 | 152 | 94 | 9 | 4 | 14 | 48 |
| 11 | 45 | 107 | 5 | 2 | 14 | 31 |
| 2 | 87 | 166 | 13 | 1 | 14 | 167 |
| 12 | 114 | 191 | 4 | 11 | 14 | 116 |
| 13 | 13 | 211 | 7 | 1 | 14 | 99 |
| 5 | 22 | 237 | 16 | 12 | 14 | 235 |
| 13 | 132 | 252 | 14 | 12 | 14 | 14 |
| 5 | 73 | 35 | 1 | 5 | 15 | 236 |
| 10 | 197 | 40 | 6 | 10 | 15 | 49 |
| 14 | 48 | 44 | 10 | 14 | 15 | 253 |
| 16 | 33 | 63 | 12 | 3 | 15 | 15 |
| 1 | 35 | 99 | 14 | 9 | 15 | 32 |
| 3 | 122 | 101 | 16 | 11 | 15 | 117 |
| 12 | 165 | 109 | 7 | 4 | 15 | 185 |
| 2 | 189 | 117 | 15 | 12 | 15 | 219 |
| 12 | 80 | 161 | 8 | 11 | 15 | 168 |
| 13 | 30 | 162 | 9 | 12 | 15 | 66 |
| 7 | 177 | 190 | 3 | 10 | 15 | 134 |
| 8 | 178 | 225 | 4 | 0 | 15 | 151 |
| 5 | 226 | 20 | 3 | 5 | 16 | 152 |
| 7 | 24 | 22 | 5 | 7 | 16 | 254 |
| 15 | 15 | 81 | 13 | 6 | 16 | 33 |
| 12 | 216 | 95 | 10 | 5 | 16 | 67 |
| 11 | 164 | 145 | 9 | 10 | 16 | 118 |
| 9 | 145 | 177 | 7 | 12 | 16 | 16 |
| 10 | 61 | 178 | 8 | 13 | 16 | 186 |
| 6 | 210 | 182 | 12 | 2 | 16 | 220 |
| 1 | 222 | 186 | 16 | 6 | 16 | 237 |
| 6 | 40 | 208 | 4 | 13 | 16 | 84 |
| 4 | 89 | 240 | 2 | 0 | 16 | 203 |

FIG. 71A

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 3 | 33 | 63 | 12 | 3 | 0 | 15 |
| 1 | 31 | 121 | 2 | 1 | 0 | 45 |
| 8 | 113 | 10 | 10 | 10 | 1 | 76 |
| 10 | 25 | 27 | 10 | 12 | 1 | 1 |
| 13 | 43 | 30 | 13 | 0 | 1 | 121 |
| 6 | 186 | 53 | 2 | 8 | 1 | 61 |
| 6 | 171 | 83 | 15 | 8 | 1 | 211 |
| 0 | 45 | 107 | 5 | 2 | 1 | 31 |
| 14 | 29 | 136 | 0 | 1 | 1 | 91 |
| 8 | 23 | 160 | 7 | 10 | 1 | 196 |
| 10 | 145 | 177 | 7 | 12 | 1 | 16 |
| 13 | 178 | 225 | 4 | 0 | 1 | 151 |
| 6 | 51 | 17 | 0 | 2 | 2 | 107 |
| 1 | 226 | 20 | 3 | 5 | 2 | 152 |
| 5 | 50 | 54 | 3 | 9 | 2 | 2 |
| 11 | 86 | 60 | 9 | 0 | 2 | 242 |
| 1 | 46 | 65 | 14 | 5 | 2 | 137 |
| 5 | 35 | 99 | 14 | 9 | 2 | 32 |
| 2 | 2 | 102 | 0 | 12 | 2 | 17 |
| 12 | 117 | 106 | 4 | 1 | 2 | 122 |
| 12 | 87 | 166 | 13 | 1 | 2 | 167 |
| 11 | 101 | 195 | 8 | 0 | 2 | 47 |
| 0 | 90 | 214 | 10 | 4 | 2 | 62 |
| 0 | 240 | 21 | 4 | 6 | 3 | 18 |
| 2 | 77 | 23 | 6 | 8 | 3 | 228 |
| 5 | 5 | 26 | 9 | 11 | 3 | 138 |
| 0 | 15 | 81 | 13 | 6 | 3 | 33 |
| 8 | 158 | 89 | 4 | 14 | 3 | 93 |
| 2 | 152 | 94 | 9 | 4 | 3 | 48 |
| 2 | 212 | 113 | 11 | 8 | 3 | 78 |
| 11 | 161 | 122 | 3 | 2 | 3 | 108 |
| 8 | 233 | 149 | 13 | 14 | 3 | 213 |
| 5 | 80 | 161 | 8 | 11 | 3 | 168 |
| 11 | 26 | 167 | 14 | 2 | 3 | 198 |
| 3 | 183 | 174 | 4 | 9 | 3 | 123 |
| 10 | 55 | 181 | 11 | 1 | 3 | 63 |
| 4 | 124 | 229 | 8 | 4 | 3 | 3 |
| 3 | 123 | 234 | 13 | 9 | 3 | 183 |

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 11 | 71 | 34 | 0 | 4 | 4 | 109 |
| 2 | 197 | 40 | 6 | 10 | 4 | 49 |
| 9 | 174 | 77 | 9 | 2 | 4 | 79 |
| 10 | 100 | 108 | 6 | 3 | 4 | 4 |
| 7 | 172 | 120 | 1 | 0 | 4 | 229 |
| 2 | 92 | 130 | 11 | 10 | 4 | 19 |
| 7 | 202 | 135 | 16 | 0 | 4 | 94 |
| 10 | 70 | 198 | 11 | 3 | 4 | 64 |
| 4 | 4 | 204 | 0 | 9 | 4 | 34 |
| 9 | 234 | 212 | 8 | 2 | 4 | 244 |
| 12 | 162 | 37 | 3 | 7 | 5 | 65 |
| 3 | 168 | 73 | 5 | 13 | 5 | 80 |
| 12 | 42 | 82 | 14 | 7 | 5 | 20 |
| 0 | 105 | 91 | 6 | 1 | 5 | 110 |
| 0 | 165 | 109 | 7 | 4 | 5 | 185 |
| 11 | 176 | 111 | 9 | 6 | 5 | 95 |
| 3 | 138 | 148 | 12 | 13 | 5 | 5 |
| 14 | 194 | 189 | 2 | 9 | 5 | 125 |
| 14 | 44 | 219 | 15 | 9 | 5 | 215 |
| 11 | 11 | 246 | 8 | 6 | 5 | 245 |
| 0 | 225 | 42 | 8 | 12 | 6 | 36 |
| 1 | 211 | 43 | 9 | 13 | 6 | 171 |
| 4 | 154 | 46 | 12 | 1 | 6 | 201 |
| 10 | 10 | 52 | 1 | 7 | 6 | 21 |
| 10 | 160 | 67 | 16 | 7 | 6 | 81 |
| 7 | 52 | 79 | 11 | 4 | 6 | 141 |
| 5 | 170 | 85 | 0 | 10 | 6 | 51 |
| 6 | 111 | 93 | 8 | 3 | 6 | 246 |
| 0 | 30 | 162 | 9 | 12 | 6 | 66 |
| 1 | 61 | 178 | 8 | 13 | 6 | 186 |
| 4 | 49 | 188 | 1 | 8 | 6 | 96 |
| 4 | 19 | 203 | 16 | 8 | 6 | 6 |
| 6 | 246 | 213 | 9 | 3 | 6 | 111 |
| 4 | 169 | 226 | 5 | 1 | 6 | 156 |
| 7 | 67 | 244 | 6 | 4 | 6 | 216 |
| 12 | 12 | 11 | 11 | 11 | 7 | 127 |
| 10 | 235 | 24 | 7 | 9 | 7 | 22 |
| 11 | 146 | 70 | 2 | 10 | 7 | 217 |
| 6 | 216 | 95 | 10 | 5 | 7 | 67 |
| 11 | 41 | 100 | 15 | 10 | 7 | 157 |
| 6 | 66 | 126 | 7 | 6 | 7 | 7 |
| 10 | 190 | 129 | 10 | 9 | 7 | 97 |
| 12 | 192 | 176 | 6 | 11 | 7 | 247 |
| 7 | 7 | 231 | 10 | 6 | 7 | 112 |
| 6 | 141 | 245 | 7 | 5 | 7 | 52 |
| 3 | 78 | 247 | 9 | 7 | 7 | 142 |
| 12 | 147 | 253 | 15 | 13 | 7 | 37 |

FIG. 71B

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 4 | 184 | 5 | 5 | 5 | 8 | 38 |
| 14 | 149 | 15 | 15 | 0 | 8 | 188 |
| 7 | 142 | 68 | 0 | 8 | 8 | 173 |
| 4 | 139 | 80 | 12 | 5 | 8 | 98 |
| 5 | 140 | 141 | 5 | 6 | 8 | 128 |
| 8 | 8 | 153 | 0 | 3 | 8 | 68 |
| 3 | 93 | 154 | 1 | 4 | 8 | 158 |
| 3 | 213 | 169 | 16 | 4 | 8 | 233 |
| 5 | 200 | 216 | 12 | 6 | 8 | 8 |
| 14 | 89 | 240 | 2 | 0 | 8 | 203 |
| 2 | 62 | 242 | 4 | 2 | 8 | 23 |
| 10 | 130 | 13 | 13 | 13 | 9 | 69 |
| 1 | 76 | 47 | 13 | 2 | 9 | 24 |
| 13 | 208 | 61 | 10 | 1 | 9 | 54 |
| 9 | 219 | 87 | 2 | 12 | 9 | 189 |
| 9 | 189 | 117 | 15 | 12 | 9 | 219 |
| 0 | 120 | 138 | 2 | 3 | 9 | 9 |
| 1 | 166 | 139 | 3 | 4 | 9 | 114 |
| 0 | 135 | 168 | 15 | 3 | 9 | 144 |
| 4 | 79 | 172 | 2 | 7 | 9 | 174 |
| 1 | 106 | 184 | 14 | 4 | 9 | 39 |
| 4 | 244 | 202 | 15 | 7 | 9 | 234 |
| 10 | 40 | 208 | 4 | 13 | 9 | 84 |
| 13 | 13 | 211 | 7 | 1 | 9 | 99 |
| 6 | 21 | 41 | 7 | 11 | 10 | 10 |
| 1 | 1 | 51 | 0 | 6 | 10 | 25 |
| 9 | 69 | 74 | 6 | 14 | 10 | 130 |
| 13 | 133 | 123 | 4 | 3 | 10 | 250 |
| 6 | 81 | 146 | 10 | 11 | 10 | 160 |
| 9 | 84 | 164 | 11 | 14 | 10 | 40 |
| 3 | 63 | 173 | 3 | 8 | 10 | 55 |
| 0 | 210 | 182 | 12 | 2 | 10 | 220 |
| 13 | 88 | 183 | 13 | 3 | 10 | 175 |
| 0 | 75 | 218 | 14 | 8 | 10 | 115 |
| 7 | 97 | 222 | 1 | 12 | 10 | 190 |
| 7 | 22 | 237 | 16 | 12 | 10 | 235 |

| index | | | | | index | |
|---|---|---|---|---|---|---|
| σ(w)(15) | σ(w) | σ(H) | σ(H)(17) | σ(H)(15) | σ(w+1)(15) | σ(w+1) |
| 5 | 245 | 12 | 12 | 12 | 11 | 11 |
| 13 | 73 | 35 | 1 | 5 | 11 | 236 |
| 13 | 148 | 50 | 16 | 5 | 11 | 206 |
| 6 | 96 | 88 | 3 | 13 | 11 | 251 |
| 6 | 6 | 133 | 14 | 13 | 11 | 191 |
| 13 | 28 | 159 | 6 | 9 | 11 | 86 |
| 3 | 108 | 175 | 5 | 10 | 11 | 161 |
| 9 | 114 | 191 | 4 | 11 | 11 | 116 |
| 5 | 95 | 192 | 5 | 12 | 11 | 176 |
| 3 | 18 | 243 | 5 | 3 | 11 | 56 |
| 3 | 198 | 250 | 12 | 10 | 11 | 26 |
| 9 | 39 | 251 | 13 | 11 | 11 | 71 |
| 1 | 91 | 254 | 16 | 14 | 11 | 146 |
| 0 | 60 | 69 | 1 | 9 | 12 | 132 |
| 0 | 195 | 84 | 16 | 9 | 12 | 72 |
| 2 | 167 | 86 | 1 | 11 | 12 | 87 |
| 8 | 53 | 92 | 7 | 2 | 12 | 147 |
| 2 | 122 | 101 | 16 | 11 | 12 | 117 |
| 5 | 20 | 104 | 2 | 14 | 12 | 42 |
| 5 | 65 | 134 | 15 | 14 | 12 | 162 |
| 8 | 38 | 151 | 15 | 1 | 12 | 12 |
| 14 | 104 | 158 | 5 | 8 | 12 | 27 |
| 10 | 85 | 170 | 0 | 5 | 12 | 102 |
| 12 | 237 | 171 | 1 | 6 | 12 | 222 |
| 12 | 222 | 186 | 16 | 6 | 12 | 237 |
| 8 | 83 | 197 | 10 | 2 | 12 | 57 |
| 14 | 134 | 233 | 12 | 8 | 12 | 177 |
| 10 | 250 | 6 | 6 | 6 | 13 | 133 |
| 14 | 74 | 25 | 8 | 10 | 13 | 103 |
| 3 | 48 | 44 | 10 | 14 | 13 | 253 |
| 10 | 175 | 96 | 11 | 6 | 13 | 88 |
| 9 | 99 | 125 | 6 | 5 | 13 | 13 |
| 8 | 173 | 127 | 8 | 7 | 13 | 73 |
| 14 | 164 | 145 | 9 | 10 | 13 | 118 |
| 3 | 3 | 194 | 7 | 14 | 13 | 223 |
| 14 | 14 | 207 | 3 | 12 | 13 | 43 |
| 9 | 54 | 215 | 11 | 5 | 13 | 208 |
| 12 | 57 | 223 | 2 | 13 | 13 | 58 |
| 9 | 9 | 249 | 11 | 9 | 13 | 28 |
| 5 | 125 | 3 | 3 | 3 | 14 | 194 |
| 9 | 24 | 22 | 5 | 7 | 14 | 254 |
| 5 | 215 | 48 | 14 | 3 | 14 | 44 |
| 9 | 129 | 97 | 12 | 7 | 14 | 239 |
| 7 | 37 | 140 | 4 | 5 | 14 | 179 |
| 12 | 177 | 190 | 3 | 10 | 14 | 134 |
| 7 | 82 | 200 | 13 | 5 | 14 | 59 |
| 12 | 27 | 235 | 14 | 10 | 14 | 104 |
| 6 | 156 | 239 | 1 | 14 | 14 | 29 |
| 12 | 132 | 252 | 14 | 12 | 14 | 14 |

FIG. 73
index(17),(15) & Latch
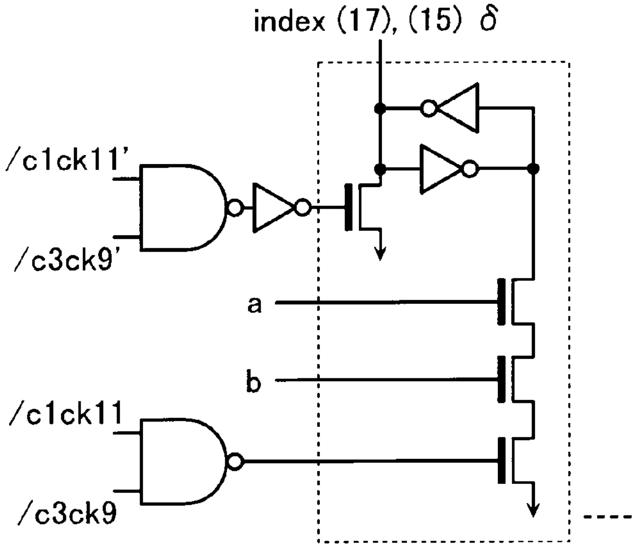
index (17)
| | | | | | | | | | | | | | | | | | |
|---|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 | 16 |
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |
index (15)
| | | | | | | | | | | | | | | | |
|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 |
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |
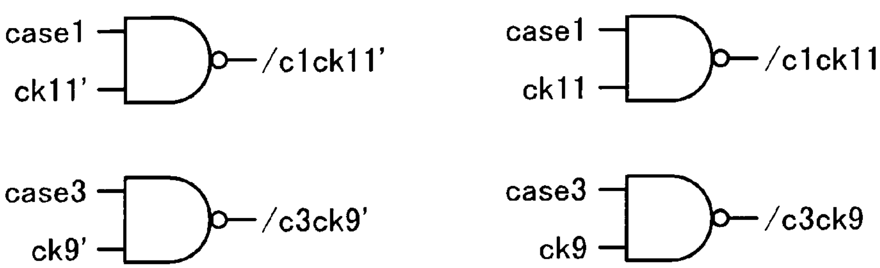

FIG. 80
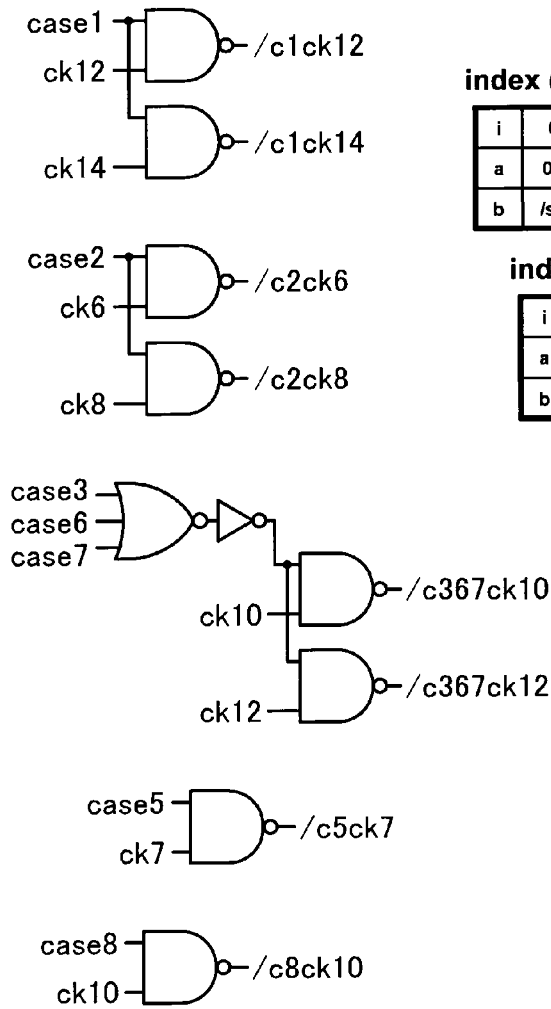
index(17),(15) &Latch
index (17)
| | | | | | | | | | | | | | | | | | |
|---|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 | 16 |
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |
index (15)
| | | | | | | | | | | | | | | | |
|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 |
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |
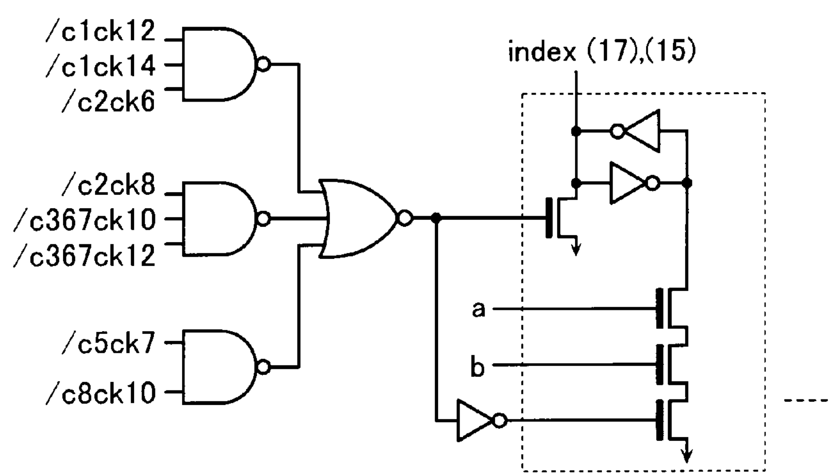

FIG. 81A

| $\sigma(y)$ | $\sigma(L)$ | $\sigma(L)$ | $\sigma(y)$ |
|---|---|---|---|
| y=0 | L=0 | L=0 | y=0 |
| 0 | L=0 | | 0 |
| 1 | 26 | 0 | 85 |
| 2 | 52 | | 170 |
| 3 | 226 | 1 | 11 |
| 4 | 104 | | 245 |
| 5 | 143 | 2 | 22 |
| 6 | 197 | | 235 |
| 7 | 119 | 3 | 18 |
| 8 | 208 | | 240 |
| 9 | 129 | 4 | 44 |
| 10 | 31 | | 215 |
| 11 | 1 | 6 | 36 |
| 12 | 139 | | 225 |
| 13 | 112 | 7 | 54 |
| 14 | 238 | | 208 |
| 15 | 48 | 8 | 88 |
| 16 | 161 | | 175 |
| 17 | 85 | 12 | 72 |
| 18 | 3 | | 195 |
| 19 | 111 | 13 | 128 |
| 20 | 62 | | 140 |
| 21 | 31 | 14 | 108 |
| 22 | 2 | | 161 |
| 23 | 219 | 16 | 95 |
| 24 | 23 | | 176 |
| 25 | 26 | 17 | 119 |
| 26 | 224 | | 153 |
| 27 | 131 | 19 | 75 |
| 28 | 221 | | 199 |
| 29 | 210 | 23 | 24 |
| 30 | 96 | | 254 |
| 31 | 76 | 24 | 135 |
| 32 | 67 | | 144 |
| 33 | 48 | 25 | 114 |
| 34 | 170 | | 166 |
| 35 | 67 | 26 | 1 |
| 36 | 6 | | 25 |
| 37 | 216 | 27 | 118 |
| 38 | 222 | | 164 |
| 39 | 145 | 28 | 67 |
| 40 | 124 | | 216 |
| 41 | 198 | 31 | 10 |
| 42 | 62 | | 21 |
| 43 | 164 | 32 | 97 |
| 44 | 4 | | 190 |
| 45 | 76 | 34 | 51 |
| 46 | 183 | | 238 |
| 47 | 148 | 35 | 78 |
| 48 | 46 | | 212 |
| 49 | 246 | 37 | 89 |
| 50 | 52 | | 203 |

| $\sigma(y)$ | $\sigma(L)$ | $\sigma(L)$ | $\sigma(y)$ |
|---|---|---|---|
| 51 | 34 | 38 | 143 |
| 52 | 193 | | 150 |
| 53 | 200 | 41 | 94 |
| 54 | 7 | | 202 |
| 55 | 118 | 45 | 91 |
| 56 | 187 | | 209 |
| 57 | 140 | 46 | 48 |
| 58 | 165 | | 253 |
| 59 | 141 | 48 | 15 |
| 60 | 192 | | 33 |
| 61 | 247 | 49 | 124 |
| 62 | 152 | | 180 |
| 63 | 118 | 50 | 77 |
| 64 | 134 | | 228 |
| 65 | 227 | 51 | 123 |
| 66 | 96 | | 183 |
| 67 | 28 | 52 | 2 |
| 68 | 85 | | 50 |
| 69 | 199 | 54 | 73 |
| 70 | 134 | | 236 |
| 71 | 180 | 56 | 134 |
| 72 | 12 | | 177 |
| 73 | 54 | 59 | 155 |
| 74 | 177 | | 159 |
| 75 | 19 | 62 | 20 |
| 76 | 189 | | 42 |
| 77 | 50 | 64 | 125 |
| 78 | 35 | | 194 |
| 79 | 253 | 67 | 32 |
| 80 | 248 | | 35 |
| 81 | 241 | 68 | 102 |
| 82 | 141 | | 221 |
| 83 | 140 | 70 | 156 |
| 84 | 124 | | 169 |
| 85 | 0 | 73 | 86 |
| 86 | 73 | | 242 |
| 87 | 254 | 74 | 151 |
| 88 | 8 | | 178 |
| 89 | 37 | 75 | 116 |
| 90 | 152 | | 214 |
| 91 | 45 | 76 | 31 |
| 92 | 111 | | 45 |
| 93 | 251 | 82 | 149 |
| 94 | 41 | | 188 |
| 95 | 16 | 85 | 17 |
| 96 | 92 | | 68 |
| 97 | 32 | 90 | 163 |
| 98 | 237 | | 182 |
| 99 | 112 | 92 | 96 |
| 100 | 104 | | 251 |
| 101 | 148 | 96 | 30 |
| 102 | 68 | | 66 |

FIG. 81B

| σ(y) | σ(L) | σ(L) | σ(y) |
|---|---|---|---|
| 103 | 177 | 98 | 105 |
| 104 | 131 | | 248 |
| 105 | 98 | 99 | 148 |
| 106 | 145 | | 206 |
| 107 | 165 | 100 | 154 |
| 108 | 14 | | 201 |
| 109 | 180 | 102 | 111 |
| 110 | 236 | | 246 |
| 111 | 102 | 103 | 115 |
| 112 | 119 | | 243 |
| 113 | 189 | 104 | 4 |
| 114 | 25 | | 100 |
| 115 | 103 | 105 | 142 |
| 116 | 75 | | 218 |
| 117 | 239 | 108 | 146 |
| 118 | 27 | | 217 |
| 119 | 17 | 111 | 19 |
| 120 | 129 | | 92 |
| 121 | 164 | 112 | 13 |
| 122 | 239 | | 99 |
| 123 | 51 | 113 | 129 |
| 124 | 49 | | 239 |
| 125 | 64 | 118 | 55 |
| 126 | 236 | | 63 |
| 127 | 139 | 119 | 7 |
| 128 | 13 | | 112 |
| 129 | 113 | 123 | 152 |
| 130 | 199 | | 226 |
| 131 | 187 | 124 | 40 |
| 132 | 192 | | 84 |
| 133 | 128 | 127 | 171 |
| 134 | 56 | | 211 |
| 135 | 24 | 128 | 133 |
| 136 | 170 | | 250 |
| 137 | 183 | 129 | 9 |
| 138 | 143 | | 120 |
| 139 | 237 | 131 | 27 |
| 140 | 13 | | 104 |
| 141 | 193 | 134 | 64 |
| 142 | 105 | | 70 |
| 143 | 38 | 136 | 187 |
| 144 | 24 | | 204 |
| 145 | 161 | 137 | 165 |
| 146 | 108 | | 227 |
| 147 | 200 | 139 | 12 |
| 148 | 99 | | 127 |
| 149 | 82 | 140 | 57 |
| 150 | 38 | | 83 |
| 151 | 74 | 141 | 59 |
| 152 | 123 | | 82 |
| 153 | 17 | 143 | 5 |
| 154 | 100 | | 138 |

| σ(y) | σ(L) | σ(L) | σ(y) |
|---|---|---|---|
| 155 | 59 | 145 | 39 |
| 156 | 70 | | 106 |
| 157 | 198 | 146 | 172 |
| 158 | 251 | | 229 |
| 159 | 59 | 148 | 47 |
| 160 | 241 | | 101 |
| 161 | 14 | 150 | 173 |
| 162 | 227 | | 232 |
| 163 | 90 | 152 | 62 |
| 164 | 27 | | 90 |
| 165 | 137 | 153 | 189 |
| 166 | 25 | | 219 |
| 167 | 254 | 157 | 205 |
| 168 | 248 | | 207 |
| 169 | 70 | 161 | 16 |
| 170 | 0 | | 145 |
| 171 | 127 | 164 | 43 |
| 172 | 146 | | 121 |
| 173 | 150 | 165 | 58 |
| 174 | 253 | | 107 |
| 175 | 8 | 170 | 34 |
| 176 | 16 | | 136 |
| 177 | 56 | 177 | 74 |
| 178 | 74 | | 103 |
| 179 | 216 | 179 | 185 |
| 180 | 49 | | 249 |
| 181 | 210 | 180 | 71 |
| 182 | 90 | | 109 |
| 183 | 51 | 183 | 46 |
| 184 | 222 | | 137 |
| 185 | 179 | 184 | 192 |
| 186 | 247 | | 247 |
| 187 | 136 | 187 | 56 |
| 188 | 82 | | 131 |
| 189 | 153 | 189 | 76 |
| 190 | 32 | | 113 |
| 191 | 197 | 191 | 213 |
| 192 | 184 | | 233 |
| 193 | 221 | 192 | 60 |
| 194 | 64 | | 132 |
| 195 | 12 | 193 | 52 |
| 196 | 219 | | 141 |
| 197 | 246 | 196 | 210 |
| 198 | 224 | | 241 |
| 199 | 19 | 197 | 6 |
| 200 | 208 | | 191 |
| 201 | 100 | 198 | 41 |
| 202 | 41 | | 157 |
| 203 | 37 | 199 | 69 |
| 204 | 136 | | 130 |
| 205 | 157 | 200 | 53 |
| 206 | 99 | | 147 |

FIG. 81C

| σ(y) | σ(L) | σ(L) | σ(y) |
|---|---|---|---|
| 207 | 157 | 204 | 222 |
| 208 | 7 | | 237 |
| 209 | 45 | 206 | 230 |
| 210 | 196 | | 231 |
| 211 | 127 | 208 | 8 |
| 212 | 35 | | 200 |
| 213 | 191 | 210 | 29 |
| 214 | 75 | | 181 |
| 215 | 4 | 216 | 37 |
| 216 | 28 | | 179 |
| 217 | 108 | 217 | 220 |
| 218 | 105 | | 252 |
| 219 | 153 | 219 | 23 |
| 220 | 217 | | 196 |
| 221 | 68 | 221 | 28 |
| 222 | 204 | | 193 |
| 223 | 226 | 222 | 38 |
| 224 | 238 | | 184 |
| 225 | 6 | 223 | 234 |
| 226 | 123 | | 244 |
| 227 | 137 | 224 | 26 |
| 228 | 50 | | 198 |
| 229 | 146 | 226 | 3 |
| 230 | 206 | | 223 |
| 231 | 206 | 227 | 65 |
| 232 | 150 | | 162 |
| 233 | 191 | 236 | 110 |
| 234 | 223 | | 126 |
| 235 | 2 | 237 | 98 |
| 236 | 54 | | 139 |
| 237 | 204 | 238 | 14 |
| 238 | 34 | | 224 |
| 239 | 113 | 239 | 117 |
| 240 | 3 | | 122 |
| 241 | 196 | 241 | 81 |
| 242 | 73 | | 160 |
| 243 | 103 | 246 | 49 |
| 244 | 223 | | 197 |
| 245 | 1 | 247 | 61 |
| 246 | 102 | | 186 |
| 247 | 184 | 248 | 80 |
| 248 | 98 | | 168 |
| 249 | 179 | 251 | 93 |
| 250 | 128 | | 158 |
| 251 | 92 | 253 | 79 |
| 252 | 217 | | 174 |
| 253 | 46 | 254 | 87 |
| 254 | 23 | | 167 |
| | | | |
| | | | |
| | | | |
| | | | |

FIG. 82A

| index | | σ(y)(17) | | | | |
|---|---|---|---|---|---|---|
| σ(y)(17) | σ(y) | bs1 | bs2 | σ(L) | σ(L)(17) | σ(L)(15) |
| zero | y=0 | | zero | L=0 | zero | zero |
| 0 | 0 | 0 | | L=0 | zero | zero |
| 0 | 85 | 0 | | 0 | 0 | 0 |
| 0 | 187 | 0 | | 136 | 0 | 1 |
| 0 | 119 | 0 | | 17 | 0 | 2 |
| 0 | 51 | 0 | | 34 | 0 | 4 |
| 0 | 34 | 0 | | 170 | 0 | 5 |
| 0 | 102 | 0 | | 68 | 0 | 8 |
| 0 | 17 | 0 | | 85 | 0 | 10 |
| 0 | 170 | | 0 | 0 | 0 | 0 |
| 0 | 204 | | 0 | 136 | 0 | 1 |
| 0 | 153 | | 0 | 17 | 0 | 2 |
| 0 | 238 | | 0 | 34 | 0 | 4 |
| 0 | 136 | | 0 | 170 | 0 | 5 |
| 0 | 221 | | 0 | 68 | 0 | 8 |
| 0 | 68 | | 0 | 85 | 0 | 10 |
| 1 | 222 | 1 | | 204 | 0 | 9 |
| 1 | 18 | 1 | | 3 | 3 | 3 |
| 1 | 205 | 1 | | 157 | 4 | 7 |
| 1 | 86 | 1 | | 73 | 5 | 13 |
| 1 | 52 | 1 | | 193 | 6 | 13 |
| 1 | 171 | 1 | | 127 | 8 | 7 |
| 1 | 1 | 1 | | 26 | 9 | 11 |
| 1 | 69 | 1 | | 199 | 12 | 4 |
| 1 | 154 | 1 | | 100 | 15 | 10 |
| 1 | 103 | | 1 | 177 | 7 | 12 |
| 1 | 120 | | 1 | 129 | 10 | 9 |
| 1 | 239 | | 1 | 113 | 11 | 8 |
| 1 | 137 | | 1 | 183 | 13 | 3 |
| 1 | 188 | | 1 | 82 | 14 | 7 |
| 1 | 35 | | 1 | 67 | 16 | 7 |
| 2 | 189 | 2 | | 153 | 0 | 3 |
| 2 | 2 | 2 | | 52 | 1 | 7 |
| 2 | 36 | 2 | | 6 | 6 | 6 |
| 2 | 155 | 2 | | 59 | 8 | 14 |
| 2 | 19 | 2 | | 111 | 9 | 6 |
| 2 | 172 | 2 | | 146 | 10 | 11 |
| 2 | 53 | 2 | | 200 | 13 | 5 |
| 2 | 87 | 2 | | 254 | 16 | 14 |
| 2 | 240 | | 2 | 3 | 3 | 3 |
| 2 | 223 | | 2 | 226 | 5 | 1 |
| 2 | 138 | | 2 | 143 | 7 | 8 |
| 2 | 121 | | 2 | 164 | 11 | 14 |
| 2 | 104 | | 2 | 131 | 12 | 11 |
| 2 | 206 | | 2 | 99 | 14 | 9 |
| 2 | 70 | | 2 | 134 | 15 | 14 |
| 3 | 156 | 3 | | 70 | 2 | 10 |
| 3 | 3 | 3 | | 226 | 5 | 1 |
| 3 | 54 | 3 | | 7 | 7 | 7 |
| 3 | 88 | 3 | | 8 | 8 | 8 |
| 3 | 71 | 3 | | 180 | 10 | 0 |
| 3 | 20 | 3 | | 62 | 11 | 2 |
| 3 | 37 | 3 | | 216 | 12 | 6 |
| 3 | 105 | 3 | | 98 | 13 | 8 |
| 3 | 173 | 3 | | 150 | 14 | 0 |
| 3 | 224 | | 3 | 238 | 0 | 13 |
| 3 | 122 | | 3 | 239 | 1 | 14 |
| 3 | 207 | | 3 | 157 | 4 | 7 |
| 3 | 241 | | 3 | 196 | 9 | 1 |
| 3 | 190 | | 3 | 32 | 15 | 2 |
| 3 | 139 | | 3 | 237 | 16 | 12 |

| index | | σ(y)(17) | | | | |
|---|---|---|---|---|---|---|
| σ(y)(17) | σ(y) | bs1 | bs2 | σ(L) | σ(L)(17) | σ(L)(15) |
| 4 | 123 | 4 | | 51 | 0 | 6 |
| 4 | 38 | 4 | | 222 | 1 | 12 |
| 4 | 4 | 4 | | 104 | 2 | 14 |
| 4 | 89 | 4 | | 37 | 3 | 7 |
| 4 | 72 | 4 | | 12 | 12 | 12 |
| 4 | 55 | 4 | | 118 | 16 | 13 |
| 4 | 242 | | 4 | 73 | 5 | 13 |
| 4 | 225 | | 4 | 6 | 6 | 6 |
| 4 | 208 | | 4 | 7 | 7 | 7 |
| 4 | 106 | | 4 | 145 | 9 | 10 |
| 4 | 191 | | 4 | 197 | 10 | 2 |
| 4 | 157 | | 4 | 198 | 11 | 3 |
| 4 | 140 | | 4 | 13 | 13 | 13 |
| 4 | 21 | | 4 | 31 | 14 | 1 |
| 4 | 174 | | 4 | 253 | 15 | 13 |
| 5 | 56 | 5 | | 187 | 0 | 7 |
| 5 | 22 | 5 | | 2 | 2 | 2 |
| 5 | 73 | 5 | | 54 | 3 | 9 |
| 5 | 5 | 5 | | 143 | 7 | 8 |
| 5 | 39 | 5 | | 145 | 9 | 10 |
| 5 | 192 | 5 | | 184 | 14 | 4 |
| 5 | 124 | 5 | | 49 | 15 | 4 |
| 5 | 243 | | 5 | 103 | 1 | 13 |
| 5 | 226 | | 5 | 123 | 4 | 3 |
| 5 | 141 | | 5 | 193 | 6 | 13 |
| 5 | 175 | | 5 | 8 | 8 | 8 |
| 5 | 209 | | 5 | 45 | 11 | 0 |
| 5 | 107 | | 5 | 165 | 12 | 0 |
| 5 | 158 | | 5 | 251 | 13 | 11 |
| 5 | 90 | | 5 | 152 | 16 | 2 |
| 6 | 142 | 6 | | 105 | 3 | 0 |
| 6 | 57 | 6 | | 140 | 4 | 5 |
| 6 | 40 | 6 | | 124 | 5 | 4 |
| 6 | 74 | 6 | | 177 | 7 | 12 |
| 6 | 210 | 6 | | 196 | 9 | 1 |
| 6 | 6 | 6 | | 197 | 10 | 2 |
| 6 | 91 | 6 | | 45 | 11 | 0 |
| 6 | 125 | 6 | | 64 | 13 | 4 |
| 6 | 108 | 6 | | 14 | 14 | 14 |
| 6 | 23 | 6 | | 219 | 15 | 9 |
| 6 | 193 | | 6 | 221 | 0 | 11 |
| 6 | 227 | | 6 | 137 | 1 | 2 |
| 6 | 244 | | 6 | 223 | 2 | 13 |
| 6 | 159 | | 6 | 59 | 8 | 14 |
| 6 | 176 | | 6 | 16 | 16 | 1 |
| 7 | 7 | 7 | | 119 | 0 | 14 |
| 7 | 75 | 7 | | 19 | 2 | 4 |
| 7 | 143 | 7 | | 38 | 4 | 8 |
| 7 | 24 | 7 | | 23 | 6 | 8 |
| 7 | 41 | 7 | | 198 | 11 | 3 |
| 7 | 58 | 7 | | 165 | 12 | 0 |
| 7 | 245 | | 7 | 1 | 1 | 1 |
| 7 | 160 | | 7 | 241 | 3 | 1 |
| 7 | 177 | | 7 | 56 | 5 | 11 |
| 7 | 211 | | 7 | 127 | 8 | 7 |
| 7 | 92 | | 7 | 111 | 9 | 6 |
| 7 | 109 | | 7 | 180 | 10 | 0 |
| 7 | 194 | | 7 | 64 | 13 | 4 |
| 7 | 126 | | 7 | 236 | 15 | 11 |
| 7 | 228 | | 7 | 50 | 16 | 5 |

FIG. 82B

| index | | σ(y)(17) | | | | |
|---|---|---|---|---|---|---|
| σ(y)(17) | σ(y) | bs1 | bs2 | σ(L) | σ(L)(17) | σ(L)(15) |
| 8 | 76 | 8 | | 189 | 2 | 9 |
| 8 | 8 | 8 | | 208 | 4 | 13 |
| 8 | 59 | 8 | | 141 | 5 | 6 |
| 8 | 93 | 8 | | 251 | 13 | 11 |
| 8 | 110 | 8 | | 236 | 15 | 11 |
| 8 | 246 | | 8 | 102 | 0 | 12 |
| 8 | 212 | | 8 | 35 | 1 | 5 |
| 8 | 127 | | 8 | 139 | 3 | 4 |
| 8 | 178 | | 8 | 74 | 6 | 14 |
| 8 | 144 | | 8 | 24 | 7 | 9 |
| 8 | 25 | | 8 | 26 | 9 | 11 |
| 8 | 229 | | 8 | 146 | 10 | 11 |
| 8 | 42 | | 8 | 62 | 11 | 2 |
| 8 | 195 | | 8 | 12 | 12 | 12 |
| 8 | 161 | | 8 | 14 | 14 | 14 |
| 9 | 111 | 9 | | 102 | 0 | 12 |
| 9 | 230 | 9 | | 206 | 2 | 11 |
| 9 | 26 | 9 | | 224 | 3 | 14 |
| 9 | 213 | 9 | | 191 | 4 | 11 |
| 9 | 60 | 9 | | 192 | 5 | 12 |
| 9 | 94 | 9 | | 41 | 7 | 11 |
| 9 | 9 | 9 | | 129 | 10 | 9 |
| 9 | 43 | 9 | | 164 | 11 | 14 |
| 9 | 128 | 9 | | 13 | 13 | 13 |
| 9 | 77 | 9 | | 50 | 16 | 5 |
| 9 | 162 | | 9 | 227 | 6 | 2 |
| 9 | 145 | | 9 | 161 | 8 | 11 |
| 9 | 179 | | 9 | 216 | 12 | 6 |
| 9 | 247 | | 9 | 184 | 14 | 4 |
| 9 | 196 | | 9 | 219 | 15 | 9 |
| 10 | 78 | 10 | | 35 | 1 | 5 |
| 10 | 44 | 10 | | 4 | 4 | 4 |
| 10 | 163 | 10 | | 90 | 5 | 0 |
| 10 | 146 | 10 | | 108 | 6 | 3 |
| 10 | 61 | 10 | | 247 | 9 | 7 |
| 10 | 129 | 10 | | 113 | 11 | 8 |
| 10 | 27 | 10 | | 131 | 12 | 11 |
| 10 | 10 | 10 | | 31 | 14 | 1 |
| 10 | 95 | 10 | | 16 | 16 | 1 |
| 10 | 112 | | 10 | 119 | 0 | 14 |
| 10 | 231 | | 10 | 206 | 2 | 11 |
| 10 | 214 | | 10 | 75 | 7 | 0 |
| 10 | 197 | | 10 | 246 | 8 | 6 |
| 10 | 248 | | 10 | 98 | 13 | 8 |
| 10 | 180 | | 10 | 49 | 15 | 4 |
| 11 | 28 | 11 | | 221 | 0 | 11 |
| 11 | 11 | 11 | | 1 | 1 | 1 |
| 11 | 96 | 11 | | 92 | 7 | 2 |
| 11 | 79 | 11 | | 253 | 15 | 13 |
| 11 | 62 | 11 | | 152 | 16 | 2 |
| 11 | 113 | | 11 | 189 | 2 | 9 |
| 11 | 198 | | 11 | 224 | 3 | 14 |
| 11 | 215 | | 11 | 4 | 4 | 4 |
| 11 | 181 | | 11 | 210 | 6 | 0 |
| 11 | 45 | | 11 | 76 | 8 | 1 |
| 11 | 249 | | 11 | 179 | 9 | 14 |
| 11 | 164 | | 11 | 27 | 10 | 12 |
| 11 | 130 | | 11 | 199 | 12 | 4 |
| 11 | 147 | | 11 | 200 | 13 | 5 |
| 11 | 232 | | 11 | 150 | 14 | 0 |

| index | | σ(y)(17) | | | | |
|---|---|---|---|---|---|---|
| σ(y)(17) | σ(y) | bs1 | bs2 | σ(L) | σ(L)(17) | σ(L)(15) |
| 12 | 165 | 12 | | 137 | 1 | 2 |
| 12 | 12 | 12 | | 139 | 3 | 4 |
| 12 | 29 | 12 | | 210 | 6 | 0 |
| 12 | 114 | 12 | | 25 | 8 | 10 |
| 12 | 80 | 12 | | 248 | 10 | 8 |
| 12 | 46 | 12 | | 183 | 13 | 3 |
| 12 | 148 | 12 | | 99 | 14 | 9 |
| 12 | 97 | 12 | | 32 | 15 | 2 |
| 12 | 131 | | 12 | 187 | 0 | 7 |
| 12 | 199 | | 12 | 19 | 2 | 4 |
| 12 | 233 | | 12 | 191 | 4 | 11 |
| 12 | 182 | | 12 | 90 | 5 | 0 |
| 12 | 250 | | 12 | 128 | 9 | 8 |
| 12 | 216 | | 12 | 28 | 11 | 13 |
| 12 | 63 | | 12 | 118 | 16 | 13 |
| 13 | 115 | 13 | | 103 | 1 | 13 |
| 13 | 234 | 13 | | 223 | 2 | 13 |
| 13 | 81 | 13 | | 241 | 3 | 1 |
| 13 | 13 | 13 | | 112 | 10 | 7 |
| 13 | 30 | 13 | | 96 | 11 | 6 |
| 13 | 47 | 13 | | 148 | 12 | 13 |
| 13 | 149 | 13 | | 82 | 14 | 7 |
| 13 | 64 | 13 | | 134 | 15 | 14 |
| 13 | 98 | 13 | | 237 | 16 | 12 |
| 13 | 183 | | 13 | 51 | 0 | 6 |
| 13 | 200 | | 13 | 208 | 4 | 13 |
| 13 | 132 | | 13 | 192 | 5 | 12 |
| 13 | 217 | | 13 | 108 | 6 | 3 |
| 13 | 251 | | 13 | 92 | 7 | 2 |
| 13 | 166 | | 13 | 25 | 8 | 10 |
| 14 | 14 | 14 | | 238 | 0 | 13 |
| 14 | 65 | 14 | | 227 | 6 | 2 |
| 14 | 116 | 14 | | 75 | 7 | 0 |
| 14 | 31 | 14 | | 76 | 8 | 1 |
| 14 | 133 | 14 | | 128 | 9 | 8 |
| 14 | 48 | 14 | | 46 | 12 | 1 |
| 14 | 184 | | 14 | 222 | 1 | 12 |
| 14 | 235 | | 14 | 2 | 2 | 2 |
| 14 | 218 | | 14 | 105 | 3 | 0 |
| 14 | 150 | | 14 | 38 | 4 | 8 |
| 14 | 82 | | 14 | 141 | 5 | 6 |
| 14 | 99 | | 14 | 112 | 10 | 7 |
| 14 | 252 | | 14 | 217 | 13 | 7 |
| 14 | 201 | | 14 | 100 | 15 | 10 |
| 14 | 167 | | 14 | 254 | 16 | 14 |
| 15 | 117 | 15 | | 239 | 1 | 14 |
| 15 | 134 | 15 | | 56 | 5 | 11 |
| 15 | 151 | 15 | | 74 | 6 | 14 |
| 15 | 49 | 15 | | 246 | 8 | 6 |
| 15 | 185 | 15 | | 179 | 9 | 14 |
| 15 | 15 | 15 | | 48 | 14 | 3 |
| 15 | 32 | 15 | | 67 | 16 | 7 |
| 15 | 219 | | 15 | 153 | 0 | 3 |
| 15 | 100 | | 15 | 104 | 2 | 14 |
| 15 | 236 | | 15 | 54 | 3 | 9 |
| 15 | 83 | | 15 | 140 | 4 | 5 |
| 15 | 202 | | 15 | 41 | 7 | 11 |
| 15 | 168 | | 15 | 248 | 10 | 8 |
| 15 | 66 | | 15 | 96 | 11 | 6 |
| 15 | 253 | | 15 | 46 | 12 | 1 |

FIG. 82C

| index | | σ(y)(17) | | | | |
|---|---|---|---|---|---|---|
| σ(y)(17) | σ(y) | bs1 | bs2 | σ(L) | σ(L)(17) | σ(L)(15) |
| 16 | 152 | 16 | | 123 | 4 | 3 |
| 16 | 135 | 16 | | 24 | 7 | 9 |
| 16 | 16 | 16 | | 161 | 8 | 11 |
| 16 | 118 | 16 | | 27 | 10 | 12 |
| 16 | 67 | 16 | | 28 | 11 | 13 |
| 16 | 220 | 16 | | 217 | 13 | 7 |
| 16 | 237 | | 16 | 204 | 0 | 9 |
| 16 | 50 | | 16 | 52 | 1 | 7 |
| 16 | 169 | | 16 | 70 | 2 | 10 |
| 16 | 203 | | 16 | 37 | 3 | 7 |
| 16 | 84 | | 16 | 124 | 5 | 4 |
| 16 | 254 | | 16 | 23 | 6 | 8 |
| 16 | 186 | | 16 | 247 | 9 | 7 |
| 16 | 101 | | 16 | 148 | 12 | 13 |
| 16 | 33 | | 16 | 48 | 14 | 3 |

FIG. 83A

| index | | σ(y)(15) | | | | |
|---|---|---|---|---|---|---|
| σ(y)(15) | σ(y) | bs1 | bs2 | σ(L) | σ(L)(17) | σ(L)(15) |
| zero | y=0 | | zero | L=0 | zero | zero |
| 0 | 0 | 0 | | L=0 | zero | zero |
| 0 | 165 | 0 | | 137 | 1 | 2 |
| 0 | 75 | 0 | | 19 | 2 | 4 |
| 0 | 60 | 0 | | 192 | 5 | 12 |
| 0 | 135 | 0 | | 24 | 7 | 9 |
| 0 | 210 | 0 | | 196 | 9 | 1 |
| 0 | 30 | 0 | | 96 | 11 | 6 |
| 0 | 105 | 0 | | 98 | 13 | 8 |
| 0 | 15 | 0 | | 48 | 14 | 3 |
| 0 | 240 | | 0 | 3 | 3 | 3 |
| 0 | 150 | | 0 | 38 | 4 | 8 |
| 0 | 225 | | 0 | 6 | 6 | 6 |
| 0 | 45 | | 0 | 76 | 8 | 1 |
| 0 | 120 | | 0 | 129 | 10 | 9 |
| 0 | 195 | | 0 | 12 | 12 | 12 |
| 0 | 180 | | 0 | 49 | 15 | 4 |
| 0 | 90 | | 0 | 152 | 16 | 2 |
| 1 | 76 | 1 | | 189 | 2 | 9 |
| 1 | 151 | 1 | | 74 | 6 | 14 |
| 1 | 31 | 1 | | 76 | 8 | 1 |
| 1 | 16 | 1 | | 161 | 8 | 11 |
| 1 | 1 | 1 | | 26 | 9 | 11 |
| 1 | 61 | 1 | | 247 | 9 | 7 |
| 1 | 91 | 1 | | 45 | 11 | 0 |
| 1 | 46 | 1 | | 183 | 13 | 3 |
| 1 | 136 | | 1 | 170 | 0 | 5 |
| 1 | 226 | | 1 | 123 | 4 | 3 |
| 1 | 181 | | 1 | 210 | 6 | 0 |
| 1 | 166 | | 1 | 25 | 8 | 10 |
| 1 | 211 | | 1 | 127 | 8 | 7 |
| 1 | 106 | | 1 | 145 | 9 | 10 |
| 1 | 241 | | 1 | 196 | 9 | 1 |
| 1 | 121 | | 1 | 164 | 11 | 14 |
| 1 | 196 | | 1 | 219 | 15 | 9 |
| 2 | 17 | 2 | | 85 | 0 | 10 |
| 2 | 2 | 2 | | 52 | 1 | 7 |
| 2 | 152 | 2 | | 123 | 4 | 3 |
| 2 | 47 | 2 | | 148 | 12 | 13 |
| 2 | 77 | 2 | | 50 | 16 | 5 |
| 2 | 32 | 2 | | 67 | 16 | 7 |
| 2 | 62 | 2 | | 152 | 16 | 2 |
| 2 | 212 | | 2 | 35 | 1 | 5 |
| 2 | 227 | | 2 | 137 | 1 | 2 |
| 2 | 122 | | 2 | 239 | 1 | 14 |
| 2 | 242 | | 2 | 73 | 5 | 13 |
| 2 | 182 | | 2 | 90 | 5 | 0 |
| 2 | 197 | | 2 | 246 | 8 | 6 |
| 2 | 92 | | 2 | 111 | 9 | 6 |
| 2 | 107 | | 2 | 165 | 12 | 0 |
| 2 | 137 | | 2 | 183 | 13 | 3 |
| 2 | 167 | | 2 | 254 | 16 | 14 |

| index | | σ(y)(15) | | | | |
|---|---|---|---|---|---|---|
| σ(y)(15) | σ(y) | bs1 | bs2 | σ(L) | σ(L)(17) | σ(L)(15) |
| 3 | 123 | 3 | | 51 | 0 | 6 |
| 3 | 78 | 3 | | 35 | 1 | 5 |
| 3 | 18 | 3 | | 3 | 3 | 3 |
| 3 | 213 | 3 | | 191 | 4 | 11 |
| 3 | 3 | 3 | | 226 | 5 | 1 |
| 3 | 48 | 3 | | 46 | 12 | 1 |
| 3 | 93 | 3 | | 251 | 13 | 11 |
| 3 | 108 | 3 | | 14 | 14 | 14 |
| 3 | 153 | | 3 | 17 | 0 | 2 |
| 3 | 183 | | 3 | 51 | 0 | 6 |
| 3 | 243 | | 3 | 103 | 1 | 13 |
| 3 | 198 | | 3 | 224 | 3 | 14 |
| 3 | 138 | | 3 | 143 | 7 | 8 |
| 3 | 168 | | 3 | 248 | 10 | 8 |
| 3 | 33 | | 3 | 48 | 14 | 3 |
| 3 | 228 | | 3 | 50 | 16 | 5 |
| 3 | 63 | | 3 | 118 | 16 | 13 |
| 4 | 34 | 4 | | 170 | 0 | 5 |
| 4 | 4 | 4 | | 104 | 2 | 14 |
| 4 | 94 | 4 | | 41 | 7 | 11 |
| 4 | 49 | 4 | | 246 | 8 | 6 |
| 4 | 19 | 4 | | 111 | 9 | 6 |
| 4 | 124 | 4 | | 49 | 15 | 4 |
| 4 | 154 | 4 | | 100 | 15 | 10 |
| 4 | 64 | 4 | | 134 | 15 | 14 |
| 4 | 79 | 4 | | 253 | 15 | 13 |
| 4 | 184 | | 4 | 222 | 1 | 12 |
| 4 | 199 | | 4 | 19 | 2 | 4 |
| 4 | 169 | | 4 | 70 | 2 | 10 |
| 4 | 244 | | 4 | 223 | 2 | 13 |
| 4 | 214 | | 4 | 75 | 7 | 0 |
| 4 | 229 | | 4 | 146 | 10 | 11 |
| 4 | 109 | | 4 | 180 | 10 | 0 |
| 4 | 139 | | 4 | 237 | 16 | 12 |
| 5 | 230 | 5 | | 206 | 2 | 11 |
| 5 | 65 | 5 | | 227 | 6 | 2 |
| 5 | 5 | 5 | | 143 | 7 | 8 |
| 5 | 155 | 5 | | 59 | 8 | 14 |
| 5 | 185 | 5 | | 179 | 9 | 14 |
| 5 | 80 | 5 | | 248 | 10 | 8 |
| 5 | 20 | 5 | | 62 | 11 | 2 |
| 5 | 125 | 5 | | 64 | 13 | 4 |
| 5 | 110 | 5 | | 236 | 15 | 11 |
| 5 | 95 | 5 | | 16 | 16 | 1 |
| 5 | 170 | | 5 | 0 | 0 | 0 |
| 5 | 245 | | 5 | 1 | 1 | 1 |
| 5 | 50 | | 5 | 52 | 1 | 7 |
| 5 | 215 | | 5 | 4 | 4 | 4 |
| 5 | 200 | | 5 | 208 | 4 | 13 |
| 5 | 140 | | 5 | 13 | 13 | 13 |
| 5 | 35 | | 5 | 67 | 16 | 7 |

FIG. 83B

| index | | σ(y)(15) | | | | |
|---|---|---|---|---|---|---|
| σ(y)(15) | σ(y) | bs1 | bs2 | σ(L) | σ(L)(17) | σ(L)(15) |
| 6 | 51 | 6 | | 34 | 0 | 4 |
| 6 | 111 | 6 | | 102 | 0 | 12 |
| 6 | 156 | 6 | | 70 | 2 | 10 |
| 6 | 81 | 6 | | 241 | 3 | 1 |
| 6 | 36 | 6 | | 6 | 6 | 6 |
| 6 | 96 | 6 | | 92 | 7 | 2 |
| 6 | 171 | 6 | | 127 | 8 | 7 |
| 6 | 6 | 6 | | 197 | 10 | 2 |
| 6 | 246 | | 6 | 102 | 0 | 12 |
| 6 | 231 | | 6 | 206 | 2 | 11 |
| 6 | 141 | | 6 | 193 | 6 | 13 |
| 6 | 186 | | 6 | 247 | 9 | 7 |
| 6 | 216 | | 6 | 28 | 11 | 13 |
| 6 | 66 | | 6 | 96 | 11 | 6 |
| 6 | 21 | | 6 | 31 | 14 | 1 |
| 6 | 201 | | 6 | 100 | 15 | 10 |
| 6 | 126 | | 6 | 236 | 15 | 11 |
| 7 | 7 | 7 | | 119 | 0 | 14 |
| 7 | 187 | 7 | | 136 | 0 | 1 |
| 7 | 22 | 7 | | 2 | 2 | 2 |
| 7 | 142 | 7 | | 105 | 3 | 0 |
| 7 | 52 | 7 | | 193 | 6 | 13 |
| 7 | 172 | 7 | | 146 | 10 | 11 |
| 7 | 67 | 7 | | 28 | 11 | 13 |
| 7 | 37 | 7 | | 216 | 12 | 6 |
| 7 | 97 | 7 | | 32 | 15 | 2 |
| 7 | 112 | | 7 | 119 | 0 | 14 |
| 7 | 127 | | 7 | 139 | 3 | 4 |
| 7 | 82 | | 7 | 141 | 5 | 6 |
| 7 | 217 | | 7 | 108 | 6 | 3 |
| 7 | 202 | | 7 | 41 | 7 | 11 |
| 7 | 157 | | 7 | 198 | 11 | 3 |
| 7 | 232 | | 7 | 150 | 14 | 0 |
| 7 | 247 | | 7 | 184 | 14 | 4 |
| 8 | 38 | 8 | | 222 | 1 | 12 |
| 8 | 143 | 8 | | 38 | 4 | 8 |
| 8 | 8 | 8 | | 208 | 4 | 13 |
| 8 | 128 | 8 | | 13 | 13 | 13 |
| 8 | 53 | 8 | | 200 | 13 | 5 |
| 8 | 173 | 8 | | 150 | 14 | 0 |
| 8 | 23 | 8 | | 219 | 15 | 9 |
| 8 | 98 | 8 | | 237 | 16 | 12 |
| 8 | 68 | | 8 | 85 | 0 | 10 |
| 8 | 113 | | 8 | 189 | 2 | 9 |
| 8 | 203 | | 8 | 37 | 3 | 7 |
| 8 | 218 | | 8 | 105 | 3 | 0 |
| 8 | 83 | | 8 | 140 | 4 | 5 |
| 8 | 233 | | 8 | 191 | 4 | 11 |
| 8 | 248 | | 8 | 98 | 13 | 8 |
| 8 | 158 | | 8 | 251 | 13 | 11 |
| 8 | 188 | | 8 | 82 | 14 | 7 |

| index | | σ(y)(15) | | | | |
|---|---|---|---|---|---|---|
| σ(y)(15) | σ(y) | bs1 | bs2 | σ(L) | σ(L)(17) | σ(L)(15) |
| 9 | 189 | 9 | | 153 | 0 | 3 |
| 9 | 234 | 9 | | 223 | 2 | 13 |
| 9 | 24 | 9 | | 23 | 6 | 8 |
| 9 | 54 | 9 | | 7 | 7 | 7 |
| 9 | 114 | 9 | | 25 | 8 | 10 |
| 9 | 39 | 9 | | 145 | 9 | 10 |
| 9 | 9 | 9 | | 129 | 10 | 9 |
| 9 | 129 | 9 | | 113 | 11 | 8 |
| 9 | 69 | 9 | | 199 | 12 | 4 |
| 9 | 204 | | 9 | 136 | 0 | 1 |
| 9 | 219 | | 9 | 153 | 0 | 3 |
| 9 | 84 | | 9 | 124 | 5 | 4 |
| 9 | 144 | | 9 | 24 | 7 | 9 |
| 9 | 159 | | 9 | 59 | 8 | 14 |
| 9 | 249 | | 9 | 179 | 9 | 14 |
| 9 | 99 | | 9 | 112 | 10 | 7 |
| 9 | 174 | | 9 | 253 | 15 | 13 |
| 10 | 85 | 10 | | 0 | 0 | 0 |
| 10 | 115 | 10 | | 103 | 1 | 13 |
| 10 | 205 | 10 | | 157 | 4 | 7 |
| 10 | 40 | 10 | | 124 | 5 | 4 |
| 10 | 220 | 10 | | 217 | 13 | 7 |
| 10 | 10 | 10 | | 31 | 14 | 1 |
| 10 | 55 | 10 | | 118 | 16 | 13 |
| 10 | 235 | | 10 | 2 | 2 | 2 |
| 10 | 100 | | 10 | 104 | 2 | 14 |
| 10 | 160 | | 10 | 241 | 3 | 1 |
| 10 | 175 | | 10 | 8 | 8 | 8 |
| 10 | 145 | | 10 | 161 | 8 | 11 |
| 10 | 25 | | 10 | 26 | 9 | 11 |
| 10 | 250 | | 10 | 128 | 9 | 8 |
| 10 | 130 | | 10 | 199 | 12 | 4 |
| 10 | 190 | | 10 | 32 | 15 | 2 |
| 10 | 70 | | 10 | 134 | 15 | 14 |
| 11 | 56 | 11 | | 187 | 0 | 7 |
| 11 | 11 | 11 | | 1 | 1 | 1 |
| 11 | 26 | 11 | | 224 | 3 | 14 |
| 11 | 86 | 11 | | 73 | 5 | 13 |
| 11 | 146 | 11 | | 108 | 6 | 3 |
| 11 | 116 | 11 | | 75 | 7 | 0 |
| 11 | 71 | 11 | | 180 | 10 | 0 |
| 11 | 41 | 11 | | 198 | 11 | 3 |
| 11 | 221 | | 11 | 68 | 0 | 8 |
| 11 | 131 | | 11 | 187 | 0 | 7 |
| 11 | 236 | | 11 | 54 | 3 | 9 |
| 11 | 251 | | 11 | 92 | 7 | 2 |
| 11 | 191 | | 11 | 197 | 10 | 2 |
| 11 | 101 | | 11 | 148 | 12 | 13 |
| 11 | 161 | | 11 | 14 | 14 | 14 |
| 11 | 206 | | 11 | 99 | 14 | 9 |
| 11 | 176 | | 11 | 16 | 16 | 1 |

FIG. 83C

| index | | σ(y)(15) | | | | |
|---|---|---|---|---|---|---|
| σ(y)(15) | σ(y) | bs1 | bs2 | σ(L) | σ(L)(17) | σ(L)(15) |
| 12 | 102 | 12 | | 68 | 0 | 8 |
| 12 | 222 | 12 | | 204 | 0 | 9 |
| 12 | 117 | 12 | | 239 | 1 | 14 |
| 12 | 12 | 12 | | 139 | 3 | 4 |
| 12 | 57 | 12 | | 140 | 4 | 5 |
| 12 | 72 | 12 | | 12 | 12 | 12 |
| 12 | 27 | 12 | | 131 | 12 | 11 |
| 12 | 192 | 12 | | 184 | 14 | 4 |
| 12 | 87 | 12 | | 254 | 16 | 14 |
| 12 | 237 | | 12 | 204 | 0 | 9 |
| 12 | 207 | | 12 | 157 | 4 | 7 |
| 12 | 177 | | 12 | 56 | 5 | 11 |
| 12 | 132 | | 12 | 192 | 5 | 12 |
| 12 | 162 | | 12 | 227 | 6 | 2 |
| 12 | 42 | | 12 | 62 | 11 | 2 |
| 12 | 147 | | 12 | 200 | 13 | 5 |
| 12 | 252 | | 12 | 217 | 13 | 7 |
| 13 | 28 | 13 | | 221 | 0 | 11 |
| 13 | 73 | 13 | | 54 | 3 | 9 |
| 13 | 163 | 13 | | 90 | 5 | 0 |
| 13 | 88 | 13 | | 8 | 8 | 8 |
| 13 | 133 | 13 | | 128 | 9 | 8 |
| 13 | 118 | 13 | | 27 | 10 | 12 |
| 13 | 13 | 13 | | 112 | 10 | 7 |
| 13 | 43 | 13 | | 164 | 11 | 14 |
| 13 | 58 | 13 | | 165 | 12 | 0 |
| 13 | 148 | 13 | | 99 | 14 | 9 |
| 13 | 238 | | 13 | 34 | 0 | 4 |
| 13 | 193 | | 13 | 221 | 0 | 11 |
| 13 | 223 | | 13 | 226 | 5 | 1 |
| 13 | 178 | | 13 | 74 | 6 | 14 |
| 13 | 208 | | 13 | 7 | 7 | 7 |
| 13 | 103 | | 13 | 177 | 7 | 12 |
| 13 | 253 | | 13 | 46 | 12 | 1 |
| 14 | 119 | 14 | | 17 | 0 | 2 |
| 14 | 14 | 14 | | 238 | 0 | 13 |
| 14 | 89 | 14 | | 37 | 3 | 7 |
| 14 | 44 | 14 | | 4 | 4 | 4 |
| 14 | 134 | 14 | | 56 | 5 | 11 |
| 14 | 59 | 14 | | 141 | 5 | 6 |
| 14 | 29 | 14 | | 210 | 6 | 0 |
| 14 | 74 | 14 | | 177 | 7 | 12 |
| 14 | 149 | 14 | | 82 | 14 | 7 |
| 14 | 224 | | 14 | 238 | 0 | 13 |
| 14 | 254 | | 14 | 23 | 6 | 8 |
| 14 | 164 | | 14 | 27 | 10 | 12 |
| 14 | 209 | | 14 | 45 | 11 | 0 |
| 14 | 239 | | 14 | 113 | 11 | 8 |
| 14 | 104 | | 14 | 131 | 12 | 11 |
| 14 | 179 | | 14 | 216 | 12 | 6 |
| 14 | 194 | | 14 | 64 | 13 | 4 |

CLOCK GEN. LOGIC CIRCUIT index(17),(15) &Latch index (17)

| i | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| a | 0h | 1 | 2 | 3 | 0 | 1 | 2 | 3 | 0 | 1 | 2 | 3 | 0 | 1 | 2 | 3 | H |
| b | /s4 | 00 | 00 | 00 | 4 | 4 | 4 | 4 | 8 | 8 | 8 | 8 | 12 | 12 | 12 | 12 | s4 |

index (15)

| i | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| a | 0 | 1 | 2 | 3 | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 | 8 | 12 | 12 | 12 |

$X_4 = \beta_1 z_2 + a \; (\delta = \zeta^{-1} + \eta)$

MEMORY DEVICE WITH ERROR CORRECTION SYSTEM FOR DETECTION AND CORRECTION ERRORS IN READ OUT DATA

CROSS-REFERENCE TO RELATED APPLICATION

This application is based on and claims the benefit of priority from the prior Japanese Patent Application No. 2007-210659, filed on Aug. 13, 2007, the entire contents of which are incorporated herein by reference. U.S. Pat. No. 7,369,433 is incorporated herein by reference in its entirety.

BACKGROUND OF THE INVENTION

1. Field of the Invention

This invention relates to a memory device with an error correction system configured to be 4-bit error correctable.

2. Description of the Related Art

As a memory device is miniaturized and has a great capacity, the data retention characteristic (i.e., data reliability) is reduced. Specifically, in case a multi-level data storage scheme is adapted to the memory device, the data retention property will become a large problem. In a phase change memory and a resistance change memory, which are expected to succeed a conventional NAND-type flash memory, there is such a problem that a data state is not stable, and it is difficult to secure the data retention reliability.

Therefore, it becomes a material technology to form an ECC (Error Correcting Code) system in a memory chip for error-detecting and correcting read data prior to data outputting.

There has already been proposed such a technology that an ECC circuit is built in a flash memory chip or memory controller thereof (for example, JP-A-2000-173289).

If error location search in a BCH-ECC system, which is constituted by use of Galois field (finite field) $GF(2^n)$ to perform error-correction for 2-bit or more errors, is performed in such a manner as to substitute elements of the Galois field one by one and select them as solutions satisfying an error location searching equation, thereby searching an error location, the arithmetic operation time will be very long.

Even if the ECC system is formed as on-chip type one, this leads to great reduction of the read/write performance.

Therefore, it is required of us to achieve a high speed ECC system, which does not sacrifice the performance of a conventional flash memory without the above-described one by one searching.

SUMMARY OF THE INVENTION

According to an aspect of the present invention, there is provided a memory device with an error detection and correction system formed therein, the error detection and correction system being configured to detect and correct errors in read out data by use of a BCH code, wherein the error detection and correction system is 4-bit error correctable, and searches error locations in such a way as to: divide an error location searching biquadratic equation into two or more factor equations; convert the factor equations to have unknown parts and syndrome parts separated from each other for solving them; and compare indexes of the solution candidates with those of the syndromes, the corresponding relationships being previously obtained as a table, thereby obtaining error locations.

According to another aspect of the present invention, there is provided a method of testing a memory device with an error detection and correction system formed therein, the error detection and correction system being configured to detect and correct errors in read out data by use of a BCH code, including:

adding an error data pattern to an information data code to be input to the memory device;

passing the information data code with the error data pattern added through the error detection and correction system without writing it into a memory core; and testing whether the information data code with the error data pattern added is corrected or not.

According to still another aspect of the present invention, there is provided a memory system including:

a memory device;

an error detection and correction system installed in the memory device to detect and correct errors in read out data by use of a BCH code, the error detection and correction system having such a function as to generate a non-correctable signal for non correctable errors; and a contents addressable memory configured to store the corresponding relationship between a bad block address of the memory device and a to-be-replaced block address in accordance with the non-correctable signal, and send the to-be-replaced block address to the memory device in place of the bad block address when it is accessed.

BRIEF DESCRIPTION OF THE DRAWINGS

FIG. 1 shows finite field elements obtained from the syndromes at the respective calculation steps.

FIGS. 13A and 13B show a selecting table used for selecting the degree numbers in case of dealing with 128-bit data.

FIGS. 14A to 14D show a set of selecting tables for selecting the polynomial degree numbers used for calculating the check bits.

FIGS. 19A to 19C show a selecting table used for selecting the polynomial degree numbers in case of calculating syndrome S.

FIGS. 20A to 20C show a set of selecting tables used for selecting the polynomial degree numbers in case of calculating syndrome $S_1$.

FIGS. 21A to 21C show a set of selecting tables used for selecting the polynomial degree numbers in case of calculating syndrome $S_3$.

FIGS. 22A to 22C show a set of selecting tables used for selecting the polynomial degree numbers in case of calculating syndrome $S_5$.

FIGS. 28A to 28C show a converting table used for converting the polynomial expression coefficients of GF(256) elements to the expression index components (17).

FIGS. 29A to 29C show a converting table used for converting the polynomial expression coefficients of GF(256) elements to the expression index components (15).

FIG. 30 is a converting table used for converting the power of elements to the expression index in GF(256) elements.

FIGS. 32A to 32E show a set of decode tables used for parity checking the elements by use of the expression index components.

FIG. 65 shows the index & latch circuit in FIG. 62.

FIGS. 66A to 66C show a set of index tables of elements of the solution of $w^3+w=H$.

FIGS. 67A and 67B show a set of tables showing elements drawn from FIGS. 66A to 66C to be necessary for calculating.

FIGS. 68A and 68B show a set of tables showing the relationship between "H" and "w" drawn from FIGS. 67A and 67B and the expression index component (17).

FIGS. 69A and 69B show a set of tables showing the relationship between "H" and "w" drawn from FIGS. 67A and 67B and the expression index component (15).

FIGS. 70A and 70B show a set of tables showing the relationship between "H" and "w+1" drawn from FIGS. 67A and 67B and the expression index components (17).

FIGS. 71A and 71B show a set of tables showing the relationship between "H" and "w+1" drawn from FIGS. 67A and 67B and the expression index components (15).

FIG. 73 shows the index (17),(15) & latch circuit.

FIG. 80 shows the index decoder at the output portion of the initial stage adder in FIG. 74.

FIGS. 81A to 81C show a set of index tables of the elements of the solution of $y^2+y=L$.

FIGS. 82A to 82C show a set of tables showing the relationship between "L" and "u" drawn from FIGS. 81A to 81C, the expression index components (17) and buses.

FIGS. 83A to 83C show a set of tables showing the relationship between "L" and "u" drawn from FIGS. 81A to 81C, the expression index components (15) and buses.

FIG. 97 shows a test-free type of file memory system, in which an ECC system is built-in.

DETAILED DESCRIPTION OF THE EMBODIMENTS

Figure 2:
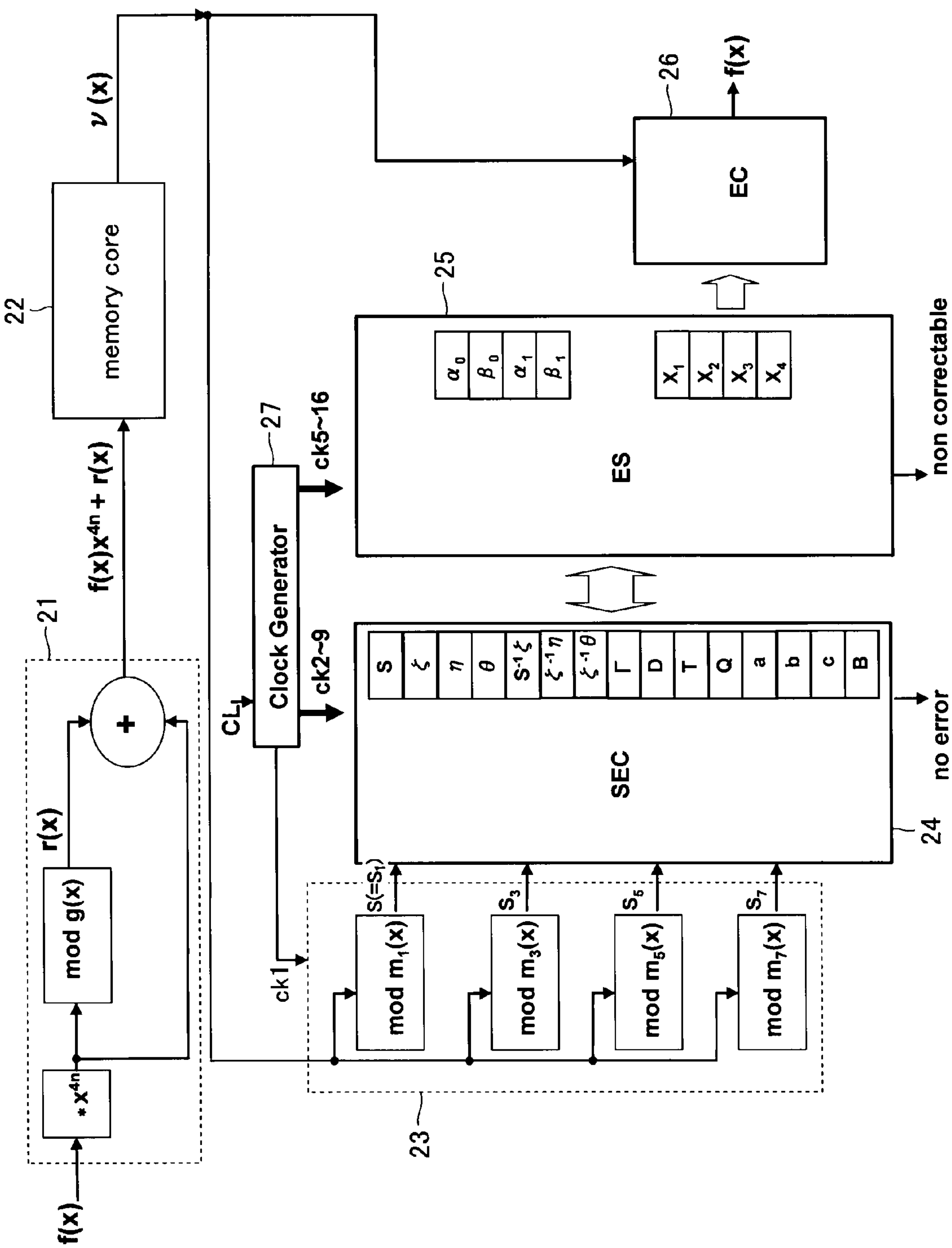
FIG. 2 shows a 4EC-EW-BCH system in accordance with an embodiment.

To make a memory equipped with an ECC system, high speed calculation processing is required because it is in need of performing real time data correction. It is well known that ECC with BCH code is effective against random error generation. However, in the prior arts, it has not been known high speed and 4-bit error correctable ECC. Therefore, in the present invention, there will be provided an on-chip and high speed 4-bit error correctable ECC system to be installed in a memory device.

To perform error detecting operation at a high rate with a BCH code, a solution table is previously formed, and syndromes calculated from the read data are compared with the table, so that a solution will be obtained. A key technology for the above-described data comparison is in that a to-be-solved polynomial may be divided into an unknown quantity part (variable part) and a syndrome part by use of variable conversion.

In a 4-bit error correctable BCH code system, an error searching equation is expressed as a biquadratic equation, in which unknown numbers and syndromes are mixed. Therefore, translate the biquadratic equation to the product of quadratic equations by use of certain parameters, and the method of solving the equation results in that factor equations with lower degrees (for example, second and third degrees) are subjected to the solution processing.

By use of this conversion scheme, it is possible to separate the variables and syndromes from each other. Further, when comparing finite field elements of BCH code with the solution table, a so-called "expression index" is put in, so that error searching may be done as parallel operations with short calculation times at a high rate.

Equipping the ECC system described above in a memory device, there will be provided a memory system, which has been improved apparently in the data retention reliability without reducing the memory performance.

The outline of the embodiments to be described below is follows:

- An ECC system is formed on a substrate together with a memory, or mounted on the package of the memory. The ECC system is for error-detecting and correcting for 4-bit errors in such a manner as to perform data encoding and decoding in a data transferring process during writing or reading data of a memory cell array.
- In the 4-bit error correctable ECC system with BCH code of Galois finite field GF($2^n$), the error searching equation including unknown quantity parts (designating error locations) and syndromes (calculated from data including errors) is converted to the product of two or more factor equations. After deciding the coefficient parameters, the factor equations are solved, so that error locations will be searched.
- A test method of a memory device with a n(≧2)-bit error correctable ECC system equipped is disclosed. The test is performed in such a way as to apply a series of error data patterns directly to the information data code without reading or writing data, and check whether errors are corrected or not.

[Explanation of the Principle of 4EC-EW(4 Error Correction-Error Warning)-BCH System]

Data Encoding

The system principle will be explained with respect to a general case of Galois field GF($2^n$), and then an application system with GF(256) will be explained in detail.

Assume here that a primitive irreducible polynomial on GF(2) is referred to as $m_1(x)$, and its root (primitive root) is $\alpha$. In consideration of finite field GF($2^n$), $m_1(x)$ becomes an n-th degree polynomial. Using this $\alpha$, there are $2^n$ elements of GF($2^n$) as follows: 0, $\alpha^0$, $\alpha^1$, . . . , $\alpha^{h-2}$ and $\alpha^{h-1}$ (where $h=2^n-1$).

To do 4-bit error detection and correction, as shown in the following expression, Exp. 1, $m_1(x)$, $m_3(x)$, $m_5(x)$ and $m_7(x)$ are selected as four primitive irreducible polynomials having roots of $\alpha^1$, $\alpha^3$, $\alpha^5$ and $\alpha^7$.

$$\alpha^1: m_1(\alpha^1)=0$$

$$\alpha^3: m_3(\alpha^3)=0$$

$$\alpha^5: m_5(\alpha^5)=0$$

$$\alpha^7: m_7(\alpha^7)=0 \qquad \text{[Exp. 1]}$$

Based on these irreducible polynomials, 4n-th degree code generation polynomial g(x) is obtained as shown in the following expression Exp. 2.

$$g(x)=m_1(x)m_3(x)m_5(x)m_7(x) \qquad \text{[Exp. 2]}$$

Since the number of elements constituting the code of ECC system is "h" except zero factors, coefficients of (h−1)th degree polynomial constitute data. That is, information polynomial f(x) is expressed as follows.

$$f(x)=a_{h-1}x^{h-1-4n}+a_hx^{h-2-4n}+\ldots+a_{4n+2}x^2+a_{4n+1}x+a_{4n} \qquad \text{[Exp. 3]}$$

Assigning the information bits in data bits to the coefficients $a^{4n}$ to $a^{h-1}$, and dividing the 4n-th degree polynomial $f(x)x^{4n}$ by g(x), surplus r(x) is obtained as shown in the following expression Exp. 4.

$$f(x)x^{4n}=q(x)g(x)+r(x)$$

$$r(x)=b_{4n-1}x^{4n-1}+b_{4n-2}x^{4n-2}+\ldots+b_1x+b_0 \qquad \text{[Exp. 4]}$$

As described above, r(x) is a (4n−1)th degree polynomial, and coefficients thereof serve as check bits $b_{4n-1}$ to $b_0$, which constitute data to be stored together with the information bits $a_{4n}$ to $a_{h-1}$.

Data Decoding

Errors generated on the data bits are expressed by (h−1)th degree error polynomial e(x). Data polynomial ν(x) corresponding to the read out data of the memory is expressed together with the error polynomial e(x) as follows.

$$\begin{aligned} \nu(x) &= f(x)x^{4n} + r(x) + e(x) \\ &= q(x)g(x) + e(x) \end{aligned} \quad \text{[Exp. 5]}$$

The terms with coefficient "1" in the error polynomial e(x) are error bits, and to search the error bits becomes error detection.

At a first stage, divide ν(x) by $m_1(x)$, $m_3(x)$, $m_5(x)$ and $m_7(x)$, and obtain surplus or remainder polynomials $S_1(x)$, $S_3(x)$, $S_5(x)$ and $S_7(x)$, respectively. These also are surplus of e(x), and referred to as syndrome polynomials as shown in the following expression Exp. 6.

$$\nu(x) \equiv S_1(x) \bmod m_1(x) \rightarrow e(x) \equiv S_1(x) \bmod m_1(x)$$

$$\nu(x) \equiv S_3(x) \bmod m_3(x) \rightarrow e(x) \equiv S_3(x) \bmod m_3(x)$$

$$\nu(x) \equiv S_5(x) \bmod m_5(x) \rightarrow e(x) \equiv S_5(x) \bmod m_5(x)$$

$$\nu(x) \equiv S_7(x) \bmod m_7(x) \rightarrow e(x) \equiv S_7(x) \bmod m_7(x) \quad \text{[Exp. 6]}$$

If 4-bit errors are located at the degree numbers "i", "j", "k" and "l", the error polynomial e(x) will be expressed by the following expression Exp. 7.

$$e(x) = x^i + x^j + x^k + x^l \quad \text{[Exp. 7]}$$

Searching the degree numbers "i", "j", "k" and "l", error locations are obtained, i.e., error bits in data are determined. Therefore, perform index calculation with respect to the roots of $m_1(x)=0$ on Galois field $GF(2^n)$, and "i", "j;", "k" and "l" will be obtained.

For this purpose, assume that the remainder obtained by dividing $x^n$ by $m_1(x)$ is referred to as pn(x). Since $\alpha^n = pn(\alpha)$ on this assumption, define the following $X_1$, $X_2$, $X_3$ and $X_4$, and syndromes $S_1$, $S_3$, $S_5$ and $S_7$ are shown in the expression Exp. 8.

$$X_1 = pi(\alpha) = \alpha^i$$

$$S_1 = S_1(\alpha) = \alpha^{\sigma 1}$$

$$X_2 = pj(\alpha) = \alpha^j$$

$$S_3 = S_3(\alpha^3) = \alpha^{\sigma 3}$$

$$X_3 = pk(\alpha) = \alpha^k$$

$$S_5 = S_5(\alpha^5) = \alpha^{\sigma 5}$$

$$X_4 = pl(\alpha) = \alpha^l$$

$$S_7 = S_7(\alpha^7) = \alpha^{\sigma 7} \quad \text{[Exp. 8]}$$

Based on the above-described definition, the following relationships will be obtained.

$$e(\alpha) = X_1 + X_2 + X_3 + X_4 = S_1$$

$$e(\alpha^3) = X_1^3 + X_2^3 + X_3^3 + X_4^3 = S_3$$

$$e(\alpha^5) = X_1^5 + X_2^5 + X_3^5 + X_4^5 = S_5$$

$$e(\alpha^7) = X_1^7 + X_2^7 + X_3^7 + X_4^7 = S_7 \quad \text{[Exp. 9]}$$

As shown in Exp. 8, indexes of $X_1$, $X_2$, $X_3$ and $X_4$ are "i", "j", "k" and "l", respectively, and indexes of $S_1$, $S_3$, $S_5$ and $S_7$ are $\sigma$1$(=\sigma)$, $\sigma$3, $\sigma$5 and $\sigma$7, respectively.

As a second stage, consider a polynomial $\Lambda^R(x)$ on $GF(2^n)$ that has unknown quantities $X_1$, $X_2$, $X_3$ and $X_4$ as shown in the following expression Exp. 10.

$$\begin{aligned} \Lambda^R(x) &= (x - X_1)(x - X_2)(x - X_3)(x - X_4) \\ &= x^4 + Sx^3 + Dx^2 + Tx + Q \end{aligned} \quad \text{[Ex. 10]}$$

The respective coefficient parameters "S", "D", "T" and "Q" are, as shown in the expression Exp. 11, expressed by basic symmetric polynomials with respect to $X_1$, $X_2$, $X_3$ and $X_4$.

$$S = S_1 = X_1 + X_2 + X_3 + X_4$$

$$D = X_1X_2 + X_2X_3 + X_3X_4 + X_4X_1 + X_1X_3 + X_2X_4$$

$$T = X_1X_2X_3 + X_2X_3X_4 + X_4X_1X_2$$

$$Q = X_1X_2X_3X_4 \quad \text{[Exp. 11]}$$

There are relationships between the above-described coefficients and syndromes (i.e., symmetric polynomials) $S_1=S$, $S_3$, $S_5$ and $S_7$. These relationships are as shown in the following expression Exp. 12, and constitute simultaneous equations.

$$SD + T = \zeta$$

$$(\zeta + S^3)D + S^2T + SQ = \eta$$

$$(\eta + S^5)D + S^4T + (\zeta + S^3)Q = \theta \quad \text{[Exp. 12]}$$

where, $\zeta = S^3 + S_3$, $\eta = S^5 + S_5$ and $\theta = S^7 + S_7$

To express "D", "T" and "Q" with syndromes, solve the above-described ternary simultaneous equations. With determinant $\lceil$, the simultaneous equations will be solved as follows.

$$\lceil = S^3\zeta + S\eta + \zeta^2$$

$$\lceil D = S^3\eta + S^2\zeta^2 + S\theta + \zeta\eta$$

$$\lceil T = S^4\eta + S^2\theta + \zeta^3$$

$$\lceil Q = S^4\zeta + S^2\zeta\eta + \zeta\theta + \eta^2 \quad \text{[Exp. 13]}$$

If $\lceil \neq 0$, "D", "T" and "Q" are decided, and then go to the successive stage for solving the error location searching equation shown in the expression Exp. 14.

$$\Lambda^R(x) = x^4 + Sx^3 + Dx^2 + Tx + Q = 0 \quad \text{[Exp. 14]}$$

In case of $\lceil = 0$, as known as solving method of simultaneous equations, substituting an optional value for one of the unknown quantities, "Q", it is possible to look for "D" and "T". However, if just four errors are generated, there are no optional relationships between "S", "D" and "T". Therefore, this case designates either five or more errors, or three or less error.

In case of three errors, $X_4=0$, then Q=0, thereby resulting in the following quadratic simultaneous equations, and "D" and "T" may be solved.

$SD+T=\zeta$ $(\zeta+S^3)D+S^2T=\eta$ [Exp. 15]

In case of $S\zeta\neq0$, $D=\zeta/S$, and $T=0$, then it designates that there are two errors.

In case of $S\zeta=0$, since $\zeta$ is a coefficient determinant of quadratic simultaneous equations, if $S\neq0$ and $\zeta=0$, then it is possible to obtain "D" by substituting an optional value for "T". If there are generated three errors, there is not an optional relationship between "S", "D" and "T". Therefore, this case designates either five errors or two or less error.

In case of two or less error, $X_3=0$, then "D" will be obtained by substituting $T=0$.

In case of $\Gamma=0$, $\zeta=0$ and $T=0$, the above-described simultaneous equations result in $SD=0$. Since "S" is not zero, $D=0$, i.e., it designates one error ($X_1=S$). In this case, $\zeta=\eta=\theta=0$ is brought out, then $Q=0$ is obtained. This excludes the possibility of five or more errors.

In case of $S=0$, since $\zeta=0$, then $T=0$, and this designates two or less error. From $S=X_1+X_2=0$, the possibility of one error is excluded, it results in zero error (no error).

In the above description, all solution methods of the simultaneous equations have been explained briefly, and in case there is not obtained a solution in the error searching branches, it designates that there are five or more errors.

Next, with respect to the branched cases (1) to (9), the solution method of the biquadratic equation will be explained in detail in accordance with the quantity relationship defined by the syndromes. The biquadratic equation to be solved is shown in the expression Exp. 14.

(1) In case of $S\neq0$, $\Gamma\neq0$, $b\neq0$ and $c\neq0$:

Note here that $a=D/S$, $b=D^2+ST$, $c=S^2Q+SDT+T^2$ and $B=a^4+Ta+Q$.

As shown in the expression Exp. 16, the error location searching biquadratic equation is subjected to variable conversion of $X=x+a$, and factorized to be expressed as the product of two quadratic equations.

$$x^4+Sx^3+(b/S)x+B=(x^2+\alpha_1x+\alpha_0)(x^2+\beta_1x+\beta_0)=0 \quad \text{[Exp. 16]}$$

Based on the relationships between the coefficients $\alpha_0$, $\alpha_1$, $\beta_0$, $\beta_1$ of the factorized quadratic equations and the quantities brought out syndromes, and using unknown quantity $\delta=\alpha_0+\beta_0$, a cubic equation is obtained to be satisfied with $\delta$ as shown in the expression Exp. 17. Note here that $\alpha_0+\beta_0=\delta$, $\alpha_0\beta_0=B$, $\beta_1\alpha_0+\alpha_1\beta_0=b/S$, $\delta+\alpha_1\beta_1=0$ and $\alpha_1+\beta_1=S$.

$$(\delta/b^{1/2})^3+(\delta/b^{1/2})+c/b^{3/2}=0 \quad \text{[Exp. 17]}$$

Solve this equation, and select one root $\delta$, and two quadratic equations are obtained as shown in the following expression Exp. 18, which are satisfied with the factorization coefficients.

$$(\epsilon/\delta)^2+(\epsilon/\delta)+B/\delta^2=0$$

$$(\epsilon/S)^2+(\epsilon/S)+\delta/S^2=0 \quad \text{[Exp. 18]}$$

Solve these equations, and coefficients $\alpha_0$, $\alpha_1$, $\beta_0$ and $\beta_1$ are obtained. By use of these coefficients, the following factor equations, two quadratic equations, are obtained to be solved as shown in the expression Exp. 19.

$$(x/\alpha_1)^2+(x/\alpha_1)+\alpha_0/\alpha_1^2=0$$

$$(x/\beta_1)^2+(x/\beta_1)+\beta_0/\beta_1^2=0 \quad \text{[Exp. 19]}$$

Solve these equations to look for the unknown quantity, and four solutions of the error searching biquadratic equation will be obtained by use of $X=x+a$.

Note here that when solving the respective equations, to be able to use solution tables, coefficients of the unknown quantities are converted to be elements on GF(2). That is, the unknown quantities are set as follows: $\delta/b^{1/2}$ in the cubic equation (Exp. 17) for looking for $\delta$; $\epsilon/\delta$ in the quadratic equation (Exp. 18) for looking for $\alpha_0$, $\beta_0$; $\epsilon/S$ in the quadratic equation (Exp. 18) for looking for $\alpha_1$, $\beta_1$; and $x/\alpha_1$, $x/\beta_1$ in the quadratic factor equations (Exp. 19).

(2) In case of $S\neq0$, $\Gamma\neq0$, $b\neq0$ and $c=0$:

Note here that $a=D/S$, $b=D^2+ST$, $B=a^4+Ta+Q$, and $S^2Q+SDT+T^2=0$, $S^4B=b^2$.

Subjected to the variable conversion of $X=x+a$, the term of the second degree is removed from the error location searching equation, and the resultant is factorized into a product of two quadratic equations as shown in Exp. 20.

$$x^4+Sx^3+(b/S)x+B=(x^2+\alpha_1x+\alpha_0)(x^2+\beta_1x+\beta_0)=0 \quad \text{[Exp. 20]}$$

Based on the relationships between the coefficients $\alpha_0$, $\alpha_1$, $\beta_0$, $\beta_1$ of the factorized quadratic equations and the quantities brought out syndromes, and using unknown quantity $\delta=\alpha_0+\beta_0$, a cubic equation is obtained to be satisfied with $\delta$ as shown in the expression Exp. 21. Note here that $\alpha_0+\beta_0=\delta$, $\alpha_0\beta_0=B$, $\beta_1\alpha_0+\alpha_1\beta_0=b/S$, $\delta+\alpha_1\beta_1=0$ and $\alpha_1+\beta_1=S$.

$$\delta^3+b\delta=0 \quad \text{[Exp. 21]}$$

Solve this equation, and select one root $\delta$ ($\neq0$), i.e., $b^{1/2}$, and two quadratic equations are obtained as shown in the following expression Exp. 22, which are satisfied with the factorization coefficients.

$$(\epsilon/\delta)^2+(\epsilon/\delta)+B/\delta^2=0$$

$$(\epsilon/S)^2+(\epsilon/S)+\delta/S^2=0 \quad \text{[Exp. 22]}$$

Solve these equations, and coefficients $\alpha_0$, $\alpha_1$, $\beta_0$ and $\beta_1$ are obtained. Note here that since $B/\delta^2=(\delta/S^2)^2$, $\alpha_0/\delta=(\alpha_1/S)^2$ and $\beta_0/\delta=(\beta_1/S)^2$ are obtained. The following factor equations, two quadratic equations, with the coefficients are to be solved as shown in the expression Exp. 23.

$$(x/\alpha_1)^2+(x/\alpha_1)+\alpha_0/\alpha_1^2=0$$

$$(x/\beta_1)^2+(x/\beta_1)+\beta_0/\beta_1^2=0 \quad \text{[Exp. 23]}$$

Solve these equations to look for the unknown quantity "x". As a result, solutions of the error searching biquadratic equation will be obtained by use of $X=x+a$. As expressed above, since $\alpha_0/\alpha_1^2=\beta_0/\beta_1^2=\delta/S^2$, four roots of the biquadratic equation are obtained with the relationships of $u_1=\alpha_1/S$, $u_2=\beta_1/S$, as shown in the expression Exp. 24.

$$X_1=\alpha_1u_1+a=\alpha_1^2/S+a$$

$$X_2=\alpha_1u_2+a=\alpha_1\beta_1/S+a=\delta/S+a$$

$$X_3=\beta_1u_1+a=\alpha_1\beta_1/S+a=\delta/S+a$$

$$X_4=\beta_1u_2+a=\beta_1^2/S+a \quad \text{[Exp. 24]}$$

As expressed in Exp. 24, $X_2=X_3$, then it results in that three errors are searched.

Note here that $\delta=0$ also satisfies the condition for solving the equation. However, the calculation process becomes different from the above-described one, and the calculation process explained in the above-described condition (1) is not adaptable. Therefore, this case is not selected here.

As similar to the case (1), to use solution tables, coefficients of the unknown quantities are converted to be elements on GF(2). That is, the unknown quantities are set as follows: $\epsilon/\delta$ in the quadratic equation (Exp. 22) for looking for $\alpha_0$, $\beta_0$; $\epsilon/S$ in the quadratic equation (Exp. 22) for looking for $\alpha_1$, $\beta_1$; and $x/\alpha_1$, $x/\beta_1$ in the quadratic factor equations (Exp. 23).

(3) In case of $S\neq 0$, $\lceil \neq 0$, $b=0$ and $c\neq 0$:

Note here that $a=D/S$, $c=S^2Q+SDT+T^2$, $B=a^4+Ta+Q$, and $D^2+ST=0$, $S^2B=c$.

Subjected to the variable conversion $X=x+a$, the term of the second degree is eliminated from the error search equation, and the resultant is factorized into a product of two quadratic equations as shown in Exp. 25.

$$x^4+Sx^3+B=(x^2+\alpha_1 x+\alpha_0)(x^2+\beta_1 x+\beta_0)=0 \quad \text{[Exp. 25]}$$

Based on the relationships between the coefficients $\alpha_0$, $\alpha_1$, $\beta_0$, $\beta_1$ of the factorized quadratic equations and the quantities brought out syndromes, and using unknown quantity $\delta=\alpha_0+\beta_0$, a cubic equation is obtained to be satisfied with $\delta$ as shown in the expression Exp. 26. Note here that $\alpha_0+\beta_0=\delta$, $\alpha_0\beta_0=B$, $\beta_1\alpha_0+\alpha_1\beta_0=0$, $\delta+\alpha_1\beta_1=0$ and $\alpha_1+\beta_1=S$.

$$\delta^3+c=0 \quad \text{[Exp. 26]}$$

By use of $\delta=c^{1/3}$, two quadratic equations to be satisfied with the factorization coefficient are obtained as shown in the following expression Exp. 27.

$$(\epsilon/\delta)^2+(\epsilon/\delta)+B/\delta^2=0$$

$$(\epsilon/S)^2+(\epsilon/S)+\delta/S^2=0 \quad \text{[Exp. 27]}$$

Solve these equations, and coefficients $\alpha_0$, $\alpha_1$, $\beta_0$ and $\beta_1$ are obtained. Since, in this case, $B/\delta^2=\delta/S_2$ is obtained from the condition shown in Exp. 26, the root of a quadratic equation for solving $\alpha_1$ and $\beta_1$ is the same as that of another quadratic equation for solving $\alpha_0$ and $\beta_0$, i.e., $u_1=\alpha_0/\delta=\alpha_1/S$ and $u_2=\beta_0/\delta=\beta_1/S$, and two quadratic equations become substantially identical with each other. That is, to-be-solved equations are expressed as the following expression Exp. 28.

$$(x/\alpha_1)^2+(x/\alpha_1)+\alpha_0/\alpha_1{}^2=0$$

$$(x/\beta_1)^2+(x/\beta_1)+\beta_0/\beta_1{}^2=0 \quad \text{[Exp. 28]}$$

When the unknown quantity "x" is obtained from the equations, the solution of the biquadratic error search equation will be solved by use of $X=x+a$. At this time, in accordance with $\alpha_0/\alpha_1{}^2=\delta/(S^2u_1)$ and $\beta_0/\beta_1{}^2=/(S^2u_2)$ obtained from the above-described relationships, four solutions are obtained.

Like the case (1), to be able to use a solution table when solving the respective equations, coefficients of the unknown quantities are converted to elements on GF(2). That is, the unknown quantities are replaced as follows: $\epsilon/\delta$ in the quadratic equation for looking for $\alpha_0$, $\beta_0$; $\epsilon/S$ in the quadratic equation for looking for $\alpha_1$, $\beta_1$; and $x/\alpha_1$, $x/\beta_1$ in the quadratic factor equations.

(4) In case of $S\neq 0$, $\lceil \neq 0$, $b=0$ and $c=0$:

Note here, $a=D/S$, $B=a^4+Ta+Q$, $D^2+ST=0$, $S^2Q+SDT+T^2=0$ and $S^2B=0$.

Subjected to the variable conversion $X=x+a$, and eliminate the term of the second degree, the following expression Exp. 29 is obtained.

$$x^4+Sx^3=0. \quad \text{[Exp. 29]}$$

Two solutions, $X_1=a$ and $X_2=S+a$, will be obtained from this equation.

(5) In case of $S\neq 0$, $\zeta\neq 0$ and $\lceil =0$:

Only when $Q=0$, there are four errors or less. If there is not a solution in the above-described case, there are five or more errors, and $D=\zeta/S$ and $T=0$ are obtained.

The error location searching biquadratic equation results in the following quadratic equation.

$$X^2+SX+\zeta/S=0 \quad \text{[Exp. 30]}$$

Solve this equation, and two solutions will be obtained. To be able to use a solution table when solving the equation, coefficients of the unknown quantities are converted to elements on GF(2). That is, X/S is dealt with the unknown quantity.

(6) In case of $S\neq 0$, $\lceil =0$ and $\zeta=0$:

$T=0$, and $D=0$ from $SD+T=\zeta$, and further $Q=0$. Therefore, the error searching equation will be expressed as follows.

$$X^4+SX^3=0 \quad \text{[Exp. 31]}$$

From this equation, as one solution except zero, $X_1=S$ is obtained.

(7) In case of $\lceil \neq 0$, $D\neq 0$ and $S=0$:

$\zeta\neq 0$ and $\eta\neq 0$ from $\lceil D\neq 0$, and $\lceil =\zeta^2$, $D=\eta/\zeta$, $T=\zeta$, $Q=\eta^2/\zeta^2+\theta/\zeta$, $b=D^2$ and $c=T^2$.

As expressed in Exp. 32, the term of the third degree is removed from the error searching equation, and it is factorized to a product of quadratic equations.

$$X^4+DX^2+TX+Q=(X^2+\alpha_1 X+\alpha_0)(X^2+\beta_1 X+\beta_0) \quad \text{[Exp. 32]}$$

Based on the relationships between the coefficients $\alpha_0$, $\alpha_1$, $\beta_0$, $\beta_1$ of the factorized quadratic equations and the quantities brought out syndromes, using unknown quantity $\delta=\alpha_0+\beta_0$, and $\alpha_0\beta_0=Q$, $\beta_1\alpha_0+\alpha_1\beta_0=T$, $\delta+\alpha_1\beta_1=D$ and $\alpha_1+\beta_1=0$, a cubic equation is obtained to be satisfied with $\delta/D+1$ as shown in the expression Exp. 33.

$$(\delta/D+1)^3+(\delta/D+1)+c/b^{3/2}=0 \quad \text{[Exp. 33]}$$

This is a cubic equation without the secondary term, which is similar to that used in other cases. Solve this equation to look for a root as $\delta$, and two quadratic equations are obtained to be satisfied with the factorized coefficient as shown in the following expression Exp. 34.

$$(\epsilon/\delta)^2+(\epsilon/\delta)+Q/\delta^2=0$$

$$\epsilon^2+\delta+D=0 \quad \text{[Exp. 34]}$$

Solve these equations, and coefficients $\alpha_0$, $\alpha_1$, $\beta_0$ and $\beta_1$ are obtained. The equation with roots of $\alpha_1$ and $\beta_1$ is easily solved, and $\alpha_1=\beta_1=(\delta+D)^{1/2}$ is obtained.

Next, solve the following quadratic equations with the above-described coefficients shown in Exp. 35.

$$(X/\alpha_1)^2+(X/\alpha_1)+\alpha_0/\alpha_1{}^2=0$$

$$(X/\alpha_1)^2+(X/\alpha_1)+\beta_0/\alpha_1{}^2=0 \quad \text{[Exp. 35]}$$

As a result, the unknown quantity "X" will be obtained as four solutions of the error searching equation.

Like the case (1), to be able to use a solution table when solving the respective equations, coefficients of the unknown quantities are converted to elements on GF(2). That is, the unknown quantities are replaced as follows: $\epsilon/\delta$ in the quadratic equation for looking for $\alpha_0$, $\beta_0$; and $X/\alpha_1$ in the quadratic factor equation.

(8) In case of $\Gamma=0$, $S=0$ and $D=0$:

$\zeta\neq 0$ from $\Gamma\neq 0$, $\eta=0$ from $S=D=0$, and $\Gamma=\zeta^2$, $D=\eta/\zeta$, $T=\zeta$, $c=T^2$, $D=0$ and $Q=\theta/\zeta$. The error searching equation becomes one without the second term and the third term, as follows.

$$X^4+TX+Q=(X^2+\alpha_1X+\alpha_0)(X^2+\beta_1X+\beta_0)=0 \quad \text{[Exp. 36]}$$

Based on the relationships between the coefficients $\alpha_0$, $\alpha_1$, $\beta_0$, $\beta_1$ of the factorized quadratic equations and the quantities brought out syndromes, using unknown quantity $\delta=\alpha_0+\beta_0$ and $\alpha_0\beta_0=Q$, $\beta_1\alpha_0+\alpha_1\beta_0=T$, $\delta+\alpha_1\beta_1=D$ and $\alpha_1+\beta_1=0$, a cubic equation is obtained to be satisfied with $\delta$ as shown in the expression Exp. 37.

$$\delta^3+c=0 \quad \text{[Exp. 37]}$$

This equation is easily solved, and $\delta=c^{1/3}$ is obtained. Based on this $\delta$, the following two quadratic equations are obtained to be satisfied with factorization coefficients.

$$(\epsilon/\delta)^2+(\epsilon/\delta)+Q/\delta^2=0$$

$$\epsilon^2+\delta=0 \quad \text{[Exp. 38]}$$

Next, solve the following quadratic equations with the above-described coefficients shown in Exp. 39.

$$(X/\alpha_1)^2+(X/\alpha_1)+\alpha_0/\alpha_1^2=0$$

$$(X/\alpha_1)^2+(X/\alpha_1)+\beta_0/\alpha_1^2=0 \quad \text{[Exp. 39]}$$

As a result, the unknown quantity "X" will be obtained as four solutions of the error searching equation.

Like the case (1), to be able to use a solution table when solving the respective equations, coefficients of the unknown quantities are converted to elements on GF(2). That is, the unknown quantities are set as follows: $\epsilon/\delta$ in the quadratic equation for looking for $\alpha_0$, $\beta_0$; and $X/\alpha_1$ in the quadratic factor equation.

(9) In case of $\Gamma=0$ and $S=0$:

In this case, $\Gamma=\zeta^2=0$ and $T=\zeta=0$. Further, $\eta=\theta=0$, $D=0$ and $Q=0$ based on the relationship with respect to the syndrome quantities in the case of four or more errors. Therefore, the error searching equation will be expressed as follows.

$$X^4=0 \quad \text{[Exp. 40]}$$

This means "no error". If there are five or more errors, the equation of Exp. 40 is not realized because of $\eta\neq 0$ or $\theta\neq 0$. That is, this case means that error correction is impossible, i.e., "non correctable".

The above-described error-detection calculation processes will be expressed only with quantities and equations required for the calculation procedure in the actual system as follows.

Calculation procedure (a)—In case of $S=0$ and $\zeta=0$, i.e., corresponding to the above-described case (9):

If $\eta=0$ and $\theta=0$, it results in "no error". If $\eta\neq 0$ or $\theta\neq 0$, it becomes "non correctable".

Calculation procedure (b)—In case of $S=0$, $\zeta\neq 0$ and $\eta=0$, i.e., corresponding to the above-described case (8):

Replace $\delta=\zeta^{2/3}$ and $Q=\theta/\zeta$, and solve equation $u^2+u=Q/\delta^2$, thereby getting solutions $u_1$ and $u_2$. Replace $\alpha_0=\delta u_1$, $\beta_0=\delta u_2$ and $\alpha_1=\beta_1=\delta^{1/2}$, and solve equations $y^2+y=\alpha_0/\alpha_1^2$, $z^2+z=\beta_0/\beta_1^2$, thereby getting $y_1$, $y_2$ and $z_1$, $z_2$. $X_1=\alpha_1y_1$, $X_2=\alpha_1y_2$, $X_3=\beta_1z_1$ and $X_4=\beta_1z_2$ are solutions that designate error locations.

Calculation procedure (c)—In case of $S=0$, $\zeta\neq 0$ and $\eta\neq 0$, i.e., corresponding to the above-described case (7):

Replace $b=\eta^2/\zeta^2$, $c=\zeta^2$ and $Q=\eta^2/\zeta^2+\theta^2/\zeta$, solve equation of $w^3+w=c/b^{3/2}$, and select one root "w". Form equation $\delta=b^{1/2}(w+1)$ by use of "w", solve equation $u^2+u=Q/\delta^2$, and get roots $u_1$ and $u_2$. Replace $\alpha_0=\delta u_1$, $\beta_0=\delta u_2$ and $\alpha_1=\beta_1=(\delta+b^{1/2})^{1/2}$, and solve equations $y^2+y=\alpha_0/\alpha_1^2$, $z^2+z=\beta_0/\beta_1^2$, thereby getting $y_1$, $y_2$ and $z_1$, $z_2$. $X_1=\alpha_0y_1$, $X_2=\alpha_1y_2$, $X_3=\beta_1z_1$ and $X_4=\beta_1z_2$ are solutions that designate error locations.

Calculation procedure (d)—In case of $S=0$, $\zeta=0$ and $\Gamma=0$, i.e., corresponding to the above-described case (6):

This case designates that there is one error defined by $X_1=S$.

Calculation procedure (e)—In case of $S\neq 0$, $\zeta\neq 0$ and $\Gamma=0$, i.e., corresponding to the above-described case (5):

Replace $D=\zeta/S$ and $\alpha_0=D$, $\alpha_1=S$, solve equation $y^2+y=\alpha_0/\alpha_1^2$, and get roots $y_1$ and $y_2$. $X_1=\alpha_1y_1$ and $X_2=\alpha_1y_2$ are solutions that designate two error locations.

Calculation procedure (f)—In case of $S\neq 0$, $\Gamma\neq 0$, $b\neq 0$ and $c\neq 0$, i.e., corresponding to the above-described case (1):

Solve equation of $w^3+w=c/b^{3/2}$, and select one root "w". Form equation $\delta=b^{1/2}w$ by use of "w", and solve equations $u^2+u=B/\delta^2$ and $v^2+v=\delta/S_2$, thereby getting roots $u_1$, $u_2$ and $v_1$, $v_2$. Replace $\alpha_0=\delta u_1$, $\beta_0=\delta u_2$, $\alpha_1=Sv_1$ and $\beta_1=Sv_2$, and solve equations $y^2+Y=\alpha_0/\alpha_1^2$, $z^2+z=\beta_0/\beta_1^2$, thereby getting $y_1$, $y_2$ and $z_1$, $Z_2$. $X_1=\alpha_1y_1+a$, $X_2=\alpha_1y_2+a$, $X_3=\beta_1z_1+a$ and $X_4=\beta_1z_2+a$ are solutions that designate error locations.

Calculation procedure (g)—In case of $S\neq 0$, $\Gamma\neq 0$, $b\neq 0$ and $c=0$, i.e., corresponding to the above-described case (2):

Replace $\delta=b^{1/2}$, solve the equations $u_2+u=B/\delta^2$ and $v_1+v=\delta/S^2$, thereby getting roots $u_1$, $u_2$ and $v_1$, $v_2$. Note here that the relationship of $u=v^2$ is satisfied due to the condition. Replace $\alpha_0=\delta u_1$, $\beta_0=\delta u_2$, $\alpha_1=Sv_1$ and $\beta_1=Sv_2$, and solve equations $y^2+y=\alpha_0/\alpha_1^2$, $z^2+z=\beta_0/\beta_1^2$, thereby getting $y_1$, $y_2$ and $z_1$, $z_2$. There is also here a relationship of $y=x$ satisfied due to the condition. $X_1=\alpha_1y_1+a$, $X_2=\alpha_1y_2+a$, $X_3=\beta_1z_1+a$ and $X_4=\beta_1z_2+a$ are solutions that designate error locations. Note here that $X_2=X_3=\delta/S+a$ due to the condition.

Calculation procedure (h)—In case of $S\neq 0$, $\Gamma\neq 0$, $c\neq 0$ and $b=0$, i.e., corresponding to the above-described case (3):

Replace $\delta=c^{1/3}$, and solve equations $u_2+u=B/\delta^2$ and $v^2+v=\delta/S^2$, thereby getting solutions $u_1$, $u_2$ and $v_1$, $v_2$. Note here that the relationship of $u=v$ is satisfied due to the condition. Replace $\alpha_0=\delta u_1$, $\beta_0=\delta u_2$, $\alpha_1=Sv_1$ and $\beta_1=Sv_2$, and solve equations $y^2+y=\alpha_0/\alpha_1^2$, $z^2+z=\beta_0/\beta_1^2$, thereby getting $y_1$, $y_2$ and $z_1$, $z_2$. $X_1=\alpha_1y_1+a$, $X_2=\alpha_1y_2+a$, $X_3=\beta_1z_1+a$ and $X_4=\beta_1z_2+a$ are solutions that designate error locations.

Calculation procedure (i) —In case of $S\neq 0$, $\Gamma\neq 0$, $c\neq 0$ and $c=0$, i.e., corresponding to the above-described case (4):

Although solutions $X_1=a$ and $X_2=S+a$ are directly obtained from the case (4), to use the same calculation process as the procedure (h) as possible, the following procedures are used. Replace $\alpha_0=\beta_0=0$, and $\alpha_1=\beta_1=S$, solve the equations $y^2+y=\alpha_0/\alpha_1^2$ and $z^2+z=\beta_0/\beta_1^2$, thereby getting solutions $y_1$, $y_2$ and $z_1$, $z_2$. Here, one of the solutions $y_1$ and $y_2$ is "0" and the other is "1"; similarly, one of the solutions $z_1$ and $Z_2$ is "0" and the other is "1". For example, $y_1=0$, $y_2=1$, $z_1=0$ and $z_2=1$. At this time, $X_1=\alpha_1y_1+a$, $X_2=\alpha_1y_2+a$, $X_3=\beta_1z_1+a$ and $X_4=\beta_1z_2+a$ are solutions that designate error locations.

While in the above-described procedures for solving the error search equation, many quantities are used in the calculation branches and calculation steps, these quantities are ones calculated from the syndromes. Syndromes $S(=S_1)$, $S_3$, $S_5$ and $S_7$ are quantities directly calculated from the stored data, and other quantities are obtained by arithmetical product, involution and addition thereof.

FIG. 1 shows procedures for getting quantities required in calculations from the syndromes. At step 1 just after obtaining the syndromes, $\zeta=S^3+S_3$, $\eta=S^5+S_5$ and $\theta=S^7+S_7$ are obtained through involution and addition.

At step 2, many kinds of products and quotients of involutions are calculated from the result at step 1. Required quantities are thirteen, and product and sum thereof are calculated at the next step 3. That is, four quantities, ⌈, ⌈D, ⌈T and $S^2\zeta\eta$, are calculated at step 3.

At step 4, based on the quotient arithmetic at the last step and the sum of previously obtained quantities, "D", "T" and ⌈Q are calculated. At the next step 5, "a", "ST", "DT" and "Q" are calculated based on the product and quotient of the obtained quantities.

At step 5, "b", $S^2Q$, SDT and "Ta" are calculated through addition, product and quotient arithmetic, and "c" and "B" are calculated at the final step 7.

Calculation steps after syndromes are 7 steps described above. Involution arithmetic may be performed with multiplexing, i.e., arrangement of codes expressing quantities; addition may be performed by a parity checker; and product and quotient may be performed with adders for codes expressing quantities. The detail will be explained later.

[Constitution of the 4EC-EW-BCH System]

FIG. 2 shows the 4EC-EW-BCH system, which is able to correct up to 4-bit errors and warns of five or more errors.

Encode part 21 is disposed to obtain surplus polynomial r(x) used for generating check bit based on information polynomial f(x) corresponding to the to-be-stored data. As information bits, only coefficients of required degree numbers are used in accordance with the constitution of data bits while unused coefficients are fixed to be dealt with "0" or "1" data. As a result, a suitable system adaptable to the memory capacity will be constituted without storing the fixed bits in the memory.

The degree numbers constituting the information bits are so selected as to make the calculation scale and system scale minimum. Generally speaking, (h-1-4n)th degree polynomial with coefficients as being information bits $a_i$ is dealt with information polynomial f(x).

As described above, surplus r(x) is obtained by dividing $f(x)x^{4n}$ by code generation polynomial g(x), and coefficients of polynomial $f(x)x^{4n}+r(x)$ are written into memory core 22 as data bits. This memory core 22 includes a memory cell array, decoder circuits and sense amplifier circuits. Used in detail in this embodiment is a memory, in which error bits are not avoidable, such as a NAND-type flash memory (for example, refer to U.S. Pat. No. 7,369,433, or JP-A-2007-35124), a resistance change memory, a phase change memory and the like.

With respect to data reading, h-bit data read out the memory core 22 are dealt with coefficients of (h−1)th degree polynomial ν(x).

Syndrome calculation part 23 is prepared for calculating syndromes $S(=S_1)$, $S_3$, $S_5$ and $S_7$ based on the read out polynomial ν(x). At this part 23, syndromes S, $S_3$, $S_5$ and $S_7$ are obtained as surpluses by dividing ν(x) by $m_1(x)$, $m_3(x)$, $m_5(x)$ and $m_7(x)$, and indexes thereof are decomposed by factorization.

Indexes expressed as components are referred to as "expression indexes" hereinafter. In the following calculations, syndromes S, $S_3$, $S_5$ and $S_7$ are expressed as the expression indexes; binary number addition is performed; the expression indexes are decoded in the parity checker to be expressed as (n−1)-degree polynomial as finite field elements; coefficients of polynomial as addition elements as a result of parity checking for coefficients of the respective degrees; and then they are decoded to expression indexes.

After having obtained the syndromes, at syndrome element calculation (SEC) part 24, quantities required in the steps shown in FIG. 1 are calculated and stored in registers with steps shown in FIG. 1. Here are fifteen registers.

Error search (ES) part 25 is prepared for performing error location search based on the quantities obtained at the SEC part 24. All data stored in these parts 24 and 25 are expression indexes. Clock generator 27 is for generating clocks used for controlling the calculating processes, in which clocks ck1 to ck16 are divided from the external clock CL and used. In the drawing, there are shown clock dispersions used for mainly controlling the calculation blocks.

Note here that since syndrome element calculating part 24 and error search part 25 do not reciprocate data, circuit blocks are multiplexed and the circuit scale is made small. Therefore, syndrome element calculating part 24 and error search part 25 are coupled with bi-directional arrow.

The result of the error search part 25 is input to error correction (EC) part 26 to be used for error-correcting read out data of this memory. At this error correction part 26, externally input information data polynomial f(x) is restored and output as information data.

Figure 3:
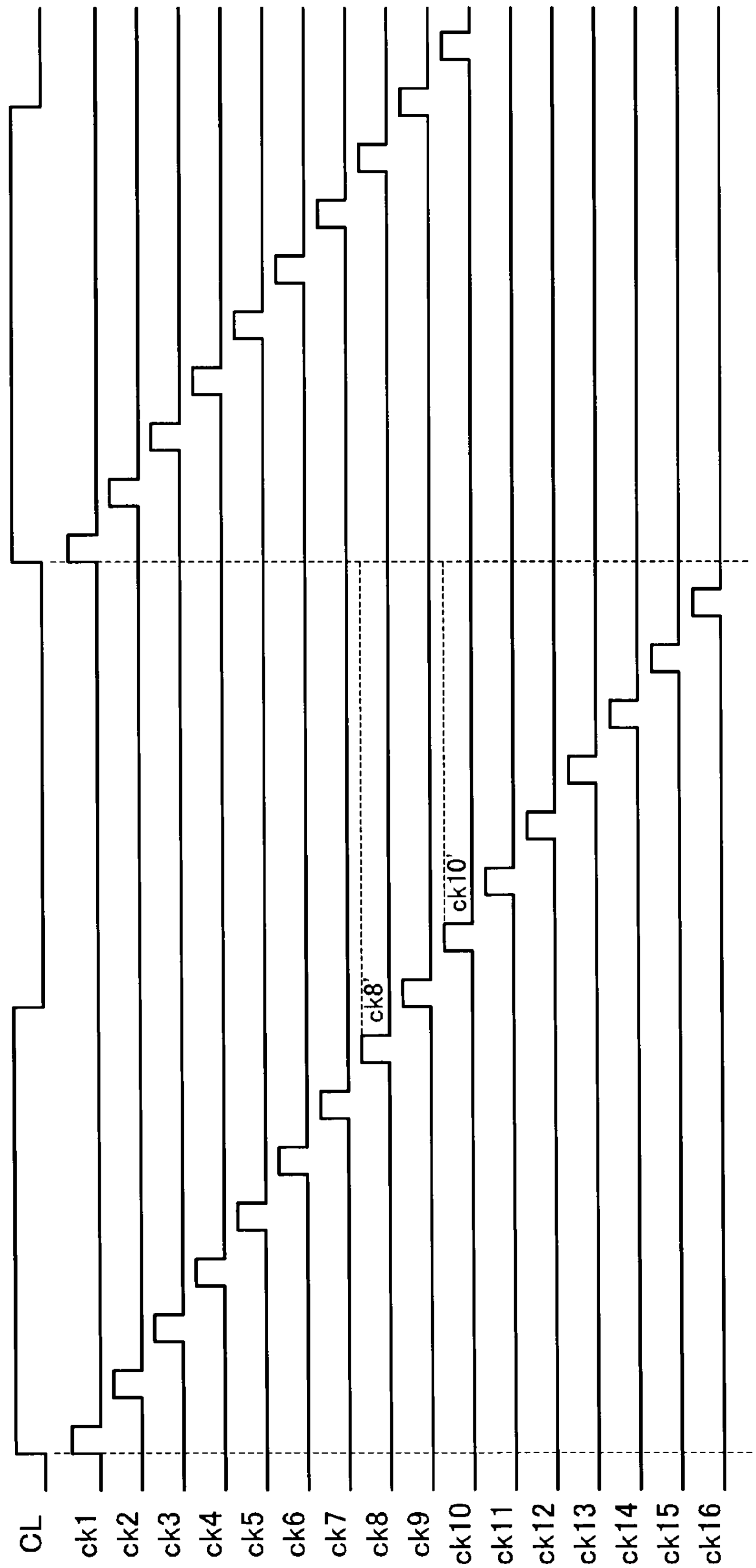
FIG. 3 shows clocks used for driving the error searching and correcting system.

FIG. 3 shows clocks generated from the clock generator 27. Basic clock CL for controlling the memory and data transferring has a cycle time of scores [ns]. Although the detail of this clock generation is not explained here, the method disclosed in JP-A-2004-50614 will be useful, which has been proposed by this inventor.

Clocks ck1 to ck16 are clock pulses with a pulse width of several [ns], which are sequentially and cyclically generated in a cascade manner without overlaps therebetween. Further, clocks attached with dashes are generated in response to the above-described clocks used as triggers for holding states until the successive cycle starts. For example, clocks ck8' and cl10' are generated based on clock 8 and clock 10, respectively.

Figure 4:
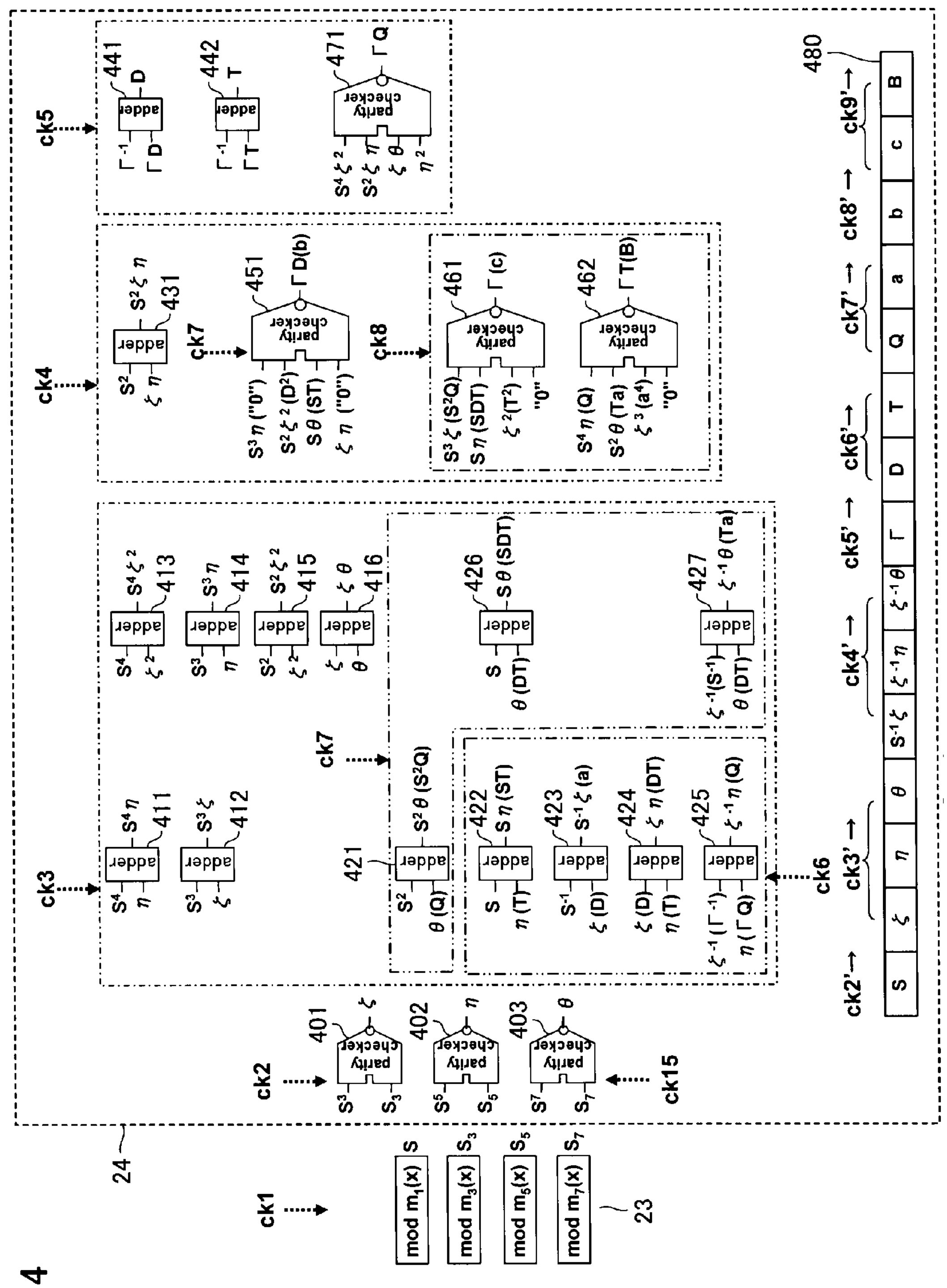
FIG. 4 shows the syndrome element calculation (SEC) part of the system.

FIG. 4 shows a detailed configuration of SEC part 24. SEC part 24 has three two-input parity checkers 401, 402 and 403; sixteen adders 411 to 416, 421 to 427, 431, 441 and 442; four four-input parity checkers 451, 461, 462 and 471; and data register group 480 having fifteen data registers. In these circuit elements, three 2-input parity checkers 401 to 403; seven adders 421 to 427, at the input(s) and output of which other quantities are shown in parentheses; and three 4-input parity checkers 451, 461 and 462 serve as multiplex use.

There are shown the relationship between the respective circuit groups and control clocks thereof. The calculation steps correspond to the above-described seven calculation steps.

Syndrome calculation part 23 is controlled with clock ck1. In response to the calculation, in SEC part 24, three 2-input parity checkers 401 to 403 are activated with clock ck2 to perform calculations corresponding to step 1, and then adders 411 to 416, 421 to 427 are activated with clock ck3 to perform thirteen calculations corresponding to step 2.

Addition and product corresponding to the following step 3 are performed in one adder 431 and three 4-input parity checkers 451, 461 and 462 activated with clock ck4. Product and addition corresponding to the following step 4 are performed in two adders 441 and 442, and one 4-input parity checker 471 activated with clock ck5.

Product corresponding to step 5 are performed in four adders 422 to 425 activated with clock ck6, which are subjected to multiplex use. Product and addition corresponding to step 6 are performed in three adders 421, 426 and 427, and one 4-input parity checkers 451 activated with clock ck7. Addition corresponding to step 7 is performed in two 4-input parity checkers 461 and 462 activated with clock ck8.

Fifteen calculation results obtained through the above-described calculation processes are stored in register group activated with clocks with dash.

The detail of the respective circuits will be explained later.

Figure 5:
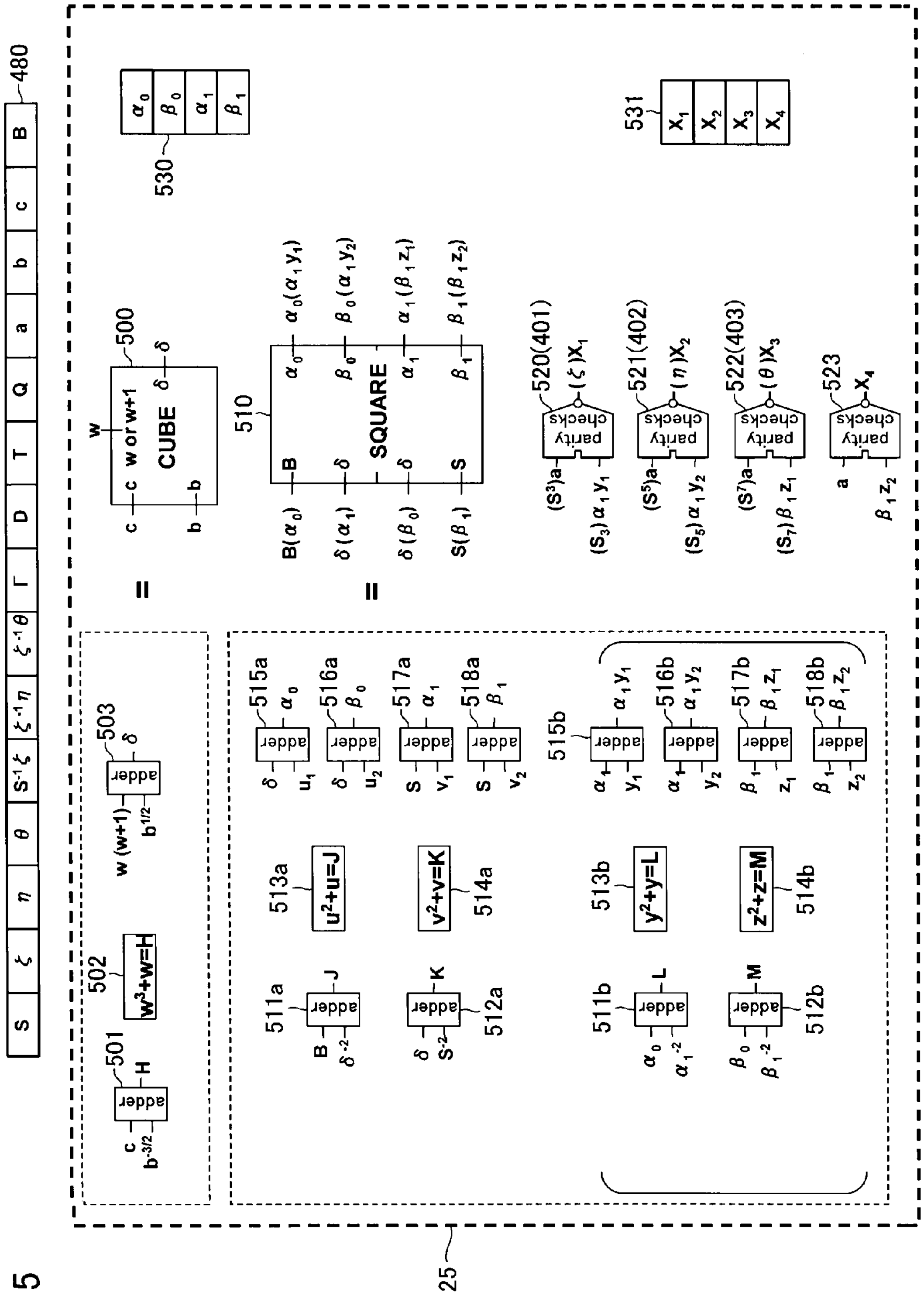
FIG. 5 shows the error searching (ES) part of the system.

FIG. 5 shows the detailed configuration of ES part 25. This performs searching calculations based on the Galois field elements stored as calculation results of SEC part 24, and specifies the error locations. As shown in FIG. 5, it has: circuit block (CUBE part) 500 for solving a cubic equation; circuit block (SQUARE part) 510 for solving a quadratic equation; and four, two-input parity checkers 520 to 523, each calculating addition between elements.

CUBE part 500 includes: one adder 501 for calculating quantity "H" obtained from syndromes, for which unknown quantity parts of the cubic equation is substituted; decoder circuit 502 for searching "w" in the cubic equation of $w^3+w=H$; and another adder 503 for calculating a desirable quantity δ from "w" as a product of "w" or "w+1" by $b^{1/2}$.

SQUARE part 510 includes: two adders 511*a* and 512*a* for calculating quantities "J" and "K" obtained from δ, for which unknown quantity parts of the quadratic equations are substituted, the quadratic equations being prepared for searching roots of biquadratic error search equation; decoder circuits 513*a* and 514*a* for searching "u" and "v" in the quadratic equations $u^2+u=J$ and $v^2+v=K$, respectively; and four adders 515*a* to 518*a* for calculating factorization coefficients $\alpha_0$, $\beta_0$, $\alpha_1$ and $\beta_1$, which are prepared for factorizing the biquadratic equation into quadratic equations, based on "u" and "v".

SQUARE part 510 further includes: two adders 511*b* and 512*b* for calculating quantities "L" and "M" to be substituted for unknown quantity parts of the quadratic equations, which are prepared for searching roots of biquadratic error search equation; decoder circuits 513*b* and 514*b* for searching "y" and "z" in the quadratic equations $y^2+y=L$ and $z^2+z=M$, respectively; and four adders 515*b* to 518*b* for calculating the solutions of the biquadratic equation based on "y" and "z".

Note here that in SQUARE part 510, the same circuit systems will be used in the latter half as those in the former half. Therefore, as the calculation circuit parts 511*b* to 518*b*, which are shown in parentheses and used in the latter half, the calculation circuit parts 511*a* to 518*a* used in the former half serve as multiplex use. For this purpose, to hold the calculation result in the former half, there are prepared a group of registers (α0, β0, α1, β1), 530.

The calculation results in SQUARE part 510 are added to quantities obtained from the syndromes, and it becomes the real error searched results. To perform the additional calculation, there are prepared four 2-input parity checkers 520 to 523, and a register group ($X_1$, $X_2$, $X_3$, $X_4$), 531, are disposed for holding the calculation results.

Within the four parity checkers 520 to 523, three checkers 520 to 522 are the same as three parity checkers 401 to 403 used in SEC part 24, i.e., these serve as multiplex use.

Next, with respect to ES part 25, the calculation process will be explained in accordance with detailed calculation cases. The calculation processes of eight cases, case 1 to case 8, will be explained with reference to FIGS. 6 to 12.

Figure 6:
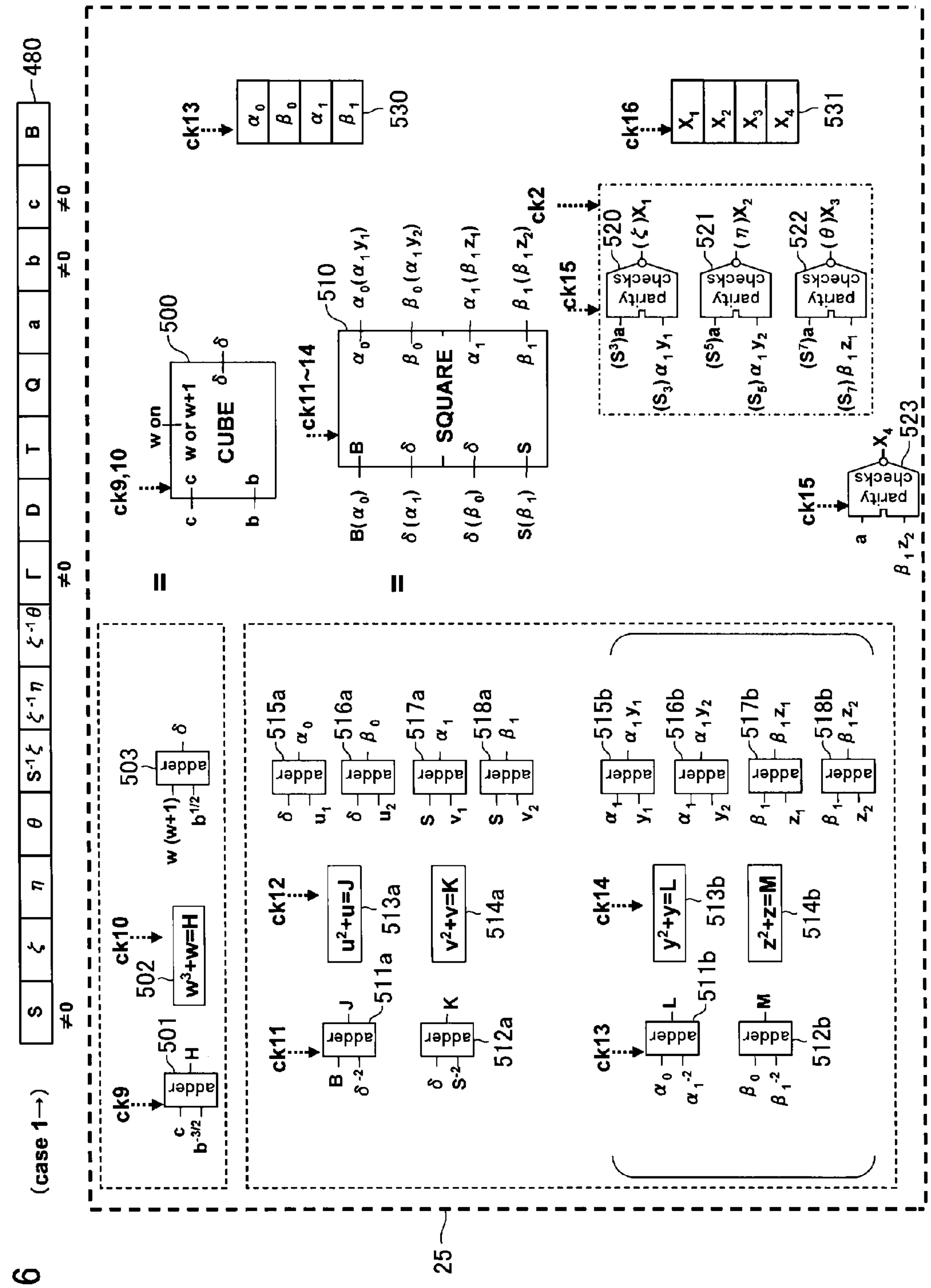
FIG. 6 is a diagram for explaining the operation of the ES part (in case 1).

FIG. 6 shows the "case 1", which corresponds to the above-described calculation procedure (f). Register group 480 in SEC part 24 is in the state of: S≠0, ⌈≠0, b≠0 and c≠0. "B" is used in the calculation process as another quantity. There are shown timing clocks for making the respective circuit blocks function.

In the circuit block (i.e., CUBE part) 500, the product of "$b^{-3/2}$" by "c" is calculated at adder 501 with clock ck9; the solution of the cubic equation $w^3+w=H$ is decoded at decoder 502 with clock ck10; and the product of "w(w+1)" by "$b^{1/2}$" is calculated at adder 503, so that result δ is output.

In the circuit (i.e., SQUARE part) 510, the product of "B" by $\delta^{-2}$ is calculated at adder 511*a*, and the product of δ by $S^{-2}$ is calculated at adder 512*a* with clock ck11; the solutions of quadratic equations $u^2+u=J$ and $v^2+v=K$ are calculated at decoders 513*a* and 514*a* with clock ck12; the products of the respective solutions by the involutions of δ and "S" are calculated at adders 515*a* to 518*a* to output $\alpha_0$, $\beta_0$, $\alpha_1$ and $\beta_1$. These outputs are stored in the data register group 530 with clock ck13.

This circuit block 510 serves for the successive calculation in a multiplex use. That is, with clock ck13, the product of $\alpha_0$ by $\alpha_1^{-2}$ and the product of $\beta_0$ by $\beta_1^{-2}$ are calculated at adder 511*b* and 512*b*, respectively; with clock ck14, the solutions of quadratic equations $y^2+y=L$ and $z^2+z=M$ are calculated at decoders 513*b* and 514*b*, respectively; and the products of the respective solutions by the involutions of $\alpha_1$ and $\beta_1$ are calculated at adder groups 515*b* to 518*b*, whereby $\alpha_1y_1$, $\alpha_1y_2$, $\beta_1z_1$ and $\beta_1z_2$ are output.

The above-described results are added to "a" in the two-input parity checker groups 520 to 523 with clock ck15, whereby outputs $X_1$, $X_2$, $X_3$ and $X_4$ are obtained. These outputs are stored in register group 531 with clock 16.

Figure 7:
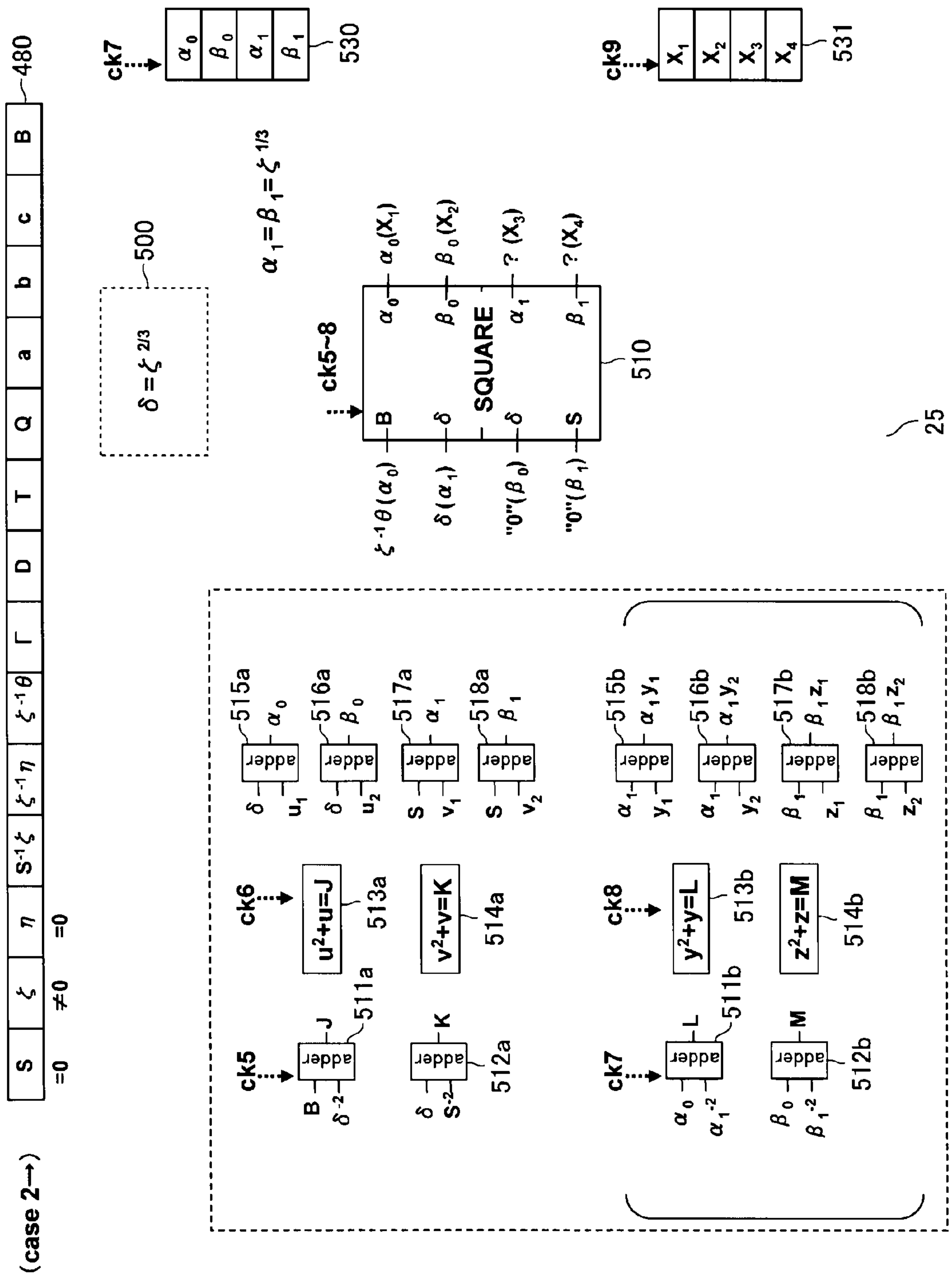
FIG. 7 is another diagram for explaining the operation of the ES part (in case 2).

FIG. 7 shows the "case 2", which corresponds to the above-described calculation procedure (b). Register group 480 in SEC part 24 is in the state of: S=0, ζ≠0 and η=0. $\zeta^{-1}\theta$ is used as another quantity in the calculation process. There are shown timing clocks for making the respective circuit blocks function. In this case, the calculation of the circuit block 500 is not necessary, so that here is shown $\delta=\zeta^{2/3}$. Parity checker groups are not also used in this case.

In the circuit block 510, with clock ck5, the product of $\zeta^{-1}\theta$ by δ is calculated at adder 511*a*, and "0" is input to another adder 512*a*; the solutions of quadratic equations $u^2+u=J$ and $v^2+v=K$ are calculated at decoders 513*a* and 514*a* with clock ck6; and the products of the respective solutions by δ are calculated at adders 515*a* and 516*a*, and $\alpha_0$ and $\beta_0$ are output. Further, $\alpha_1=\beta_1=\zeta^{1/2}$ is set. These outputs are stored in the data register group 530 with clock ck7.

This circuit block 510 serves for the successive calculation in a multiplex use. That is, with clock ck7, the product of $\alpha_0$ by $\alpha_1^{-2}$ is calculated at adder 511*b*, and the product of $\beta_0$ by $\beta_1^{-2}$ is calculated at adder 512*b*; and with clock ck8, the solutions of quadratic equations $y^2+y=L$ and $z^2+z=M$ are calculated at decoders 513*b* and 514*b*, respectively; and the products of the respective solutions by $\alpha_1$ and $\beta_1$ are calculated at adder groups 515*b* to 518*b*, whereby $X_1$, $X_2$, $X_3$ and $X_4$ are output. These outputs are stored in the register group 531 with clock ck9.

Figure 8:
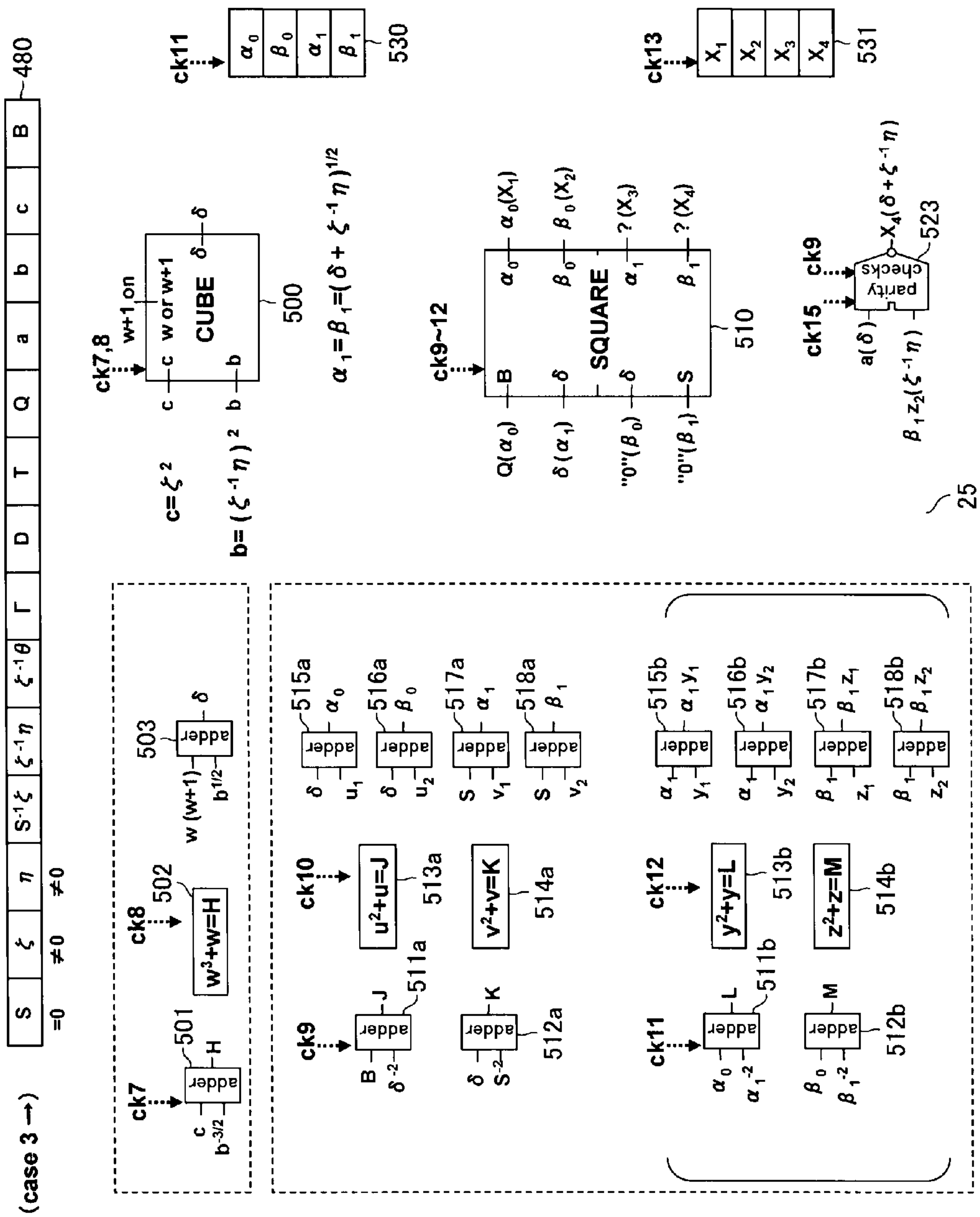
FIG. 8 is another diagram for explaining the operation of the ES part (in case 3).

FIG. 8 shows "case 3", which corresponds to the calculation procedure (c). Register group 480 in SEC part 24 is in the state of: S=0, ζ≠0 and η≠0. $\zeta^{-1}\theta$ and Q are used as other quantities in the calculation process. There are shown timing clocks for making the respective circuit blocks function.

Replacing $c=\zeta^2$ and $b=(\zeta^{-1}\eta)^2$, in the circuit block 500, based on "b" and "c", the product of involutions thereof is calculated with clock ck7 (adder 501); cubic equation is solved with clock ck8 (decode circuit 502); and the product of "w+1" by the involution of "b" is calculated (adder 503), whereby result δ is gotten.

In the circuit block 510, the product of "Q" by the involution of δ is calculated at adder 511*a* with clock ck9 while zero input in another adder 512*a* because it is not used; quadratic equation is solved at decode circuits 513a and 514a with clock ck10; and the products of the solutions by δ are calculated at adders 515a and 516a, so that $\alpha_0$ and $\beta_0$ are gotten. Further, replacing $\alpha_1=\beta_1=(\delta+\zeta^{-1}\eta)^{1/2}$, obtained data are stored in register group 530 with clock ck11.

At the timing of clock ck9, addition of δ and $\zeta^{-1}\eta$ is calculated in one of two-input parity checker 523, and it is used in $\alpha_1$ and $\beta_1$. The circuit block 510 is used again. That is, the product of $\alpha_0$ by the involution of $\alpha_1$ is calculated at one adder 511b, and the product of $\beta_0$ by the involution of $\beta_1$ is calculated at another adder 512b with clock ck11; quadratic equations are solved at decode circuits 513b and 514b with clock ck12; and the products of the solutions by $\alpha_1$ an d$\beta_1$ are calculated at four adders 515b-518b, so that $X_1$, $X_2$, $X_3$ and $X_4$ are gotten. These resultant data are stored in register group 531 with clock ck13.

Figure 9:
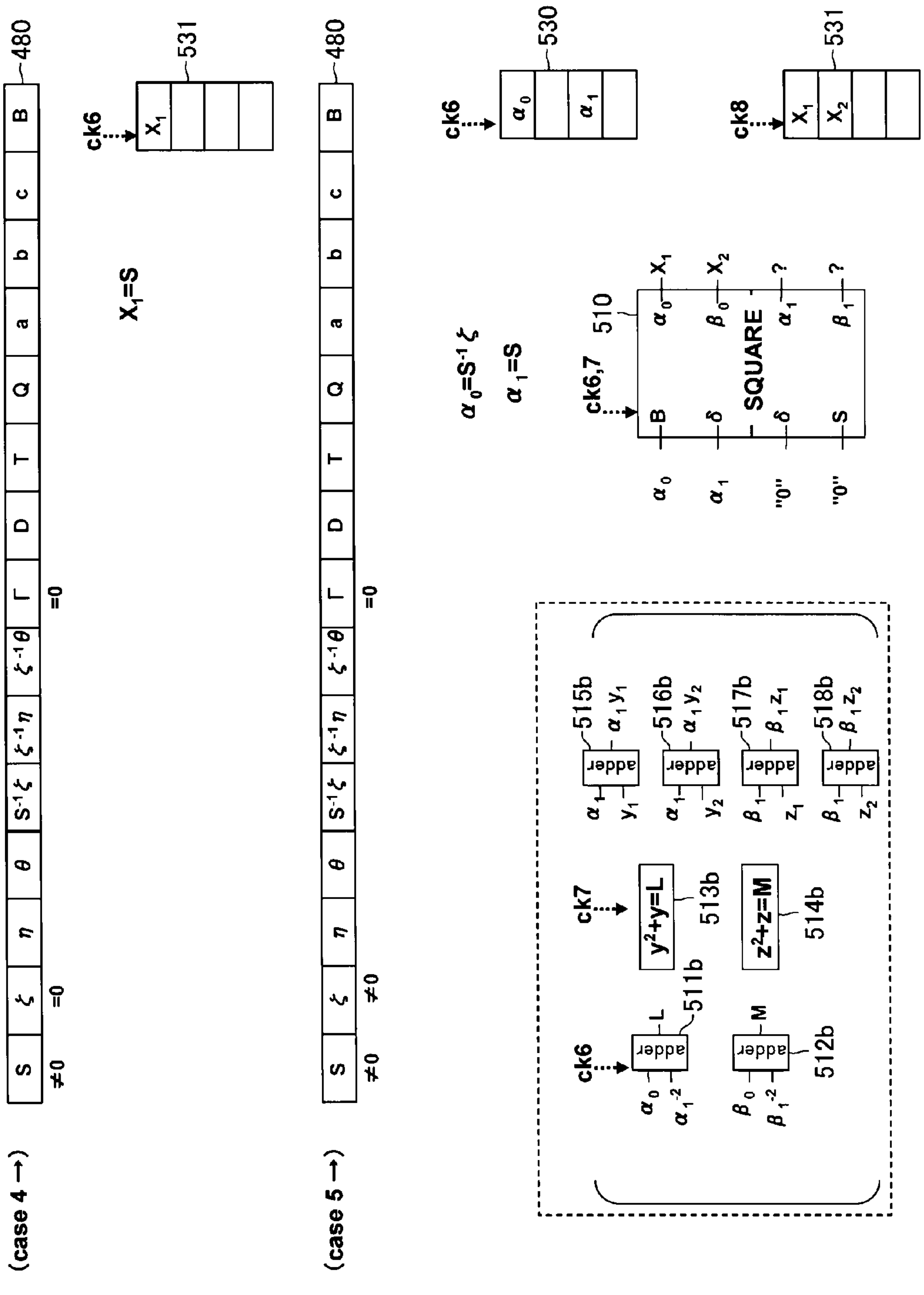
FIG. 9 is another diagram for explaining the operation of the ES part (in case 4).

FIG. 9 shows case 4 and case 5. The case 4 shown in the upper portion corresponds to calculation procedure (d), i.e., case of S≠0., ζ=0 and ⌈=0. In this procedure, it is only one process that $X_1$=S is stored in resister group 531 with clock ck6.

The case 5 shown in the lower portion in FIG. 9 corresponds to the calculation procedure (e), i.e., case of S≠0, ζ≠0 and ⌈=0. As another quantity, $S^{-1}\zeta$ is used. At the respective circuit blocks, there are shown timing clocks used for making them active.

There is no need of calculation in the circuit block 500 and the former calculation in the circuit block 510. Replace $\alpha_0=S^{-1}$ and $\alpha_1$=S, and store them in the register group 503 with clock ck6.

In the circuit block 510, the product of $\alpha_0$ by the involution of $\alpha_1$ is calculated at adder 511b with clock ck6, and zero is input to another adder 512b because it is not used. The solutions of quadratic equations are decoded at decode circuits 513b and 514b with clock ck7, and the product of the solutions by $\alpha_1$ are calculated at adders 515b and 516b, whereby $X_1$ and $X_2$ are output. These outputs are stored in register group 531.

Figure 10:
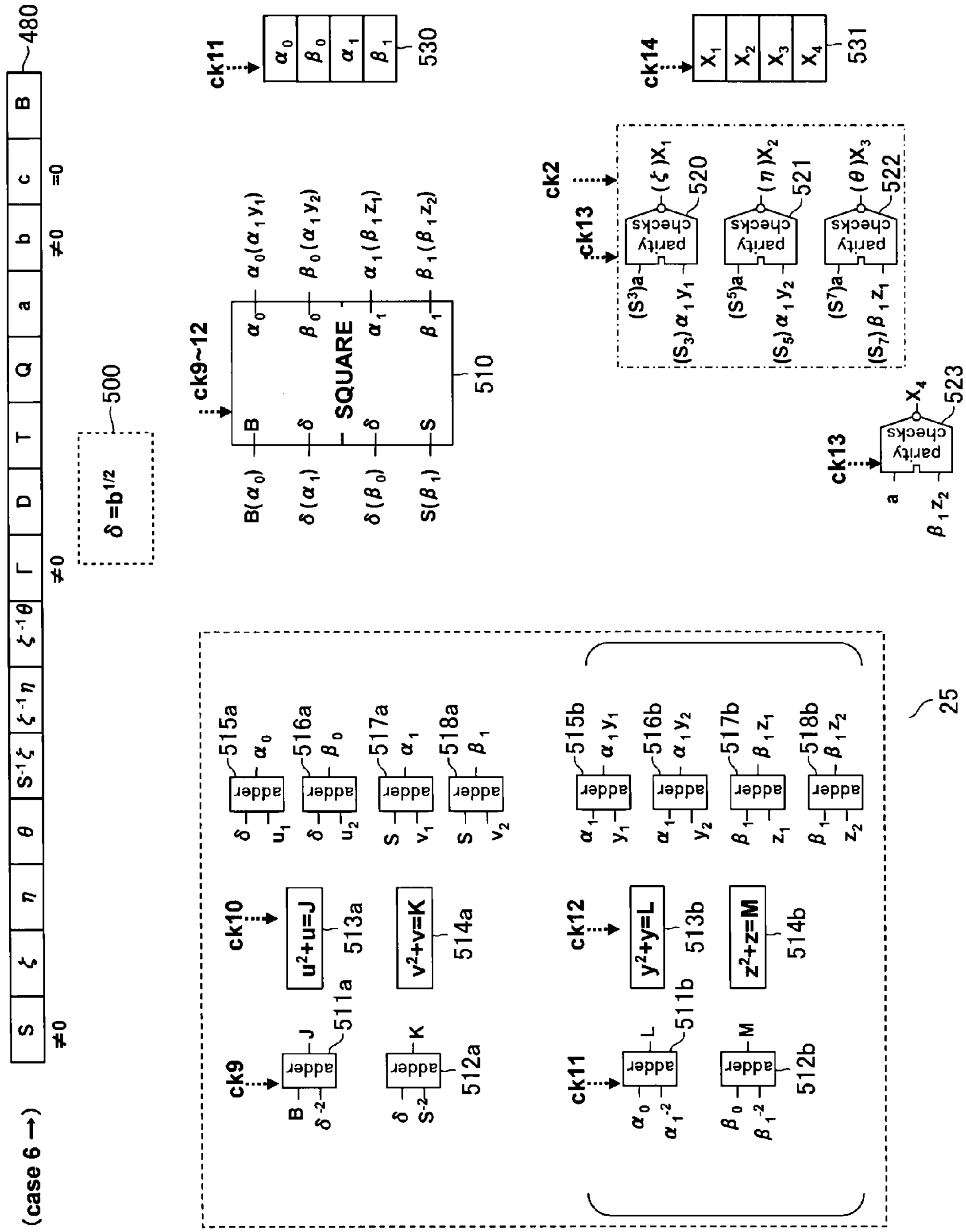
FIG. 10 is another diagram for explaining the operation of the ES part (in case 5).

FIG. 10 shows "case 6", which corresponds to the calculation procedure (g). That is, in case of S≠0, ⌈≠0 and b≠0 and c=0, and another quantity "B" is used. There are shown timing clocks at the respective circuit blocks, which are used for making them active. Since there is no need of calculation in the circuit block 500, $\delta=b^{1/2}$ will be set.

Calculations in circuit block 510 are as follows: the product of "B" by the involution of δ is calculated at adder 511a, and the product of δ by the involution of "S" is calculated at another adder 512a with clock ck9; solutions of the quadratic equations are decoded at decode circuits 513a and 514a with clock ck10; and the products of the respective solutions by δ and "S" are calculated at four adders 515a to 518a, whereby $\alpha_0$, $\beta_0$, $\alpha_1$ and $\beta_1$ are obtained. These results are stored in register group 530 with clock ck11.

Next, the circuit block 510 is activated again as the multiplex use. That is, the product of $\alpha_0$by the involution of $\alpha_1$ is calculated at adder 511b, and the product of $\beta_0$ by the involution of $\beta_1$ is calculated at adder 512b with clock ck11; Solutions of quadratic equations are decoded at decode circuits 513b and 514b with clock ck12; and the products of the solutions by $\alpha_1$ and $\beta_1$ are calculated at adders 515b to 518b, whereby $\alpha_1 y_1$, $\alpha_1 y_2$, $\beta_1 z_1$ and $\beta_1 z_2$ are gotten.

These results are added to "a" at parity checkers 520 to 523 with clock ck13, so that $X_1$, $X_2$, $X_3$ and $X_4$ are output. These are stored in register group 531 with clock ck14.

Figure 11:
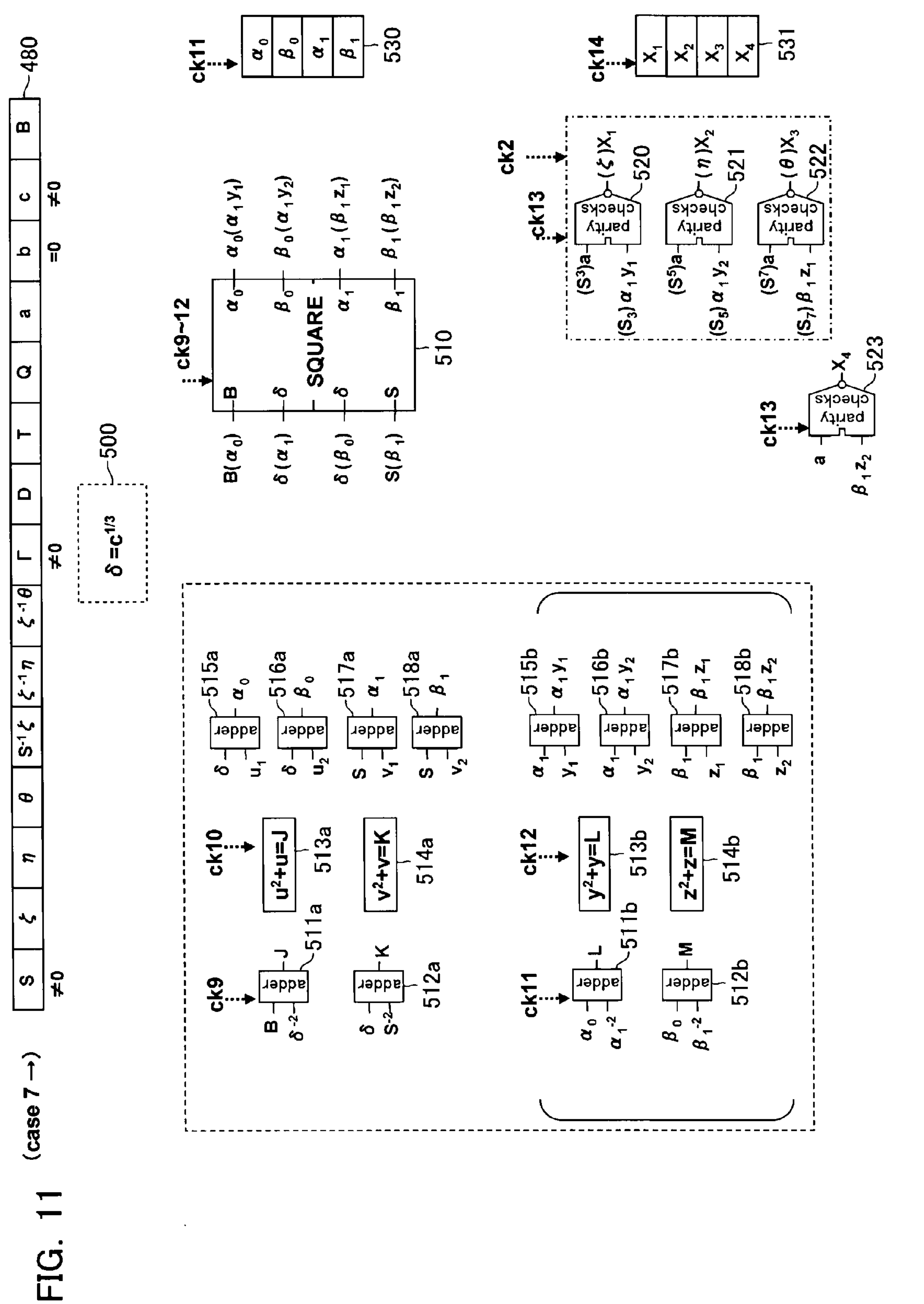
FIG. 11 is another diagram for explaining the operation of the ES part (in case 6).

FIG. 11 shows "case 7", which corresponds to the calculation procedure (h). That is, in case of S≠0, ⌈≠0, b=0 and c≠0, and another quantity "B" is used. There are shown timing clocks at the respective circuit blocks, which are used for making them active. Since there is no need of calculation in the circuit block 500, $\delta=c^{1/3}$ is set.

Calculations in circuit block 510 are as follows: the product of "B" by the involution of δ is calculated at adder 511a, and the product of δ by the involution of "S" is calculated at another adder 512a with clock ck9; solutions of the quadratic equations are decoded at decode circuits 513a and 514a with clock ck10; and the products of the respective solutions by δ and "S" are calculated at four adders 515a to 518a, whereby $\alpha_0$, $\beta_0$, $\alpha_1$ and $\beta_1$ are obtained. These results are stored in register group 530 with clock ck11.

Next, the circuit block 510 is activated again as the multiplex use. That is, the product of $\alpha_0$ by the involution of $\alpha_1$ is calculated at adder 511b, and the product of $\beta_0$ by the involution of $\beta_1$ is calculated at adder 512b with clock ck11; Solutions of quadratic equations are decoded at decode circuits 513b and 514b with clock ck12; and the products of the solutions by $\alpha_1$ and $\beta_1$ are calculated at adders 515b to 518b, whereby $\alpha_1 y_1$, $\alpha_1 y_2$, $\beta_1 z_1$ and $\beta_1 z_2$ are gotten.

These results are added to "a" at parity checkers 520 to 523 with clock ck13, so that $X_1$, $X_2$, $X_3$ and $X_4$ are output. These are stored in register group 531 with clock ck14.

Figure 12:
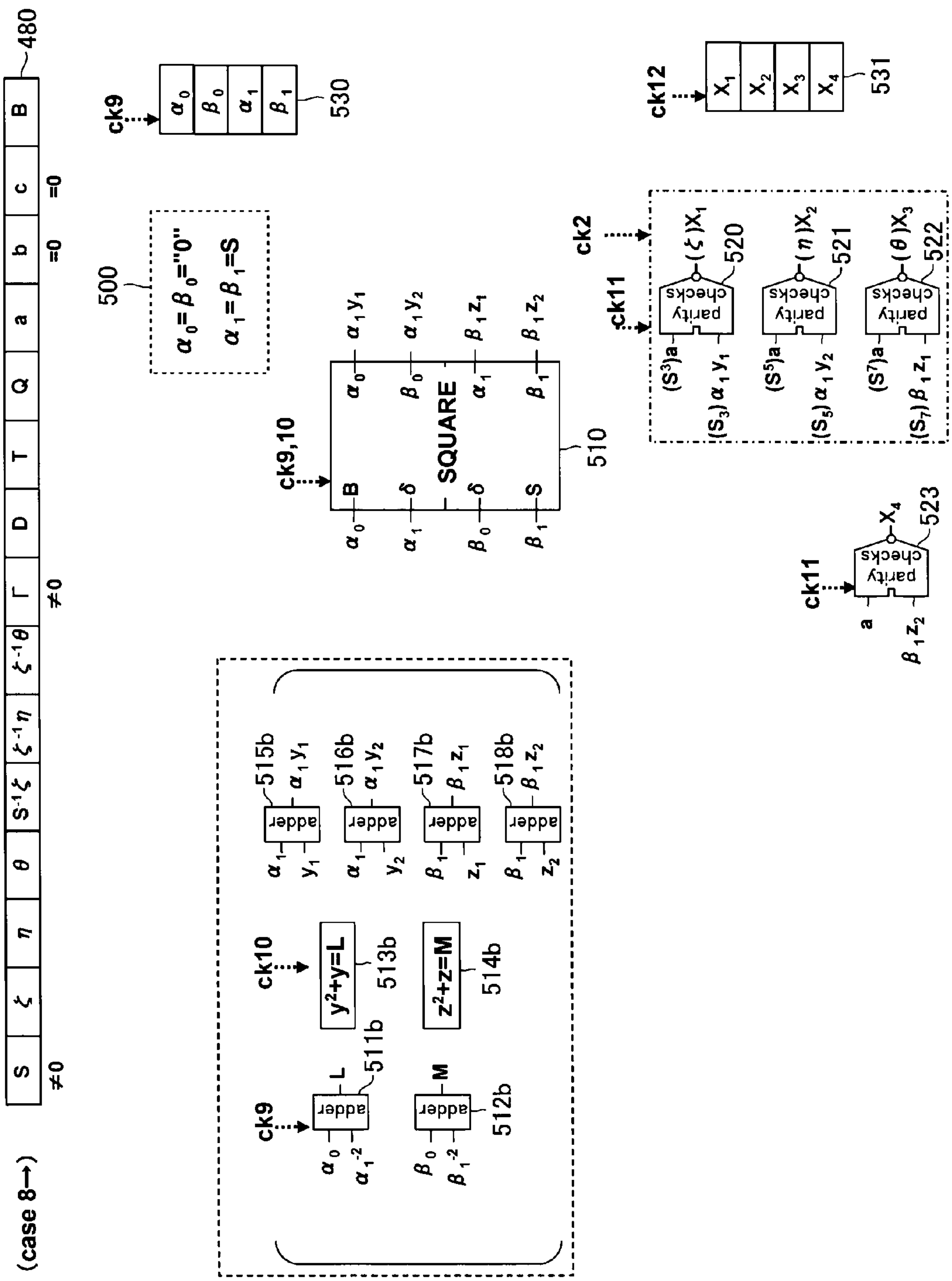
FIG. 12 is a diagram for explaining the operation of the ES part (in case 7).

FIG. 12 shows "case 8", which corresponds to the calculation procedure (i). That is, in case of S≠0, ⌈≠0, b=0 and c=0, and another quantities "a" and "B" are used. There are shown timing clocks at the respective circuit blocks, which are used for making them active. Since there is no need of calculation in the circuit block 500 and the former calculation in the circuit 510. Therefore, replacing $\alpha_0=\beta_0$="0", and $\alpha_1=\beta_1$=S, these are stored in register group 530 with clock ck9.

Calculations in circuit block 510 are as follows: the product of $\alpha_0$ by the involution of $\alpha_1$ is calculated at adder 511b, and the product of $\beta_0$ by the involution of $\beta_1$ is calculated at another adder 512b with clock ck9; solutions of the quadratic equations are decoded at decode circuits 513b and 514b with clock ck10; and the products of the respective solutions by $\alpha_1$ and $\beta_1$ are calculated at four adders 515b to 518b, whereby $\alpha_1 y_1$, $\alpha_1 y_2$, $\beta_1 z_1$ and $\beta_1 z_2$ are obtained.

These results are added to "a" at parity checkers 520 to 523 with clock ck11, so that $X_1$, $X_2$, $X_3$ and $X_4$ are output. These are stored in register group 531 with clock ck12.

So far, the principle of the 4-bit error search and correction system has been explained in a general description. Next, more detailed embodiment of the circuit system will be explained below with respect to the case of GF(256) with 256 elements. The reason why GF(256) is used is in that the practical data quantity to be dealt with in a memory in a lump is in a rage from 128 bits to 256 bits.

Data Encoding

The basic irreducible polynomial $m_1(x)$ is expressed by the following expression Exp. 41, and root thereof is α.

$$\alpha: m_1(x)=x^8+x^4+x^3+x^2+1 \quad \text{[Exp. 41]}$$

In case of GF(256), the irreducible polynomial on GF(2) is defined as 8th-degree one. With this root, elements of GF(256) are 256, i.e., 0, $\alpha^0$, $\alpha^1$, . . . , $\alpha^{253}$ and $\alpha^{254}$.

As irreducible polynomials with roots of $\alpha^3$, $\alpha^5$ and $\alpha^7$, $m_3(x)$, $m_5(x)$ and $m_7(x)$ are selected as follows:

$$\alpha^3: m_3(x)=x^8+x^6+x^5+x^4+x^2+x+1$$

$$\alpha^5: m_5(x)=x^8+x^7+x^6+x^5+x^4+x+1$$

$$\alpha^7: m_3(x)=x^8+x^6+x^5+x^3+1 \quad \text{[Exp. 42]}$$

Based on these irreducible polynomials, code generation polynomial $g(x)=m_1(x)m_3(x)m_5(x)m_7(x)$ may be constituted as the following 32nd-degree polynomial.

$$
\begin{aligned}
g(x) &= m_1(x)m_3(x)m_5(x)m_7(x) \\
&= x^{32} + x^{31} + x^{30} + x^{29} + x^{27} + \\
&\quad x^{26} + x^{25} + x^{22} + x^{20} + x^{19} + \\
&\quad x^{17} + x^{16} + x^{14} + x^{10} + x^{7} + \\
&\quad x^{6} + x^{5} + x^{4} + x^{3} + x^{2} + 1
\end{aligned}
\quad \text{[Exp. 43]}
$$

The elements for constituting the code of the ECC system are 255 excepting zero factor of the finite field. Therefore, data is expressed by coefficients of 254th degree polynomial. Assign the information bits in data bits to coefficients $a^{32}$ to $a^{254}$, and divide polynomial $f(x)x^{32}$ that starts from 32nd degree by g(x), and obtained remainder is referred to as r(x). This becomes 31st degree polynomial as shown in the following expression Exp. 44.

$$f(x)x^{32}=q(x)g(x)+r(x)$$

$$r(x)=b_{31}x^{31}+b_{30}x^{30}+\ldots+b_1x+b_0 \quad \text{[Exp. 44]}$$

Coefficients $b_{31}$, $b_{30}$, . . . , $b_1$ and $b_0$ of r(x) serve as 32-check bits to be accompanied with the information bits, and constitute data to be stored in the memory together with the information bits.

It is desirable that the information bits to be dealt with are expressed by a power of 2. Supposing that 128 bits are used as information bits, the number of data bits is 160. How to assign 128-information bits to the degree numbers of the polynomial on GF(256) is determined in consideration of the calculation efficiency. This method will be explained later.

The degree is selected in such a way as to make the calculation scale or system scale minimum. Assuming that 128 information bits are referred to as ai(1) to ai(128), and [i(128)-1]th degree polynomial with the information bits as coefficients is expressed as f(x), which serves as input data. Selected 128-bit degree numbers are expressed as i(1), i(2), . . . , i(128) in the increasing order.

FIGS. 13A and 13B show an example of the polynomial degree selection, in which the calculation quantity is made to be as small as possible when syndrome polynomials $S_1(x)$, $S_3(x)$, $S_5(x)$ and $S_7(x)$ are simultaneously calculated in parallel in the 4EC-BCH system. In detail, 128 degrees are selected in such a manner that the total number of coefficient "1" of 7th-degree polynomial pn(x) becomes as small as possible, and it is scattered uniformly between the degree numbers.

Explaining in detail, the degree selection is performed in consideration of the number of coefficient "1" of pn(x), which corresponds to a surplus obtained by dividing $x^n$ by $m_1(x)$, $m_3(x)$, $m_5(x)$ or $m_7(x)$ and expressed by finite elements, p3n (x) (the third power of pn(x)), p5n(x)(the fifth power of pn(x)) and p7n(x)(the seventh power of pn(x)). Since 0 to 31st degrees are used as check bits, these are fixed bits. In FIG. 13, selected 128 degree numbers being referred to as i(1), i(2), . . . , i(127) and i(128) in the increase order, practically selected degree numbers corresponding to them are shown in the central row in the table.

FIGS. 14A to 14D show a set of tables for selecting degree numbers of $f(x)x^{32}$, which correspond to data bit positions used for calculating the check bits. The meaning of these tables is as follows.

Previously divide a single term $x^i$ by the code generation polynomial g(x) to get surplus ri(x) that is 31st-degree polynomial. Since selected 160 data are assigned to coefficients of the respective degrees of 254th degree polynomial, data "1" designates that there is $x^i$, the degree number "i" of which corresponds to the data position.

Therefore, selecting ri(x) with "i" of data "1", and calculating addition of coefficients of the respective degrees of ri(x) as defined by mod 2, there is obtained a remainder as defined by dividing data polynomial by g(x). Note here that since ri(x) with coefficient "0" at the respective degrees does not contribute to the calculation, such ri(x) may be previously eliminated.

With respect to the respective degrees "m" of ri(x), collect "i" with coefficient "1", and the tables shown in FIGS. 14A and 14B are obtained. Note here that only 128 degree numbers "i" are shown to be selected and used. When generating check bits, degree numbers up to i=31 are not used as data. Therefore, there are shown in the tables only degree numbers higher than i=32.

The method of employing these tables is as follows. For example, "i" of ri(x) satisfying that the coefficient of $x^{15}$ is "1" are 33, 34, 38, . . . , 227, 249 and 253 shown in a row of m=15, and in 1st to 65th columns of PCL input number. Check bit "b15" corresponding to the coefficient of $x^{15}$ is obtained as a result of parity check for i="1" of bit positions with data "1" in the selected i-th degree terms in the information data polynomial $f(x)x^{32}$. Explaining in other words, the check bit will be obtained as a remainder of mod 2 with respect to the number of "i" with data "1" in these tables.

Figure 15:
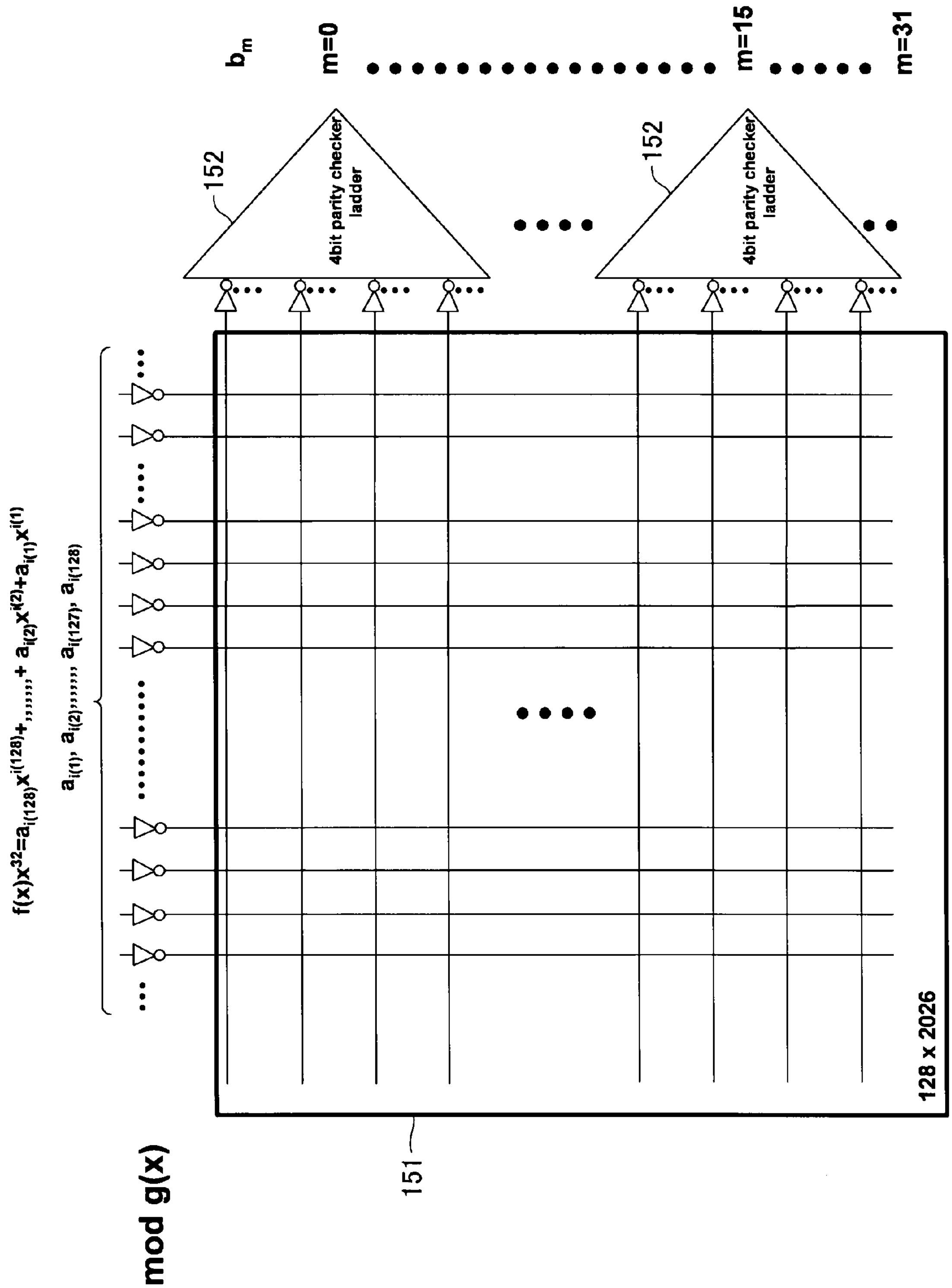
FIG. 15 shows a parity check circuit used for calculating check bits.

FIG. 15 is a check bit calculation circuit achieved as corresponding to the above-described calculation tables, which calculates check bits as a surplus of g(x) based on the information data polynomial $f(x)x^{32}$. This circuit includes input selection circuit 151; and thirty two 4-bit parity checker ladders (PCLs) 152.

4-bit PCL 152 is a set of XOR circuits, which calculates coefficient values of the respective degrees of a polynomial expressing the check bits. In detail, this circuit selects inputs in accordance with the remainder table of $x^i$ obtained by the code generation polynomial, and calculates parity.

Input selection circuit 151 is for selecting the connection between first signal wirings, on which input signals, i.e., coefficient signals ai(1) to ai(128) of the information data polynomial are inverted and supplied, and second wirings, which serve as PCL input wirings, in accordance with the table. There are 128×2026 cross points between the first and second wirings, which are defined by addition of total of inputs and total of m=0 to 32. Necessary cross points are selected in accordance with the table, and wiring contacts are formed at the selected cross points.

Figure 16:
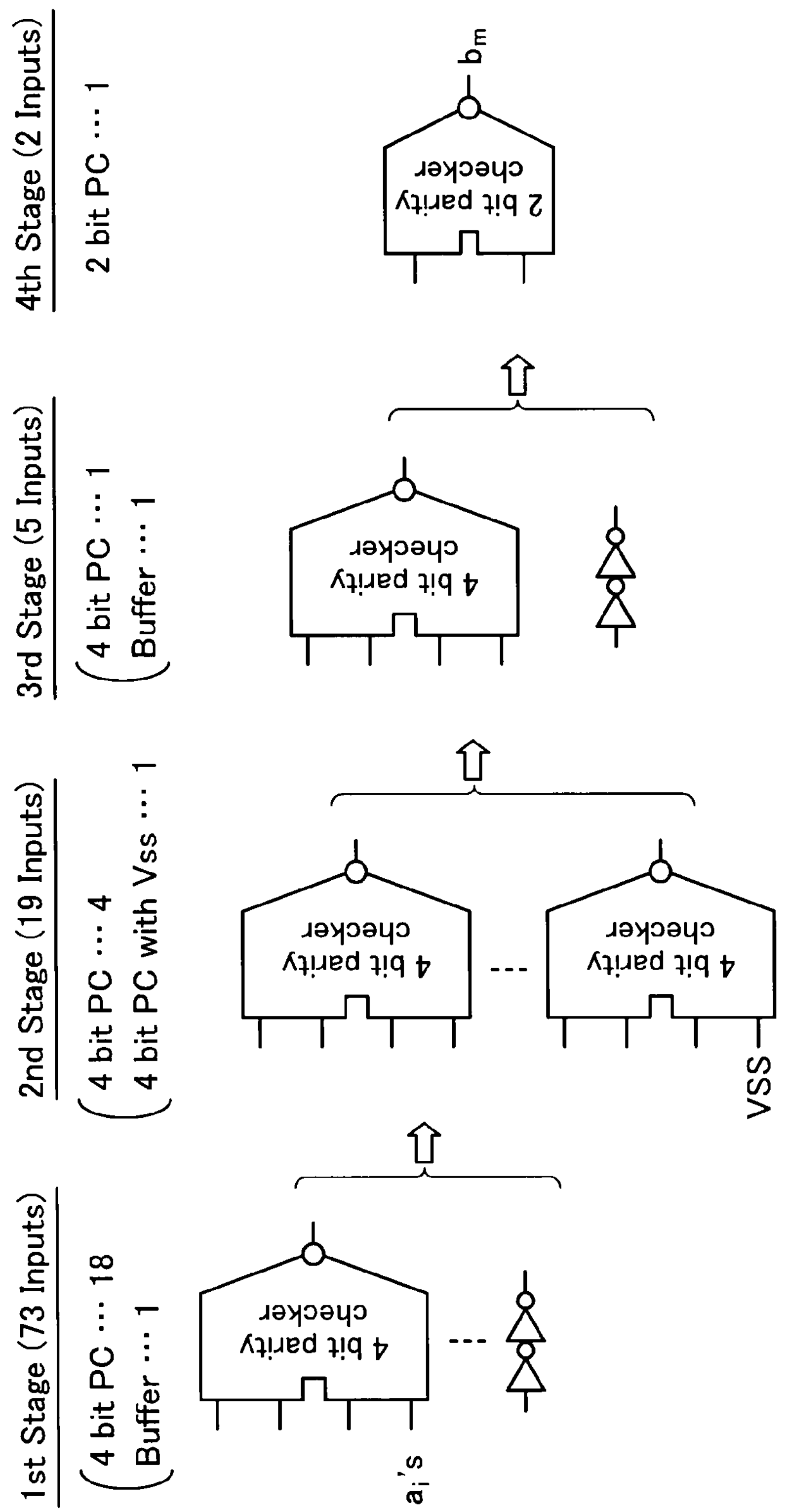
FIG. 16 is an example of the PCL shown in FIG. 15.

FIG. 16 shows an example of 4-bit PCL 152. Check bit number "n" is determined in accordance with the respective "m". The combination of parity checkers are determined in accordance with the fact that input numbers belong to which of remainder systems of 4. That is, in case the input number is just divided by 4, only 4-bit PCs are used; in case the remainder is "1", 2-bit PC, one input of which is set at Vss, i.e., a buffer is used; in case of the remainder is "2", 2-bit PC is added; and in case the remainder is "3", 4-bit PC, one input of which is set at Vss, is added.

In case of m=17, as shown in the tables shown in FIGS. 14A and 14B, bit number to be subjected to parity checking is the maximum, 73. FIG. 16 shows the PCL in this case. Since total of inputs is 73, the first stage is formed of eighteen 4-bit PCs and one buffer; the second stage becomes 19 inputs, and it is formed of five 4-bit PCs (one input of one PC is set as Vss); the third stage becomes 5 inputs, and it is formed of four 4-bit PCs and one buffer; and the fourth stage becomes 2 inputs, and it is formed of one 2-bit PC.

With respect to other "m", PCLs may be formed like the above-described example.

Figure 17:
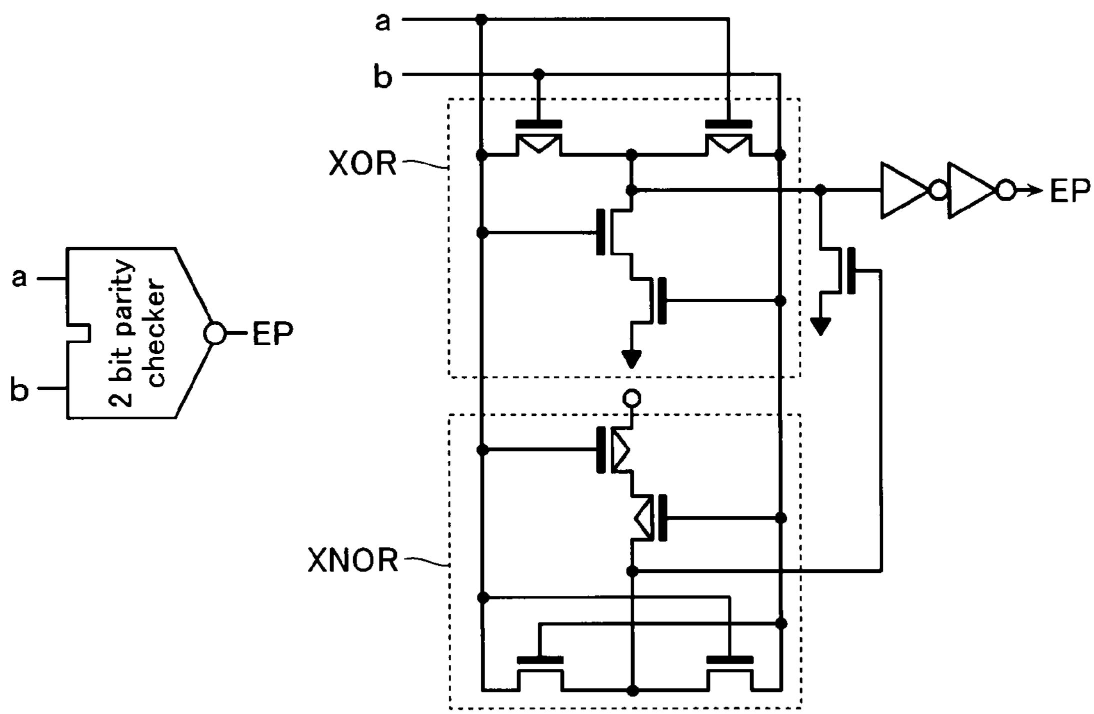
FIG. 17 shows the configuration of 2-bit PC.

FIG. 17 shows a circuit symbol and a detailed circuit of a 2-bit PC. This 2-bit PC performs logical arithmetic for two inputs of "a" and "b" with an XOR part and an XNOR part, i.e., performs "even parity check", to output EP="1" when the number of "1" within the inputs is odd.

Figure 18:
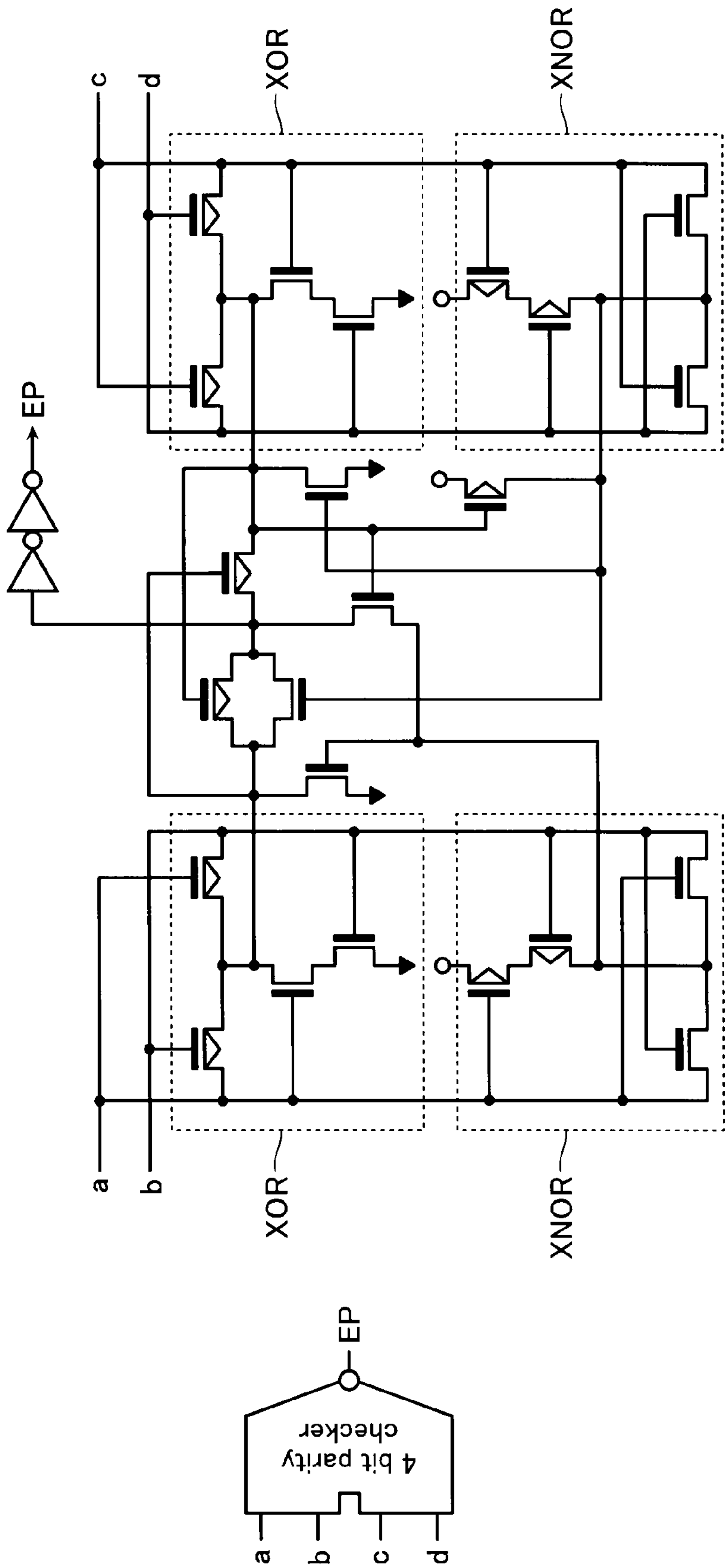
FIG. 18 shows the configuration of 4-bit PC.

FIG. 18 shows a circuit symbol and a detailed circuit of a 4-bit PC. This 4-bit PC takes even parity logic between four inputs "a", "b", "c" and "d" based on the outputs of two 2-bit PCs to output EP="1" when the number of "1" within the inputs is odd.

Syndrome Calculation Part 23

FIGS. 19A to 19C show a set of tables of the respective degrees "i" with coefficient="1" with respect to the remainder pi(x) obtained by dividing $x^i$ by $m_1(x)$, which is used in the calculation of syndrome $S=S_1(x)$. The meaning of these tables is as follows.

Previously divide a single term $x^i$ by the polynomial $m_1(x)$ to get 7th-surplus polynomial pi(x). Since 255 data correspond to coefficients of the respective degrees of 254th-polymomial, data "1" designates that there is $x^i$ term corresponding to the data position, and the remainder obtained by $m_1(x)$ constitutes pi(x). Therefore, selecting pi(x) with "i" of data "1", and calculating addition of coefficients of the respective degrees of pi(x) as defined by mod 2, there is obtained a remainder as defined by dividing data polynomial by $m_1(x)$.

Note here that since pi(x) with coefficient "0" at the respective degrees does not contribute to the calculation, such pi(x) may be previously eliminated.

With respect to the respective degrees "m" of pi(x), collect "i" with coefficient "1", and the tables shown in FIGS. 19A to 19C are obtained.

For example, "i" of pi(x) satisfying that the coefficient of $x^7$ is "1" are 7, 11, 12, . . . , 237, 242, 254 shown in a row of m=7, and in 1st to 71st columns of PCL input number. $(s)_7$, which corresponds to the coefficient of $x^7$ of $S_1(x)$, is obtained as a result of parity check of the coefficients in the selected i-th degree terms.

FIGS. 20A to 20C show a set of tables of selected degrees "i" with coefficient="1" for the remainder p3i(x), that is obtained by dividing $x^{3i}$ by $m_1(x)$ to be used in the calculation of syndrome $S_3=S_3(x^3)$. The meaning of these tables is as follows.

Previously divide a single term $x^i$ by the polynomial $m_3(x)$ to get 7th-surplus polynomial ti(x). While ti(x) contributes to $S_3(x)$, $ti(x^3)$ contributes to $S_3$ because $S_3=S_3\ (x^3)$. Since $ti(x^3)\equiv x^{3i}$ mod $m_3(x^3)$ and $m_3(x^3)\equiv 0$ mod $m_1(x)$ based on $x^i\equiv ti(x)$mod $m_3(x)$, it is obtained $ti(X^3)\equiv x^{3i}\equiv p3i(x)$mod $m_1(x)$.

Since elements of GF(256) are irreducible remainders of mod $m_1(x)$, the contribution of $x^i$ term of $\nu(x)$ to $S_3$ is the same as that of p3i(x). Therefore, previously get polynomial p3i(x). Since 255 data correspond to coefficients of the respective degrees of 254th-polymomial, data "1" designates that there is $x^i$ term corresponding to the data position, and the remainder ti(x) obtained by $m_3(x)$ constitutes p3i(x) contributing to $S_3=S_3(x^3)$.

Therefore, selecting p3i(x) with "i" of data "1", and calculating addition of coefficients of the respective degrees "m" of p3i(x) as defined by mod 2, there is directly obtained $S_3(x^3)$ without dividing data polynomial by $m_3(x)$. Since p3i(x) with coefficient "0" at the respective degrees does not contribute to the calculation, such p3i(x) may be previously eliminated. With respect to the respective degrees "m"s of p3i(x), collect "i" with coefficient "1", and the tables shown in FIGS. 20A to 20C are obtained.

For example, "i" of p3i(x) satisfying that the coefficient of $x^7$ is "1" are 4, 8, 14, . . . , 242, 249, 254 shown in a row of m=7, and in 1st to 73rd columns of PCL input number. $(s\mathbf{3})_7$, which corresponds to the coefficient of $x^7$ of $S_3(x^3)$, is obtained as a result of parity check of the coefficients in the selected i-th degree terms. With respect to other "m"s, necessary coefficients will be obtained like this.

FIGS. 21A to 21C show a set of tables of selected degrees "i" with coefficient="1" for the remainder p5i(x), that is obtained by dividing $x^{5i}$ by $m_1(x)$ to be used in the calculation of syndrome $S_5=S_5(x^5)$. The meaning of this table is as follows.

Previously divide a single term $x^i$ by the polynomial $m_5(x)$ to get 7th-surplus polynomial qi(x). While qi(x) contributes to $S_5(x)$, $qi(x^5)$ contributes to $S_5$ because $S_5=S_5(x^5)$. Since $qi(X^5)\equiv x^{5i}$ mod $m_5(x^5)$ and $m_5(x^5)\equiv 0$ mod $m_1(x)$ based on $x^i\equiv qi(x)$mod $m_5(x)$, it is obtained $qi(X^5)\equiv x^{5i}\equiv p5i(x)$ mod $m_1(x)$.

Since elements of GF(256) are irreducible remainders of mod $m_1(x)$, the contribution of $x^i$ term of $\nu(x)$ to $S_5$ is the same as that of p5i(x). Therefore, previously get polynomial p5i(x). Since 255 data correspond to coefficients of the respective degrees of 254th-polymomial, data "1" designates that there is $x^i$ term corresponding to the data position, and the remainder qi(x) obtained by $m_5(x)$ constitutes p5i(x) contributing to $S_5=S_5(x^5)$.

Therefore, selecting p5i(x) with "i" of data "1", and calculating addition of coefficients of the respective degrees "m" of p5i(x) as defined by mod 2, there is directly obtained $S_5(x^5)$ without dividing data polynomial by $m_5(x)$. Since p5i(x) with coefficient "0" at the respective degrees does not contribute to the calculation, such p5i(x) may be previously eliminated. With respect to the respective degrees "m"s of p5i(x), collect "i" with coefficient "1", and the tables shown in FIGS. 21A to 21C are obtained.

For example, "i" of p5i(x) satisfying that the coefficient of $x^7$ is "1" are 4, 7, 9, . . . , 242, 250 and 253 shown in a row of m=7, and in 1st to 64th columns of PCL input number. $(s\mathbf{5})_7$, which corresponds to the coefficient of $x^7$ of $S_5(X^5)$, is obtained as a result of parity check of the coefficients in the selected i-th degree terms. With respect to other "m"s, necessary coefficients will be obtained like this.

FIGS. 22A to 22C show a set of tables of selected degrees "i" with coefficient="1" for the remainder p7i(x), that is obtained by dividing $x^{7i}$ by $m_1(x)$ to be used in the calculation of syndrome $S_7=S_7(x^7)$. The meaning of these tables is as follows.

Previously divide a single term $x^i$ by the polynomial $m_7(x)$ to get 7th-surplus polynomial sei(x). While sei(x) contributes to $S_7(x)$, $sei(x^7)$ contributes to $S_7$ because $S_7=S_7(x^7)$. Since $sei(x^7)\equiv x^{7i}$ mod $m_7(x^7)$ and $m_7(x^7)\equiv 0$ mod $m_1(x)$ based on $x^i\equiv sei(x)$mod $m_7(x)$, it is obtained $sei(x^7)\equiv x^{7i}\equiv p7i(x)$ mod $m_1(x)$.

Since elements of GF(256) are irreducible remainders of mod $m_1(x)$, the contribution of $x^i$ term of $\nu(x)$ to $S_7$ is the same as that of p7i(x). Therefore, previously get polynomial p7i(x). Since 255 data correspond to coefficients of the respective degrees of 254th-polymomial, data "1" designates that there is $x^i$ term corresponding to the data position, and the remainder sei(x) obtained by $m_7(x)$ constitutes p7i(x) contributing to $S_7=S_7(x^7)$.

Therefore, selecting p7i(x) with "i" of data "1", and calculating addition of coefficients of the respective degrees "m" of p7i(x) as defined by mod 2, there is directly obtained $S_7(x^7)$ without dividing data polynomial by $m_7(x)$. Since p7i(x) with coefficient "0" at the respective degrees does not contribute to the calculation, such p7i(x) may be previously eliminated.

With respect to the respective degrees "m"s of p7i(x), collect "i" with coefficient "1", and the tables shown in FIGS. 22A to 22C are obtained.

For example, "i"s of p7i(x) satisfying that the coefficient of $x^7$ is "1" are 1, 5, 6, . . . , 242, 249 and 250 shown in a row of m=7, and in 1st to 81st columns of PCL input number. $(s7)_7$, which corresponds to the coefficient of $x^7$ of $S_7(x^7)$, is obtained as a result of parity check of the coefficients in the selected i-th degree terms. With respect to other "m"s, necessary coefficients will be obtained like this.

Figure 23:
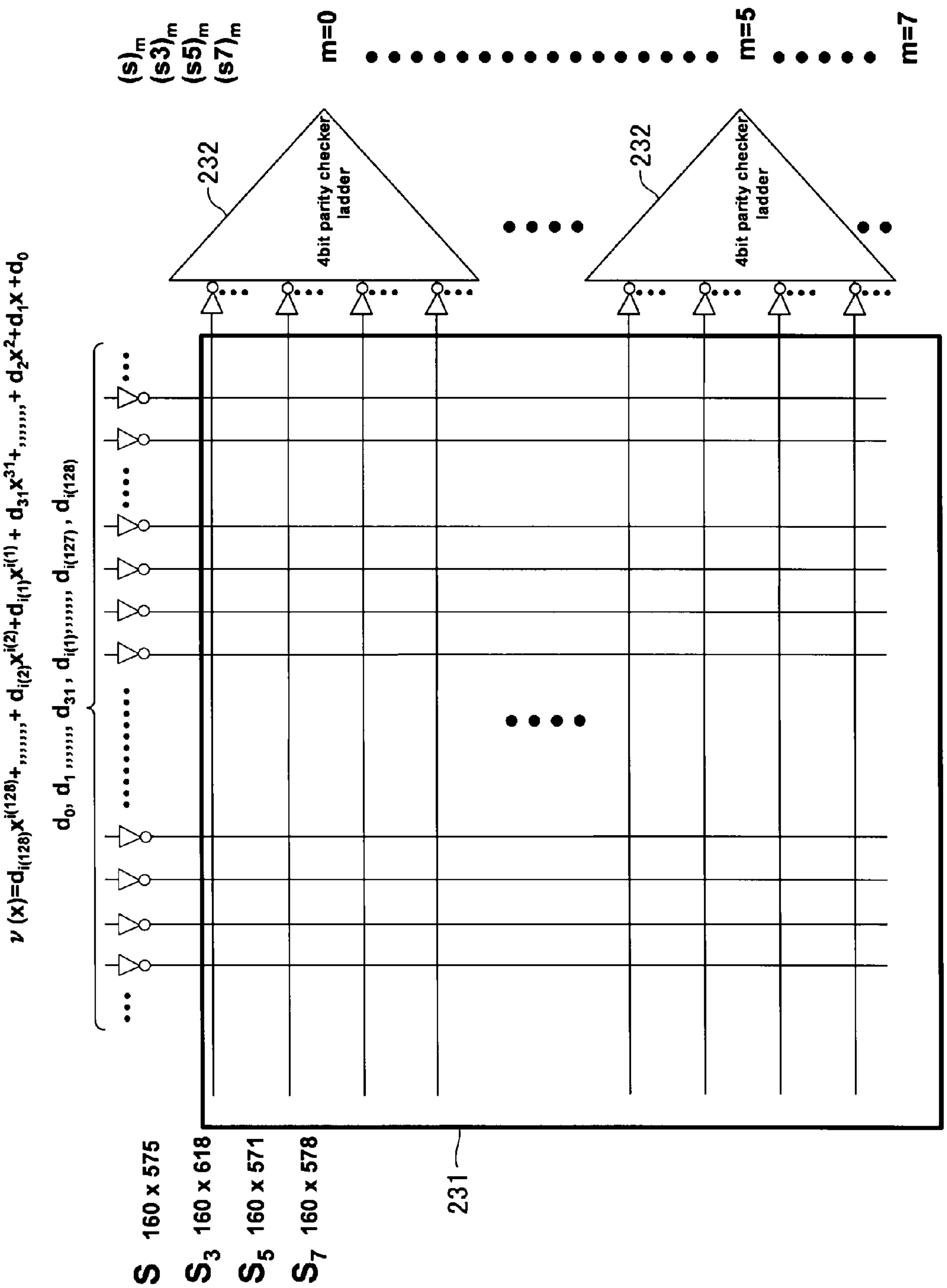
FIG. 23 shows the parity check circuit used for calculating syndromes.

FIG. 23 shows a circuit configuration corresponding to the calculation table of the above-described syndromes $S(=S_1)$, $S_3$, $S_5$ and $S_7$. This is a parity check circuit for calculating the respective syndromes as remainders obtained by dividing data polynomial ν(x), which has input circuit portion 231 and 4-bit PCLs 232.

4-bit PCL is a set of XOR circuits for calculating a coefficient value of each degree of a polynomial expressing the syndromes. Inputs are selected at the respective degrees in accordance with the table of remainder pi(x), p3i(x), p5i(x) and p7i(x), and the parity is calculated.

In the input circuit portion 231, 160 coefficients of data polynomial, $d_0$, $d_1$, $d_{31}$, $d_{i(1)}$, . . . , $d_{i(}128)$ are inverted and input on the cross points of signal wirings in accordance with the table, and then inverted again to be input to PCLs 232.

the cross points of the input wirings are 160×575 in case of "S", 160×618 in case of "$S_3$", 160×571 in case of "$S_5$" and 160×578 in case of "$S_7$" defined as additions of input data and the total of m=0 to 7 in the table. That is, necessary cross points are selected based on the table, and contacts are formed at the respective cross points, so that the input wirings are connected to each other.

Figure 24:
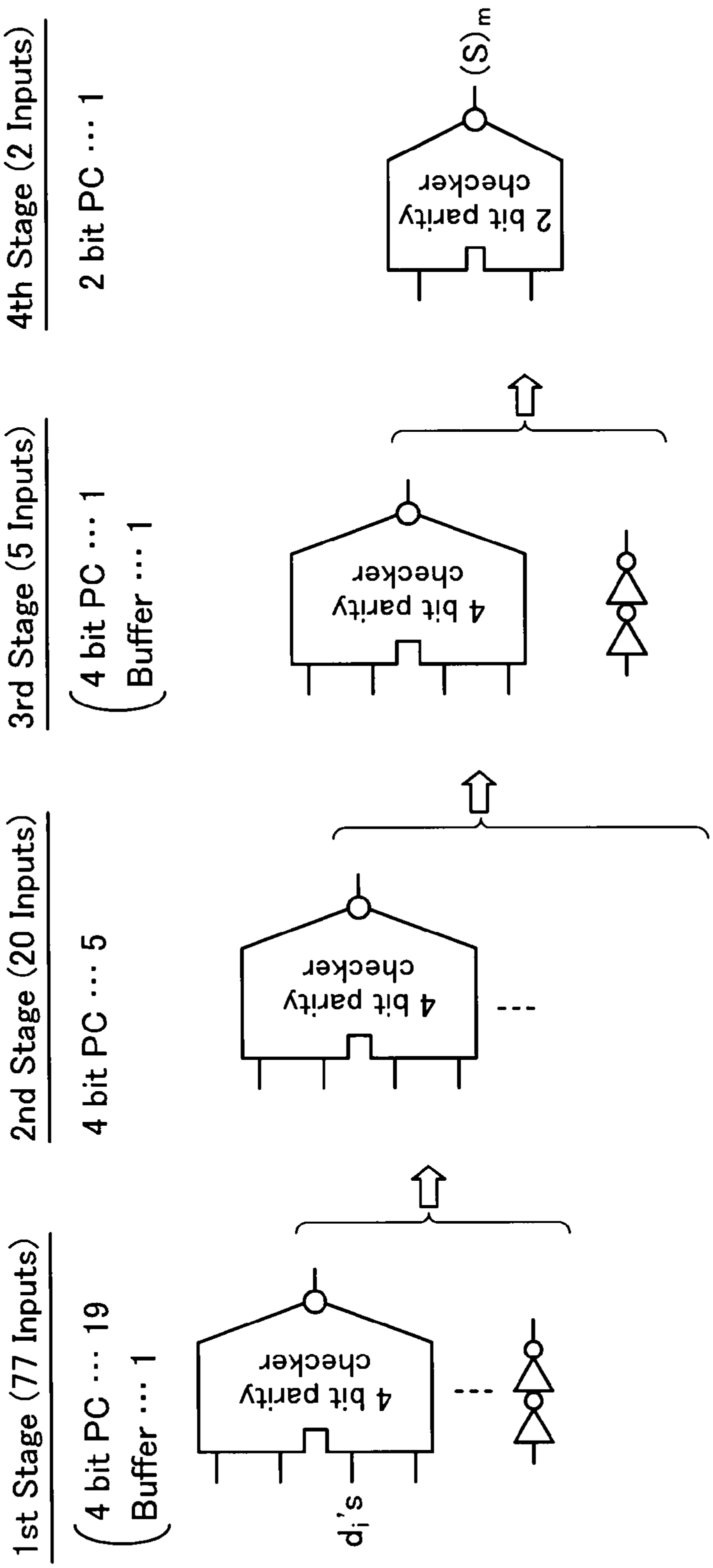
FIG. 24 shows the parity checker ladder (PCL) shown in FIG. 23.

FIG. 24 shows an example of 4-bit PCL used for calculating a syndrome. That is, select "i"s for the respective "m"s based on the table, and perform parity check by use of "$d_i$"s. Parity checkers (PC) are selected and combined in accordance with which remainder systems of 4 the number of inputs belongs to, as follows: if perfectly dividable by 4, only 4-bit PCs are used; if 1 is remained, a 2-bit PC, one input of which is set at Vss, i.e., a buffer, is added; if 2 is remained, a 2-bit PC is added; if 3 is remained, a 4-bit PC, one input of which is set at Vss, is added.

In case of m=5 of $x^i$, the number of bits to be parity-checked is the maximum, 77, as shown in the table. FIG. 24 shows the PCL in this case. Since there are 77 inputs, the first stage is constituted by nineteen 4-bit PCs and a buffer; the second stage by five 4-bit PCs because there are twenty inputs; the third stage by one 4-bit PC and one buffer because there are five inputs; and the fourth stage by one 2-bit PC because two inputs.

With respect to other "m"s, and other syndromes, PCLs may be constituted like the above described example. The detailed explanation will be omitted.

Figure 25:
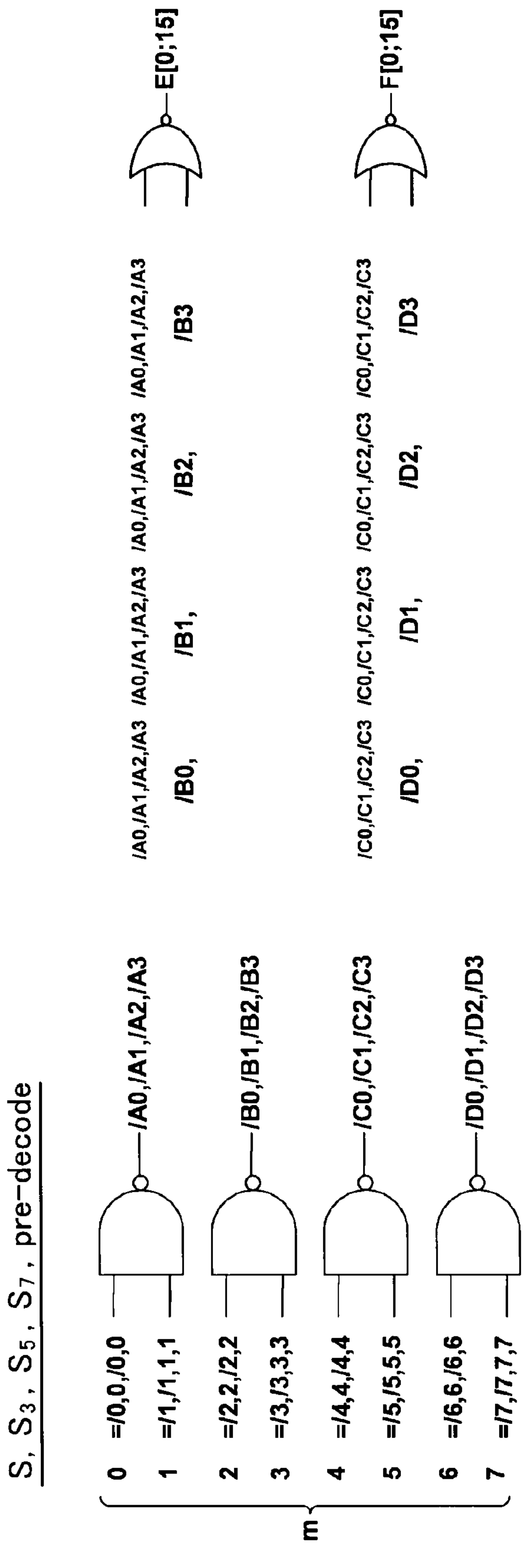
FIG. 25 shows per-decoders used for converting the polynomial expression coefficients of GF(256) elements to the expression indexes.
Figure 26:
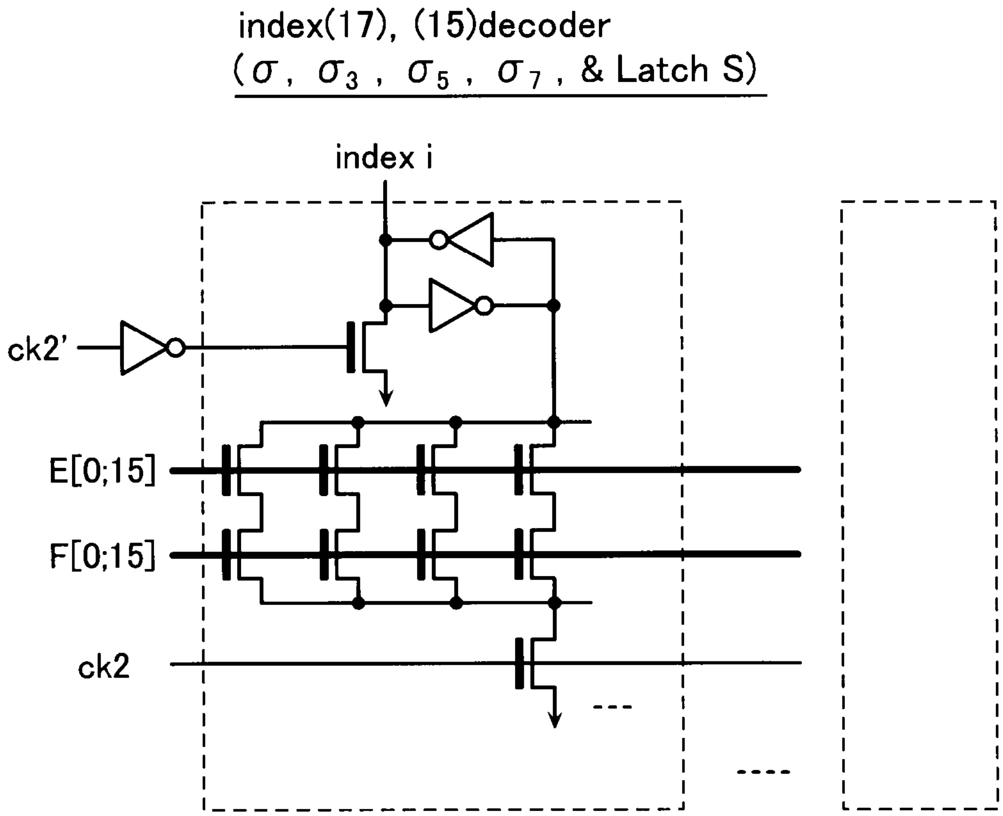
FIG. 26 shows the index decoder used in the same calculation.
Figure 27:
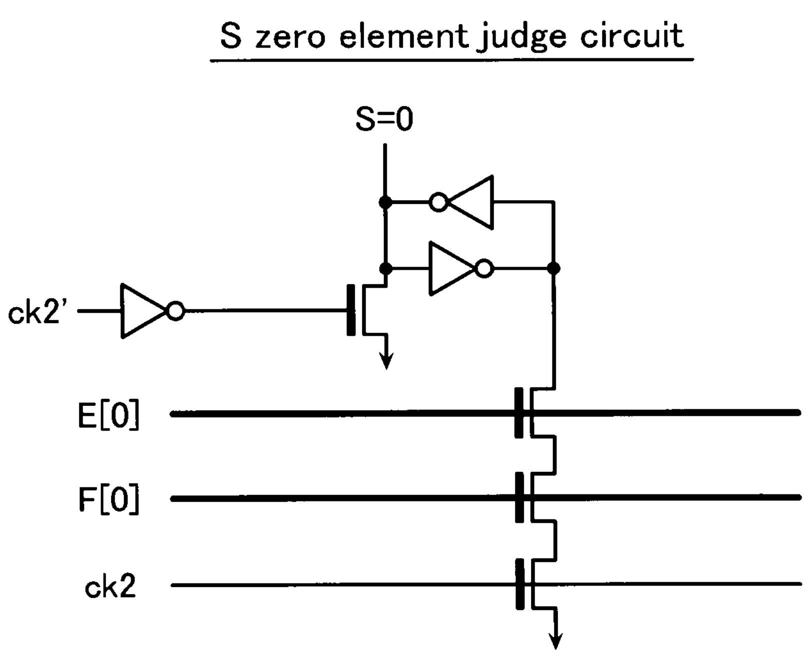
FIG. 27 shows the zero element judgment circuit used in the same calculation.

Syndromes S, $S_3$, $S_5$ and $S_7$ are obtained as 7th-degree polynomials, and are coincident with either one of pin(x) defined as elements of GF(256). Therefore, the index of root α obtained by diving the polynomial by $m_1(x)$ is transformed to an "expression index" expressed as a pair of irreducible remainders of mod 17 and mod 15 of the index mod 255, and it will be used in the successive calculations. FIGS. 25 to 27 show a decoder circuit used for performing such the transform.

FIG. 25 is a pre-decoder for expressing 256 binary signal states, which are expressed by coefficients of 8-bit pi(x), as combinations of Ai, Bi, Ci and Di (i=0~3), and further transforming them to 16 E[i] and 16 F[i], i.e., E[0;15] and F[0;15]. This pre-decoder is formed of NAND circuits and NOR circuits.

8-bit binary numbers are grouped by two bits from the lowermost side, and expressed as quaternary numbers Ai, Bi, Ci and Di. Further, the lower signal E[0;15] and the upper signal F[0;15] of a hexadecimal number are constituted by A and B, and C and D, respectively. By use of this pre-decoder, the number of transistors used in the following decoder circuit may be reduced to two from eight in comparison with the case without such the pre-decoder.

Index (17), (15) decoder shown in FIG. 26 groups the pre-decoded signals obtained in FIG. 25 into remainder groups, generates mod 17 and mod 15 components, and latch them. That is formed of NAND connections, to which E[0;15] and F[0;15] are input, and NOR connections thereof connected in parallel, so that it outputs index signals "i" of the remainders based on whether the precharged nodes are discharged or not with clocks ck2 and ck2'. These circuits are prepared for number of the remainders. Index signals are constituted for mod 17 and mod 15 to be a pair of expression indexes.

In case of pi(x)=0, it will not be obtained an index number of α. That is, since E[0]=1 and F[0]=1 in this case, index will not be output. With respect to syndrome S, zero element judgment is performed for judging that it is a zero component. Therefore, to easily judge that it is a zero element, zero element judgment circuit shown in FIG. 27 is prepared. In detail, in case syndrome S corresponds to a zero element, signal S=0 is generated.

FIGS. 28A to 28C show a set of reference tables for searching an expression index in accordance with the pre-decoder shown in FIG. 25 and the index (17), (15) decoder shown in FIG. 26, in which indexes "i"s of the irreducible remainder pi(x) are classified into remainder groups i(17) of mod 17. The remainder groups i(17) are classified by indexes 0 to 16, each of which includes fifteen "n". In the table, pre-decoder outputs, which are decoded in accordance with the coefficients of the respective degree numbers "m" of pi(x), are shown as hexadecimal numbers in the "hex" column.

Each the hexadecimal number is expressed by "jk" that designates a pair of F[j]E[k] in the circuit. That is, "01" shows a pair of F[0] and E[1]. Although Ai, Bi, Ci and Di are not shown in the table, these are obtained as quaternary numbers based on the coefficients of the respective degrees "m" of the corresponding pi(x).

Selecting the hexadecimal numbers E[0;15] and F[0;15] of the indexes corresponding to the respective expression indexes based on this table, signal wiring connection of the transistor gates will be determined in the decoder shown in FIG. 26. For example, in case of i(17)=1, NAND nodes to be NOR-connected in parallel are as follows: i=1, 18, 35, 52, 69, 86, 103, 120, 137, 154, 171, 188, 205, 222 and 239. Coupled to the transistor gates of NAND are a corresponding pair of F[j] and E[k] in the table.

FIGS. 29A to 29C show a set of reference tables for searching an expression index in accordance with the pre-decoder shown in FIG. 25 and the index (17), (15) decoder shown in FIG. 26, in which indexes "i"s of the irreducible remainder pi(x) are classified into remainder groups i(15) of mod 15. The remainder groups i(15) are classified by indexes 0 to 14, each of which includes seventeen "n"s. In the table, pre-decoder outputs, which are decoded in accordance with the coefficients of the respective degree numbers "m" of pi(x), are shown as hexadecimal numbers in the "hex" column.

Each the hexadecimal number is expressed by "jk" that designates a pair of F[j]E[k] in the circuit. That is, "01" shows a pair of F[0] and E[1]. Although Ai, Bi, Ci and Di are not shown in the table, these are obtained as quaternary numbers based on the coefficients of the respective degrees "m" of the corresponding pi(x).

Selecting the hexadecimal numbers E[0;15] and F[0;15] of the indexes corresponding to the respective expression indexes based on this table, signal wiring connection of the transistor gates will be determined in the decoder shown in FIG. 26. For example, in case of i(15)=1, NAND nodes to be NOR-connected in parallel are as follows: i=1, 16, 31, 46, 61, 76, 91, 106, 121, 136, 151, 166, 181, 196, 211, 226 and 241. Coupled to the transistor gates of NAND are a corresponding pair of F[j] and E[k] in the table.

The power of finite field element may often appear in the calculation processes. However the power relationship corresponds to a certain transformation between elements in case the expression index is used. Therefore, there is no need of calculating, but it may be achieved by signal connection changes. FIG. 30 is a table showing the relationship between indexes of the power and the expression indexes.

The power of element is expressed as a multiplier of the expression index component. Component indexes of the expression indexes {i(17), i(15)} are multiplied by "m" to become new expression indexes {i×m (17), i×m (15)}, which are shown in the column of "×m" in FIG. 30. Combining this transformation, it will be provided all expression indexes necessary in this system.

For example, −3/2 power of the element of expression index {3, 8} corresponds to such a new expression index that is obtained by multiplying the index component by −3/2. Explaining detail, the first index component is i(17)=3, and this is transformed to "14" shown in the sub-column −i(17) in the column ×(−1); this becomes a new index component of i(17), and is transformed to "8" shown in the sub-column 3i(17) in the column ×3; and then this becomes a new index component of i(17), and is transformed to "4" shown in the sub-column i/2 (17) in the column ×(1/2).

The order of the above-described transformations is not material, and the result is the same without regard to the order. The second index component is i(15)=8, and this is transformed to "7" shown in the sub-column −i(15) in the column ×(−1); this becomes a new index component of i(15), and is transformed to "6" shown in the sub-column 3i(15) in the column "×3"; and then this becomes a new index component of i(15), and is transformed to "3" shown in the sub-column i/2(15) in the column "×(1/2)". As a result, the element of the expression index {3, 8} becomes to correspond to that of the expression index {4, 3} by multiplying the component by −3/2.

As described above, it is able to obtain expression indexes necessary for the calculation. Next, it will be explained in detail the circuits used for searching ζ, η and θ defined as additions of syndromes.

Figure 31:
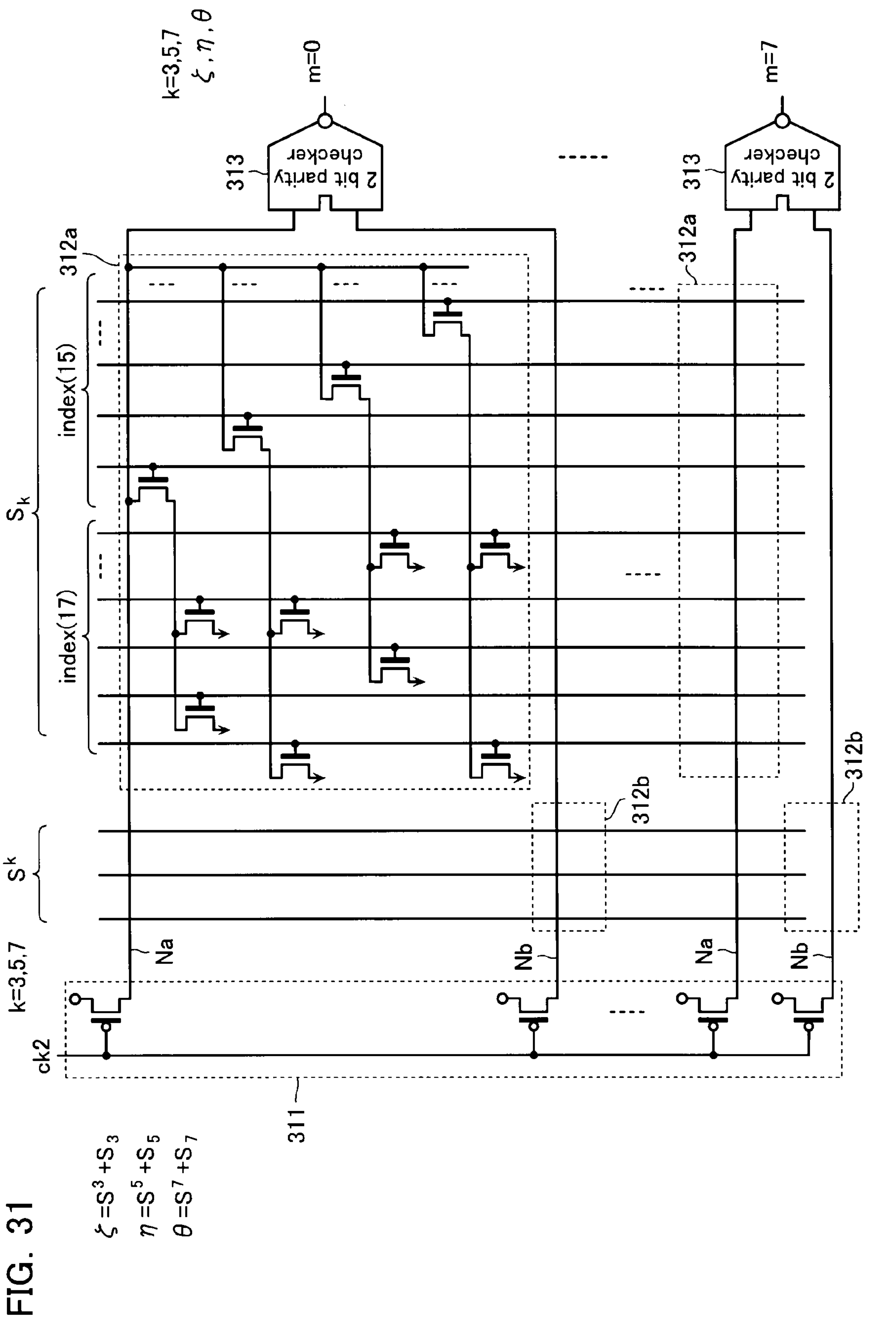
FIG. 31 shows the parity check circuit used for calculating elements ζ, η and θ.

FIG. 31 is a circuit for obtaining coefficients of polynomials ζ, η and θ, which are defined as additions of the power of the expression indexes of the syndromes. To search an addition of finite field elements from the expression indexes, it is in need of obtaining a polynomial expression of elements based on the expression indexes, and performing parity check of the coefficients. Therefore, there is prepared decoder circuits 312*a* and 312*b* used for transformation between the expression indexes and the polynomial expressions, and 2-bit PCs 313.

Input signals are expression indexes of $S^k$ and $S_k$ (k=3, 5, 7), respectively. For these inputs, there are prepared nodes Na and Nb corresponding to m-degree coefficients of the addition polynomials, and precharge circuit 311 for precharging the nodes. Make the precharge circuit 311 off by clock ck2, and the decoders 312*a* and 312*b* are activated.

Connections between the expression index signals at the nodes of the respective signals and gates of transistors are determined by a table described below, and are not dependent on the signals. With respect to the respective "m"s, parity checks of the respective two nodes Na and Nb are taken at the respective 2-bit PCs 313, coefficients of the polynomial expressions of additions of the input signals will be obtained.

The addition of the finite field elements is performed as that of mod 2 with respect to the coefficients of irreducible polynomial corresponding to the finite field elements.

Therefore, it will be explained a method of searching the coefficients used for adding the finite element polynomial pi(x) expressed by the expression indexes.

FIGS. 32A and 32E are tables showing the relationships between the coefficients of degree numbers "m"s of pi(x), "i" of the index and {i(17), i(15)}, in which the values of the expression index components i(15) are classified into groups of 0 to 14. In each group, the index components i(17) are arranged from 0 to 16 in the increasing order. In the column of "input i(17)", the values of i(17) are shown at the respective degree numbers "m"s, at each of which the coefficient is "1".

pi(x) and the expression index {i(17), i(15)} correspond to each other one to one. Therefore, when an expression index is applied, the contribution for addition of coefficients of the degree numbers "m"s of polynomial pi(x) may be decoded based on these tables.

Next, based on a calculation example of $\zeta=S^3+S_3$, it will be explained a method of dealing with the tables showing the relationship between the expression indexes and the coefficients of the polynomial expression. As shown in FIG. 31, $S^3$ and $S_3$ are input as expression indexes. With respect to the respective degree numbers "m"s of the respective inputs, NOR connections of transistors, the respective gates of which are applied with such i(17)'s that the coefficients of the degree numbers "m"s of pi(x) is "1", are formed under a transistor, the gate of which is applied with one i(15). That is, it is constituted that a current path is formed when an expression index is hit to a group.

Similar connections are formed for the respective components i(15)'s based on the tables shown in FIGS. 32A and 32E for making the common nodes discharged when hitting. The common nodes express inversions of the coefficients of the degree numbers "m"s of pi(x).

For example, m=7 is expressed by a common node defined by a NOR connection of discharge paths formed of: a NOR connection of i(17)=5, 9, 10, 11, 12 and 16 under i(15)=0; a NOR connection of i(17)=6, 7, 9, 12, 14 and 15 under i(15)=1; a NOR connection of i(17)=0, 1, 3, 4, 6, 10, 11 and 15 under i(15)=2; a NOR connection of i(17)=0, 4, 6, 8, 9, 12, 13 and 15 under i(15)=3; a NOR connection of i(17)=5, 6, 7, 10, 11, 14, 15 and 16 under i(15)=4; a NOR connection of i(17)=0, 1, 3, 4, 7, 9, 10, 11, 12 and 14 under i(15)=5; a NOR connection of i(17)=1, 3, 8, 9, 10, 11, 12 and 13 under i(15)=6; a NOR connection of i(17)=0, 4, 5, 7, 8, 9, 10, 11, 12, 13, 14 and 16 under i(15)=7; a NOR connection of i(17)=0, 1, 3, 4, 5, 6, 9, 12, 15 and 16 under i(15)=8; a NOR connection of i(17)=0, 4, 7, 8, 13 and 14 under i(15)=9; a NOR connection of i(17)=0, 1, 3, 4, 5, 7, 14 and 16 under i(15)=10; a NOR connection of i(17)=1, 3, 6, 7, 8, 10, 11, 13, 14 and 15 under i(15)=11; a NOR connection of i(17)=1, 3, 5, 6, 7, 8, 9, 12, 13, 14, 15 and 16 under i(15)=12; a NOR connection of i(17)=1, 3, 5, 8, 13 and 16 under i(15)=13 and a NOR connection of i(17)=0, 4, 5, 6, 8, 10, 11, 13, 15 and 16 under i(15)=14.

For example, {i(17), i(15)}={11, 4} is decoded as that the coefficient of m=7 is "1" as a result of discharging the nodes Na and Nb via the NOR connection of i(17)=5, 6, 7, 11, 14, and 16 under i(15)=4. The information data at the nodes Na and Nb of the degree number "m" of the inputs $S^3$ and $S_3$ are subjected to parity checking with 2-bit PC 313. Although the nodes Na and Nb are inverted by discharging, the result as an addition is the same as the case of no inversion.

As described above, the coefficients under the polynomial expression of the finite field element ζ will be obtained. In case of the input is zero element, expression index is not generated, and the signal is set at Vss, so that the discharge path is not formed, thereby resulting in that the node is "1". Therefore, the calculation at this stage becomes correct even if including the case of zero element.

ζ, η and θ defined as the sums of syndromes are obtained as 7th-degree polynomials to be coincident with anyone of pi(x) as being elements of GF(256). Therefore, the index of root α obtained by dividing the polynomial by $m_1(x)$ is transformed to an expression index expressed as a pair of mod 17 and mod 15, and the expression index will be used in the following calculation process.

Figure 33:
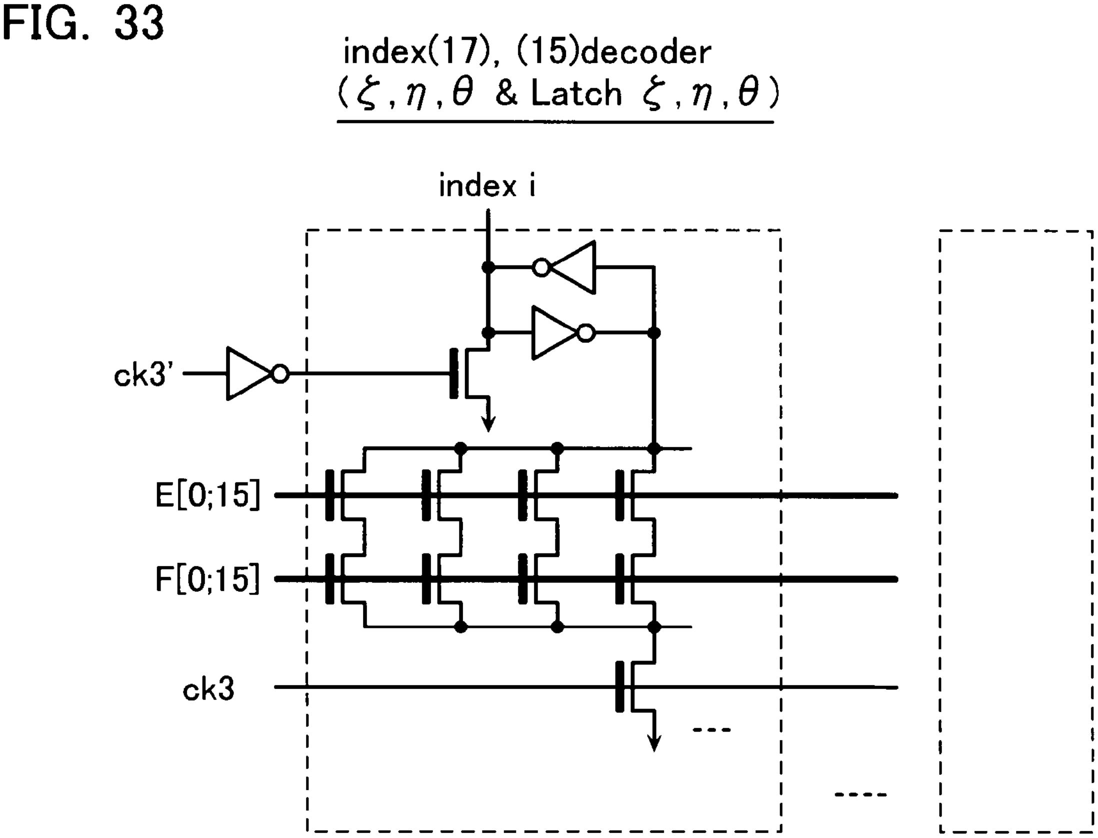
FIG. 33 shows the converting decoder used for converting the polynomial expressed coefficients in GF(256) elements to the expression indexes.

Pre-decoders used in the above-described transformation may be formed as the same as that used in the syndrome calculation as shown in FIG. 33, which generate signals E[0; 15] and F[0;15] of hexadecimal numbers based on the 8-bit coefficients of the polynomial expression. Therefore, the detail is not shown here.

Index (17), (15) decoders generate mod 17 and mod 15 components of the expression index belonging to the remainder classes based on the pre-decoded signals, and latch them. That is, combining signals E[0;15] and F[0;15] with NAND connections expressing components of the remainder classes and NOR connections thereof; discharging the pre-charged nodes with clocks ck3 and ck3'; and inverting them, remainder class index "i" is output. The decoder circuits are necessary up to the number of the remainder classes. These indexes are formed for mod 17 and mod 15 to be pairs of expression indexes.

Figure 34:
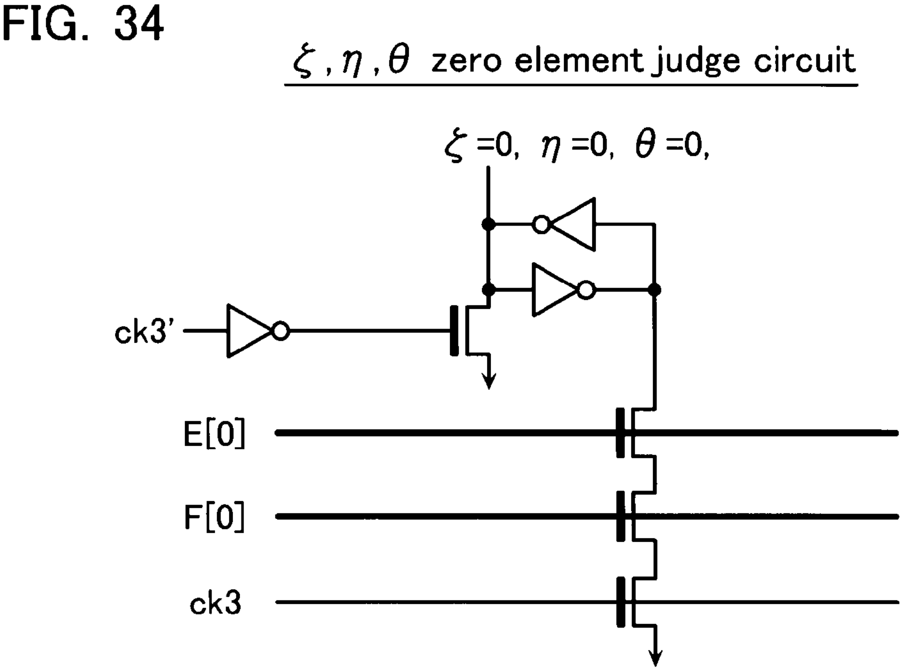
FIG. 34 shows the zero element judgment circuit used in the same calculation.

When pi(x)=0, it is not expressed as an index of α, i.e., indexes are not searched. In this case, E[0]=1 and F[0]=1, and indexes are not output. With respect to ζ, η and θ, since the judgment of zero element is used, it is possible to monitor the index state. However, to simply judge the zero element, it will be prepared decoders shown in FIG. 34 as ζ-, η- and θ-zero element judgment circuits. In detail, signals ζ=0, η=0 and θ=0 are output in accordance with the respective zero elements.

Next, error location searching will be explained below.

Syndrome Element Calculation (SEC) part 24

The calculation required for searching an error location is to define indexes based on congruences between the expression indexes. The calculation carried by clock ck3 in the syndrome element calculation part 24 will be explained below.

A product operation between the finite field elements is carried out as a congruence calculation. All congruences are in GF(256), i.e., expressed by mod 255. Therefore, if straightly calculating it, it corresponds to do comparing operations with a scale of 255×255, and the circuit scale becomes great. In consideration of this, in this embodiment, the calculation is divided into two parts that are processed in parallel. Explaining in detail, 255 is divided into two factors that are prime to each other, and the congruence is divided into two congruences with the prime factors as modulus, whereby it is used such a property that a number satisfying the two congruences satisfies the original congruence too.

In detail, in case the congruence of mod 255 is solved, using 255=17×15, solve two congruences of mod 17 and mod 15.

The following expression Exp. 45 shows congruences used for searching index $\sigma(S^4\eta)$ of $S^4\eta$Assuming that the index of "S" is σ, the fourth power of "S" is transformed to expression index of 4σ in accordance with above-described transformation table. Combining it with index σ(η), the following congruences will be obtained.

$$\sigma(S^4\eta)\equiv4\sigma+\sigma(\eta) \pmod{17}$$

$$\sigma(S^4\eta)\equiv4\sigma+\sigma(\eta) \pmod{15}$$

$$\rightarrow\sigma(S^4\eta)\equiv4\sigma+\sigma(\eta) \pmod{17\cdot15} \quad \text{[Exp. 45]}$$

The following Exp. 46 shows congruences used for searching index $\sigma(S^4\zeta^2)$ of $S^4\zeta^2$.

$$\sigma(S^4\zeta^2)\equiv4\sigma+2\sigma(\zeta) \pmod{17}$$

$$\sigma(S^4\zeta^2)\equiv4\sigma+2\sigma(\zeta) \pmod{15}$$

$$\rightarrow\sigma(S^4\zeta^2)\equiv4\sigma+2\sigma(\zeta) \pmod{17\cdot15} \quad \text{[Exp. 46]}$$

Similarly, Exp. 47 is a case of searching index $\sigma(S^3\zeta)$ of $S^3\zeta$; Exp. 48 is a case of searching index $\sigma(S^3\eta)$ of $S^3\eta$; Exp. 49 is a case of searching index $\sigma(S^2\zeta^2)$ of $S^2\zeta^2$; and Exp. 50 is a case of searching index σ(ζθ) of ζθ;

$$\sigma(S^3\zeta)\equiv3\sigma+\sigma(\zeta) \pmod{17}$$

$$\sigma(S^3\zeta)\equiv3\sigma+\sigma(\zeta) \pmod{15}$$

$$\rightarrow\sigma(S^3\zeta)\equiv3\sigma+\sigma(\zeta) \pmod{17\cdot15} \quad \text{[Exp. 47]}$$

$$\sigma(S^3\eta)\equiv3\sigma+\sigma(\eta) \pmod{17}$$

$$\sigma(S^3\eta)\equiv3\sigma+\sigma(\eta) \pmod{15}$$

$$\rightarrow\sigma(S^3\eta)\equiv3\sigma+\sigma(\eta) \pmod{17\cdot15} \quad \text{[Exp. 48]}$$

$$\sigma(S^2\zeta^2)\equiv2\sigma+2\sigma(\zeta) \pmod{17}$$

$$\sigma(S^2\zeta^2)\equiv2\sigma+2\sigma(\zeta) \pmod{15}$$

$$\rightarrow\sigma(S^2\zeta^2)\equiv2\sigma+2\sigma(\zeta) \pmod{17\cdot15} \quad \text{[Exp. 49]}$$

$$\sigma(\zeta\theta)\equiv\sigma(\zeta)+\sigma(\theta) \pmod{17}$$

$$\sigma(\zeta\theta)\equiv\sigma(\zeta)+\sigma(\theta) \pmod{15}$$

$$\rightarrow\sigma(\zeta\theta)\equiv\sigma(\zeta)+\sigma(\theta) \pmod{17\cdot15} \quad \text{[Exp. 50]}$$

Figure 35:
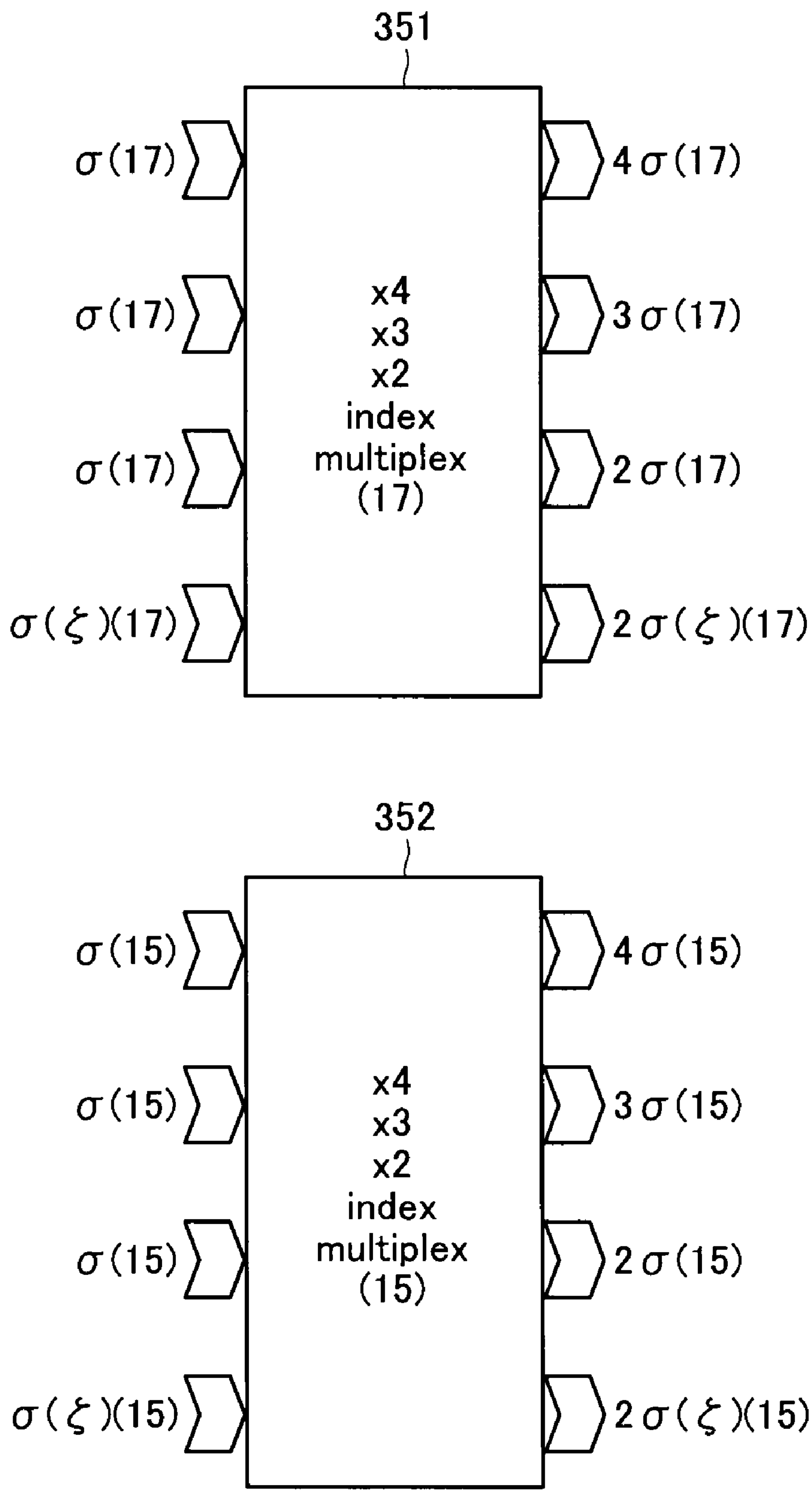
FIG. 35 shows the index multiplexer circuit used for converting the power of adder inputs.

To search the sum of the expression indexes in the congruence calculation, it is in need of transforming a power of a required element to an expression index. Required here are fourth, third and second powers. In accordance with the above-described transformation table, elements of the expression index of σ and σ(ζ) are transformed and output with index multiplexer circuits 351 and 352 shown in FIG. 35. These multiplex circuits are divider circuits only for supplying signals in accordance with the relationships between indexes.

Figure 36:
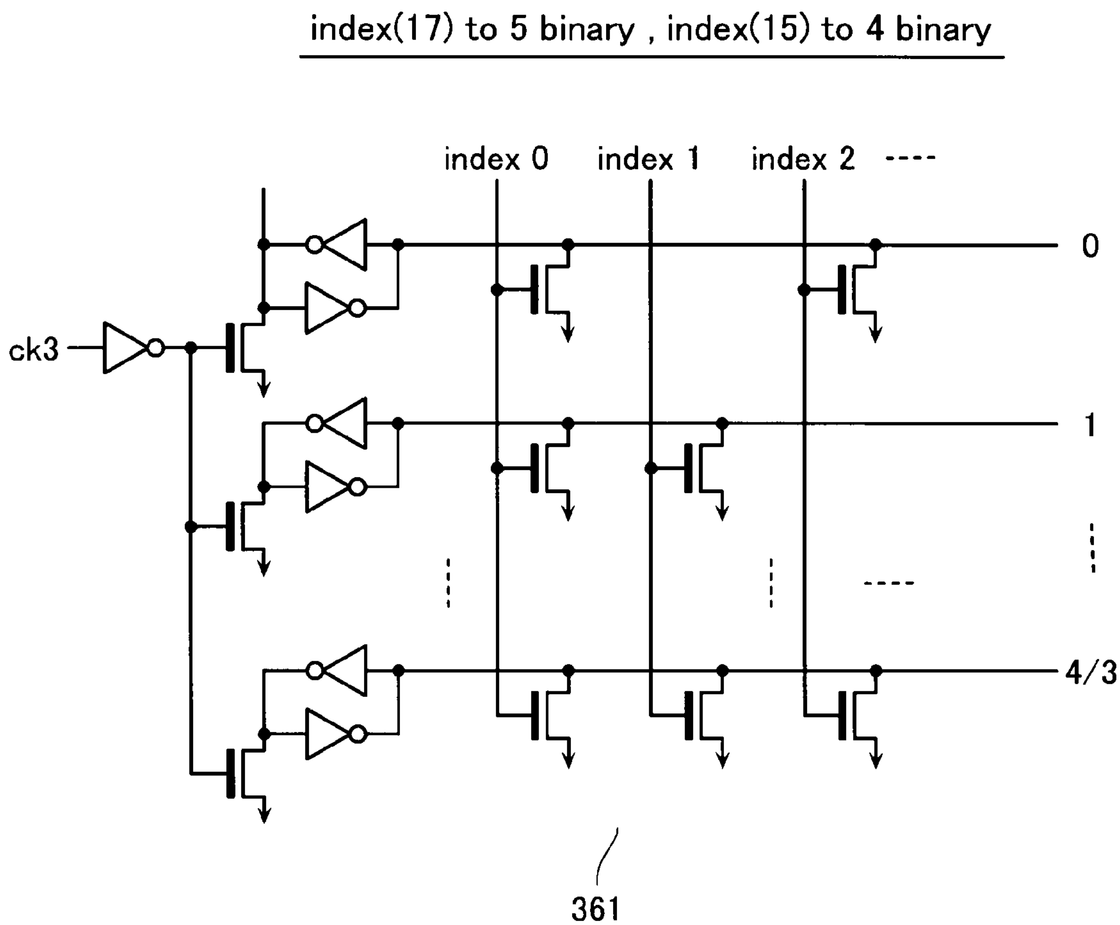
FIG. 36 shows the binary expressing decoder of the expression indexes.

Further, to convert the expression indexes to binary numbers, as shown in FIG. 36, index/binary conversion circuit 361 activated by clock ck3 is used. With this circuit, index (17) is converted to 5 binary number; and index (15) to 4 binary number.

It will be explained general adders used for searching the sum of the expression indexes. Assuming that it is searched expression index components of a product of α-power of finite field element A and β-power of finite field element B.

Index of the product is $\sigma(A^{\alpha}B^{\beta})$, which may be searched as a remainder of the sum of σ(A) multiplied by α and σ(B) multiplied by β, where σ(A) and σ(B) are indexes of the factors of the product. α-multiplying and β-multiplying may be obtained in accordance with the above-described table while the sum is obtained with an adder used for adding binary numbers. It is in need of preparing adders for the respective expression indexes, i.e., adders of mod 17 and mod 15 are necessary.

Figure 37:
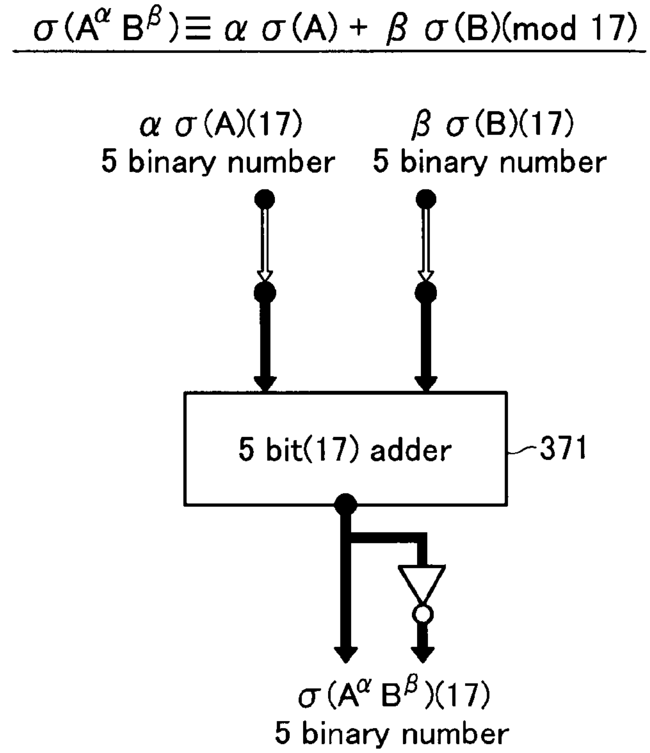
FIG. 37 shows the configuration of the index adder of mod 17.
Figure 38:
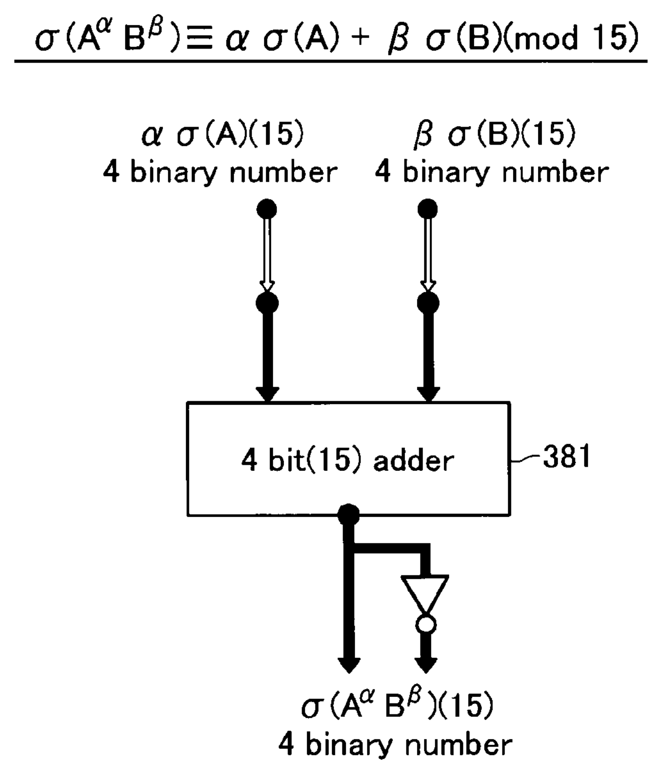
FIG. 38 shows the configuration of the index adder of mod 15.

To search remainders of the sum, 5-bit (17) adder shown in FIG. 37 and 4-bit (15) adder shown in FIG. 38 are constituted. As a result, 5-bit binary number and 4-bit binary number are obtained as the binary numbers of the expression index components.

Figure 39:
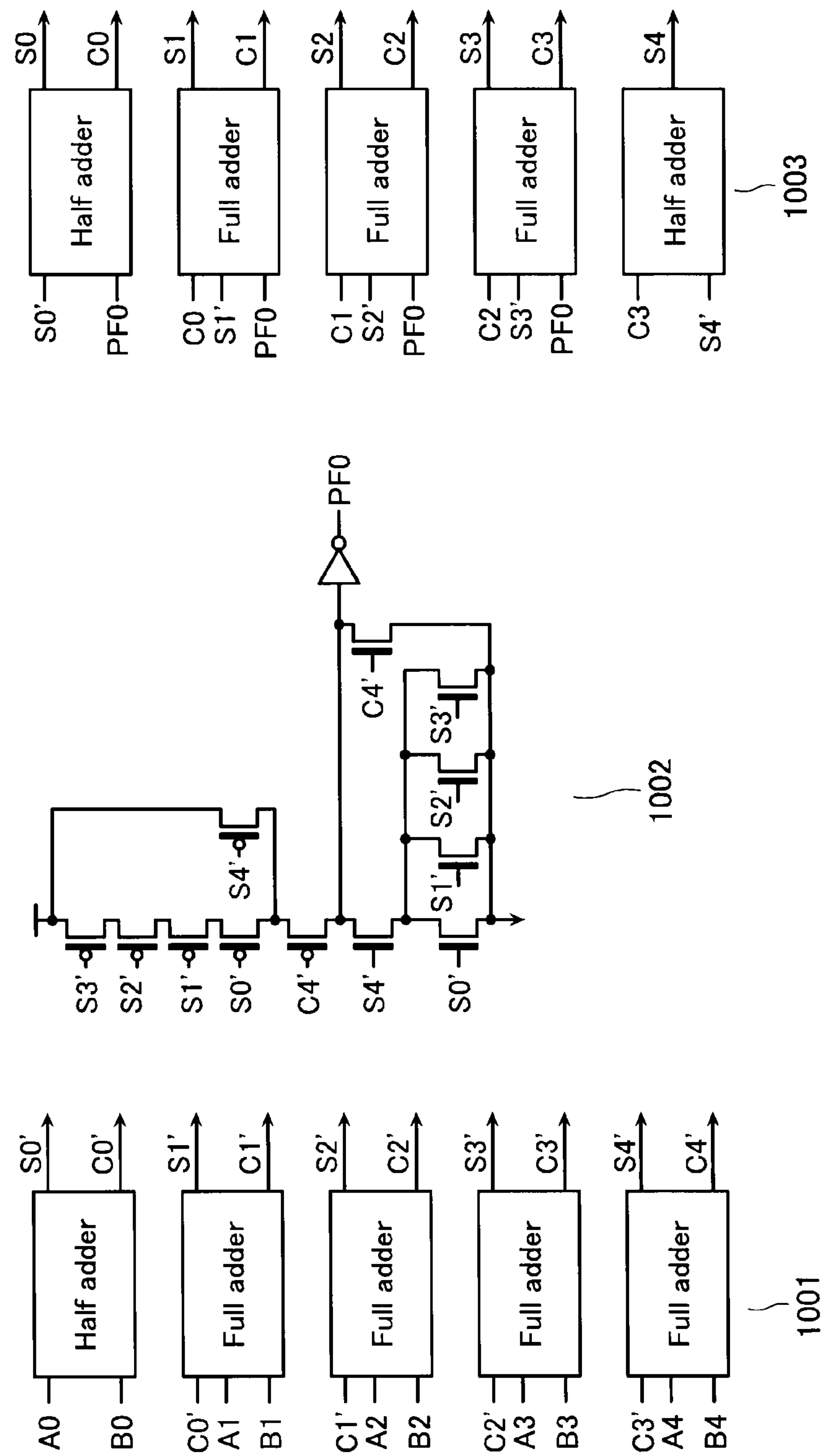
FIG. 39 shows the detailed configuration of the mod 17 adder.

FIG. 39 shows the configuration of 5-bit (17) adder 371. Additions of the respective digits of numbers Am and Bm are searched at full adders and half adders to output the sum as a remainder of mod 17.

As shown in FIG. 39, this adder has 5-bit first stage adder circuit 1001; carry correction circuit 1002 for detecting that the sum is equal to 17 or more to carry; and second stage adder circuit 1003 for adding a complement of 17, i.e., 15(=32−17), together with the carry correction circuit 1002 when the sum is 17 or more.

Figure 40:
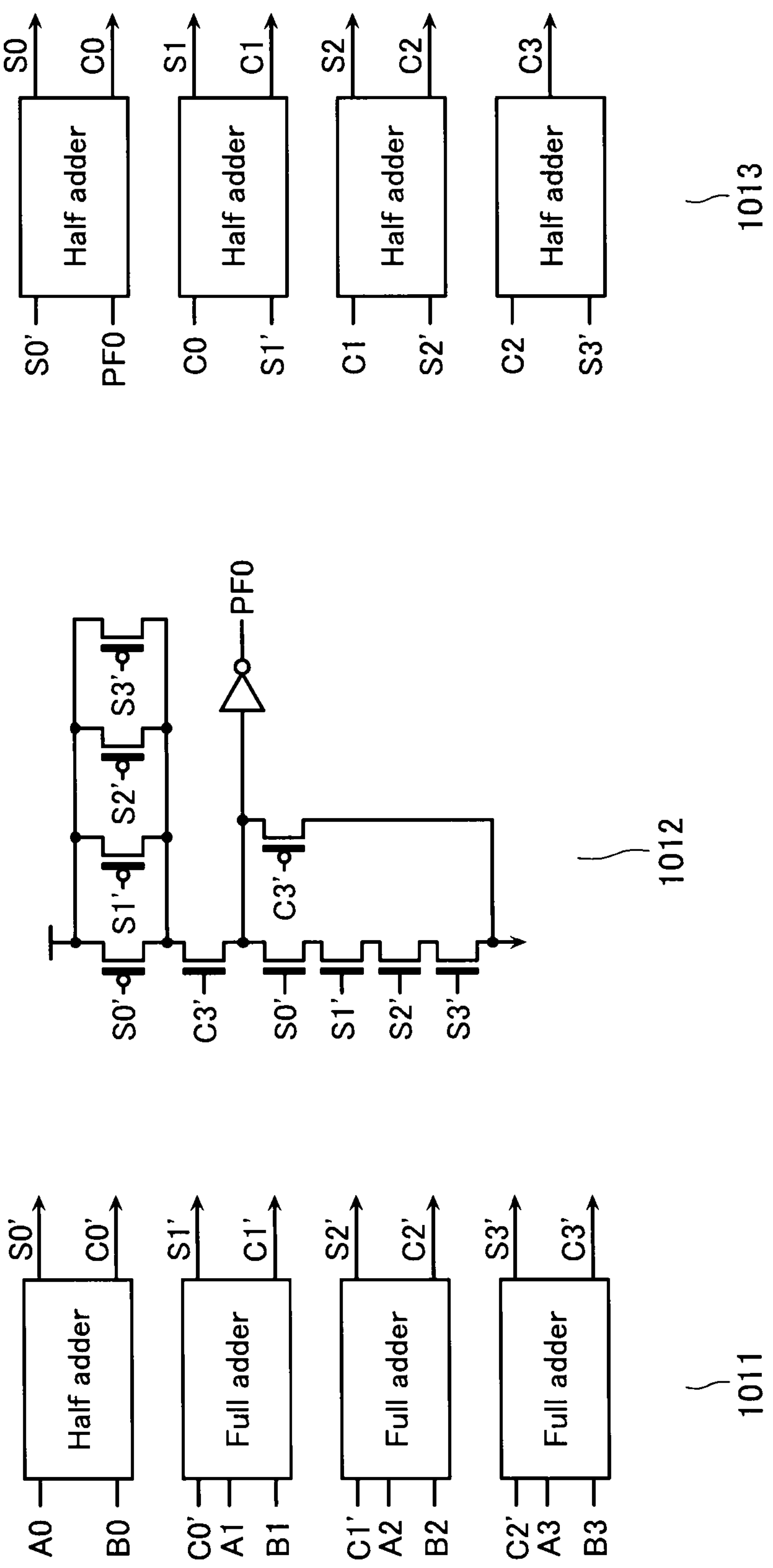
FIG. 40 shows the detailed configuration of the mod 15 adder.

FIG. 40 shows the configuration of 4-bit (15) adder 381. Additions of the respective digits of numbers Am and Bm are searched at full adders and half adders to output the sum as a remainder of mod 15.

This adder has 4-bit first stage adder circuit 1011; carry correction circuit 1012 for detecting that the sum is equal to 15 or more to carry; and second stage adder circuit 1013 for adding a complement of 15, i.e., 1(=16-15), together with the carry correction circuit 1012 when the sum is 15 or more.

It is not required of the adders shown in FIGS. 39 and 40 to be synchronized with a clock, and the output is determined when the input is determined. Therefore, the system load such as timing control has been reduced.

Figure 41:
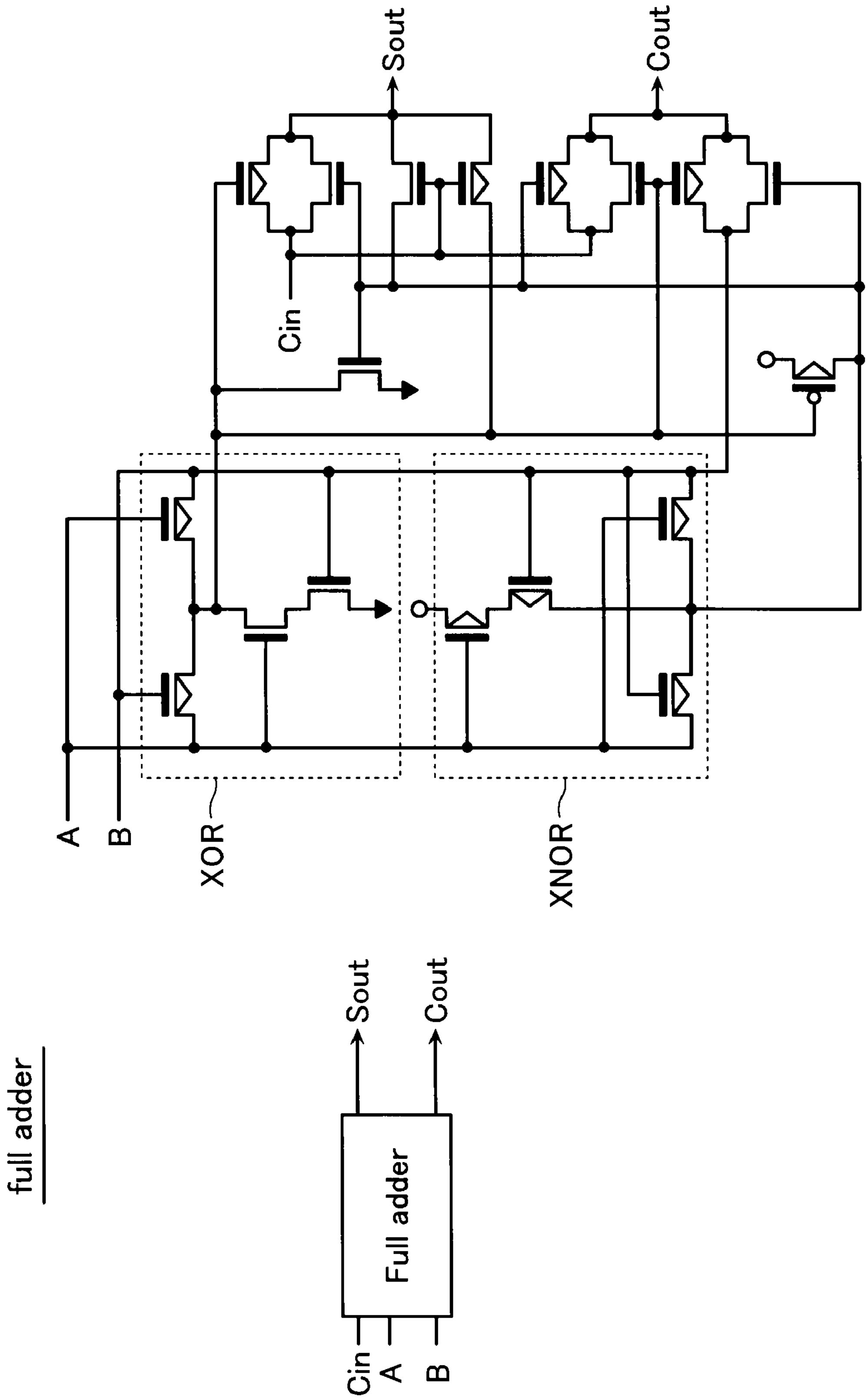
FIG. 41 shows a full adder.
Figure 42:
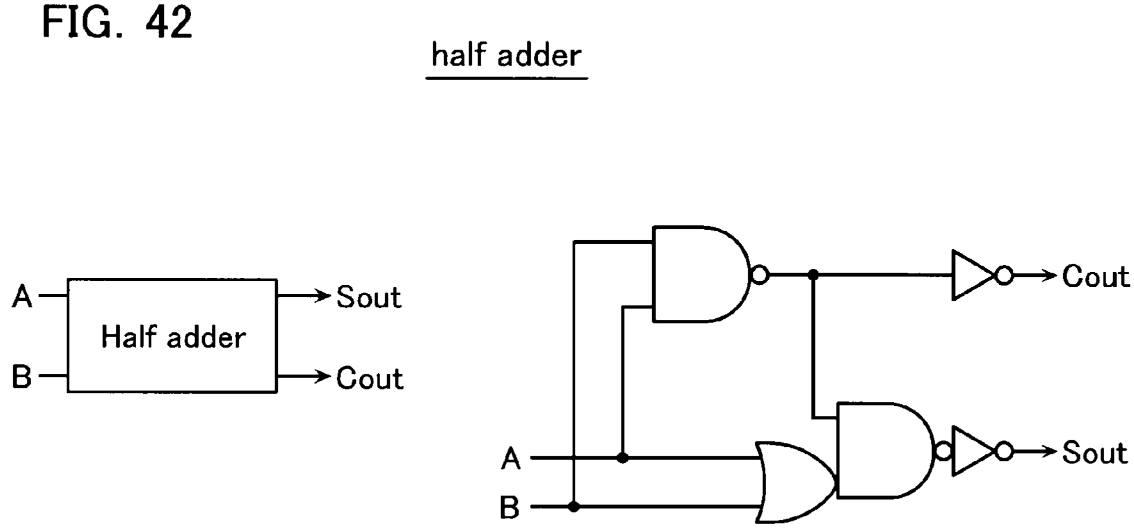
FIG. 42 shows a half adder.

FIGS. 41 and 42 show full adder and half adder and circuit symbols thereof, which are basic units used in binary addition operations. Full adder performs a logic operation for bits A and B to be added with XOR circuit and XNOR circuit, and further takes a logic with carry signal Cin, thereby outputting sum Sout obtained by adding A, B and Cin, and carry signal Cout. Half adder may be formed of general logic gates. Combining these units, necessary adder circuits may be formed.

The result obtained in the adder is binary number of the expression index component. Therefore, it is required of this to be decoded to the expression index component itself.

Figure 43:
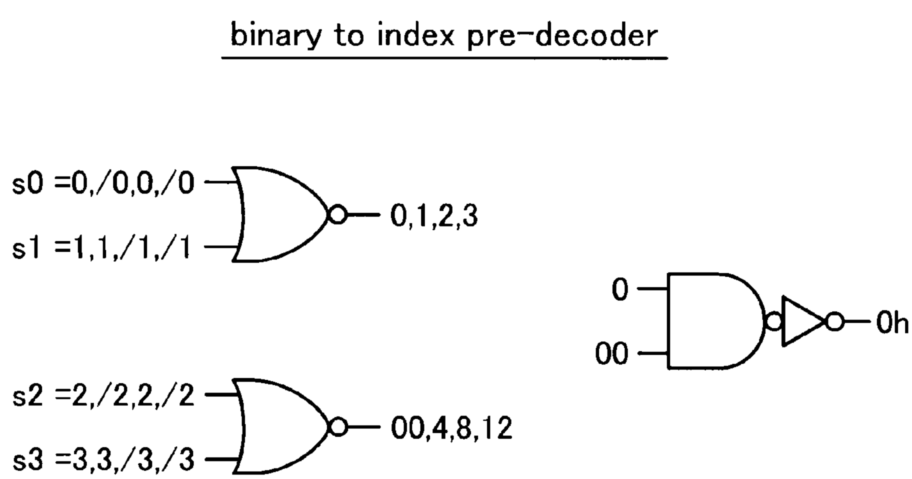
FIG. 43 shows pre-decoders used in the decoder circuit used for decoding the adder output.
Figure 44:
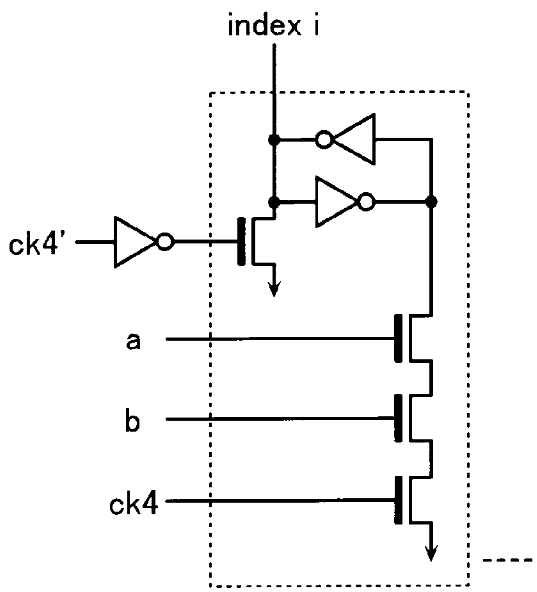
FIG. 44 shows the index & latch circuit used in the same decoder circuit.

Such a decode circuit will be constituted by pre-decoders shown in FIG. 43 and index latches shown in FIG. 44. First, with the pre-decoders shown in FIG. 43, four bits s0 to s3 from the head of the adder output binary number are subjected to pre-decoding without regard to 4-bit adder output or 5-bit adder output. In detail, the binary number is divided two bits by two bits to be transformed to quaternary number. In addition, such a signal will be formed that corresponds to zero of four bits octal number.

These pre-decoded signals are input to the index (17), (15) & latch circuit shown in FIG. 44, and the expression index components index "i" will be output in accordance with the connections between the signals and transistor gates "a" and "b". This circuit is activated by clock ck4, and the output is latched by clock ck4'.

Next, the calculation part of adders 422 to 452, which are multiplexed by clocks ck3 and ck6 in the calculation block (SEC part) 24, will be explained below.

Exp. 51 shows congruences used for searching indexes σ(Sη) and σ(ST) of Sη and ST, respectively. Assuming that index of "S" is σ, the following congruences are obtained.

$$\sigma(S\eta)\equiv\sigma+\sigma(\eta) \pmod{17}$$

$$\sigma(S\eta)\equiv\sigma+\sigma(\eta) \pmod{15}$$

$$\rightarrow\sigma(S\eta)\equiv\sigma+\sigma(\eta) \pmod{17\cdot15}$$

$$\sigma(ST)\equiv\sigma+\sigma(T) \pmod{17}$$

$$\sigma(ST)\equiv\sigma+\sigma(T) \pmod{15}$$

$$\rightarrow\sigma(ST)\equiv\sigma+\sigma(T) \pmod{17\cdot15} \quad \text{[Exp. 51]}$$

Exp. 52 shows congruences used for searching indexes $\sigma(S^{-1}\zeta)$ and σ(a) of $S^{-1}\zeta$ and a=D/S, respectively. Assuming that index of "S" is σ, expression index −σ is obtained from $S^{-1}$ in accordance with the above-described table, and the following congruences are obtained with σ(ζ) and σ(D).

$$\sigma(S^{-1}\zeta)\equiv-\sigma+\sigma(\zeta) \pmod{17}$$

$$\sigma(S^{-1}\zeta)\equiv-\sigma+\sigma(\zeta) \pmod{15}$$

$$\rightarrow\sigma(S^{-1}\zeta)\equiv-\sigma+\sigma(\zeta) \pmod{17\cdot15}$$

$$\sigma(a)\equiv-\sigma+\sigma(D) \pmod{17}$$

$$\sigma(a)\equiv-\sigma+\sigma(D) \pmod{15}$$

$$\rightarrow\sigma(a)\equiv-\sigma+\sigma(D) \pmod{17\cdot15} \quad \text{[Exp. 52]}$$

Exp. 53 shows congruences used for searching indexes σ(ζη) and σ(DT) of ζη and DT, respectively. Assuming that index of ζ is σ(ζ) and index of "D" is a (D), the following congruences are obtained with σ(η) and σ(T).

$$\sigma(\zeta\eta)\equiv\sigma(\zeta)+\sigma(\eta) \pmod{17}$$

$$\sigma(\zeta\eta)\equiv\sigma(\zeta)+\sigma(\eta) \pmod{15}$$

$$\rightarrow\sigma(\zeta\eta)\equiv\sigma(\zeta)+\sigma(\eta) \pmod{17\cdot15}$$

$$\sigma(DT)\equiv\sigma(D)+\sigma(T) \pmod{17}$$

$$\sigma(DT)\equiv\sigma(D)+\sigma(T) \pmod{15}$$

$$\rightarrow\sigma(DT)\equiv\sigma(D)+\sigma(T) \pmod{17\cdot15} \quad \text{[Exp. 53]}$$

Exp. 54 shows congruences used for searching indexes $\sigma(S^{-1}\eta)$ and σ(Q) of $S^{-1}\eta$ and Q=⌈Q/⌈, respectively. Assuming that index of ζ is σ(ζ), and index of ⌈ is σ(⌈), each −1 power thereof is obtained from the above-described table, and the following congruences are obtained with σ(η) and σ(⌈Q).

$$\sigma(S^{-1}\eta)\equiv-\sigma(\zeta)+\sigma(\eta) \pmod{17}$$

$$\sigma(S^{-1}\eta)\equiv-\sigma(\zeta)+\sigma(\eta) \pmod{15}$$

$$\rightarrow\sigma(S^{-1}\eta)\equiv-\sigma(\zeta)+\sigma(\eta) \pmod{17\cdot15}$$

$$\sigma(Q)\equiv-\sigma(\lceil)+\sigma(\lceil Q) \pmod{17}$$

$$\sigma(Q)\equiv-\sigma(\lceil)+\sigma(\lceil Q) \pmod{15}$$

$$\rightarrow\sigma(Q)\equiv-\sigma(\lceil)+\sigma(\lceil Q) \pmod{17\cdot15} \quad \text{[Exp. 54]}$$

In the above-described congruence calculations, a power of an element necessary for searching the sum of expression indexes is transformed to an expression index. Required is −1 power, and multiplexing with a clock is added to it. The transformation of the power to the expression index and the multiplexer circuit will be explained below with reference to FIGS. 45 and 46.

Figure 45:
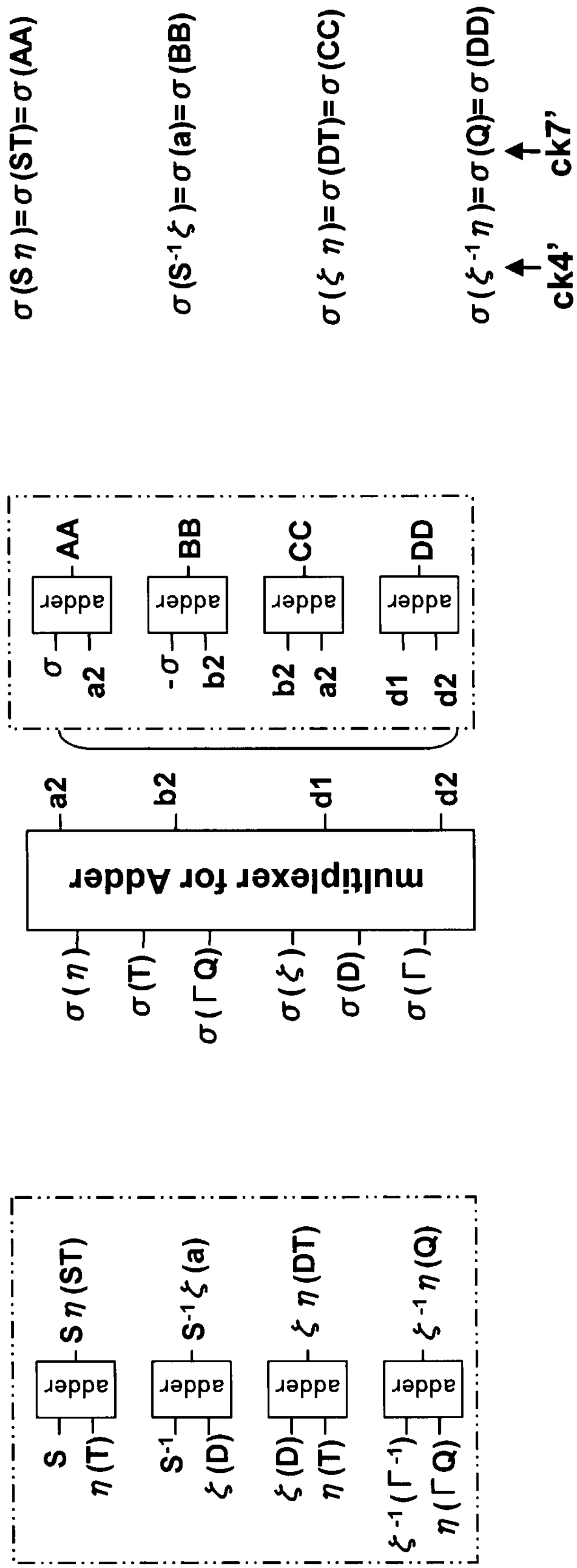
FIG. 45 shows the relationship between the adder groups controlled by clocks ck3, ck6 and the expression indexes of the finite field elements input to them.

FIG. 45 shows the relationships between adder groups (corresponding to adders 422 to 452) in SEC block 24, which are multiplexed with clocks ck3 and ck6, and expression index groups of finite field elements input to them. Adder inputs to be multiplexed are "a2", "b2", "d1" and "d2" while "S" is an expression index to be fixed as σ or −σ. Outputs of the adder groups are "AA", "BB", "CC" and "DD", which become expression indexes at the respective multiplex timings shown by arrows of clocks ck4' and ck7'.

Figure 46:
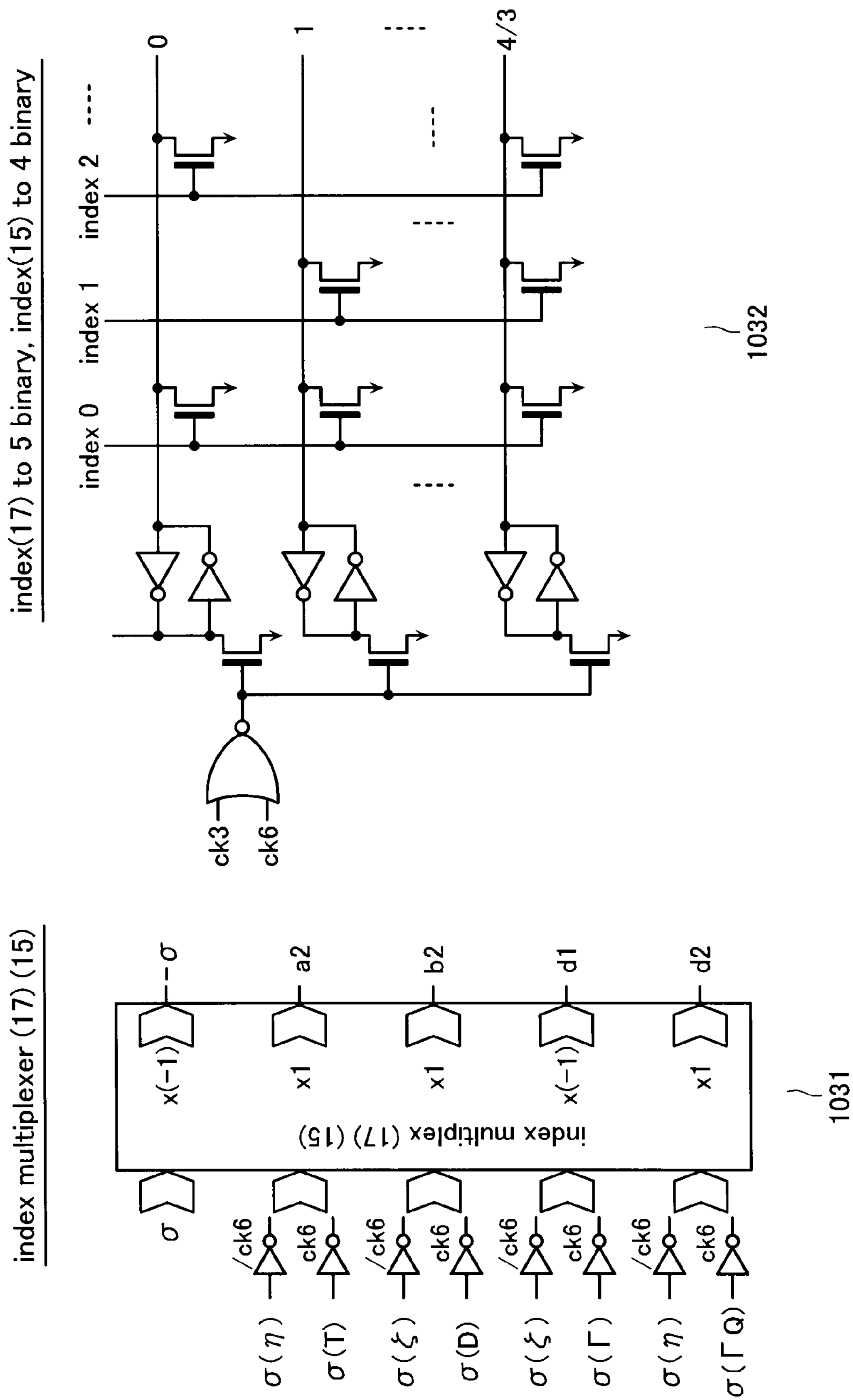
FIG. 46 shows the index multiplex circuit and index/binary converting circuit at the adder input.

FIG. 46 shows index multiplexer 1031 and index/binary conversion circuit 1032. The multiplexer (17), (15) block in the multiplexer 1031 is to output the expression index components of σ, σ(η), σ(T), σ(ζ), σ(D), σ(⌈), σ(⌈Q) or −1 power in accordance with the above-described table. In detail, this multiplex circuit is a dividing circuit configured to simply supply signals in accordance with the relationships between indexes. Alternating the inputs with clock ck6, adders are used in a multiplex manner.

The expression indexes obtained as described above are input to the index/binary conversion circuit 1032, which is activated by clock ck3 or ck6, so that indexes (17) or (15) are converted to 5-binary or 4-binary numbers. These binary data are input to adders at the respective timings.

The result of the adders expresses a binary number of an expression index. Therefore, to decode this to the expression index component itself, per-decoders shown in FIG. 43 are used. That is, the binary number is divided two bits by two bits into quaternary number, and in addition, such a signal will be formed that corresponds to zero of four bits octal number.

Figure 47:
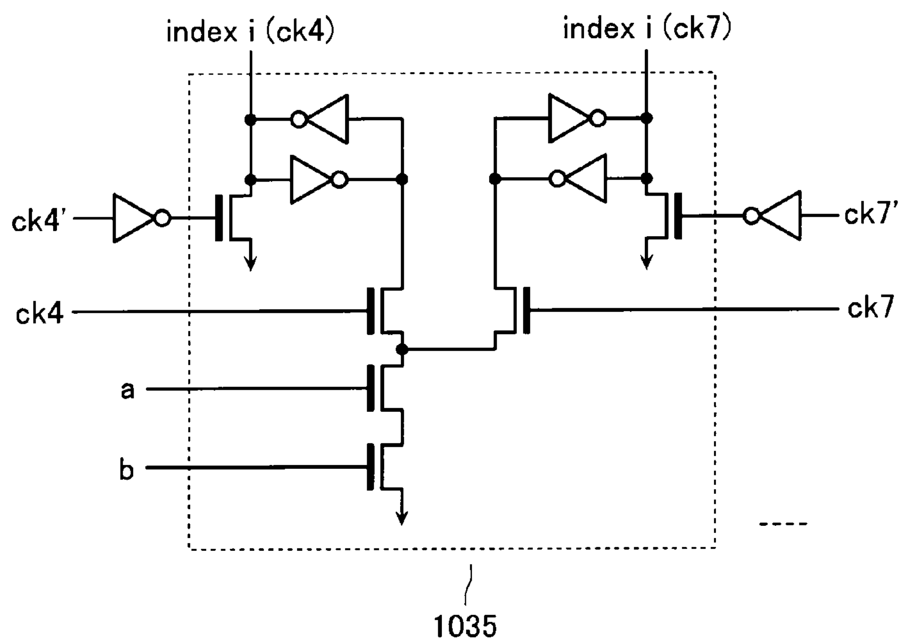
FIG. 47 shows binary/index decoding circuit used at the adder output.

These pre-decoded signals are input to the index (17), (15) & latch circuit 1035 shown in FIG. 47, and the expression index components index "i" will be output in accordance with the connections between the signals and transistor gates "a" and "b". This circuit is activated by clocks ck4 and ck7, and the output is latched by clocks ck4' and ck7'.

It is in need of preparing two systems of latch in accordance with different timings because the circuit is multiplexed. As finite field elements required later, there are expression indexes of $S^{-1}\zeta$ and $S^{-1}\eta$ to be latched by clock ck4', and expression indexes of "a" and "Q" to be latched by clock ck7'.

Next, it will be explained another calculation part (adders 421, 426 and 427) multiplexed by clocks ck3 and ck7 in the calculation block (SEC) 24.

Exp. 55 shows congruences used for searching indexes $\sigma(S^2\theta)$ and $\sigma(S^2Q)$ of $S^2$ and $S^2Q$, respectively. Assuming that index of "S" is σ, expression index 2σ is obtained from the second power of "S" based on the above-described table, and the following congruences are obtained with σ(θ) and σ(Q).

$$\sigma(S^2\theta)\equiv 2\sigma+\sigma(\theta) \pmod{17}$$

$$\sigma(S^2\theta)\equiv 2\sigma+\sigma(\theta) \pmod{15}$$

$$\rightarrow\sigma(S^2\theta)\equiv 2\sigma+\sigma(\theta) \pmod{17\cdot 15}$$

$$\sigma(S^2Q)\equiv 2\sigma+\sigma(Q) \pmod{17}$$

$$\sigma(S^2Q)\equiv 2\sigma+\sigma(Q) \pmod{15}$$

$$\rightarrow\sigma(S^2Q)\equiv 2\sigma+\sigma(Q) \pmod{17\cdot 15} \quad \text{[Exp. 55]}$$

Exp. 56 shows congruences used for searching indexes σ(Sθ) and σ(SDT) of Sθ and SDT, respectively. Assuming that index of "S" is σ, the following congruences are obtained with σ(θ) and σ(DT).

$$\sigma(S\theta)\equiv\sigma+\sigma(\theta) \pmod{17}$$

$$\sigma(S\theta)\equiv\sigma+\sigma(\theta) \pmod{15}$$

$$\rightarrow\sigma(S\theta)\equiv\sigma+\sigma(\theta) \pmod{17\cdot 15}$$

$$\sigma(SDT)\equiv\sigma+\sigma(DT) \pmod{17}$$

$$\sigma(SDT)\equiv\sigma+\sigma(DT) \pmod{15}$$

$$\rightarrow\sigma(SDT)\equiv\sigma+\sigma(DT) \pmod{17\cdot 15} \quad \text{[Exp. 56]}$$

Exp. 57 shows congruences used for searching indexes $\sigma(\zeta^{-1}\theta)$ and σ(Ta) of $\zeta^{-1}\theta$ and $Ta=S^{-1}DT$, respectively. Assuming that index of $S^{-1}$ is −σ, the following congruences are obtained with σ(θ) and σ(DT).

$$\sigma(\zeta^{-1}\theta)\equiv-\sigma+\sigma(\theta) \pmod{17}$$

$$\sigma(\zeta^{-1}\theta)\equiv-\sigma+\sigma(\theta) \pmod{15}$$

$$\rightarrow\sigma(\zeta^{-1}\theta)\equiv-\sigma+\sigma(\theta) \pmod{17\cdot 15}$$

$$\sigma(Ta)\equiv-\sigma+\sigma(DT) \pmod{17}$$

$$\sigma(Ta)\equiv-\sigma+\sigma(DT) \pmod{15}$$

$$\rightarrow\sigma(Ta)\equiv-\sigma+\sigma(DT) \pmod{17\cdot 15} \quad \text{[Exp. 57]}$$

In the above-described congruence calculations, a power of an element necessary for searching the sum of expression indexes is transformed to an expression index. Required are the second power and −1 power, and multiplexing with a clock is added to them. The transformation of the power to the expression index and the multiplexer circuit will be explained below with reference to FIGS. 48 and 49.

Figure 48:
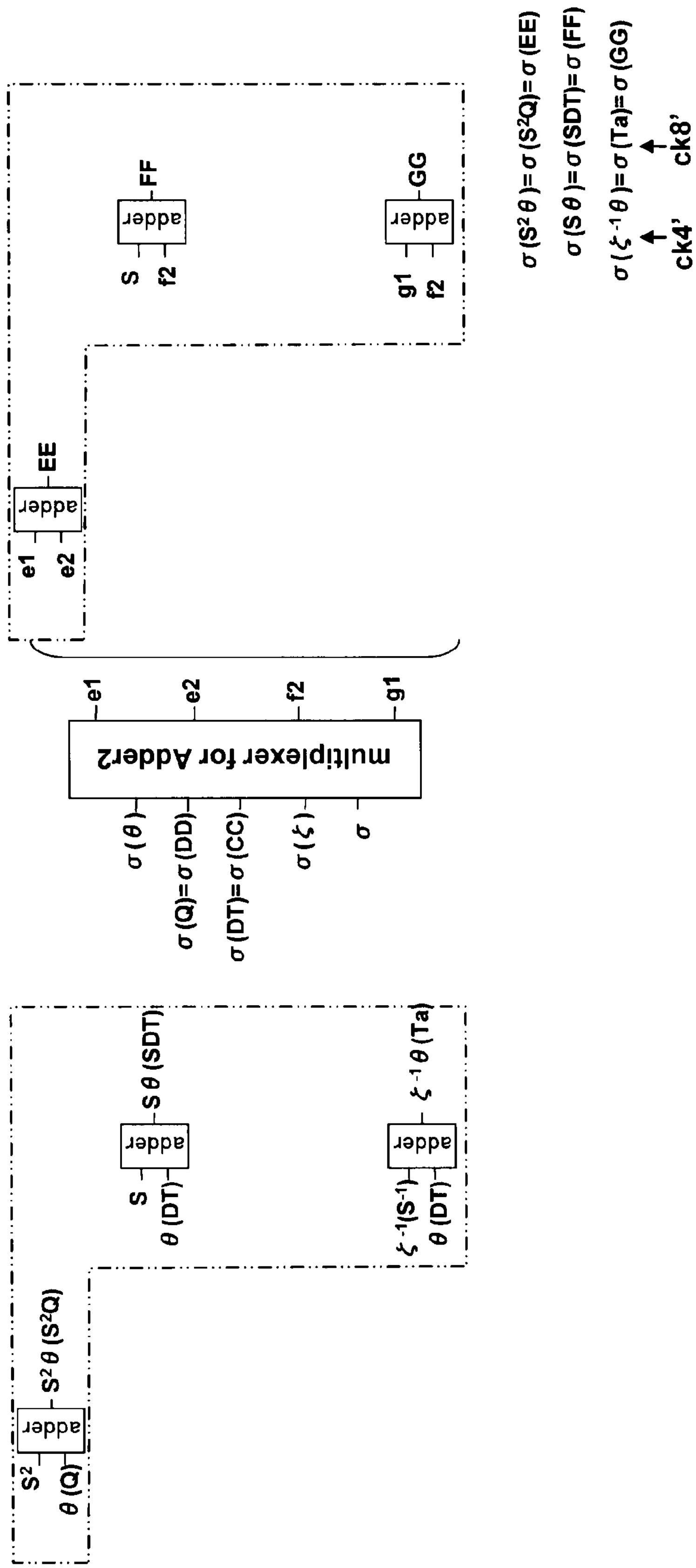
FIG. 48 shows the relationship between the adder groups controlled by clocks ck3, ck7 and the expression indexes of the finite field elements input to them.

FIG. 48 shows the relationships between adder groups, which are multiplexed with clocks ck3 and ck7, and expression index groups of finite field elements input to them. Adder inputs to be multiplexed are "e1", "e2", "f2" and "g2". Outputs of the adder groups are "EE", "FF" and "GG", which become expression indexes at the respective multiplex timings shown by arrows of clocks ck4' and ck8'.

Figure 49:
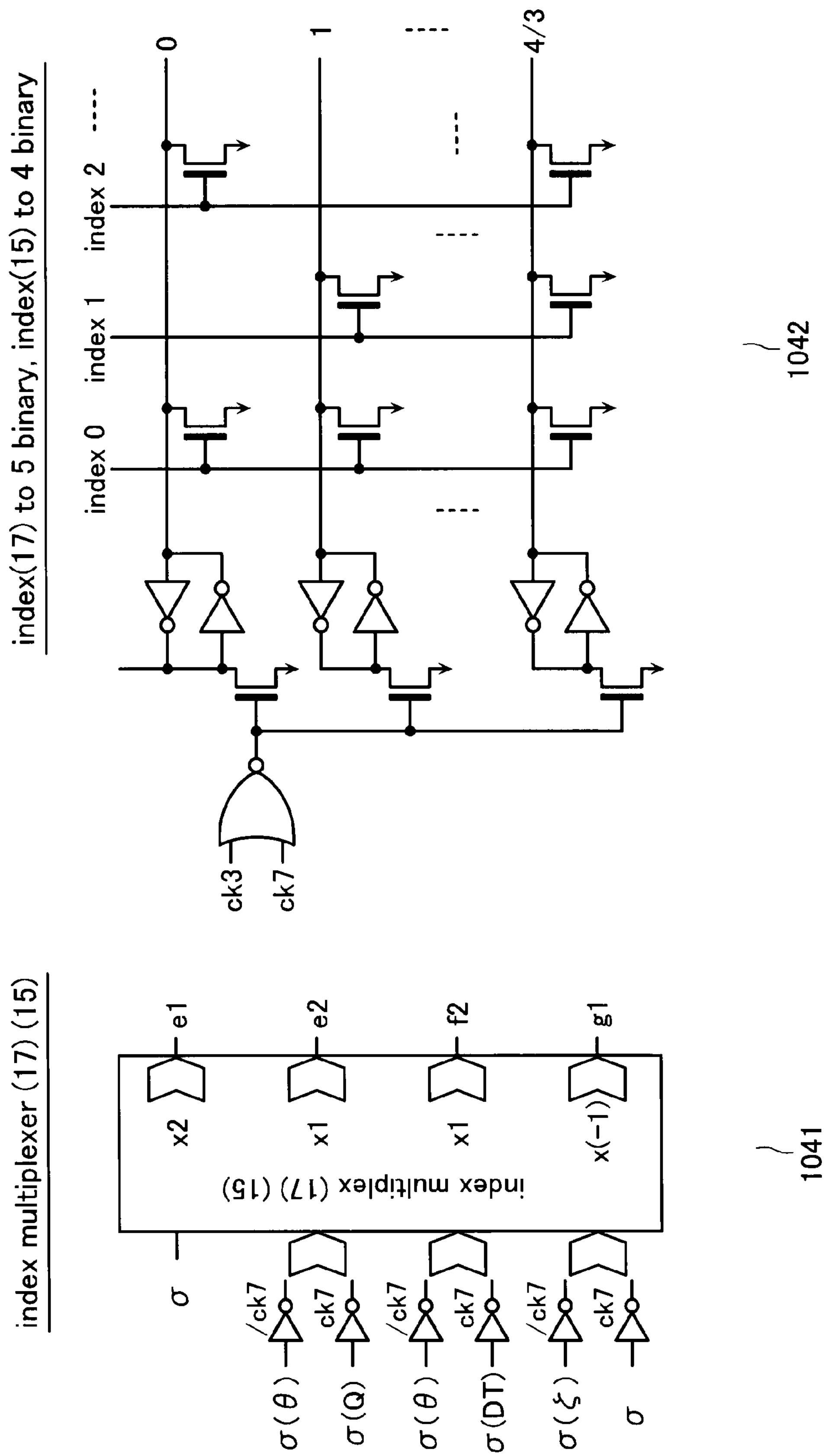
FIG. 49 shows the index multiplex circuit and index/binary converting circuit at the adder input.

FIG. 49 shows index multiplexer 1041 and index/binary conversion circuit 1042. The multiplexer (17), (15) block in the multiplexer 1041 is to output the expression index components of σ, σ(θ), σ(Q), σ(DT) or the second power or −1 power in accordance with the above-described table. In detail, this multiplex circuit is a dividing circuit configured to simply supply signals in accordance with the relationships between indexes. Alternating the inputs with clock ck7, adders are used in a multiplex manner.

The expression indexes obtained as described above are input to the index/binary conversion circuit 1042, which is activated by clock ck3 or ck7, so that indexes (17) or (15) are converted to 5-binary or 4-binary numbers. These binary data are input to adders at the respective timings.

The result of the adders expresses a binary number of an expression index. Therefore, to decode this to the expression index component itself, pre-decoders described above are used. That is, the binary number is divided two bits by two bits into quaternary number, and in addition, such a signal will be formed that corresponds to zero of four bits octal number.

Figure 50:
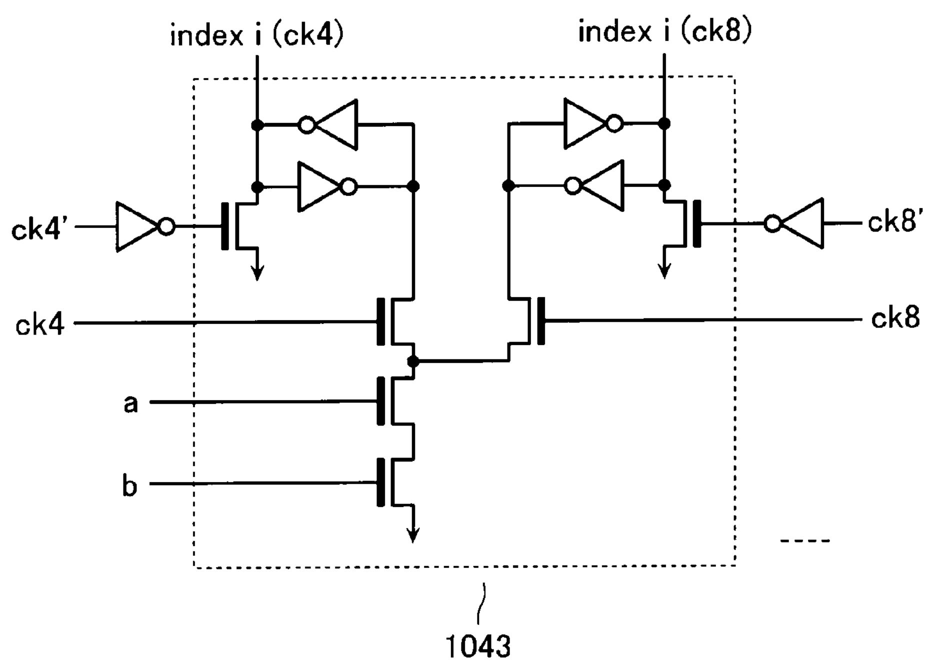
FIG. 50 shows the index & latch.

These pre-decoded signals are input to the index (17), (15) & latch circuit 1043 shown in FIG. 50, and the expression index components index "i" will be output in accordance with the connections between the signals and transistor gates "a" and "b".

This circuit is activated by clocks ck4 and ck8, and the output is latched by clocks ck4' and ck8'. It is in need of preparing two systems of latch in accordance with different timings because the circuit is multiplexed. As finite field elements required later, there is an expression index of $S^2\theta$ to be latched by clock ck4'.

It will be explained still another calculation part (i.e., PC circuits 451, 461 and 462), which are multiplexed with clocks ck4 and ck7 or ck8 in the calculation block (SEC) 24. In this part, product and sum of the expression index elements are taken. First, the product calculation will be explained, in which there is no clock multiplex.

Exp. 58 shows congruences used for searching index a $(S^2\zeta\eta)$ of $S^2\zeta\eta$. Assuming that the index of "S" is σ, the second power of "S" becomes expression index 2σ in accordance with the above-described table. Therefore, assume that index of ζη is σ(ζη), and the following congruences are obtained.

$$\sigma(S^2\zeta\eta)\equiv 2\sigma+\sigma(\zeta\eta)\ (\text{mod } 17)$$

$$\sigma(S^2\zeta\eta)\equiv 2\sigma+\sigma(\zeta\eta)\ (\text{mod } 15)$$

$$\rightarrow\sigma(S^2\zeta\eta)\equiv 2\sigma+\sigma(\zeta\eta)\ (\text{mod } 17\cdot 15) \quad \text{[Exp. 58]}$$

Index/binary conversion circuit (i.e., circuit for converting index(17) and index(15) to 5-binary and 4-binary, respectively), which is activated by clock ck4, has already been formed as the same circuit activated by clock ck3 because the expression index of the second power of "S" has been obtained. Therefore the detailed circuit is not shown here.

The result obtained with adders is binary data. To decode this binary data, there are prepared pre-decoders for decoding it to the expression index component itself. This has already been explained. The pre-decoders divide the binary data two bits by two bits and convert it into quaternary number, and in addition, form a signal corresponding to zero of four bits octal number.

Figure 51:
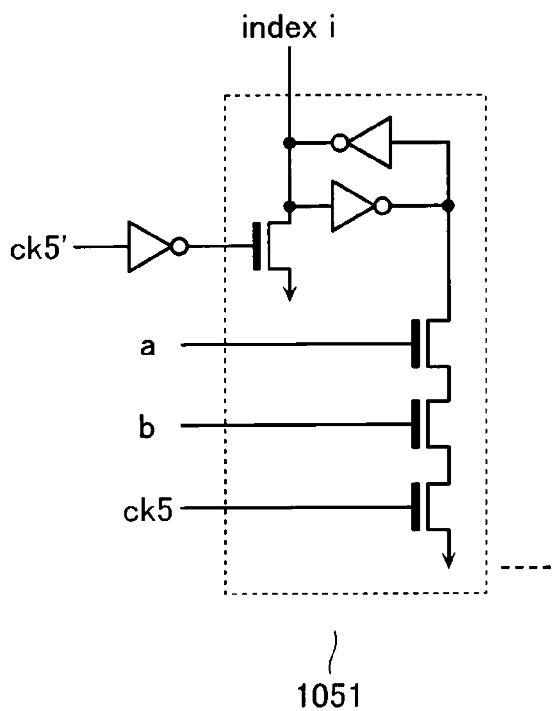
FIG. 51 shows the binary/index decoder circuit used at the adder output of the SEC part.

Index (17), (15) & latch circuit 1051 shown in FIG. 51 is prepared to generate the expression index components based on the index signals pre-decoded from bits "s0" to "s3" of adders, and latch them. The expression index components index "i" will be output in accordance with the connections between the signals and transistor gates "a" and "b". This circuit is activated by clock ck5, and the output is latched by clock ck5'.

Figure 52:
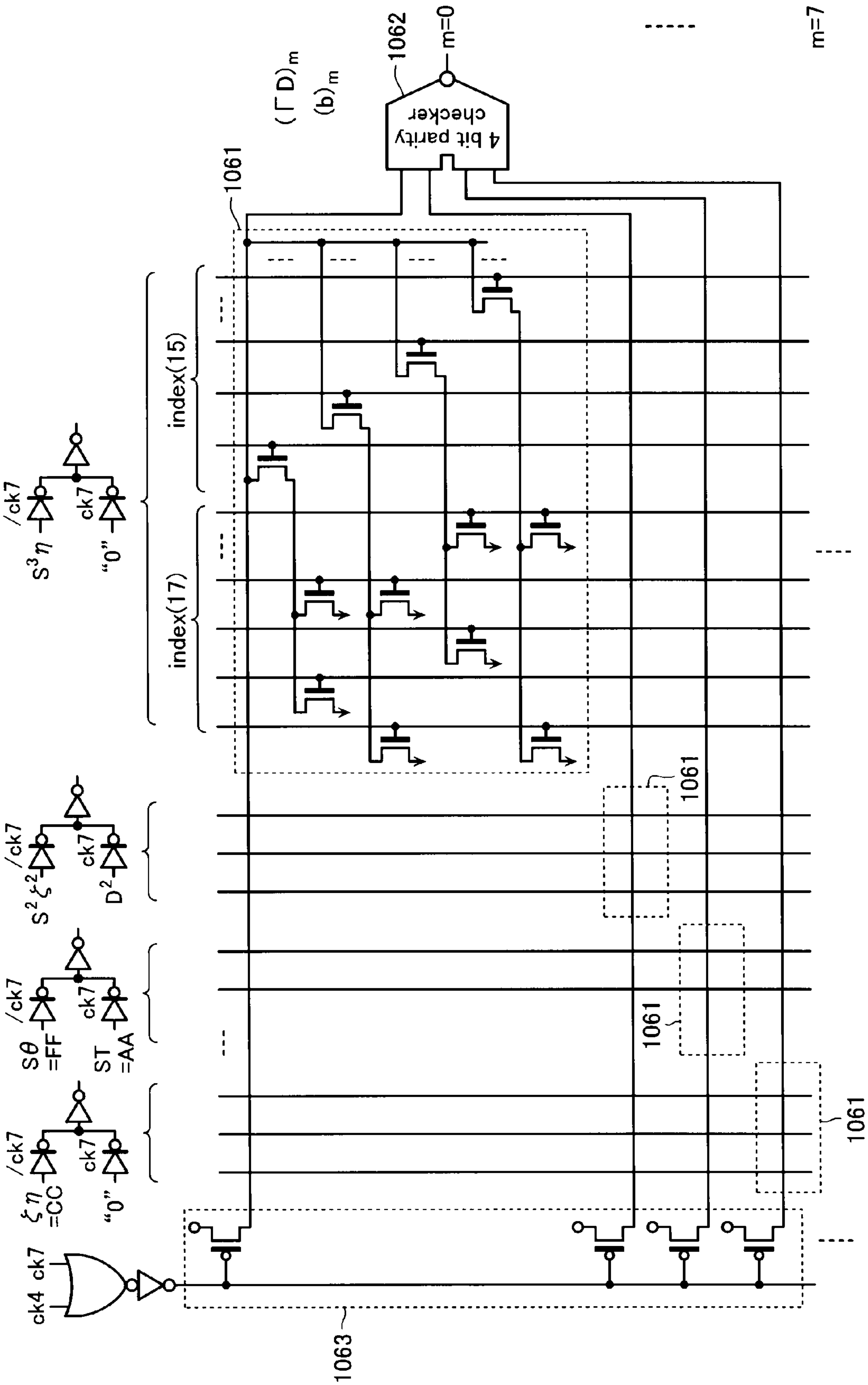
FIG. 52 shows the parity check circuit (part 1) used for calculating the sum of 4 elements in the SEC part.

FIG. 52 shows a calculation part (i.e., PC circuit 451 part) for searching the sum of finite field element components, which is multiplexed by clocks ck4 and ck7. Here, $\lceil D=S^3\eta+S^2\eta^2+S\theta+\zeta\eta$ is calculated by clock ck4 while $b=D^2+ST$ is calculated by clock ck7.

To search the sum of the finite field elements based on expression indexes thereof, the polynomial expression of the elements is obtained from the expression index, and it is required of the coefficients to be subjected to parity check. Therefore, the circuit has decoder portion 1061 for converting the expression index to the polynomial expression, and parity checker (PC) 1062.

The decoder portion 1061 is the same as described as the circuit for searching η and the like except that input numbers are four. Therefore, PC circuit 1062 becomes a 4-input circuit.

At the timing of the clock ck4, input signals are expression indexes such as $S^3\eta$, $S^2\zeta^2$, Sθ and ζη. Some of them have been multiplexed in the previous stage, and Sθ=FF and ζη=CC. At the clock ck7, input signals are the expression indexes of $D^2$, ST and zero. ST has been multiplexed in the previous stage, and ST=AA.

Each decoder portion 1061 has a node corresponding to coefficients of "m" degree of the polynomial-expressed sum of the input signals, which is precharged by precharge circuit 1063, and the decoder portion 1061 is activated by clock ck4 or ck7. The connections between the respective expression indexes and the transistor gates are performed as similar to the above-described calculation example.

For each degree number "m", 4-bit PC 1062 performs parity check for four nodes, and outputs coefficients (⌈D)m, (b) m, which are the polynomial-expressed sum of the input signals. Although the input of the PC circuit is an inverted input signal, the result of the 4-bit parity check is not different from the case where the input is not inverted.

Figure 53:
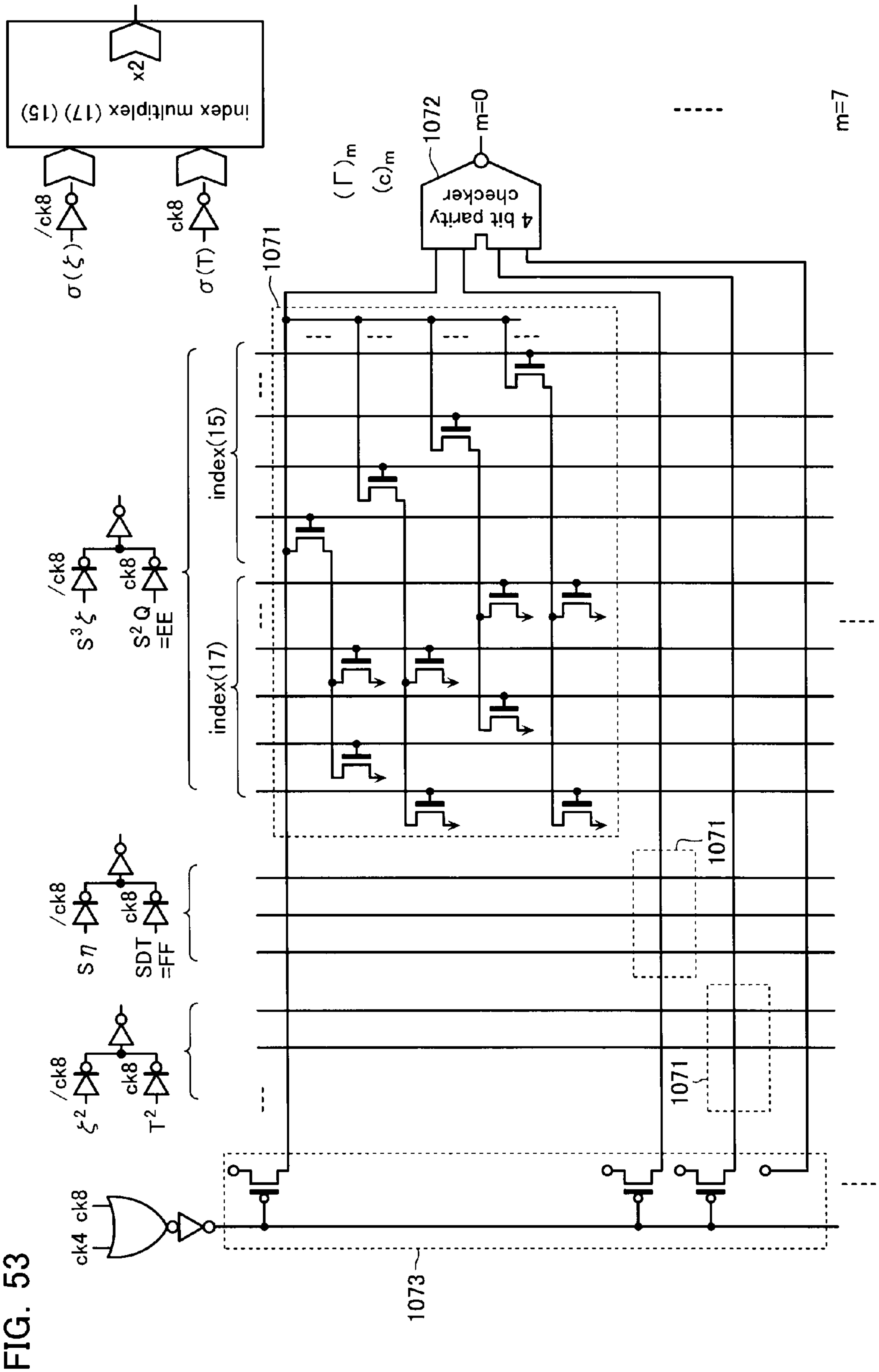
FIG. 53 shows the parity check circuit (part 2) used for calculating the sum of 4 elements in the SEC part.

FIG. 53 shows one of two calculation portions, i.e., PC circuit 461 portion, multiplexed by clocks ck4 and ck8 to calculate the sum of finite field elements in the calculation block (SEC) part 24. At this portion, $\lceil=S^3\zeta+S\eta+\zeta^2$ is calculated by clock ck4 while $c=S^2Q+SDT+T^2$ is calculated by clock ck8.

The number of inputs is three in practice. Therefore, PC circuit 1072 is used in such a manner that one of four inputs is set at Vss. At the timing of clock ck4, input signals are expression indexes of $S^3\zeta$, Sη and $\zeta^2$. At the timing of clock ck8, input signals are expression indexes of $S^2Q$, SDT and $T^2$, where $S^2$ Q=EE and SDT=FF because these are multiplexed at the previous stage.

With respect to the second power of ζ and T, connection transformation is performed in the index multiplexer (17), (15) in accordance with the table prepared for transforming the expression index of the power of finite field elements. For the respective signals, nodes are prepared to correspond to the coefficients of the m-th degree of polynomial expression of the sum to be precharged by precharge circuit 1073, and decoder 1071 is activated by clock ck4 or ck8. Parity checking the three nodes of the respective elements for the respective "m"s with 4-bit PC 1072, polynomial expressed coefficients (⌈)m and (c)m are obtained as the sums of inputs.

Figure 54:
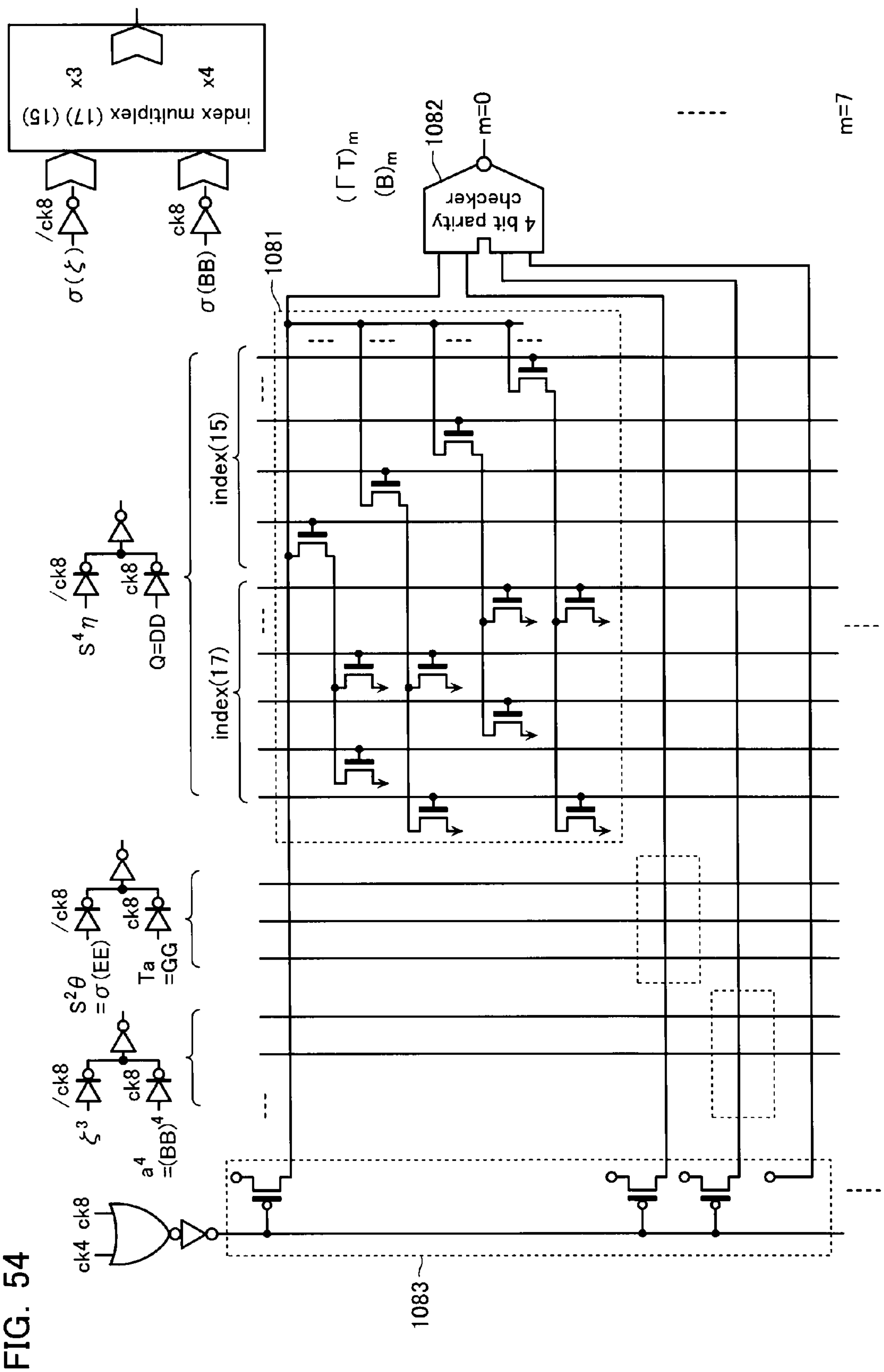
FIG. 54 shows the parity check circuit (part 3) used for calculating the sum of 4 elements in the SEC part.

FIG. 54 shows another calculation portion, i.e., PC circuit 462 portion, multiplexed by clocks ck4 and ck8 to calculate the sum of finite field elements in the calculation block (SEC) part 24. Here, $\lceil T=S^4\eta+S^2\theta+\zeta^3$ is calculated by clock ck4 while $B=Q+Ta+a^4$ is calculated by clock ck8.

The number of inputs is three, and PC circuit 1082 is used in such a manner that one of four inputs is set at Vss.

At the timing of clock ck4, input signals are expression indexes of $S^4\eta$, $S^2\theta$ and $\zeta^3$. At the timing of clock ck8, input signals are expression indexes of Q, Ta and $a^4$, where Q=DD, Ta=GG and a=BB because these are multiplexed at the previous stage.

With respect to the second and third powers of ζ and BB, respectively, connection transformation is performed in the index multiplexer (17), (15) in accordance with the table prepared for transforming the expression index of the power of finite field elements. For the respective signals, nodes are prepared to correspond to the coefficients of the m-th degree of polynomial expression of the sum to be precharged by precharge circuit 1083, and decoder 1081 is activated by clock ck4 or ck8. Parity checking the three nodes of the respective elements for the respective "m"s with 4-bit PC 1082, polynomial expressed coefficients (⌈T)m and (B)m are obtained as the sums of inputs.

The output of 4-bit PC circuit is obtained as a seventh polynomial, which coincides with either one of elements pi(x) of GF(256). Therefore, the polynomial expression is converted to the expression index, which is used in the following calculation. The decoder circuit performing the conversion is the same as that used in the syndrome calculation, which generates hexadecimal number E[0;15] and F[0;15]

from 8-bit coefficients of the polynomial expression. The detailed explanation of this decoder is omitted here.

Figure 55:
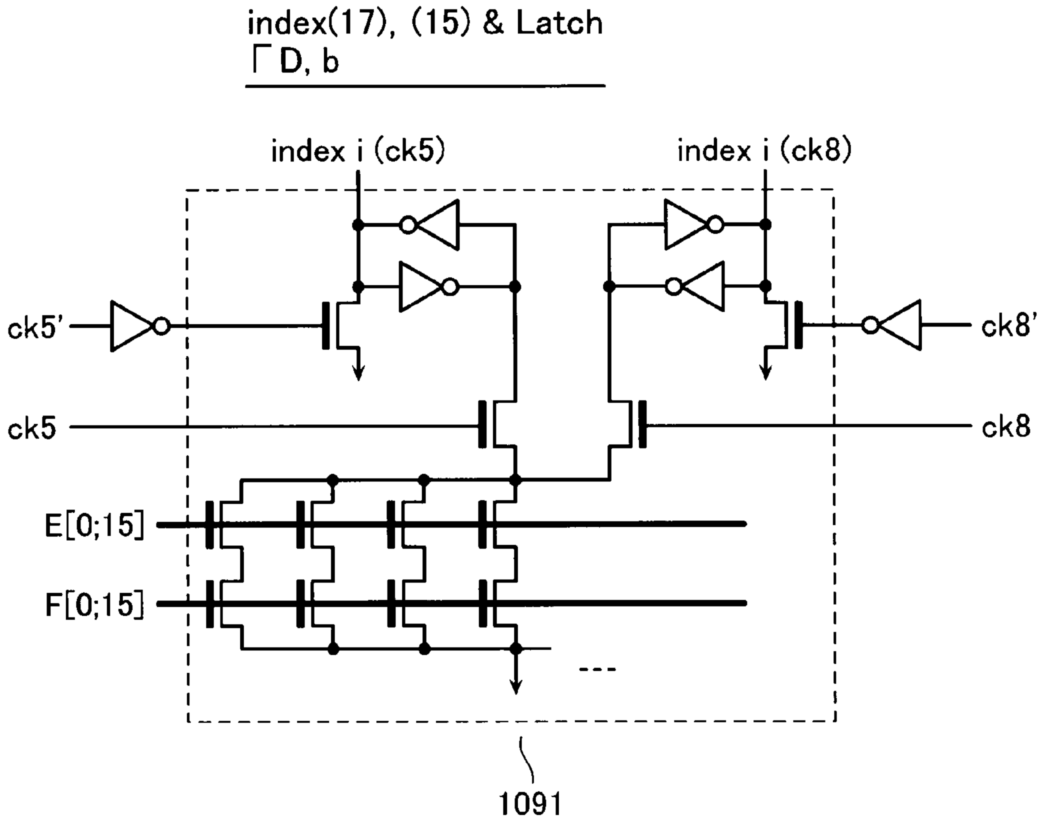
FIG. 55 shows the expression index converting decoder and the latch used in FIG. 52.

FIG. 55 shows the index (17), (15) & latch circuit 1091, which divides the pre-decoded signals into the remainder class groups and generates and latches the expression index components of mod 17 and mod 15. In the circuit multiplexed by clocks ck5 and ck8, signals E[0;15] and F[0;15] are coupled to NAND gates for decoding the respective elements of the remainder class, and combined by NOR gates for expressing a set of elements, so that nodes of the two, reset latches are discharged by clock ck5 and ck8, and inverted index signals "i" of the remainder classes are output. These latches store data by clocks ck5' and ck8'. This circuit 1091 is prepared up to the number of remainder class. Indexes are output as pairs of mod 17 and mod 15 serving as expression indexes.

Figure 56:
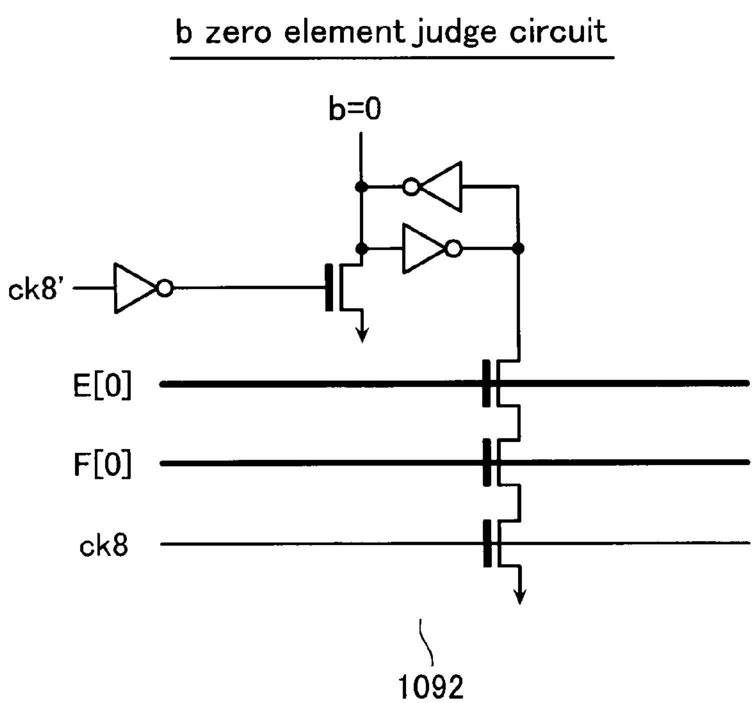
FIG. 56 shows the zero element judgment circuit.

When pi(x)=0, it may not be expressed as an index of $\alpha$. In this case, E[0]=1 and F[0]=1, and no indexes are output. With respect to "b", it is used for judging zero element. To simply judge the zero element without monitoring the index state, zero element judging circuit 1092 shown in FIG. 56 is prepared as a decoder circuit. In detail, in case of zero element, this circuit generates b=0 with clock ck8' and latches it.

Figure 57:
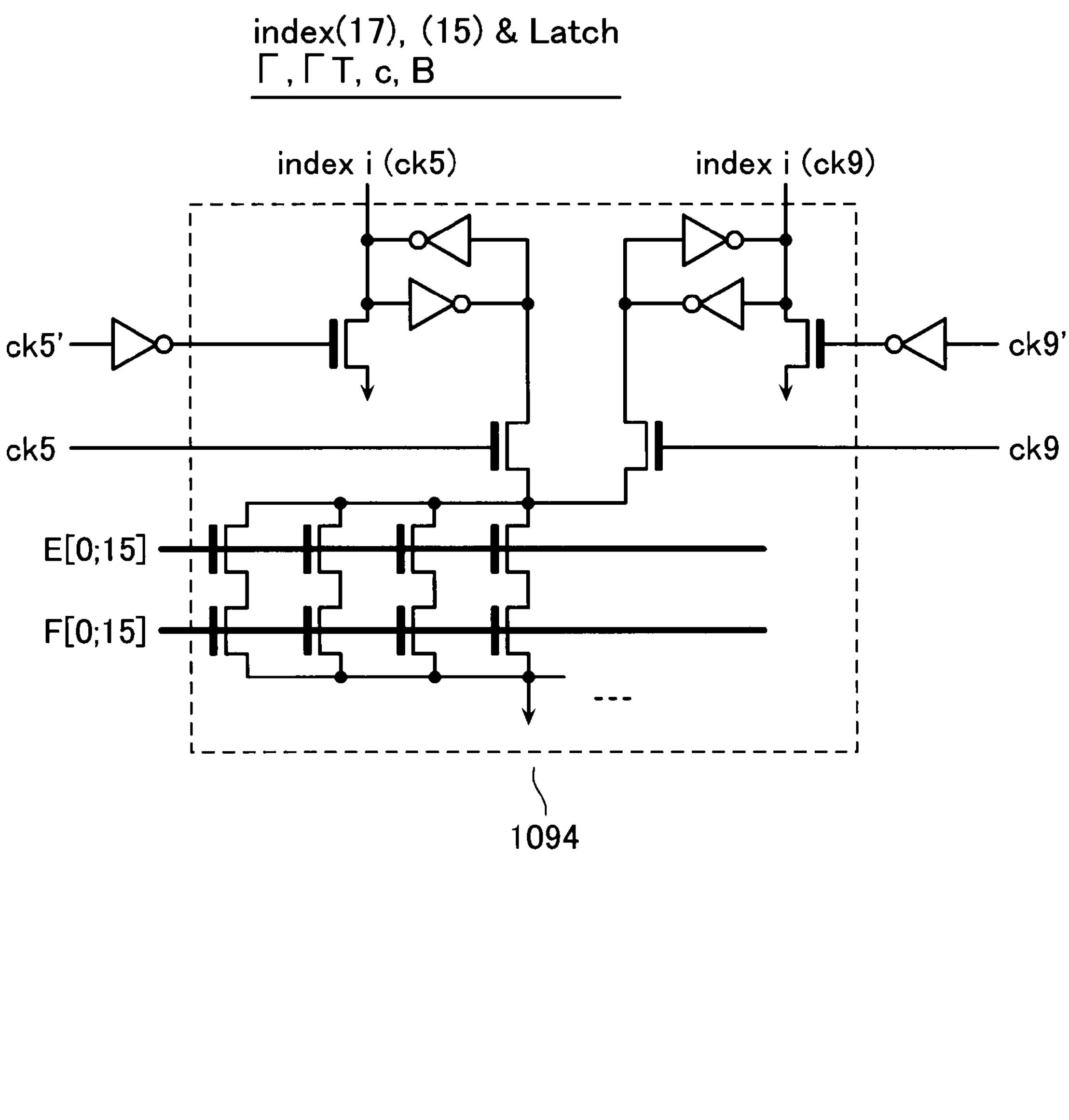
FIG. 57 shows the expression index converting decoder and the latch used in FIGS. 53 and 54.

In the circuit multiplexed by clocks ck5 and ck9 as shown in FIG. 57, signals E[0;15] and F[0;15] are coupled to NAND gates for decoding the respective elements of the remainder class, and combined by NOR gates for expressing a set of elements, so that nodes of the two, reset latches are discharged by clock ck5 and ck9, and inverted index signals "i" of the remainder classes are output. These latches store data by clocks ck5' and ck9'. This circuit 1094 is prepared up to the number of remainder class. Indexes are output as pairs of mod 17 and mod 15 serving as expression indexes.

Figure 58:
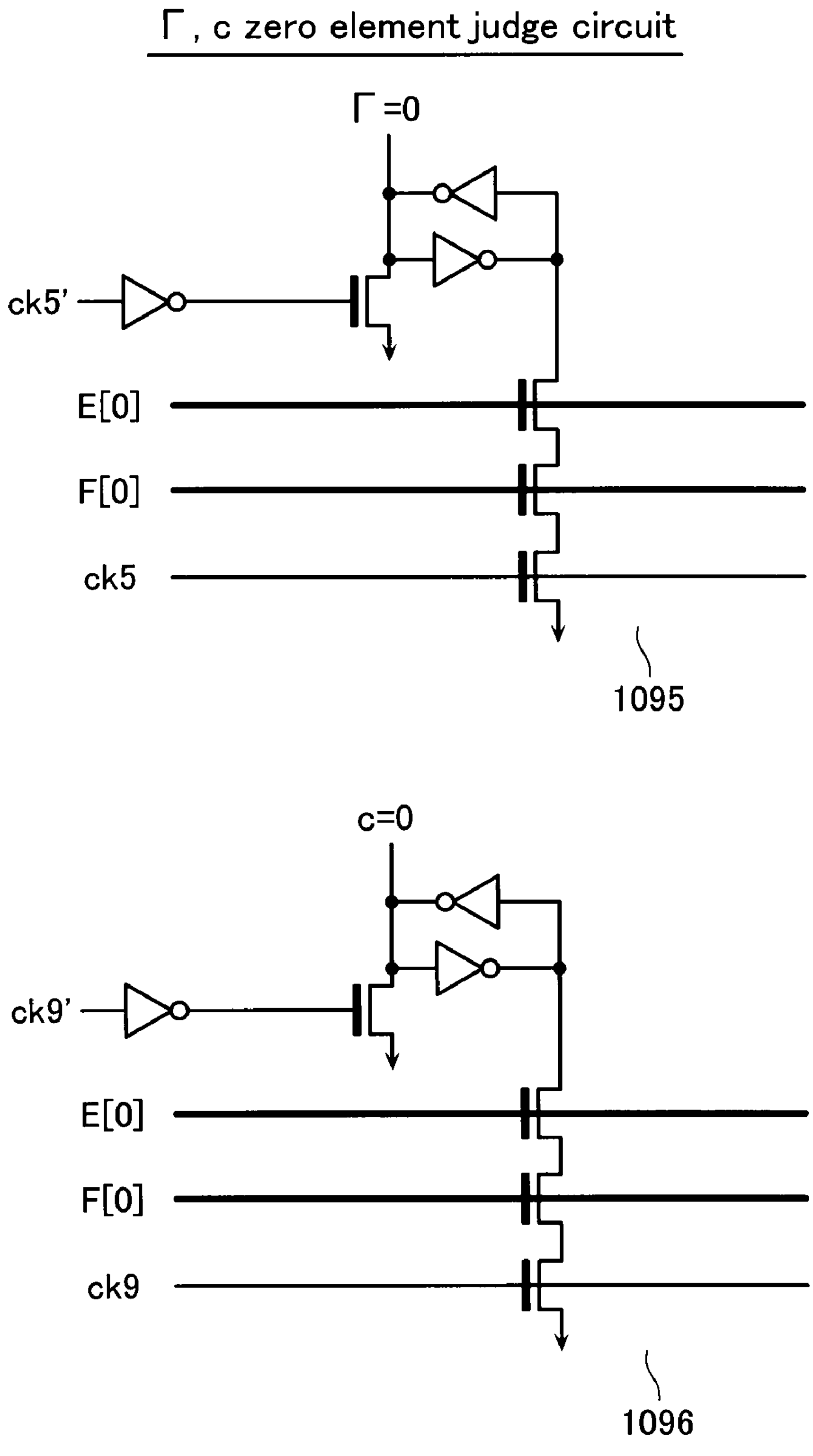
FIG. 58 shows the zero element judgment circuit.

When pi(x)=0, it may not be expressed as an index of $\alpha$. In this case, E[0]=1 and F[0]=1, and no indexes are output. With respect to ⌈ and "c", it is used for judging zero element. To simply judge the zero element, zero element judging circuits 1095 and 1096 shown in FIG. 58 are prepared as decoder circuits. In detail, in case of zero element, these circuits generate ⌈=0 and c=0 with clock ck5' and ck9', respectively, and latch them.

Next, another calculation portion (including adders 441, 442 and PC circuit 471) in the calculation block (SEC part) 24 will be explained. Here, two products of elements and one sum of elements are calculated. The product calculation portion will be initially explained. At this portion, clock multiplex is not used.

Exp. 59 shows congruences used for searching index $\sigma(D)$ of $⌈^{-1}⌈D$. Assuming that the index of ⌈ is $\sigma(⌈)$, 1−power of ⌈ becomes the expression index $-\sigma(⌈)$ in accordance with the above-described table. Further, assuming that the index of ⌈D is $\sigma(⌈D)$, the following congruences will be obtained.

$$\sigma(D) \equiv -\sigma(⌈)+\sigma(⌈D) \pmod{17}$$

$$\sigma(D) \equiv -\sigma(⌈)+\sigma(⌈D) \pmod{15}$$

$$\rightarrow \sigma(D) \equiv -\sigma(⌈)+\sigma(⌈D) \pmod{17 \cdot 15} \quad \text{[Exp. 59]}$$

The following expression, Exp. 60, shows congruences used for searching index $\sigma(T)$ of $⌈^{-1}⌈T$. Assuming that the index of ⌈ is $\sigma(⌈)$ 1−power of ⌈ becomes the expression index $-\sigma(⌈)$ in accordance with the above-described table. Further, assuming that the index of ⌈T is $\sigma(⌈T)$, the following congruences will be obtained.

$$\sigma(T) \equiv -\sigma(⌈)+\sigma(⌈T) \pmod{17}$$

$$\sigma(T) \equiv -\sigma(⌈)+\sigma(⌈T) \pmod{15}$$

$$\rightarrow \sigma(T) \equiv -\sigma(⌈)+\sigma(⌈T) \pmod{17 \cdot 15} \quad \text{[Exp. 60]}$$

Figure 59:
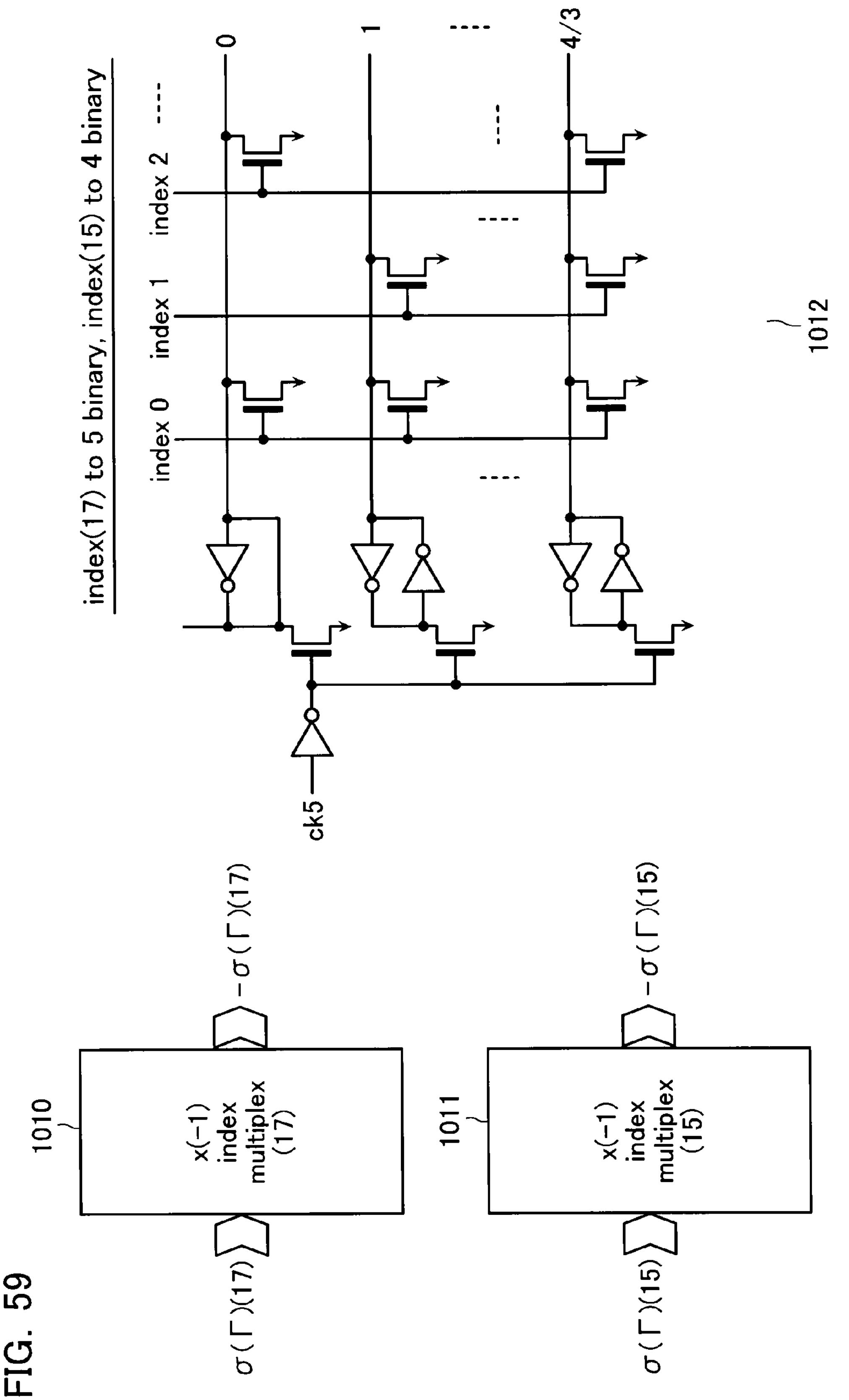
FIG. 59 shows the adder input converting and the expression index/binary expressing decoder.

When searching the sums of expression indexes in the congruence calculations shown in Exps. 59 and 60, a necessary power of element is converted to the expression index. The necessary power is −1 power, and the expression index components of the index $\sigma(⌈)$ are output with the index multiplexers 1010 and 1011 shown in FIG. 59 in accordance with the above-described conversion table. These multiplexers are divider circuits for simply supplying signals in accordance with the relationship between indexes.

In addition, to convert the expression index to binary data, it will be input to index/binary converting circuit 1012. This circuit is activated by clock ck5, the expression index components of mod 17 and mod 15 (i.e., index (17) and index (15)) are converted to 5 binary and 4 binary, respectively, and then input to adders.

The result obtained by the adder is binary data of the expression index component. Therefore, to decode the binary data to the expression index component itself, pre-decoders and index (17), (15) & latch circuit are used. These circuits are the same as above-described ones except that the circuits are activated by clock ck6 and output thereof is latched by clock ck6'. Therefore, the detailed explanation will be omitted here.

Figure 60:
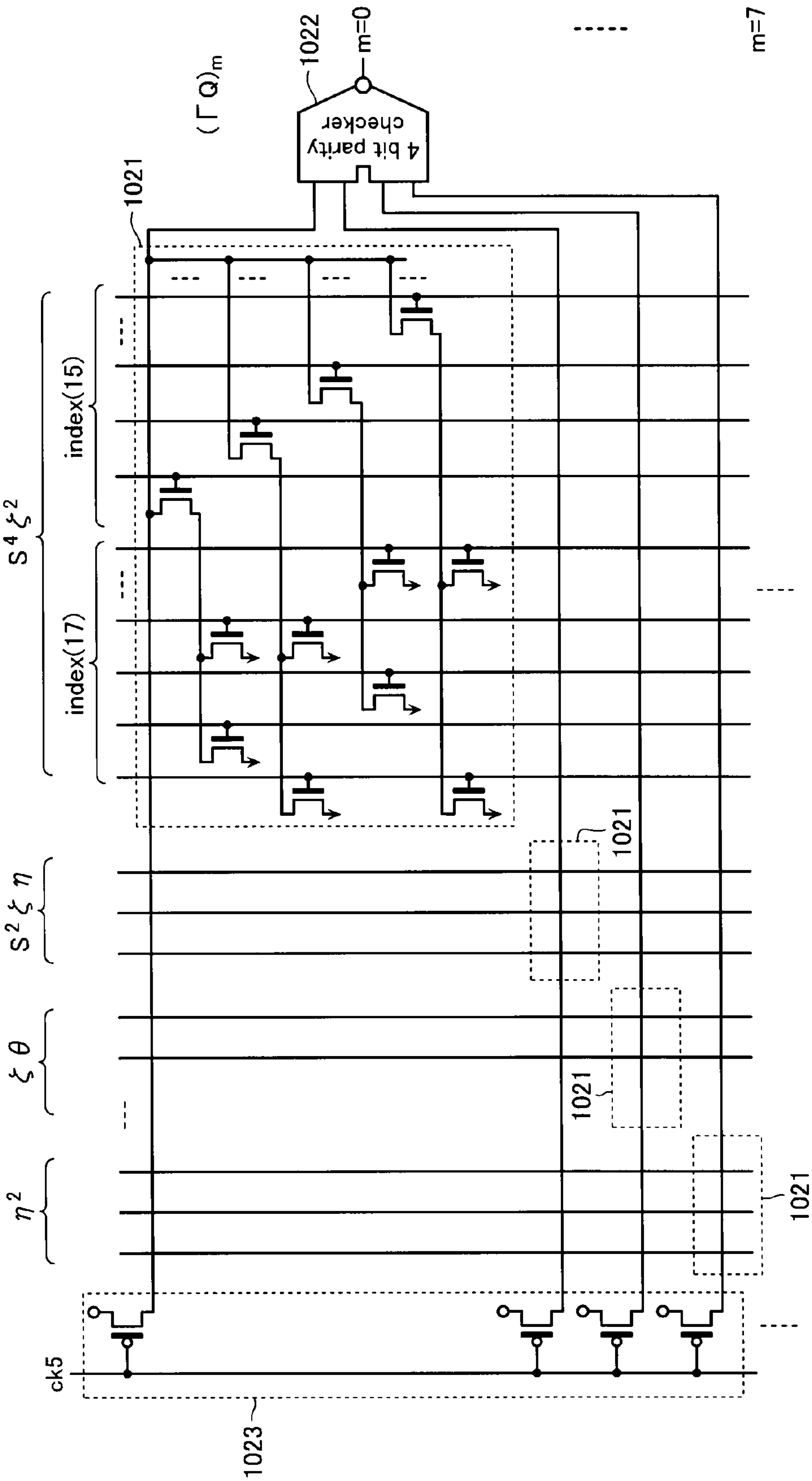
FIG. 60 shows the parity check circuit (part 4) used for calculating the sum of 4 elements in the SEC part.

FIG. 60 shows the calculation portion for calculating the sum of finite field elements with clock ck5 (i.e., PC circuit 471) in the calculation block (SEC part) 24. Here, the finite field element $⌈Q=S^4\zeta^2+S^2\zeta\eta+\zeta\sigma+\eta^2$ is calculated. Since the number of inputs is four, the PC circuit 1022 is 4-input one.

Input signals are the expression indexes of $S^4\zeta^2$, $S^2\zeta\eta$, $\zeta\sigma$ and $\eta^2S$. The circuit has nodes corresponding to the m-degree coefficients of the polynomial expression of the sum of the respective signals. These nodes are precharged by precharge circuit 1023. Decoders 1021 are activated by clock ck5. With respect to each "m", parity check is performed for four nodes corresponding to the respective elements with each 4-bit PC 1022. As a result, coefficient (⌈Q)m of the polynomial-expressed sum of inputs will be obtained.

The outputs of the 4-bit PCs 1022 constitute 7th-degree polynomial, which coincides with either one of pi(x) as elements of FG(256). Therefore, the polynomial expression is converted to the expression index, and it will be used in the successive calculation. The decoder circuit used for the conversion is the same as that used in the syndrome calculation, in which hexadecimal signals E[0;15] and F[0;15] are generated from 8-bit coefficients of the polynomial expression.

Pre-decoded signals are divided into the remainder class groups with an index (17), (15) & latch circuit, and expression index components of mod 17 and mod 15 are generated and latched. Since this circuit is the same as that described above except that clocks ck6 and ck6' are used, the detailed explanation is omitted here. With respect to ⌈Q, it is not used that it is zero, and there is no need of preparing a zero judgment circuit.

Error Searching (ES) Part 25

Figure 61:
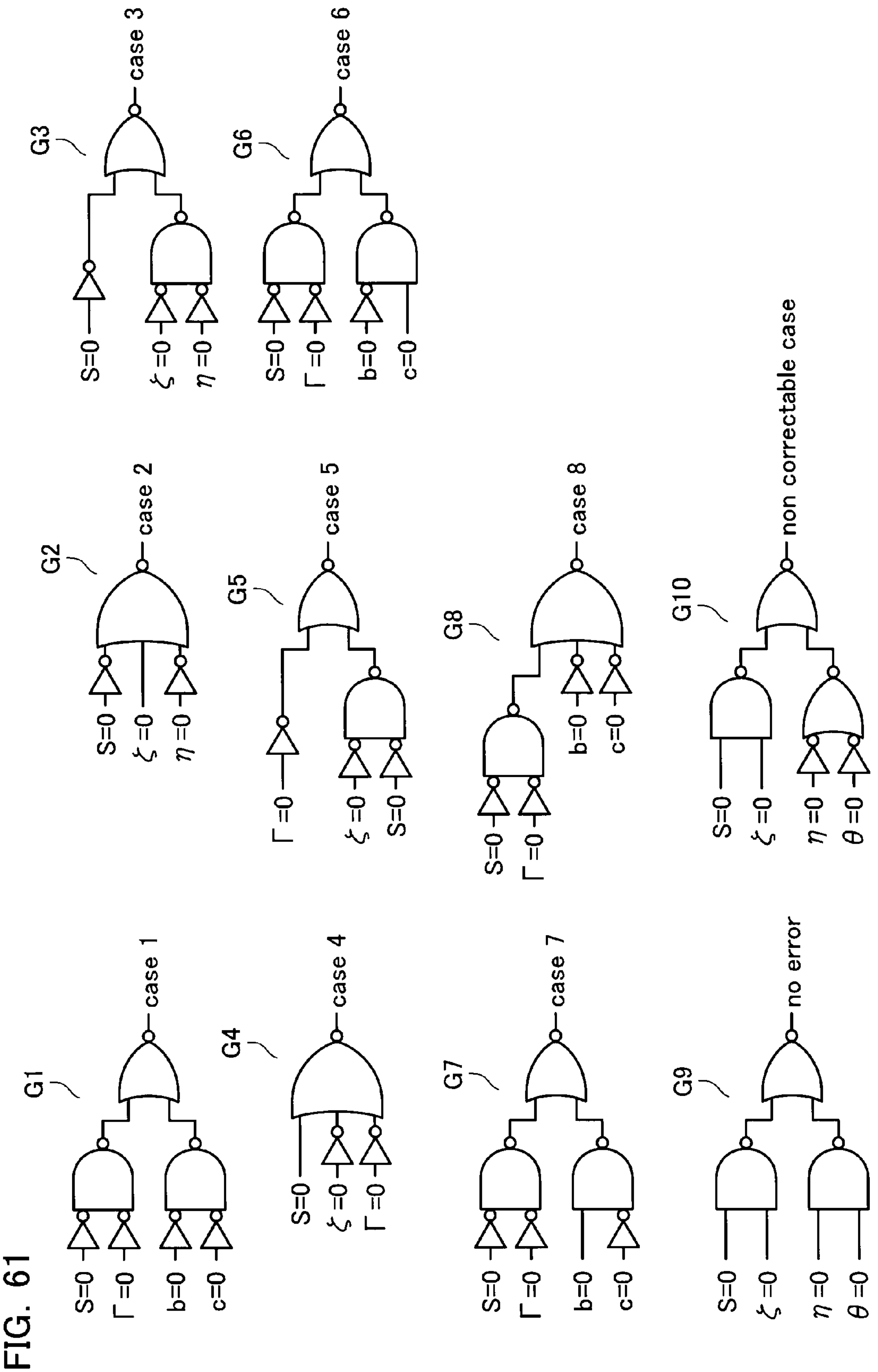
FIG. 61 shows the signal generating circuit, which shows a case of calculation dividing in the ES part.

The calculation result in the SEC part 24 is used in the following error searching (ES) part 25. The calculation process of the ES part branches in accordance with cases. To generate signals used for judging the branches, as shown in FIG. 61, many logic circuits are prepared. These logic gates G1 to G10 are formed in accordance with the cases based on the result of SEC part 24 to generate signals "case 1" to "case 8, "no error" and "non correctable".

CUBE portion 500 in the calculation block (ES part) 25 is multiplexed by signals "case 1" and "case 3". Therefore, first, the calculation with "case 1" will be explained.

In case of searching index σ(H) of $cb^{-3/2}$, assuming that index of "b" is σ(b), and index of "c" is σ(c), −3/2 power of "b" is expressed as expression index −3/2σ(b) based on the above-described table, so that the following congruences, Exp. 61, are obtained.

$$\sigma(H)\equiv\sigma(c)-(3/2)\sigma(b)\ (\mathrm{mod}\ 17)$$

$$\sigma(H)\equiv\sigma(c)-(3/2)\sigma(b)\ (\mathrm{mod}\ 15)$$

$$\rightarrow\sigma(H)\equiv\sigma(c)-(3/2)\sigma(b)\ (\mathrm{mod}\ 17\cdot 15) \quad \text{[Exp. 61]}$$

The following expression, Exp. 62, is a case of solving cubic equation $w^3+w=H$ to obtain "w", thereby searching $wb^{1/2}$. Substituting element of GF(256) for "w", index $\sigma(w^3+W)$ is previously obtained. This index $\sigma(w^3+w)$ is compared with σ(H), and index σ(w) is obtained from "w", then index σ(δ) of $wb^{1/2}$ is calculated.

Assuming that index of "b" is σ(b), 1/2 power of "b" becomes expression index (1/2)σ(b) in accordance with the above-described table, the following congruences will be obtained.

$$\sigma(\delta)\equiv\sigma(w)+(1/2)\sigma(b)\ (\mathrm{mod}\ 17)$$

$$\sigma(\delta)\equiv\sigma(w)+(1/2)\sigma(b)\ (\mathrm{mod}\ 15)$$

$$\rightarrow\sigma(\delta)\equiv\sigma(w)+(1/2)\sigma(b)\ (\mathrm{mod}\ 17\cdot 15) \quad \text{[Exp. 62]}$$

The calculation with "case 3" in the CUBE portion 500 is as follows. Exp. 63 shows congruences used in case of searching index σ(H) of $\zeta^2(\zeta^{-1}\eta)^{-3}$. Assuming that index of ζ is σ(ζ), the second power of ζ becomes expression index 2σ(ζ) in accordance with the above-described table. In addition, assuming that index of $\zeta^{-1}\eta$ is $\sigma(\zeta^{-1}\eta)$, −3 power of $\zeta^{-1}\eta$ becomes expression index $-3(\zeta^{-1}\eta)$ in accordance with the above-described table. Therefore, the following expression, Ex. 63, is obtained.

$$\sigma(H)\equiv 2\sigma(\zeta)-3\sigma(\zeta^{-1}\eta)\ (\mathrm{mod}\ 17)$$

$$\sigma(H)\equiv 2\sigma(\zeta)-3\sigma(\zeta^{-1}\eta)\ (\mathrm{mod}\ 15)$$

$$\rightarrow\sigma(H)\equiv 2\sigma(\zeta)-3\sigma(\zeta^{-1}\eta)\ (\mathrm{mod}\ 17\cdot 15) \quad \text{[Exp. 63]}$$

The following expression, Exp. 64, is a case of solving cubic equation $w^3+w=H$ to obtain "w", thereby searching $(w+1)b^{1/2}$. Substituting element of GF(256) for "w", index $\sigma(w^3+w)$ is previously obtained. This index $\sigma(w^3+w)$ is compared with σ(H), and index σ(w+1) is obtained from "w", then index or σ(δ) of $(w+1)b^{1/2}$ is calculated.

Assuming that index of "b" is σ(b), 1/2 power of "b" becomes expression index (1/2)σ(b) in accordance with the above-described table, the following congruences will be obtained.

$$\sigma(\delta)\equiv\sigma(w+1)+(1/2)\sigma(b)\ (\mathrm{mod}\ 17)$$

$$\sigma(\delta)\equiv\sigma(w+1)+(1/2)\sigma(b)\ (\mathrm{mod}\ 15)$$

$$\rightarrow\sigma(\delta)\equiv\sigma(w+1)+(1/2)\sigma(b)\ (\mathrm{mod}\ 17\cdot 15) \quad \text{[Exp. 64]}$$

Figure 62:
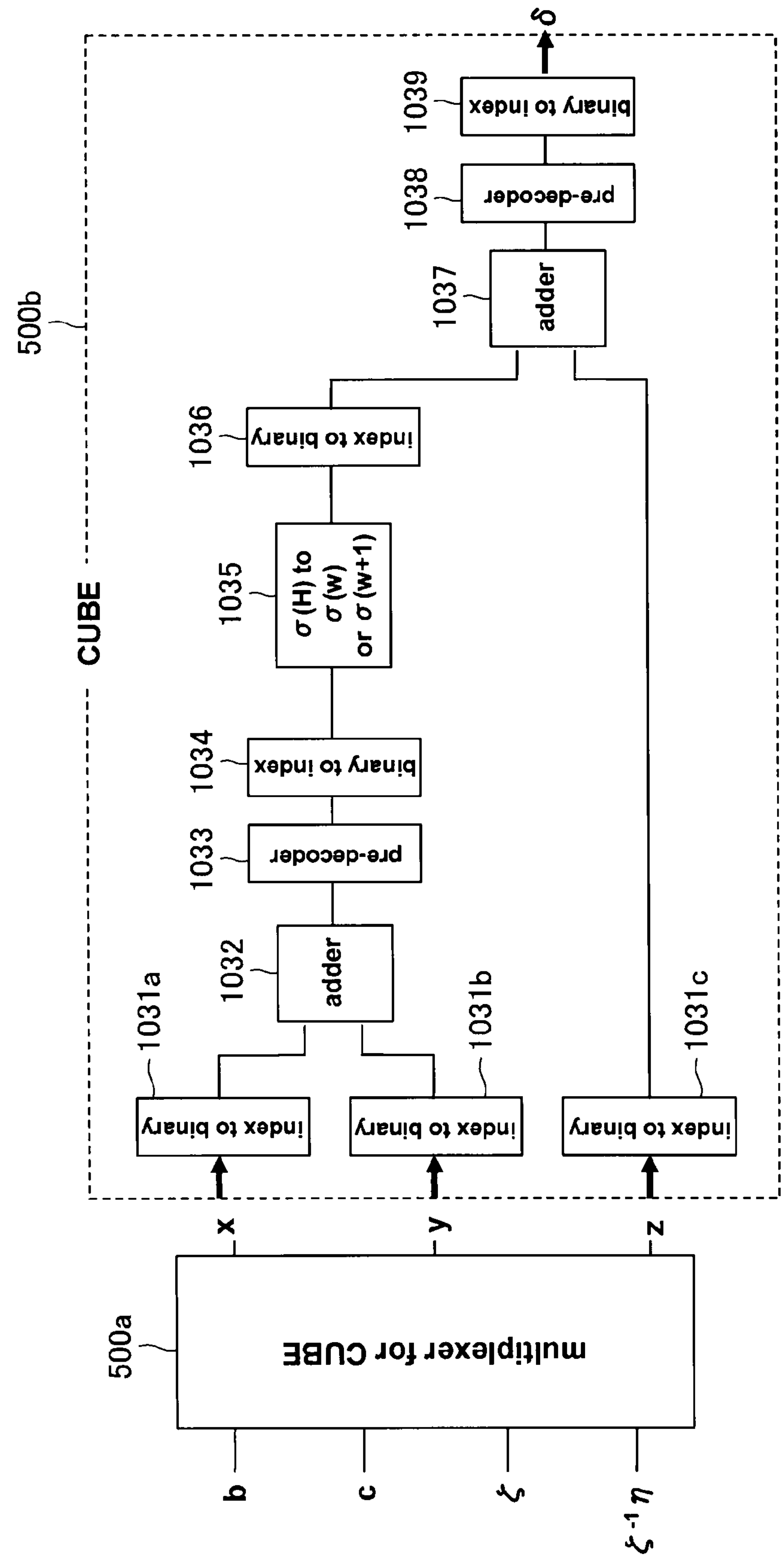
FIG. 62 shows the CUBE portion in the ES part.

The CUBE portion 500, which calculates the above-described congruences, is constituted as shown in FIG. 62. Since the circuit branches with "case 1" and "case 3", there is prepared multiplexer 500*a* at the input portion for multiplexing signals. That is, signals "b", "c", "ζ" and "$\zeta^{-1}\eta$" are multiplexed in accordance with cases, and signals "x", "y" and "z" are obtained to be input to CUBE body 500*b*.

CUBE body 500*b* receives "x", "y" and "z" with index/binary conversion circuits 1031*a* to 1031*c*, which convert these signals to binary numbers of expression indexes. "x" and "y" are converted via adder 1032 to binary number expression index of the product of elements. This is converted to expression index via pre-decoder 1033 and binary/index converter 1034, and then the cubic equation is solved by decoder 1035.

The solution is converted again to the binary number via index/binary converter 1036, and this is input to adder 1037 together with the binary number of "z", so that the product is obtained. The result is processed via pre-decoder 1038 and binary/index converter 1039, the expression index of "δ" may be obtained.

Figure 63:
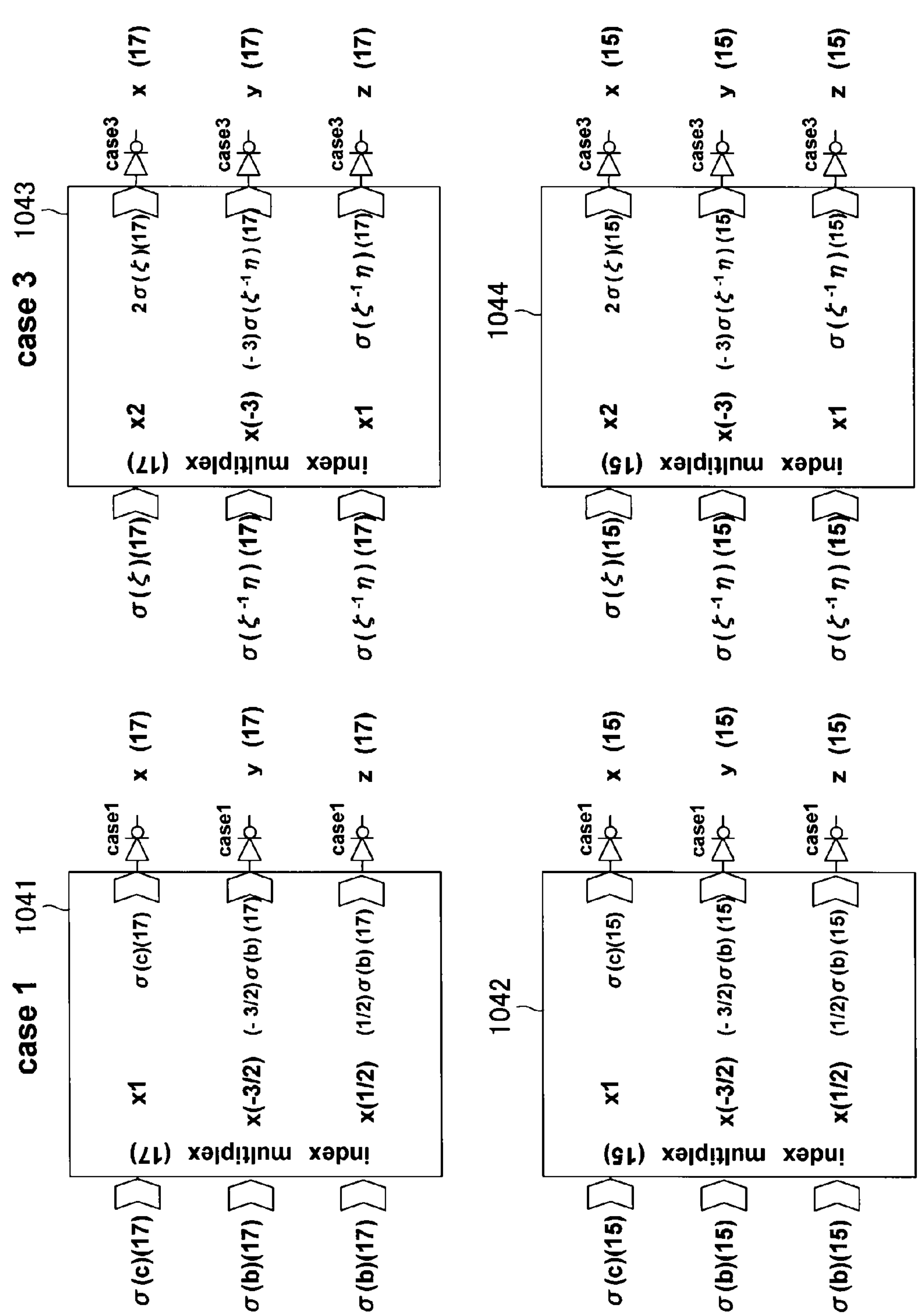
FIG. 63 shows the multiplex circuit shown in FIG. 62.

FIG. 63 shows the detailed configuration of the multiplexer 500*a*. At the timing of "case 1", in multiplexers 1041 and 1042 corresponding to mod 17 and mod 15, expression index components of signals "c" and "b" are subjected to connection switching in accordance with these powers, and "x", "y" and "z" are generated, respectively.

At the timing of "case 3", in multiplexers 1043 and 1044 corresponding to mod 17 and mod 15, expression index components of signals "ζ" and "$\zeta^{-1}\eta$" are subjected to connection switching in accordance with these powers, and "x", "y" and "z" are generated, respectively.

Figure 64:
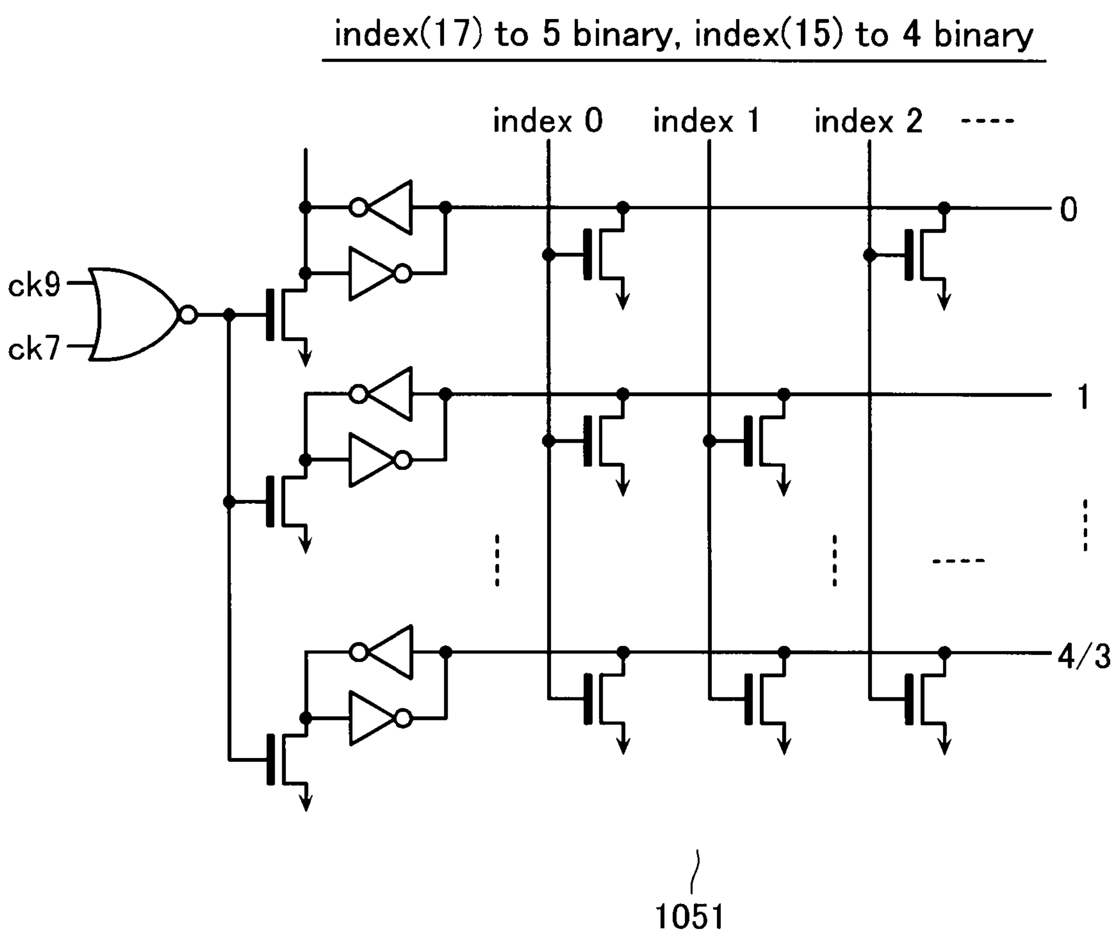
FIG. 64 shows the index/binary converting circuit at the input/output portions of the initial stage adder in FIG. 62.

To convert the expression indexes to binary number data, index/binary converter 1051 shown in FIG. 64 is used. This is activated by timing clocks ck7 of "case 1" and timing clock ck9 of "case 3", and the expression index components "index (17)" and "index (15)" are converted to "5 binary" and "4 binary", respectively, to be input to adders.

The results obtained through the adders are binary data of the expression index components. Therefore, to convert them to the expression index components, pre-decoders will be used. The explanation of these pre-decoders is omitted here because there have already been explained above. The pre-decoders divide the binary data two bits by two bits and convert it into quaternary number, and in addition, form a 4-bit signals corresponding to zero of octal number.

These signals, i.e., expression index components, index (17) and index (15), are input to index (17), (15) & latch circuit 1052 in such a way that these are coupled to transistor gates "a" and "b" with the combinations shown in tables in FIG. 65, whereby output σ(H) is obtained. This circuit is activated by clock ck8 at the timing of "case 3", and by clock ck10 at the timing of "case 1". The latch itself is set to store the output by clock ck8' and ck10'. The output will be supplied to the following stage of solving the cubic equation.

FIGS. 66A to 66C show a set of tables used for solving the cubic equation of $w^3+w=H$. The relationship between indexes satisfying the equation is expressed as: $\alpha^{3\sigma(w)}+\alpha^{\sigma(w)}=\alpha^{\sigma(H)}$, and the corresponding relationships are shown in the tables. In addition to the relationship between σ(w) and σ(H), σ(w+1) is shown.

Since the equation is cubic, the solution is a maximum three elements. For example, in cases of σ(w)=51, 58 and 163, σ(H)=17 is obtained, and σ(w+1)=107, 182 and 238, respectively. In case of "H" is zero element, "w" is σ(w)=0 or w=0, and in that case w+1=0 or σ(w+1)=0.

These tables are arranged in order of σ(H), and in case there are three σ(w)'s at the same σ(H), these are sorted into three columns. Further, when "H" is zero element, "w" is "1" or zero element, so that the index of "w" or "w+1" is "0".

FIGS. 67A and 67B show summarized tables, in which only terms used in practice in "case 1" and "case 3" are reserved. In these cases, "case 1" and "case 3", "H" does not become zero, and what is required is only one optionally selected in the solutions of the cubic equation. For reasons of these, the tables are made to be simple. Note here that in case there are three solutions, it becomes finally to search two errors or less.

In tables shown in FIGS. 68A and 68B, it is summarized the relationship between expression index {σ(H)(17), σ(H)(15)} corresponding to "case 1" and expression index component σ(w)(17) of σ(w), which are classified into groups for values of σ(w)(17). Forming decoders based on the tables with respect to the expression index of σ(H) obtained in the calculation, the expression index component of σ(w) will be obtained as a solution.

In tables shown in FIGS. 69A and 69B, it is summarized the relationship between expression index {σ(H)(17), σ(H)(15)} corresponding to "case 1" and expression index component σ(w)(15) of σ(w), which are classified into groups for values of σ(w)(15). Forming decoders based on the tables with respect to the expression index of σ(H) obtained in the calculation, the expression index component of σ(w) will be obtained as a solution.

In tables shown in FIGS. 70A and 70B, it is summarized the relationship between expression index {σ(H)(17), σ(H)(15)} corresponding to "case 3" and expression index component σ(w)(17) of σ(w+1), which are classified into groups for values of σ(w+1)(17). Forming decoders based on the tables with respect to the expression index of σ(H) obtained in the calculation, the expression index component of σ(w) will be obtained as a solution.

In tables shown in FIGS. 71A and 71B, it is summarized the relationship between expression index {σ(H)(17), σ(H)(15)} corresponding to "case 3" and expression index component σ(w)(15) of σ(w+1), which are classified into groups for values of σ(w+1)(15). Forming decoders based on the tables with respect to the expression index of σ(H) obtained in the calculation, the expression index component of σ(w) will be obtained as a solution.

Figure 72:
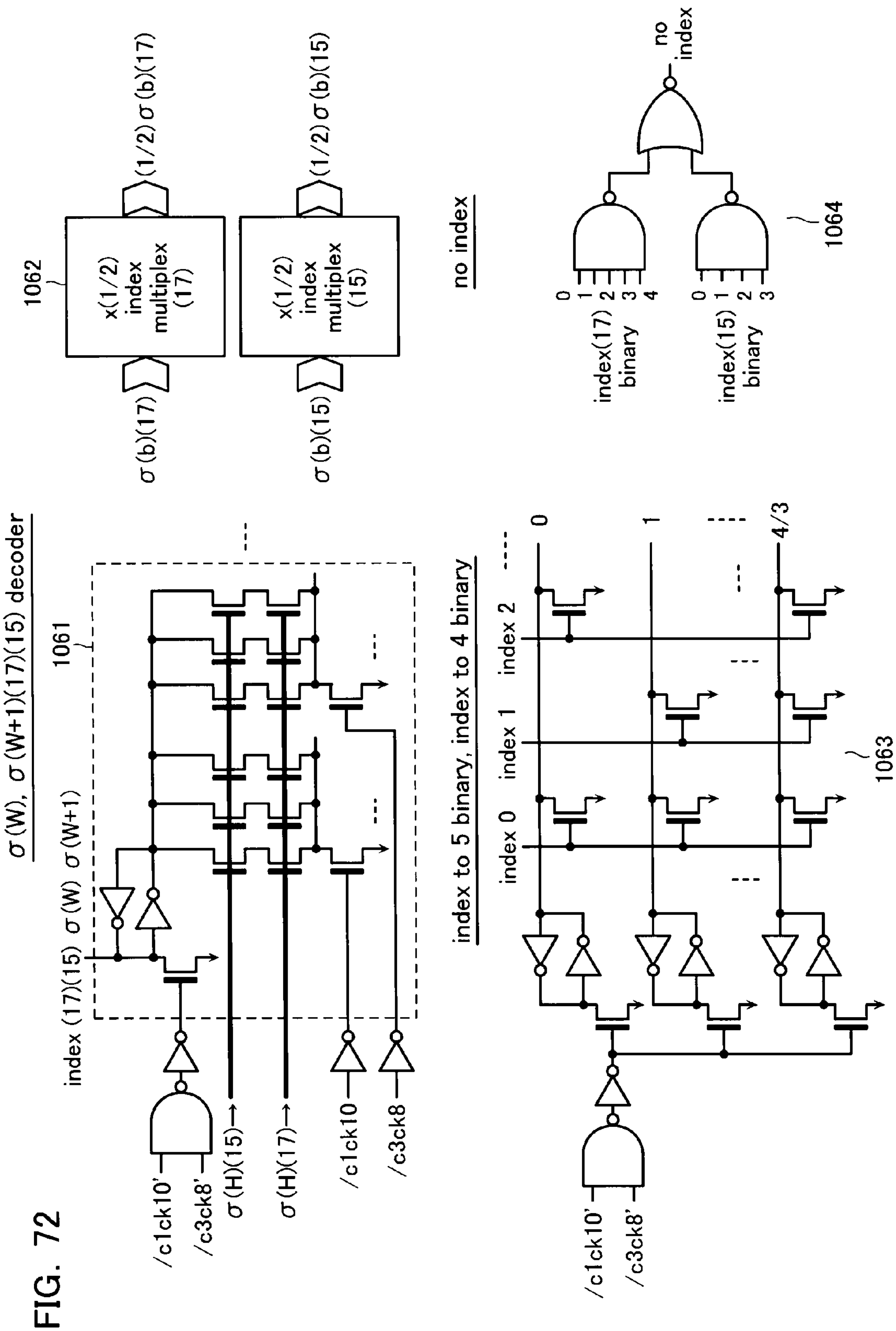
FIG. 72 shows the data conversion portion and the decoder system at the input portion of the final stage adder.

FIG. 72 shows the decoder circuit for achieving the solution method of the cubic equation shown in the above-described tables and output portion thereof for supplying the output to adders.

The decoder circuit (i.e., σ(w), σ(w+1)(17)(15) decoder) 1061, which expresses the solution method of the cubic equation, has NAND connections, to which expression index components of σ(H) are input. The NAND connections are combined as a NOR connection for the respective groups of σ(w) or σ(w+1) in accordance with the tables. This circuit is activated by timing clock ck10 in "case 1", and timing clock ck8 in "case 3", and output thereof are latched by clock ck10' and ck8', respectively.

The expression index components of product $wb^{1/2}$ and factor $b^{1/2}$ of $(w+1)b^{1/2}$ may be obtained wiring connection switching in the index multiplexer 1062.

To convert the decoder output to binary data for supplying it to adders, there is prepared index/binary converting circuit 1063. If the input is zero element, all bits of this circuit are kept "1". By use of this, it will be judged that there is no "w" as a solution. This judgment is performed with "no index" judgment circuit 1064.

The result obtained by adders is binary data of the expression index component, which is to be decoded to the expression index component itself. This is achieved with the above-described pre-decoders. The pre-decoders divide the binary data two bits by two bits and convert it into quaternary number, and in addition, form 4-bit signal corresponding to zero of octal number.

These signals are coupled to the transistor's gates "a", "b" in the index & latch circuit shown in FIG. 73, so that output δ of the expression index component, index (17) and (15), will be generated. This circuit is activated by clock ck9 in "case 3" and by clock ck11 in "case 1". The latch is set to store the output data by clock ck9' and ck11'.

Next, the calculation of SQUARE portion 510 in the calculation block (ES part) 25 will be explained below. Calculations are different from each other in accordance with cases. First, the calculations in "case 1" will be explained.

The following expression, Exp. 65, shows such a case where σ(J) is searched as the index of $B\delta^{-2}$. Assuming that the index of δ is σ(δ), −2 power of δ brings the expression index −2 σ(δ) in accordance with the above-described tables. Therefore, the following congruences are obtained.

$$\sigma(J)\equiv\sigma(B)-2\sigma(\delta)\ (\mathrm{mod}\ 17)$$

$$\sigma(J)\equiv\sigma(B)-2\sigma(\delta)\ (\mathrm{mod}\ 15)$$

$$\rightarrow\sigma(J)\equiv\sigma(B)-2\sigma(\delta)\ (\mathrm{mod}\ 17\cdot 15) \quad \text{[Exp. 65]}$$

The following expression, Exp. 66, shows such a case that quadratic equation $u^2+u=J$ is solved, and $\alpha_0$, $\beta_0=\delta u$ is searched based on two outputs "u"s. Substituting element of GF(256) for "u", the index $\sigma(u^2+U)$ of $u^2+u$ is previously searched. Comparing this index $\sigma(u^2+u)$ with σ(J) to decode it in accordance with tables, so that index σ(u) is searched. Indexes $\sigma(\alpha_0)$ and $\sigma(\beta_0)$ of δu are obtained in accordance with the following congruences.

$$\sigma(\alpha_0),\ \sigma(\beta_0)\equiv\sigma(\delta)+\sigma(u)\ (\mathrm{mod}\ 17)$$

$$\sigma(\alpha_0),\ \sigma(\beta_0)\equiv\sigma(\delta)+\sigma(u)\ (\mathrm{mod}\ 15)$$

$$\rightarrow\sigma(\alpha_0),\ \sigma(\beta_0)\equiv\sigma(\delta)+\sigma(u)\ (\mathrm{mod}\ 17\cdot 15) \quad \text{[Exp. 66]}$$

Exp. 67 shows a case of searching index σ(K) of $\delta S^{-2}$. The index of δ being σ(δ), and that of "S" being σ, −2 power of "S" becomes the expression index −2σ based on the above-described tables, and the following congruences are obtained.

$$\sigma(K)\equiv\sigma(\delta)-2\sigma(\mathrm{mod}\ 17)$$

$$\sigma(K)\equiv\sigma(\delta)-2\sigma(\mathrm{mod}\ 15)$$

$$\rightarrow\sigma(K)\equiv\sigma(\delta)-2\sigma(\mathrm{mod}\ 17\cdot 15) \quad \text{[Exp. 67]}$$

The following expression, Exp. 68, shows such a case that quadratic equation $v^2+v=K$ is solved, and $\alpha_1$, $\beta_1=Sv$ is searched based on two outputs "v"s. Substituting element of GF(256) for "v", the index $\sigma(v^2+v)$ of $v^2+v$ is previously searched. Comparing this index a $(v^2+v)$ with σ(K) to decode it in accordance with tables, so that index σ(v) is searched. Indexes $\sigma(\alpha_1)$ and $\sigma(\beta_1)$ of "Sv" are obtained in accordance with the following congruences.

$$\sigma(\alpha_1),\ \sigma(\beta_1)\equiv\sigma(S)+\sigma(v)\ (\mathrm{mod}\ 17)$$

$$\sigma(\alpha_1),\ \sigma(\beta_1)\equiv\sigma(S)+\sigma(v)\ (\mathrm{mod}\ 15)$$

$$\rightarrow\sigma(\alpha_1),\ \sigma(\beta_1)\equiv\sigma(S)+\sigma(v)\ (\mathrm{mod}\ 17\cdot 15) \quad \text{[Exp. 68]}$$

Exp. 69 shows a case of searching index σ(L) of $\alpha_0\alpha_1^{-2}$. The index of $\alpha_0$ being $\sigma(\alpha_0)$, and that of $a_1$ being $\sigma(\alpha_1)$, −2 power of $\alpha_1$ becomes the expression index $-2\sigma(\alpha_1)$ based on the above-described tables, and the following congruences are obtained.

$$\sigma(L)\equiv\sigma(\alpha_0)-2\sigma(\alpha_1)\ (\mathrm{mod}\ 17)$$

$$\sigma(L)\equiv\sigma(\alpha_0)-2\sigma(\alpha_1)\ (\mathrm{mod}\ 15)$$

$$\sigma(L)\equiv\sigma(\alpha_0)-2\sigma(\alpha_1)\ (\mathrm{mod}\ 17\cdot 15) \quad \text{[Exp. 69]}$$

The following expression, Exp. 70, shows such a case that quadratic equation $y^2+y=L$ is solved, and $\alpha_1 y$ is searched based on two outputs "y"s. Substituting element of GF(256) for "y", the index $\sigma(y^2+y)$ of $y^2+y$ is previously searched. Comparing this index $\sigma(y^2+y)$ with σ(L) to decode it in accordance with tables, so that index σ(y) is searched. Index $\sigma(\alpha_1 y)$ of $\alpha_1 y$ is obtained in accordance with the following congruences.

$$\sigma(\alpha_1 y)\equiv\sigma(\alpha_1)+\sigma(y) \pmod{17}$$

$$\sigma(\alpha_1 y)\equiv\sigma(\alpha_1)+\sigma(y) \pmod{15}$$

$$\sigma(\alpha_1 y)\equiv\sigma(\alpha_1)+\sigma(y) \pmod{17\cdot 15} \quad \text{[Exp. 70]}$$

Exp. 71 shows a case of searching index σ(M) of $\beta_0\beta_1^{-2}$. The index of $\beta_0$ being $\sigma(\beta_0)$, and that of $\beta_1$ being $\sigma(\beta_1)$, −2 power of $\beta_1$ becomes the expression index $-2\sigma(\beta_1)$ based on the above-described tables, and the following congruences are obtained.

$$\sigma(M)\equiv\sigma(\beta_0)-2\sigma(\beta_1) \pmod{17}$$

$$\sigma(M)\equiv\sigma(\beta_0)-2\sigma(\beta_1) \pmod{15}$$

$$\rightarrow\sigma(M)\equiv\sigma(\beta_0)-2\sigma(\beta_1) \pmod{17\cdot 15} \quad \text{[Exp. 71]}$$

The following expression, Exp. 72, shows such a case that quadratic equation $z^2+z=M$ is solved, and $\beta_1 z$ is searched based on two outputs "z"s. Substituting element of GF(256) for "z", the index $\sigma(z^2+z)$ of $z^2+z$ is previously searched. Comparing this index $\sigma(z^2+z)$ with σ(M) to decode it in accordance with tables, so that index σ(z) is searched. Index $\sigma(\beta_1 z)$ of $\beta_1 z$ is obtained in accordance with the following congruences.

$$\sigma(\beta_1 z)\equiv\sigma(\beta_1)+\sigma(z) \pmod{17}$$

$$\sigma(\beta_1 z)\equiv\sigma(\beta_1)+\sigma(z) \pmod{15}$$

$$\rightarrow\sigma(\beta_1 z)\equiv\sigma(\beta_1)+\sigma(z) \pmod{17\cdot 15} \quad \text{[Exp. 72]}$$

Next, the calculations in "case 2" are as follows.

Exp. 73 shows a case of searching index σ(J) of $B\delta^{-2}$. The index of "B" being σ(B), and that of $\delta=\zeta^{2/3}$ being $\sigma(\delta)=(2/3)\sigma(\zeta)$, −2 power of δ becomes the expression index $(-4/3)\sigma(\zeta)$ based on the above-described tables, and the following congruences are obtained.

$$\sigma(J)\equiv\sigma(B)-(4/3)\sigma(\zeta) \pmod{17}$$

$$\sigma(J)\equiv\sigma(B)-(4/3)\sigma(\zeta) \pmod{15}$$

$$\rightarrow\sigma(J)\equiv\sigma(B)-(4/3)\sigma(\zeta) \pmod{17\cdot 15} \quad \text{[Exp. 73]}$$

The following expression, Exp. 74, shows such a case that quadratic equation $u^2+u=J$ is solved, and α0, β0=δu is searched based on two outputs "u"s. Substituting element of GF(256) for "u", the index $\sigma(u^2+U)$ of $u^2+u$ is previously searched. Comparing this index $\sigma(u^2+u)$ with σ(J) to decode it in accordance with tables, so that index σ(u) is searched. Indexes σ(α0) and σ(β0) of δu are obtained in accordance with the following congruences.

$$\sigma(\alpha_0),\ \sigma(\beta_0)\equiv\sigma(\delta)+\sigma(u) \pmod{17}$$

$$\sigma(\alpha_0),\ \sigma(\beta_0)\equiv\sigma(\delta)+\sigma(u) \pmod{15}$$

$$\rightarrow\sigma(\alpha_0),\ \sigma(\beta_0)\equiv\sigma(\delta)+\sigma(u) \pmod{17\cdot 15} \quad \text{[Exp. 74]}$$

Exp. 75 shows a case of searching index σ(L) of $\alpha_0\alpha_1^{-2}$. The index of $\alpha_0$ being $\sigma(\alpha_0)$, and that of $\alpha_1=\zeta^{1/3}$ being $\sigma(\alpha_1)=(1/3)\sigma(\zeta)$, −2 power of $\alpha_1$ becomes the expression index $(-2/3)\sigma(\zeta)$ based on the above-described tables, and the following congruences are obtained.

$$\sigma(L)\equiv\sigma(\alpha_0)-(2/3)\sigma(\zeta) \pmod{17}$$

$$\sigma(L)\equiv\sigma(\alpha_0)-(2/3)\sigma(\zeta) \pmod{15}$$

$$\rightarrow\sigma(L)\equiv\sigma(\alpha_0)-(2/3)\sigma(\zeta) \pmod{17\cdot 15} \quad \text{[Exp. 75]}$$

The following expression, Exp. 76, shows such a case that quadratic equation $y^2+y=L$ is solved, and $\alpha_1 y=X$ is searched based on two outputs "y"s. Substituting element of GF(256) for "y", the index $\sigma(y^2+y)$ of $y^2+y$ is previously searched. Comparing this index $\sigma(y^2+y)$ with σ(L) to decode it in accordance with tables, so that index σ(y) is searched. Index σ(X) of $\alpha_1 y=\zeta^{1/3}y$ is obtained in accordance with the following congruences.

$$\sigma(X)\equiv(1/3)\sigma(\zeta)+\sigma(y) \pmod{17}$$

$$\sigma(X)\equiv(1/3)\sigma(\zeta)+\sigma(y) \pmod{15}$$

$$\rightarrow\sigma(X)\equiv(1/3)\sigma(\zeta)+\sigma(y) \pmod{17\cdot 15} \quad \text{[Exp. 76]}$$

Exp. 77 shows a case of searching index σ(M) of $\beta_0\beta_1^{-2}$. The index of $\beta_0$ being $\sigma(\beta_0)$, and that of $\beta_1=\zeta^{1/3}$ being $\sigma(\beta_1)=(1/3)\sigma(\zeta)$, −2 power of $\beta_1$ becomes the expression index $(-2/3)\sigma(\zeta)$ based on the above-described tables, and the following congruences are obtained.

$$\sigma(M)\equiv\sigma(\beta_0)-(2/3)\sigma(\zeta) \pmod{17}$$

$$\sigma(M)\equiv\sigma(\beta_0)-(2/3)\sigma(\zeta) \pmod{15}$$

$$\rightarrow\sigma(M)\equiv\sigma(\beta_0)-(2/3)\sigma(\zeta) \pmod{17\cdot 15} \quad \text{[Exp. 77]}$$

The following expression, Exp. 78, shows such a case that quadratic equation $z^2+z=M$ is solved, and $\beta_1 z=X$ is searched based on two outputs "z"s. Substituting element of GF(256) for "z", the index $\sigma(z^2+z)$ of $z^2+z$ is previously searched. Comparing this index a $(z^2+z)$ with σ(M) to decode it in accordance with tables, so that index σ(z) is searched. Index σ(X) of $\beta_1 z=\zeta^{1/3}z$ is obtained in accordance with the following congruences.

$$\sigma(X)\equiv(1/3)\sigma(\zeta)+\sigma(z) \pmod{17}$$

$$\sigma(X)\equiv(1/3)\sigma(\zeta)+\sigma(z) \pmod{15}$$

$$\rightarrow\sigma(X)\equiv(1/3)\sigma(\zeta)+\sigma(z) \pmod{17\cdot 15} \quad \text{[Exp. 78]}$$

Next, the calculations in "case 3" will be explained below.

The following expressions, Exp. 79 and Exp. 80, are the same as Exp. 65 and Exp. 66, respectively. Therefore, the detailed description will be omitted.

$$\sigma(J)\equiv\sigma(B)-2\sigma(\delta) \pmod{17}$$

$$\sigma(J)\equiv\sigma(B)-2\sigma(\delta) \pmod{15}$$

$$\rightarrow\sigma(J)\equiv\sigma(B)-2\sigma(\delta) \pmod{17\cdot 15} \quad \text{[Exp. 79]}$$

$$\sigma(\alpha_0),\ \sigma(\beta_0)\equiv\sigma(\delta)+\sigma(u) \pmod{17}$$

$$\sigma(\alpha_0),\ \sigma(\beta_0)\equiv\sigma(\delta)+\sigma(u) \pmod{15}$$

$$\rightarrow\sigma(\alpha_0),\ \sigma(\beta_0)\equiv\sigma(\delta)+\sigma(u) \pmod{17\cdot 15} \quad \text{[Exp. 80]}$$

Exp. 81 shows a case of searching index σ(L) of $\alpha_0\alpha_1^{-2}$. The index of $\alpha_0$ being $\sigma(\alpha_0)$, and that of $\alpha_1=(\delta+\zeta^{-1}\eta)^{1/2}$ being $\sigma(\alpha_1)=(1/2)\sigma(\delta+\zeta^{-1}\eta\zeta)$, −2 power of $\alpha_0$ becomes the expression index $-\sigma(\delta+\zeta^{-1}\eta\zeta)$ based on the above-described tables, and the following congruences are obtained.

$$\sigma(L)\equiv\sigma(\alpha_0)-\sigma(\delta+\zeta^{-1}\eta) \pmod{17}$$

$$\sigma(L)\equiv\sigma(\alpha_0)-\sigma(\delta+\zeta^{-1}\eta) \pmod{15}$$

$$\rightarrow\sigma(L)\equiv\sigma(\alpha_0)-\sigma(\delta+\zeta^{-1}\eta) \pmod{17\cdot 15} \quad \text{[Exp. 81]}$$

The following expression, Exp. 82, shows such a case that quadratic equation $y^2+y=L$ is solved, and $\alpha_1 y=X$ is searched based on two outputs "y"s. Substituting element of GF(256) for "y", the index $\sigma(y^2+y)$ of $y^2+y$ is previously searched. Comparing this index $\sigma(y^2+y)$ with $\sigma(L)$ to decode it in accordance with tables, so that index $\sigma(y)$ is searched. Index $\sigma(X)$ of $\alpha_1 y=(\delta+\zeta^{-1}\eta)^{1/2}y=X$ is obtained in accordance with the following congruences.

$$\sigma(X)\equiv(1/2)\sigma(\delta+\zeta^{-1}\eta)+\sigma(y) \pmod{17}$$

$$\sigma(X)\equiv(1/2)\sigma(\delta+\zeta^{-1}\eta)+\sigma(y) \pmod{15}$$

$$\rightarrow\sigma(X)\equiv(1/2)\sigma(\delta+\zeta^{-1}\eta)+\sigma(y) \pmod{17\cdot15} \quad \text{[Exp. 82]}$$

Exp. 83 shows a case of searching index $\sigma(M)$ of $\beta_0\beta_1^{-2}$. The index of $\beta_0$ being $\sigma(\beta^0)$, and that of $\beta_1=(\delta+\zeta^{-1}\eta)^{1/2}$ being $\sigma(\beta_1)=(1/2)\sigma(\delta+\zeta^{-1}\eta\zeta)$, $-2$ power of $\beta_1$ becomes the expression index $-\sigma(\delta+\zeta^{-1}\eta\zeta)$ based on the above-described tables, and the following congruences are obtained.

$$\sigma(M)\equiv\sigma(\beta_0)-\sigma(\delta+\zeta^{-1}\eta) \pmod{17}$$

$$\sigma(M)\equiv\sigma(\beta_0)-\sigma(\delta+\zeta^{-1}\eta) \pmod{15}$$

$$\rightarrow\sigma(M)\equiv\sigma(\beta_0)-\sigma(\delta+\zeta^{-1}\eta) \pmod{17\cdot15} \quad \text{[Exp. 83]}$$

The following expression, Exp. 84, shows such a case that quadratic equation $z^2+z=M$ is solved, and $\beta_1 z=X$ is searched based on two outputs "z"s. Substituting element of GF(256) for "z", the index $\sigma(z^2+z)$ of $z^2+z$ is previously searched. Comparing this index $\sigma(z^2+z)$ with $\sigma(M)$ to decode it in accordance with tables, so that index $\sigma(z)$ is searched. Index $\sigma(X)$ of $\beta_1 z=(\delta+\zeta^{-1}\eta)^{1/2}z=X$ is obtained in accordance with the following congruences.

$$\sigma(X)\equiv(1/2)\sigma(\delta+\zeta^{-1}\eta)+\sigma(z) \pmod{17}$$

$$\sigma(X)\equiv(1/2)\sigma(\delta+\zeta^{-1}\eta)+\sigma(z) \pmod{15}$$

$$\rightarrow\sigma(X)\equiv(1/2)\sigma(\delta+\zeta^{-1}\eta)+\sigma(z) \pmod{17\cdot15} \quad \text{[Exp. 84]}$$

Next, the calculations in "case 5" will be explained below.

Exp. 85 shows a case of searching index $\sigma(L)$ of $\alpha_0\alpha_1^{-2}$. The index of $\alpha_0=S^{-1}$ being $\sigma(\alpha_0)=\sigma(S^{-1}\zeta)$, and that of $\alpha_1=S$ being $\sigma(\alpha_1)=\sigma(S)$, $-2$ power of $\alpha_1$ becomes the expression index $-2\alpha(S)$ based on the above-described tables, and the following congruences are obtained.

$$\sigma(L)\equiv\sigma(S^{-1}\zeta)-2\sigma(S) \pmod{17}$$

$$\sigma(L)\equiv\sigma(S^{-1}\zeta)-2\sigma(S) \pmod{15}$$

$$\rightarrow\sigma(L)\equiv\sigma(S^{-1}\zeta)-2\sigma(S) \pmod{17\cdot15} \quad \text{[Exp. 85]}$$

The following expression, Exp. 86, shows such a case that quadratic equation $z^2+z=M$ is solved, and $\alpha_1 z=X$ is searched based on two outputs "z"s. Substituting element of GF(256) for "z", the index $\sigma(z^2+z)$ of $z^2+z$ is previously searched. Comparing this index $\sigma(z^2+z)$ with $\sigma(M)$ to decode it in accordance with tables, so that index $\sigma(z)$ is searched. Index $\sigma(X)$ of $\alpha_1 z=Sz=X$ is obtained in accordance with the following congruences.

$$\sigma(X)\equiv\sigma(S)+\sigma(z) \pmod{17}$$

$$\sigma(X)\equiv\sigma(S)+\sigma(z) \pmod{15}$$

$$\rightarrow\sigma(X)\equiv\sigma(S)+\sigma(z) \pmod{17\cdot15} \quad \text{[Exp. 86]}$$

In "case 6", $\delta=b^{1/2}$, and the successive calculations are the same as in "case 1". Note here that $\sigma(\delta)$ is replaced with $(1/2)\sigma(b)$.

In "case 7", $\delta=c^{1/3}$, and the successive calculations are the same as in "case 1". Note here that $\sigma(\delta)$ is replaced with $(1/3)\sigma(c)$.

The calculations in "case 8" are as follows.

The following expression, Exp. 87, shows such a case that quadratic equation $y^2+y=L$ is solved with $\alpha_1=S$ and $L=0$, and $\alpha_1 y=X$ is searched based on two outputs "y"s, i.e., $y=0$ and $y=1$. Substituting element of GF(256) for "y", the index $\sigma(y^2+y)$ of $y^2+y$ is previously searched. Comparing this index $\sigma(y^2+y)$ with $\sigma(L)$ to decode it in accordance with tables, so that index $\sigma(y)$ is searched. Index $\sigma(X)$ of $\alpha_1 y=Sy=X$ is obtained in accordance with the following congruences.

$$\sigma(\alpha_1 y)\equiv\sigma(S)+\sigma(y) \pmod{17}$$

$$\sigma(\alpha_1 y)\equiv\sigma(S)+\sigma(y) \pmod{15}$$

$$\rightarrow\sigma(\alpha_1 y)\equiv\sigma(S)+\sigma(y) \pmod{17\cdot15} \quad \text{[Exp. 87]}$$

The following expression, Exp. 88, shows such a case that quadratic equation $z^2+z=M$ is solved with $\beta_1=S$ and $M=0$, and $\beta_1 z$ is searched. This is the same as Exp. 87 except that $\alpha_1$, L and "y" are replaced with $\beta_1$, M and "z", respectively.

$$\sigma(\beta_1 z)\equiv\sigma(S)+\sigma(z) \pmod{17}$$

$$\sigma(\beta_1 z)\equiv\sigma(S)+\sigma(z) \pmod{15}$$

$$\rightarrow\sigma(\beta_1 z)\equiv\sigma(S)+\sigma(z) \pmod{17\cdot15} \quad \text{[Exp. 88]}$$

Figure 74:
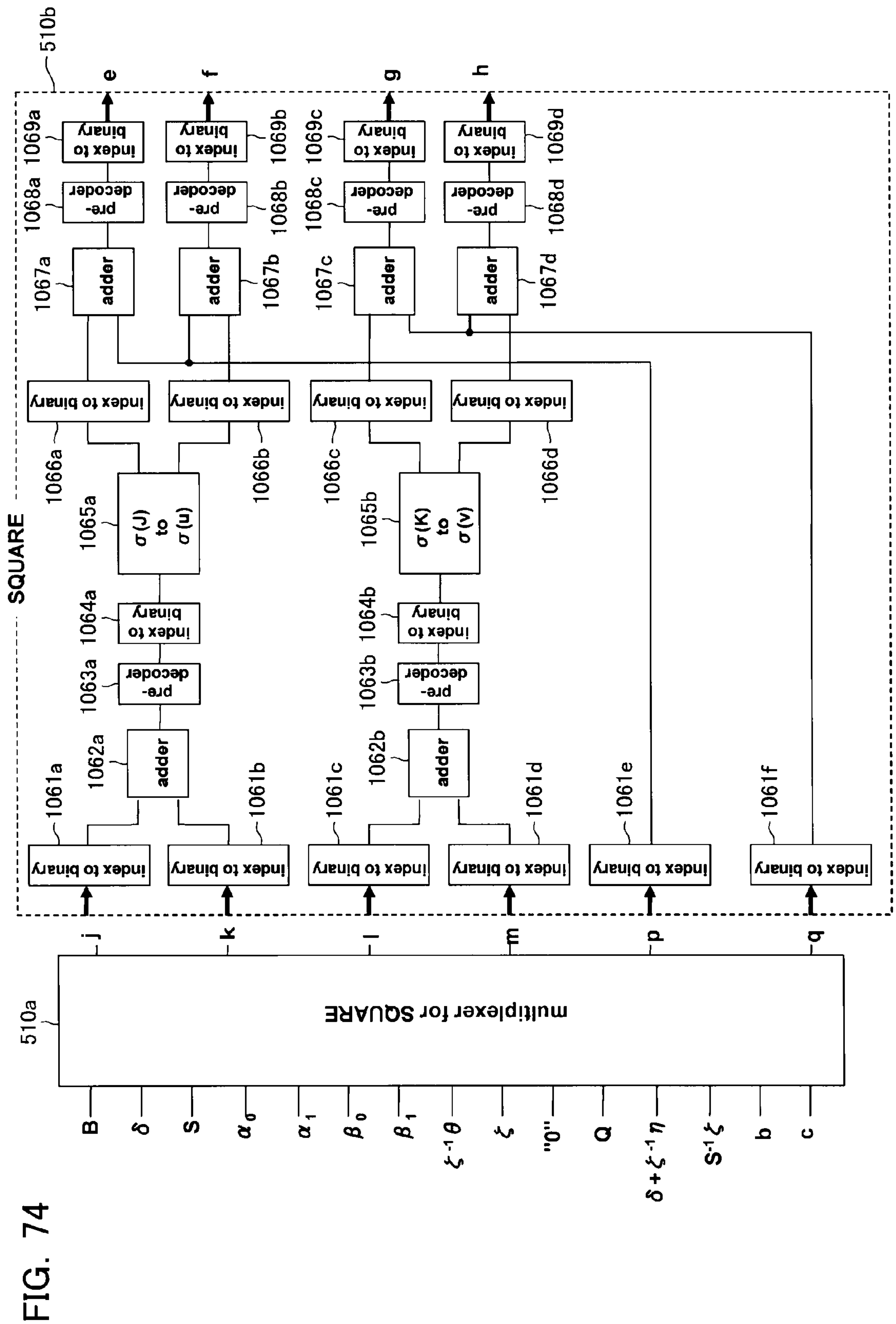
FIG. 74 shows the index conversion decoder at the output portion of the final stage adder.

The circuit configuration of SQUARE portion 510, which is used to calculate the above-described congruences, is formed as shown in FIG. 74. Since it is required of the circuit to be branched in accordance with cases, there is prepared a multiplex circuit 510*a* disposed at the input portion, which is for multiplexing input signals, and SQUARE portion body 510*b* for receiving the outputs.

Multiplex circuit 510*a* multiplexes signals B, δ, S, $\alpha_0$, $\alpha_1$, $\beta_0$, $\beta_1$, $\zeta^{-1}\theta$, ζ, "0", Q, $\delta+\zeta^{-1}$, "b" and "c" in accordance with cases, and passes signals to SQUARE portion body 510*b* such as "j", "k", "l", "m", "p" and "q".

SQUARE portion body 510 has index/binary converters 1061*a* to 1061*f*, which receive the signals "j", "k", "l", "m", "p" and "q" to convert them to binary numbers of the expression indexes. "j", "k", "l" and "m" are converted to binary numbers of the expression indexes of the products of elements via adders 1062*a* and 1062*b*, and the binary data are converted to expression indexes via pre-decoders 1063*a*, 1063*b* and binary/index converters 1064*a*, 1064*b*, and then solutions of quadratic equations, i.e., σ(J) to σ(u), σ(K) to σ(v), are searched at decoders 1065*a*, 1065*b*.

The decoded solutions are converted to binary data again in the index/binary converters 1066*a* to 1066*d*. These binary data and other binary data of "p" and "q", which are obtained by index/binary converters 1061*e* and 1061*f*, are input to adders 1067*a* to 1067*d*, so that products are searched.

These products are processed in pre-decoders 1068*a* to 1068*d* and index/binary converters 1069*a* to 1069*d*, and outputs "e", "f", "g" and "h" are obtained as expression indexes. These outputs "e", "f", "g" and "h" become error searching results directly or via other calculation processes.

Figure 75:
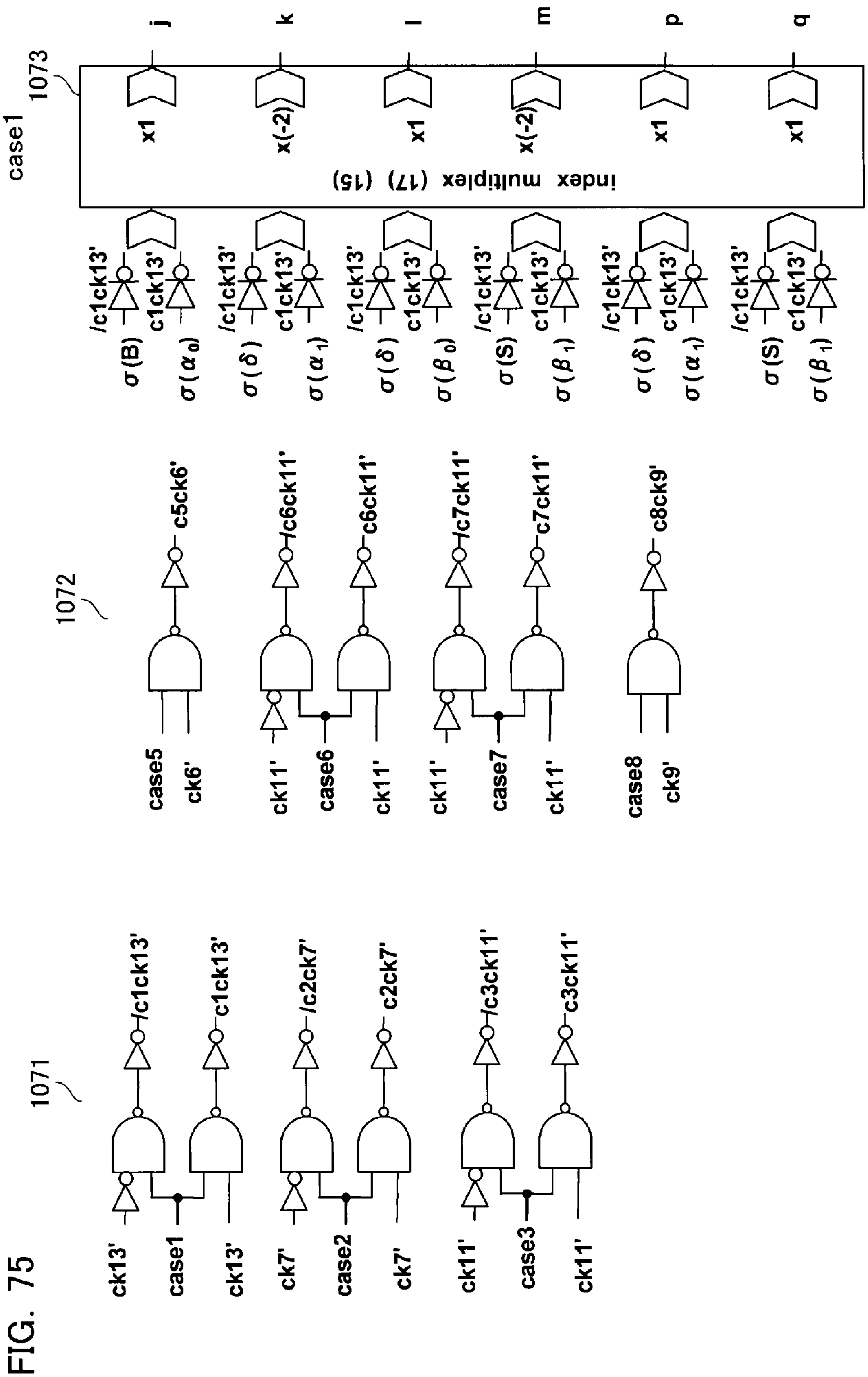
FIG. 75 shows a configuration (part 1) of the multiplexer shown in FIG. 74.

Next, a series of index multiplexers (17), (15) constituting the multiplex circuit 510*a* will be explained with reference to FIGS. 75 to 77. Switching logic signal generating circuits 1071 and 1072 are prepared for generating connection switching signals, which are used for transforming input signals to expression indexes of powers of expression indexes in accordance with cases.

These switching signals are generated from clocks with dashes because these become activated ones after certain timing clocks necessary for the respective cases. In the drawing, switching signals as outputs of switching signal generating circuits 1071 and 1072 are expressed as combinations of case numbers "ci" (i=1 to 8) and clock names "ckj'" (j=6, 7, . . . ).

Index multiplexer 1073 is for switching the input expression index components to couple them to outputs "j", "k", "l", "m", "p" and "q" with the above-described switching signals as those of clocked inverters. Explaining in detail with reference to the "case 1" clocked by timing clock ck13' shown in FIG. 75, expression index components are exchanged between index σ(B) and index σ(α0), and "j" is output; expression index components are multiplied by (−2) and exchanged between index σ(δ) and index σ(α1), then "k" is output; expression index components are exchanged between index σ(δ) and index σ(β0), and "1" is output; expression index components are multiplied by (−2) and exchanged between index σ(S) and index σ(β1), then "m" is output; expression index components are exchanged between index σ(δ) and index σ(α1), and "p" is output; and expression index components are exchanged between index σ(S) and index σ(β1), and "q" is output. Multiples, which are shown just before the outputs in the drawing, designate those corresponding to the powers of finite field elements.

Figure 76:
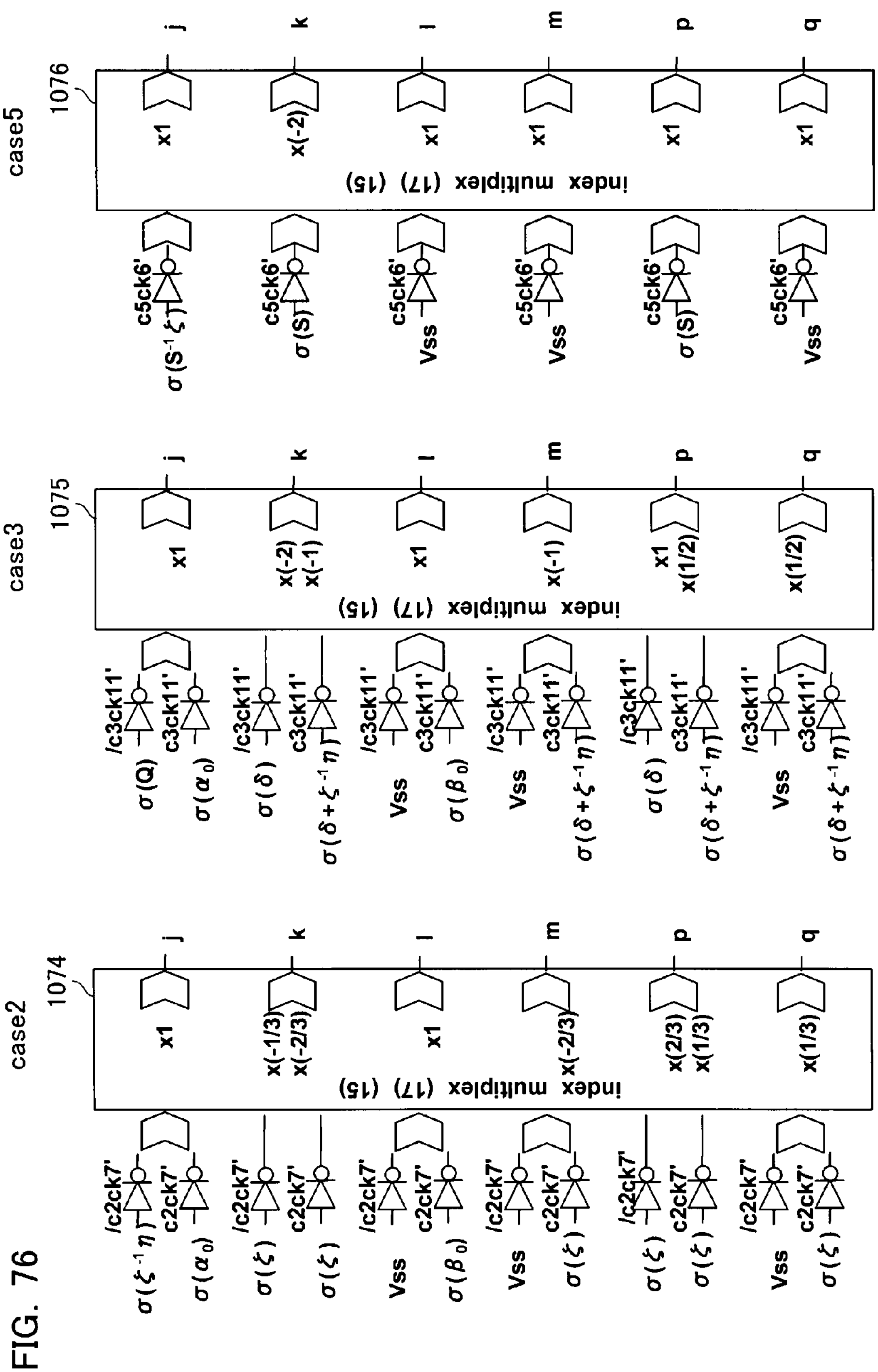
FIG. 76 shows another configuration (part 2) of the multiplexer shown in FIG. 74.

FIG. 76 shows index multiplexers 1074, 1075 and 1076 used in "case 2", "case 3" and "case 5", which exchange signals by timing clocks ck7, ck11 and ck6, respectively. The case where two multiples are shown before the output, such as output "k" of "case 2", designates that the expression index component corresponding to index σ(ζ) multiplied by (−1/3) is output as "k" until clock ck7, and the expression index component corresponding to index σ(ζ) multiplied by (−2/3) is output as "k" after clock ck7.

Figure 77:
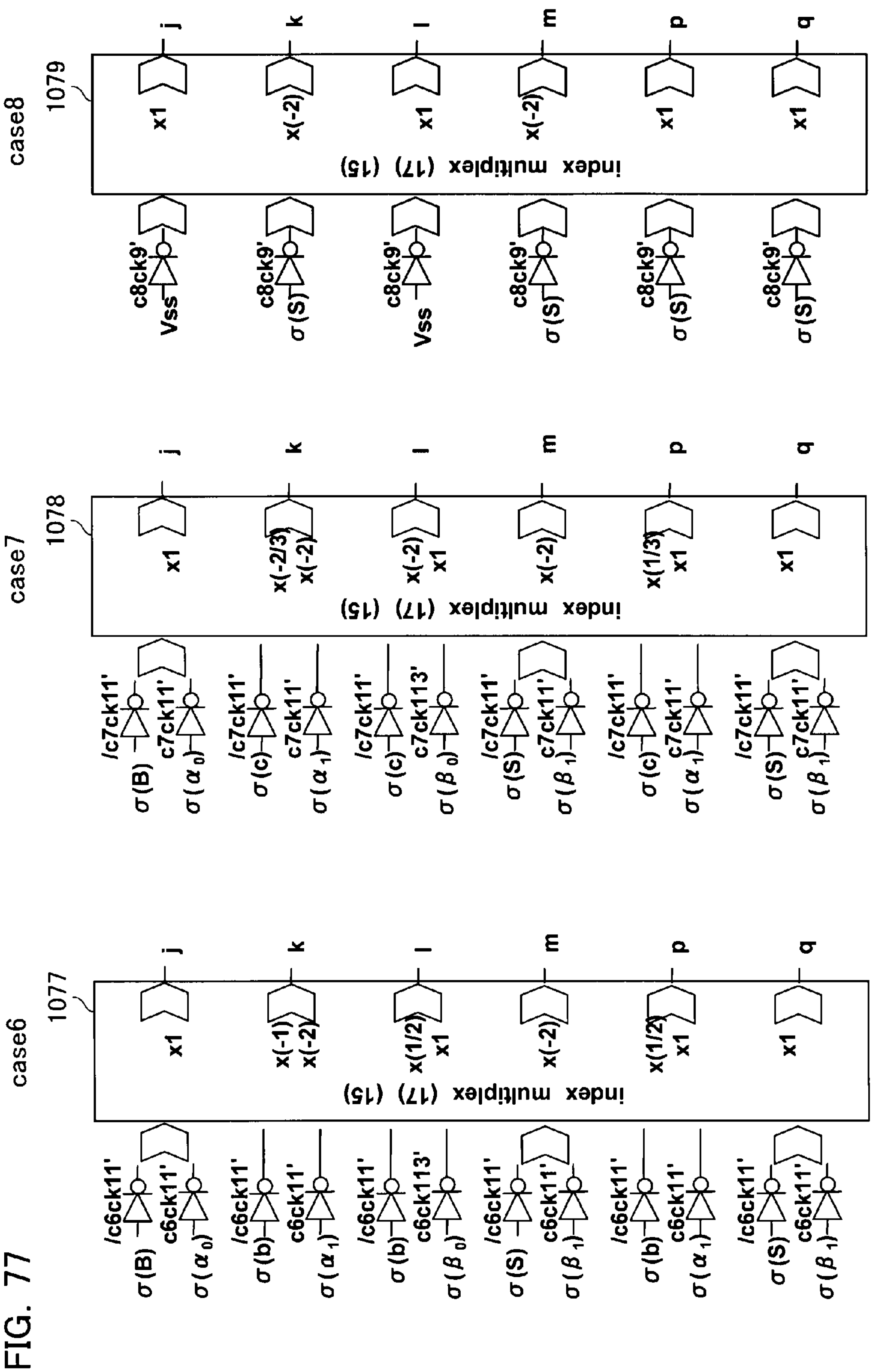
FIG. 77 shows another configuration (part 3) of the multiplexer shown in FIG. 74.

FIG. 77 shows index multiplexers 1077, 1078 and 1079 used in "case 6", "case 7" and "case 8" which exchange signals by timing clocks ck11, ck8 and ck9, respectively.

Figure 78:
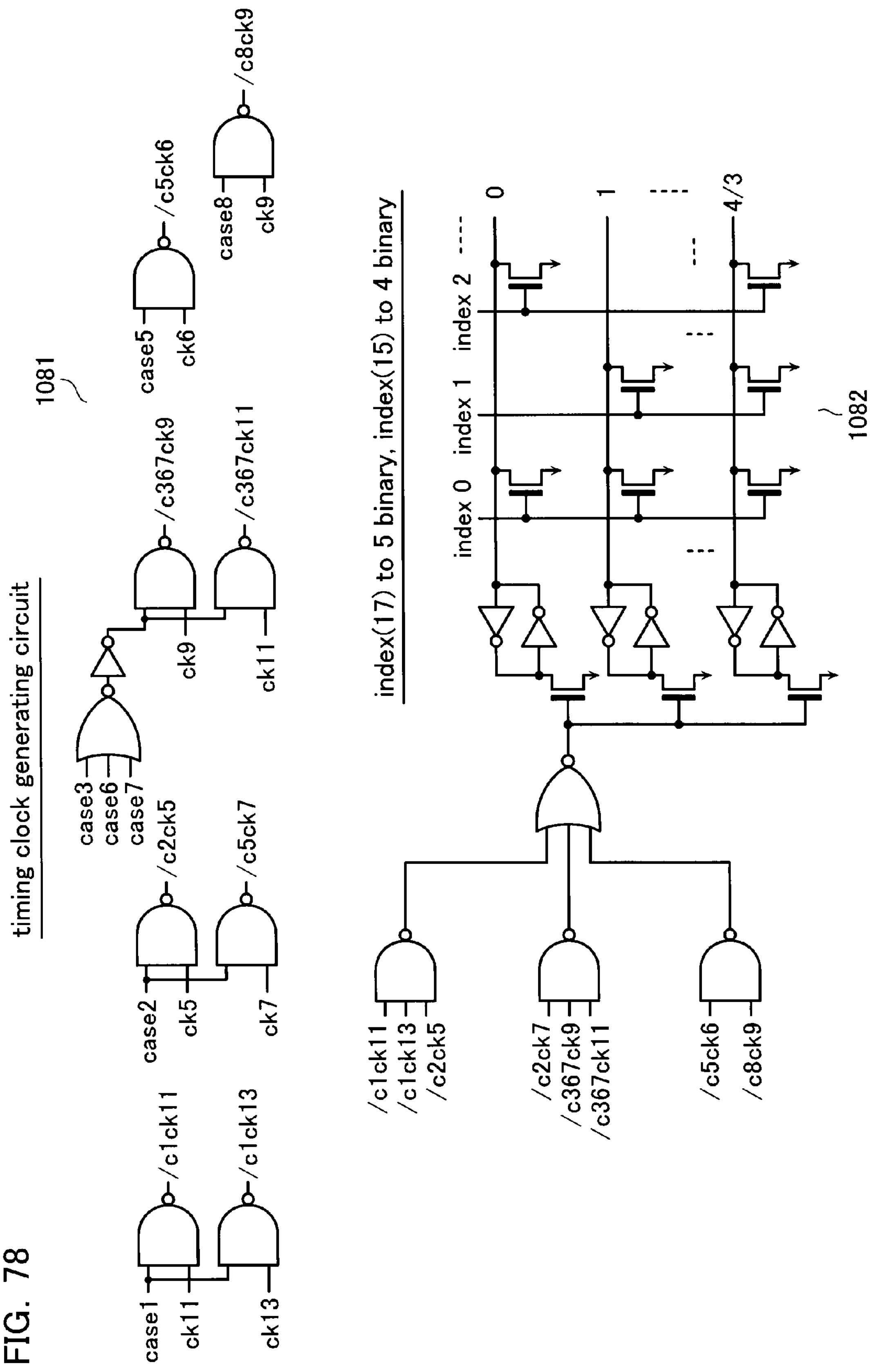
FIG. 78 shows a decoder system of the initial stage adder input portion in FIG. 74.

To express the expression indexes of multiplexer outputs "j", "k", "l", "m", "p" and "q" by binary numbers, timing clock generating circuit 1081 and binary/index converting circuit 1082 controlled by the timing clocks are prepared as shown in FIG. 78.

As shown in the timing clock generating circuit 1081 shown in FIG. 78, timing clocks are as follows: ck11 and ck13 in "case 1"; ck5 and ck7 in "case 2"; ck9 and ck11 in "cases 3", "case 6" and "case 7"; ck6 in "case 5"; and ck9 in "case 8".

The index/binary converting circuit 1082 is activated by a selected timing clock, and stores binary data state of the expression index component during the clock pulse width.

Figure 79:
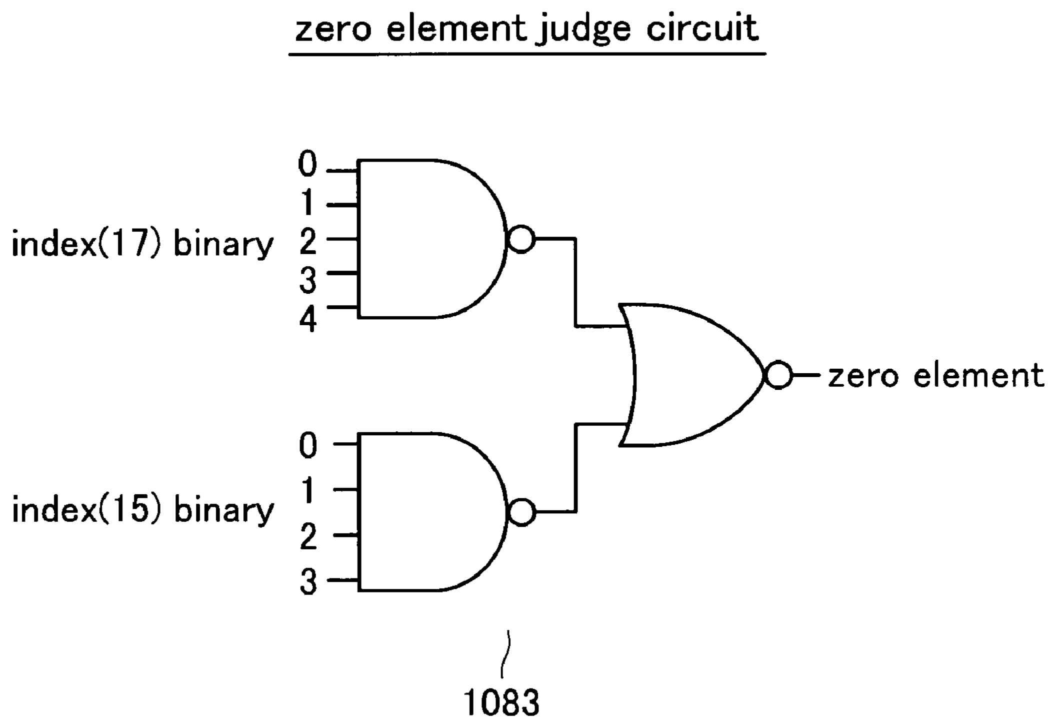
FIG. 79 shows a zero element judgment circuit.

The binary numbers obtained in the index/binary converting circuit 1082 are input to adders. If one input of the adder is zero element, the adder output is not determined. Therefore, zero element judgment is performed at this input stage. For the purpose, zero element judgment circuit 1083 is prepared as shown in FIG. 79, which judges zero element based on the binary number state to outputs "zero element".

The results obtained at the adders are binary numbers of the expression index components. To decode them into the expression index components themselves, the above-described pre-decoders are used. The pre-decoders divide the binary data two bits by two bits and convert it into quaternary number, and in addition form zero of octal number.

The pre-decoded signals of adder's bits "s0" to "s3" are processed in the index (17), (15) & latch shown in FIG. 80 in such a way that transistor gates "a" and "b" are connected as shown in tables corresponding to the expression index components, index (17) and index (15). As a result, outputs δ(J), δ(K) and δ(L), δ(M) are obtained.

This circuit is multiplexed and activated by the following clocks: ck12 and ck14 in "case 1"; ck6 and ck8 in "case 2"; ck10 and ck12 in "cases 3", "case 6" and "case 7"; ck7 in "case 5"; and ck10 in "case 8". The latch is activated during the clock pulse width as corresponding to multiplexing. The outputs are given to the following calculation stage for solving the quadratic equation.

Next, tables used for solving the quadratic equations $u^2+u=J$, $v^2+v=K$, $y^2+y=L$ and $z^2+z=M$ will be explained below.

FIGS. 81A to 81C show a set of tables, which show the relationships between the indexes satisfying the equation example of $y^2+y=L$. The relationships are summarized as the order of σ(y) for σ(L), and the order of σ(L) for σ(y). As shown in these tables, there are two σ(y)'s for one σ(L). This designates that the quadratic equation has two solutions. For example, when σ(y)=85 and 170, σ(L)=0; and when "L" is zero element, "y" becomes zero element or σ(y)=0.

FIGS. 82A to 82C show the relationships between the expression indexes {σ(L)(17), σ(L) (15)} and the expression index components σ(y)(17) of "y" with respect to the solutions of the quadratic equation. Additionally, there is shown the bus configuration (bs1, bs2) used at the decode time. These tables are classified into groups for the respective values of σ(y)(17).

Constituting decoders with respect to the expression indexes of "L" obtained in the calculation based on the tables, expression index components of "y" will be searched. Since one "L" corresponds to two "y", there are prepared two buses bs1 and bs2, to which decoder outputs are divided and supplied independently.

For example, σ(y)=119 and 153 corresponds to σ(L)=17. Therefore, data bus is divided into two buses, bs1 and bs2, to which σ(y)=119 and σ(y)=153 are output, respectively. In case of zero element, i.e., in case there is not generated an expression index of "L", signal "zero element" is output (L=0). This case will be defined by: "0" is set in "bs1"; and zero (no index) state is set in "bs2".

What is used in the practical decoding is an expression index. Therefore, the values of the expression index components σ(y)(17) of "y", which are output to buses bs1 and bs2, are corresponded to the respective expression indexes of "L". If there is no relationship between the expression indexes, there is not a solution.

FIGS. 83A to 83C show the relationships between the expression indexes {σ(L)(17), σ(L) (15)} and the expression index components σ(y)(15) of "y" with respect to the solutions of the quadratic equation. There are shown the bus configurations (bs1, bs2) used at the decode time as similar to the case of expression index component σ(y)(17) shown in FIGS. 82A to 82C. Therefore, the detailed explanation will be omitted here.

Figure 84:
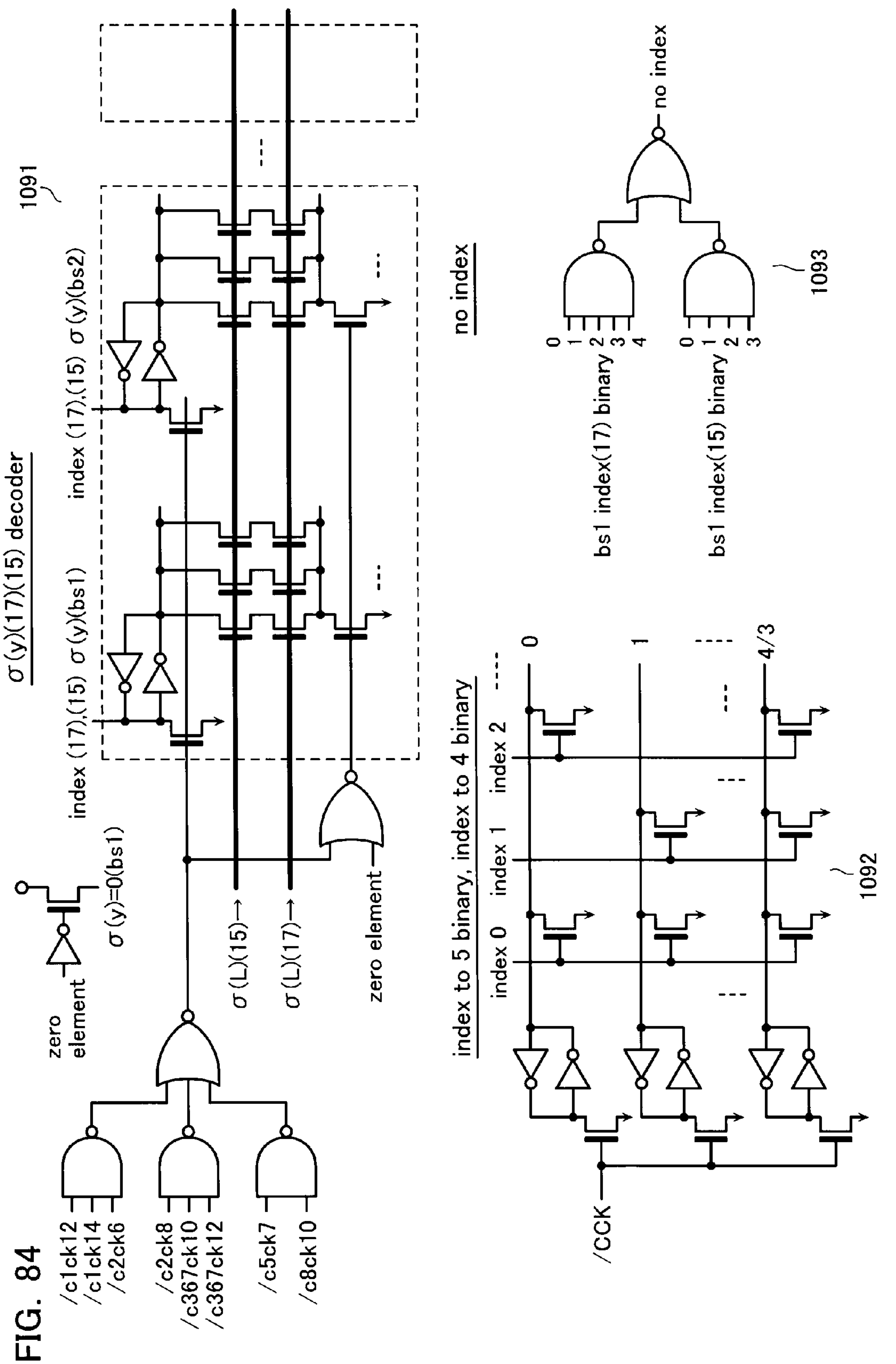
FIG. 84 shows the data conversion and decoder at the input portion of the final stage adder in FIG. 74.

FIG. 84 shows a decoder circuit, which searches the solution of the quadratic equation and transmits the result to adders. This shows a typical case of $y^2+y=L$. σ(y)(17)(15) decoder 1091 is for converting the expression index of "L" to corresponding expression index of "y". Since two "y"s correspond to one "L", there are prepared two buses bs1 and bs1, to which the expressions of "y" are transferred.

The expression indexes are distinguished based on the NAND connections, gates of which are applied with the expression index components σ(L)(17) and σ(L)(15). In accordance with the expression index components of "y"s, the respective groups are NOR-connected. Pre-charged nodes are activated by clocks in correspondence with cases as follows: ck12 and ck14 in "case 1"; ck 6 and ck8 in "case 2"; ck10 and ck12 in "case 3", "case 6" and "case 7"; ck7 in "case 5"; and ck10 in "case 8". As a result, the expression index components σ(y)(17) and σ(y)(15) are generated to the respective buses.

In correspondence to zero element of "L", based on the "zero element", σ(y)(17)=0, σ(y)(15)=0 are output to bs1 as corresponding to σ(y)=0 while "no index" to bs2.

Index/binary converting circuit 1092 is prepared for converting the sum of the expression indexes to binary data used in the adder calculation. In this circuit, the indexes are converted to 5-binary or 4-binary data.

"no index" generating circuit 1093 is prepared for designating the case where two solutions are not searched. If there is no output index, the outputs of the index/binary converting circuit 1092 become all "1" bits. "no index" generating circuit 1093 is formed of NAND circuits, each of which is able to detect all "1" state. This circuit monitors the data state of "bs1" because there are output binary data to "bs1" when there are indexes.

The adders for searching the sums of expression indexes are formed to search the expression index components of the product of α-power of finite field element "A" and β-power of finite field element "B". It is in need of preparing adders for the respective expression indexes. Therefore, in this embodiment, mod 17-use adders and mod 15-use adders are necessary.

Figure 85:
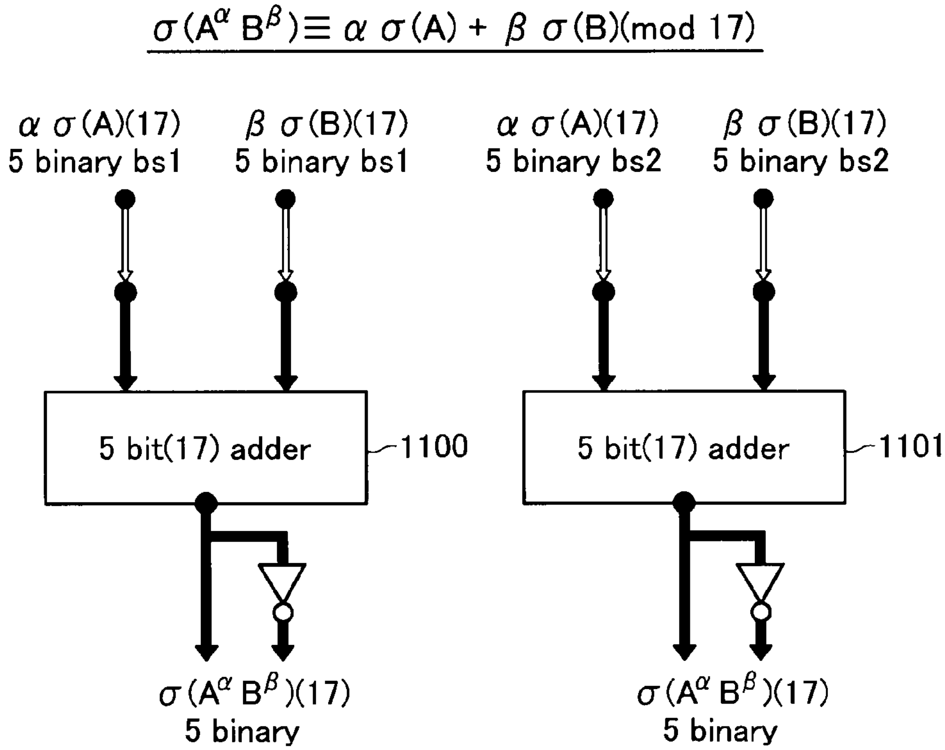
FIG. 85 shows a detailed configuration of mod 17 adders, which perform operations in parallel for two buses.
Figure 86:
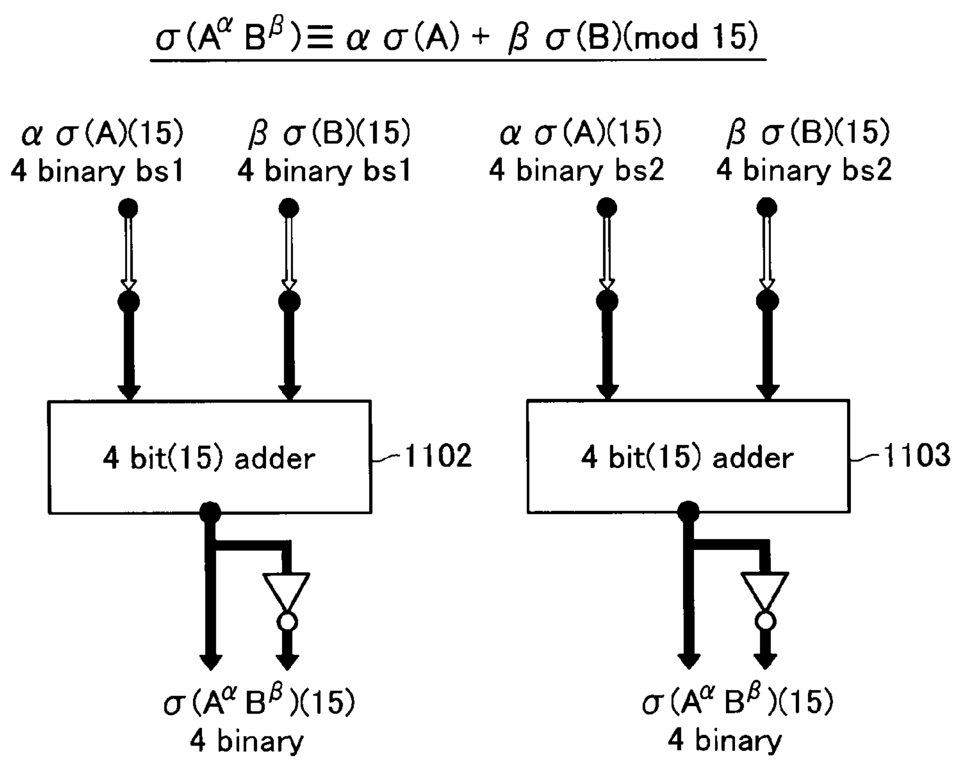
FIG. 86 shows a detailed configuration of mod 15 adders.

As shown in FIG. 85, 5-bit (17) adders 1100 and 1101 are constituted to be connected to buses bs1 and bs2 in parallel with each other. Similarly, as shown in FIG. 86, 4-bit (15) adders 1102 and 1103 are constituted to be connected to buses bs1 and bs2 in parallel with each other. As a result, 5-bit number and 4-bit number are output as binary data of the expression index components.

Figure 87:
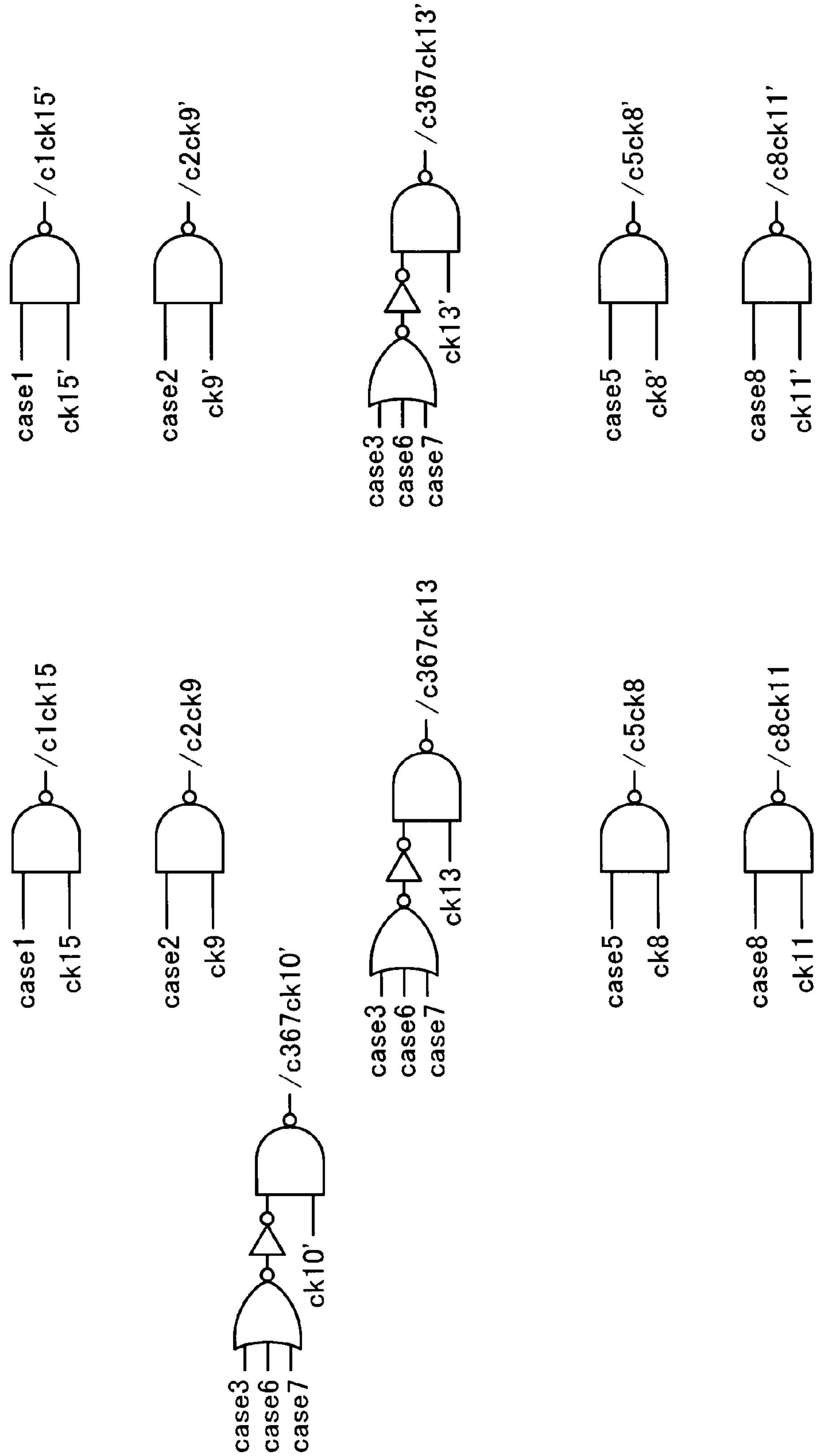
FIG. 87 shows clock generating circuits used in the respective calculation branches.

FIG. 87 shows clock generating logic circuits used for controlling timings of decoding the adder outputs and latching them for the respective cases. There are shown only logic circuits which have not been formed so far. The naming of signals is the same as examples described above. For example, an inverted clock obtained from clock ck', which rises at the timing of clock ck10 used in "case 3", "case 6" and "case 7" and is kept during the cycle, is referred to as c367ck10', where "c367" designates cases.

The results of adders are binary data of the expression index components, which are decoded to the expression indexes themselves. This is performed with pre-decoders as described above. The pre-decoders divide the adder's output bits "s0" to "s3" two bits by two bits and convert it into quaternary number, and in addition form a signal corresponding to zero of 4-bit octal number.

Figure 88:
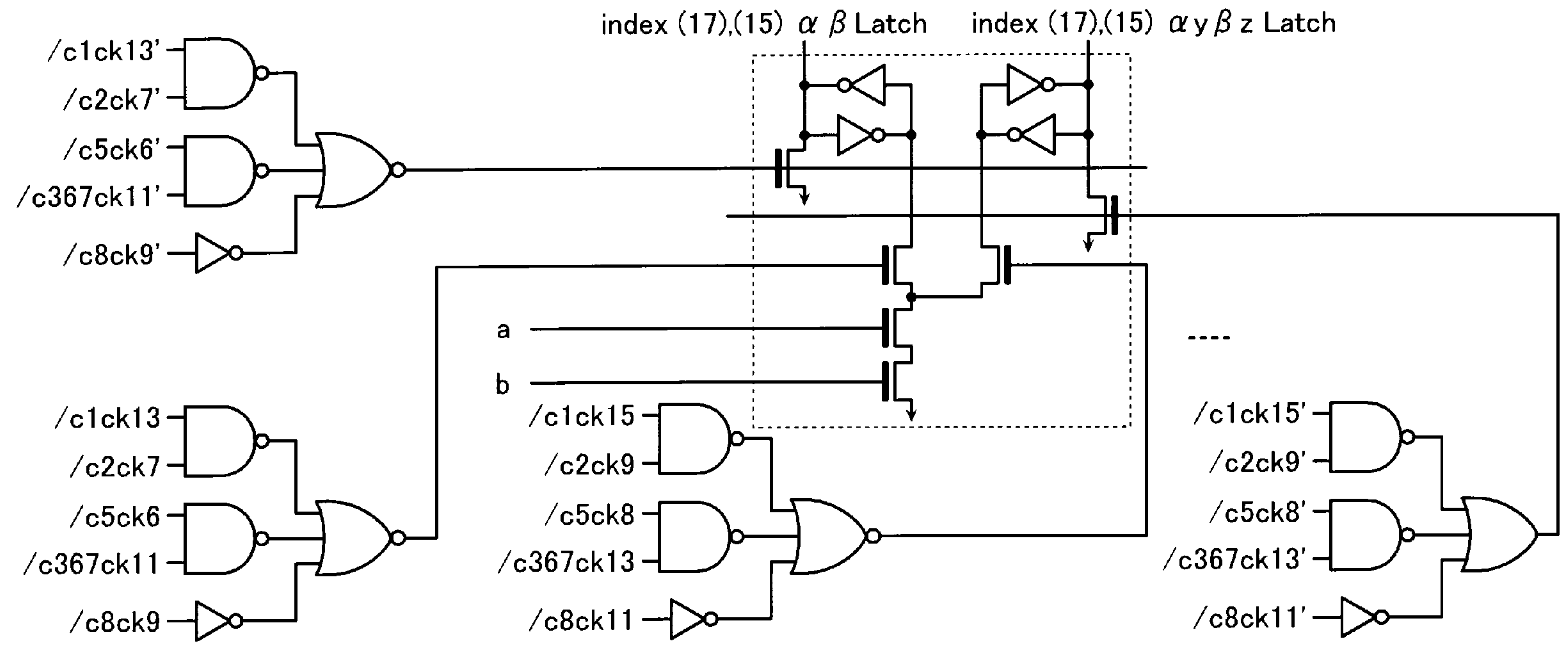
FIG. 88 shows the decoder & latch at the output portion of the final stage adder in FIG. 74.

Based on the pre-decoded signals, the index (17), (15) & latch shown in FIG. 88 generates the expression index components. That is, as shown in the tables of index (17) and index (15), signals are coupled to transistor gates "a" and "b" are coupled, so that output indexes $\sigma(\alpha_0)$, $\sigma(\beta_0)$, $\sigma(\alpha_1)$ and $\sigma(\beta_1 z_1)$ are generated from the outputs "e", "f", "g" and "h" of the SQUARE portion at a first timing while $\sigma(a_1 y_1)$, $\sigma(\alpha_1 y_2)$, $\sigma(\beta_1 z_1)$ and $\sigma(\beta_1 z_2)$ are generated at a second timing.

The first timing is defined by: clock ck13 in "case 1"; ck7 in "case 2"; ck11 in "case 3", "case 6" and "case 7"; ck 6 in "case 5"; and ck9 in "case 8". The second timing is defined by: clock ck15 in "case 1"; ck9 in "case 2"; ck13 in "case 3", "case 6" and "case 7"; ck8 in "case 5"; and ck11 in "case 8". Decoders are effective in the clock pulse width and correspond to multiplexing, and outputs thereof are kept during the cycles at the respective latches.

Figure 89:
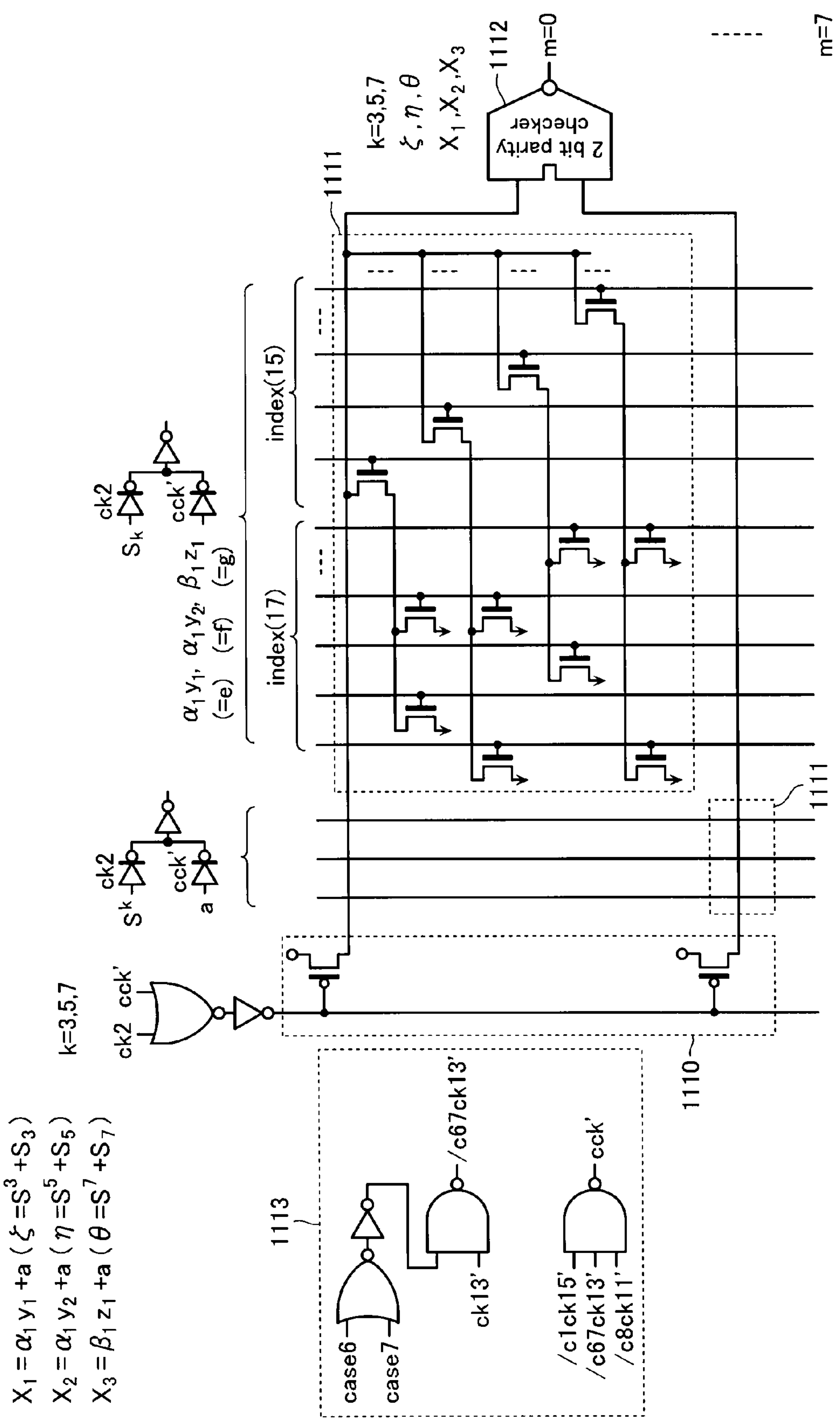
FIG. 89 shows the parity check circuit (part 1) used for calculating the sum of two elements in the ES part.

To search error locations based of the calculation result of SQUARE part 25, there is such a case as to search the sum of finite field elements. This case will be explained with reference to FIG. 89. In the calculation processes of $X_1$, $X_2$ and $X_3$, the calculation circuit for searching the polynomial expressed coefficients ζ, η and θ, which are the sum of the power of expression indexes of syndromes, is used in a multiplexed manner. This circuit will be explained as an example.

Input signals are the expression indexes of $S^k$ and $S_k$ (k=3, 5, 7) during the pulse width of timing clock ck2. $S^k$ is switched with "a" by timing clock cck' while $S_k$ is switched with $\alpha_1 y_1$ (=output "e" of SQUARE portion), $\alpha_1 y_2$ (=output "f" of SQUARE portion) and $\beta_1 z_1$ (=output "g" of SQUARE portion) by timing clock cck'. There are nodes corresponding to "m"-degree coefficients of the polynomial expressed sum for these signals, which are pre-charged by pre-charge circuit 1110, and the decoder 1110 is activated by clock ck2 or cck'.

The connections of the expression index signals of the "m"-degree nodes to the transistor gates are defined from the tables shown above. For each "m", two nodes of the respective elements are subjected to parity checking with 2-bit PC 1112, the polynomial expressed coefficients of the sum of input signals are obtained.

Timing signal cck' is generated by the logic circuit shown in the drawing as follows: from clock ck15' in "case 1"; from clock ck13' in "case 6" and "case 7"; and from clock ck11' in "case 8".

Figure 90:
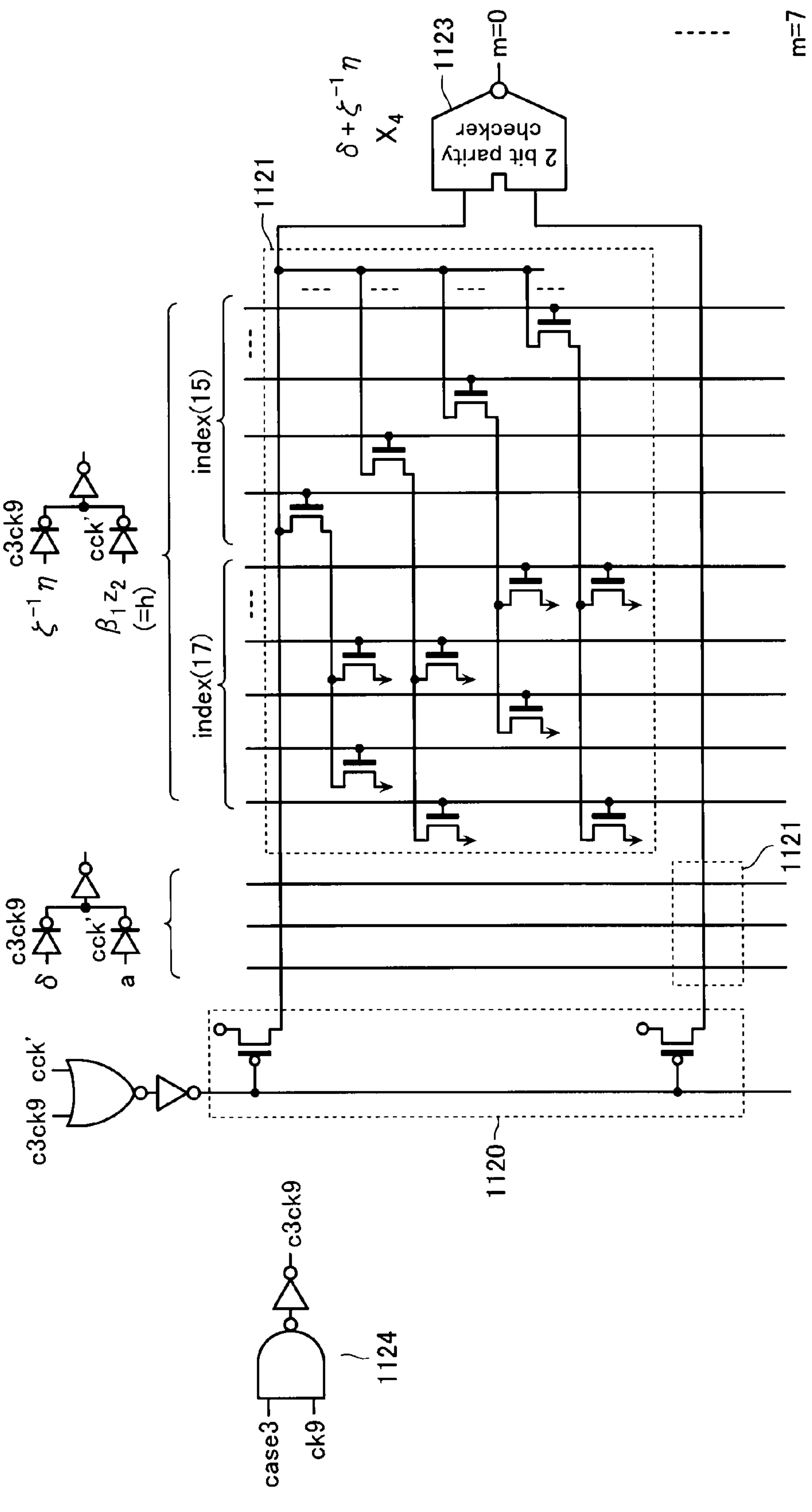
FIG. 90 shows the parity check circuit (part 2) used for calculating the sum of two elements in the ES part.

As shown in FIG. 90, in the calculation of $X_4$, the calculation circuit of $\delta+\zeta^{-1}\eta$, which is required in the calculation process of "case 3" in SQUARE part 25, is multiplexed and used.

Input signals are expression indexes of $\zeta^{-1}\eta$ and δ during the pulse width of timing clocks c3ck9, which are switched by $\beta_1 z_1$(=output "h" of SQUARE portion) and "a", respectively, by timing clock cck'. There are nodes corresponding to "m"-degree coefficients of the polynomial expressed sum for these signals, which are pre-charged by pre-charge circuit 1120, and the decoder 1121 is activated by clock ck2 or cck'.

The connections of the expression index signals of the "m"-degree nodes to the transistor gates are defined from the tables shown above. For each "m", two nodes of the respective elements are subjected to parity checking with 2-bit PC 1123, the polynomial expressed coefficients of the sum of input signals are obtained.

The timing signal c3ck9 is generated from the logic circuit 1124 shown in the drawing based on clock ck9 in "case 3".

ζ, η, θ and $X_1$, $X_2$, $X_3$, $X_4$ obtained as the sums of finite field elements are obtained as 7th-degree polynomials, and coincide with either one of pi(x) defined as element of GF(256). Therefore, these polynomials are converted in such a manner that the index of root α of $m_1(x)$ is converted to the expression index defined by mod 17 and mod 15, and the expression indexes will be used in the successive calculations. The pre-decoders are the same as used for decoding the expression index of syndromes, and the detailed explanation is omitted here. The pre-decoders express the 256 binary signal states, which express the coefficients of 8-bit pi(x), as the combinations of signals Ai, Bi, Ci and Di (i=0 to 3), and further convert them into sixteen signals E[i] and F[i], i.e., E[0;15] and F[0;15].

Figure 91:
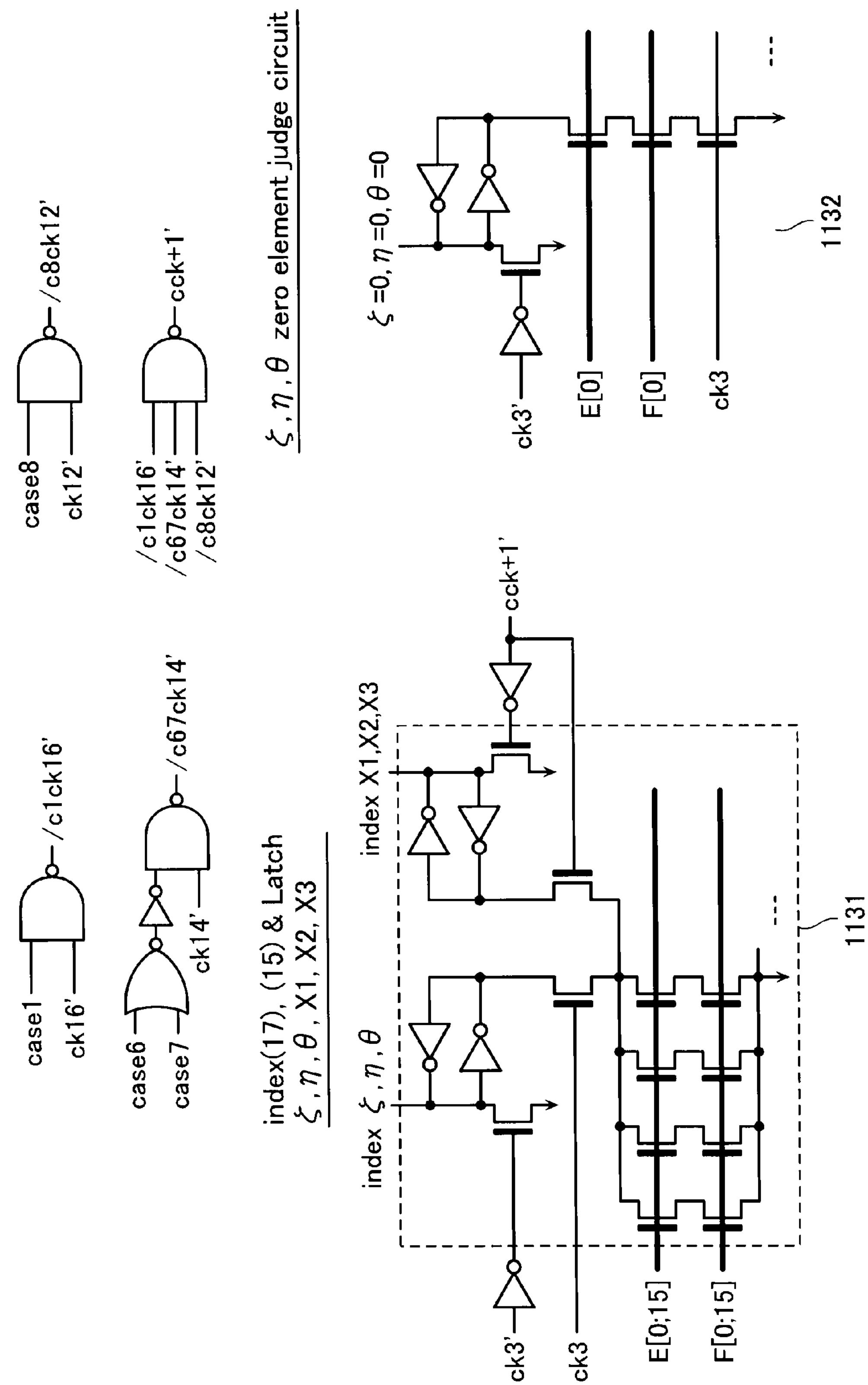
FIG. 91 shows the index conversion decoder and latch used in FIG. 89 for converting the polynomial expresses coefficients to the expression indexes.

Based on the pre-decoded signals, index(17),(15) & latch circuit 1131 shown in FIG. 91 generates and latches expression index components, which are classified into groups of the remainder classes. That is, signals E[0;15] and F[0;15] are combined by NAND connections each decoding the elements of the remainder class and NOR connections each expressing a set of elements, and pre-charged nodes are discharged at a first timing by clocks ck3 and ck3', so that index signals of the remainder classes σ(ζ), σ(η) and σ(θ) are latched and output.

At a second timing, the pre-charged nodes are discharged and latched by clock cck+1', and index signals $\sigma(X_1)$, $\sigma(X_2)$ and $\sigma(X_3)$ are output.

In case of pi(x)=0, there is no index of $\alpha$. That is, since E[0;15]=1 and F[0;15]=1 in this case, indexes are not output. With respect to $\zeta$, $\eta$ and $\theta$, to judge zero element, zero element judgment circuit 1131 is prepared as a decoder. In detail, signals $\zeta=0$, $\eta=0$, and $\theta=0$ are generated and latched when corresponding to zero elements.

The second timing is defined by the logic gate circuit 1133 shown in FIG. 91 as follows: /c1ck16' is formed by ck16' in "case 1"; /c67ck14' is formed by ck14' in "case 6" and "case 7"; /c8ck12' is formed by ck12' in "case 8"; and cck+1' is formed by /c1ck16', c67ck14' and c8ck12'. cck+1' means that it is one clock delayed from the parity check activating clock, and used for latching the calculation result.

Figure 92:
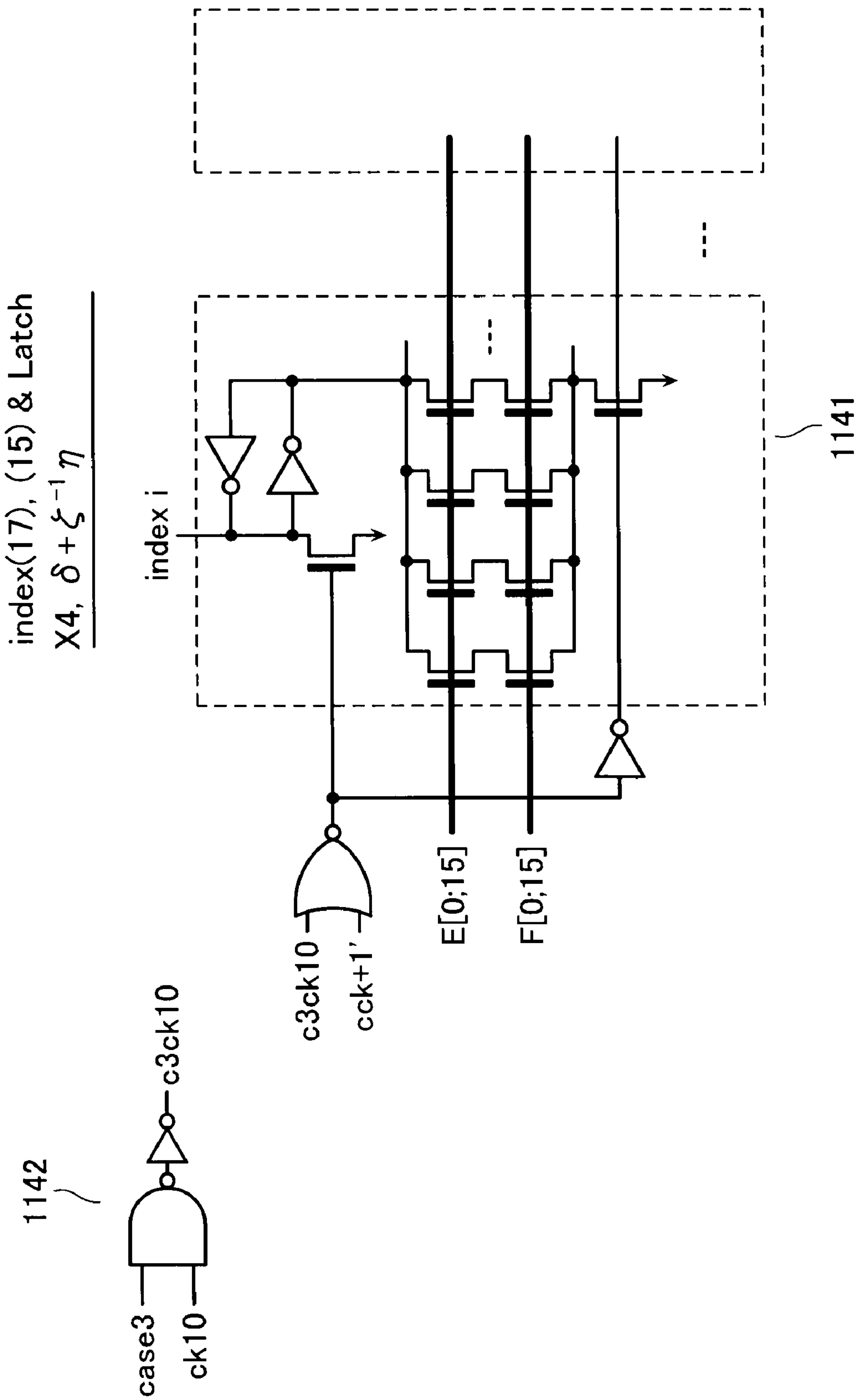
FIG. 92 shows the index conversion decoder and latch used in FIG. 90 for converting the polynomial expresses coefficients to the expression indexes.

With respect to $X_4$, index (17), (15) & latch 1141 shown in FIG. 92 is used. That is, signals E[0;15] and F[0;15] are combined by NAND connections each decoding the elements of the remainder class and NOR connections each expressing a set of elements, and pre-charged nodes are discharged at a first timing by clock ck10, so that index signals of the remainder classes $\sigma(\delta+\zeta^{-1}\eta)$ are latched and output. At a second timing, the pre-charged nodes are discharged and latched by clock cck+1', and index signals $\sigma(X_4)$ are output.

The first timing is defined by the logic circuit 1142 shown in FIG. 92. That is, based on clock ck10 in "case 3", clock ck3ck10 is generated. Output $\sigma(\delta+\zeta^{-1}\eta)$ is stored within the clock pulse width, which is necessary for calculation.

Figure 93:
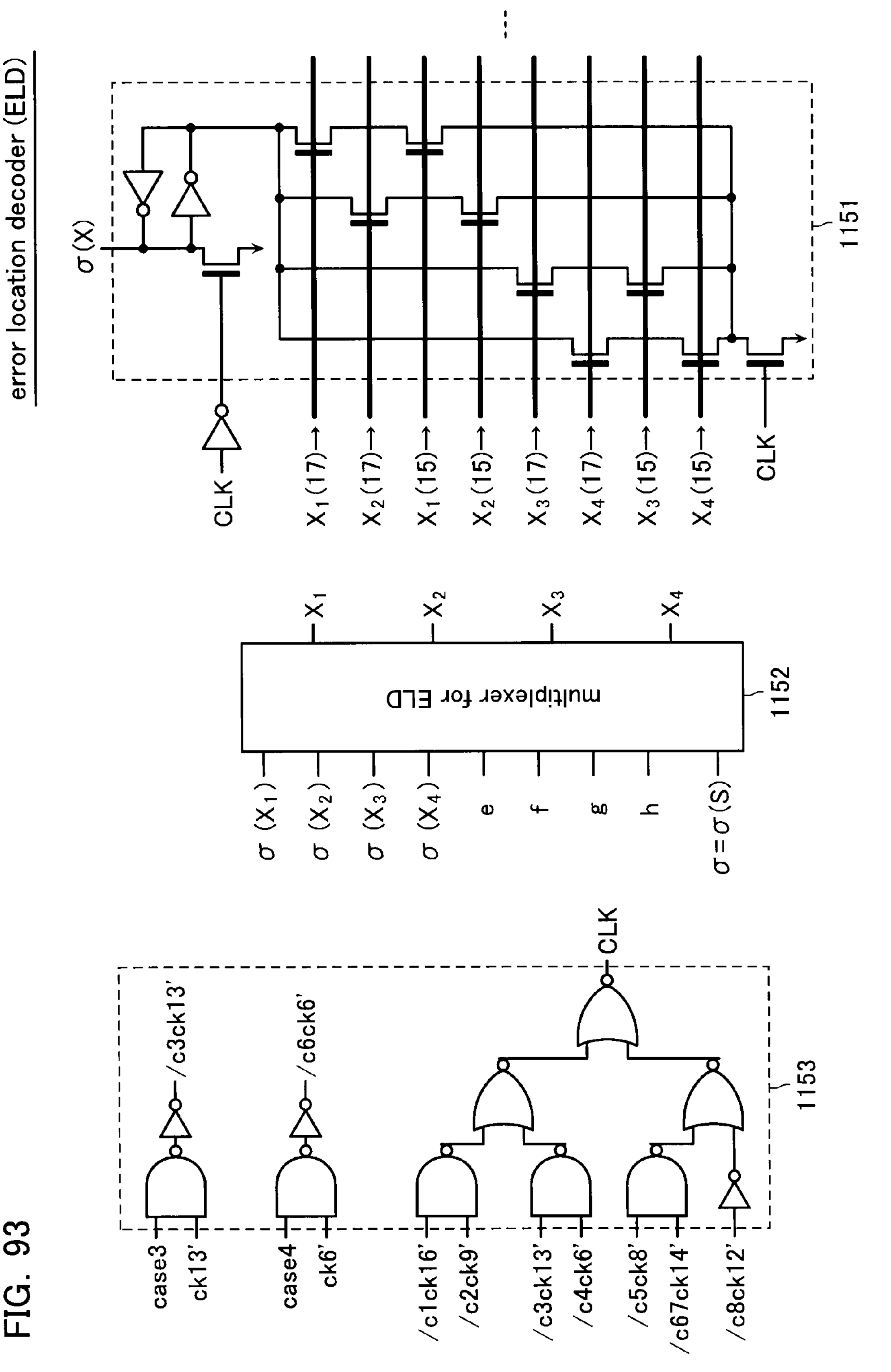
FIG. 93 shows the error location decode (ELD) portion.

FIG. 93 shows error location decoder (ELD) circuit 1151, which transforms the calculation result to error location data $X_1$, $X_2$, $X_3$ and $X_4$ and holds them. Expression indexes ("e", "f", "g" and "h") obtained as the final calculation result from SQUARE part, or indexes ($\sigma(X_1)$, $\sigma(X_2)$, $\sigma(X_3)$ and $\sigma(X_4)$) obtained by the summation operation for the expression indexes, or index $\sigma$ of syndrome S is selected in accordance with cases in multiplexer 1152. Selected indexes are decoded, and index $\sigma(X)$ of "X" is latched as an error location signal.

Clock CLK for activating the ELD 1151 is generated from logic circuit 1153 shown in FIG. 93. That is, CLK will be generated: based on ck16' in "case 1"; based on ck9' in "case 2"; based on ck13' in "case 3"; based on ck6' in "case 4"; based on ck8' in "case 5"; based on ck14' in "case 6" and "case 7"; and based on ck12' in "case 8".

Figure 94:
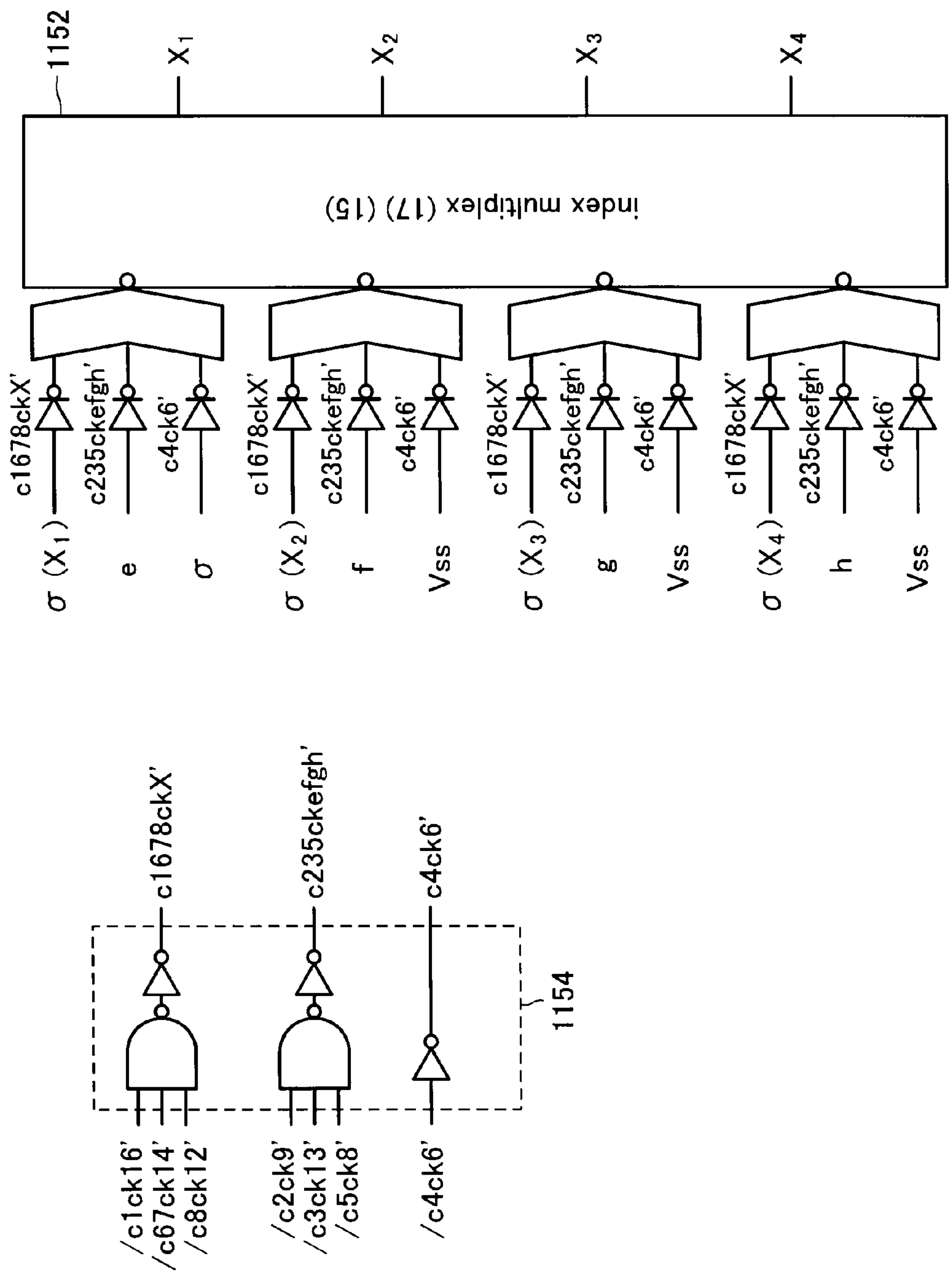
FIG. 94 shows the detail of the multiplexer shown in FIG. 93.

FIG. 94 shows the detailed configuration of the multiplexer 1152 used for ELD 1151. In this circuit, input-output corresponding relationships are switched in accordance with cases. Connected to the signal node of $X_1$ is as follows: expression index $\sigma(X_1)$ in case of c1678ckX'; expression index "e" in case of c235ckefgh'; and expression index $\sigma$ in case of c4ck6'. Connected to the signal node of $X_2$ is as follows: expression index $\sigma(X_2)$ in case of c1678ckX'; expression index "f" in case of c235ckefgh'; and Vss in case of c4ck6'.

Connected to the signal node of $X_3$ is as follows: expression index $\sigma(X_3)$ in case of c1678ckX'; expression index "g" in case of c235ckefgh'; and Vss in case of c4ck6'. Connected to the signal node of $X_4$ is as follows: expression index $\sigma(X_4)$ in case of c1678ckX'; expression index "h" in case of c235ckefgh'; and Vss in case of c4ck6'.

Clocks used for connection exchanging are generated from the logic circuit 1154 shown in FIG. 94. That is, clock c1678ckefgh' is generated by: clock ck16' in "case 1"; clock ck14' in "case 6" and "case 7"; and clock ck12' in "case 8". Clock c235ckefgh' is generated by: clock ck9' in "case 2"; clock ck13' in "case 3"; and clock ck8' in "case 5". Clock c4ck6' is generated by clock ck6' in "case 4".

Error Correction (RC) Part 26

Figure 95:
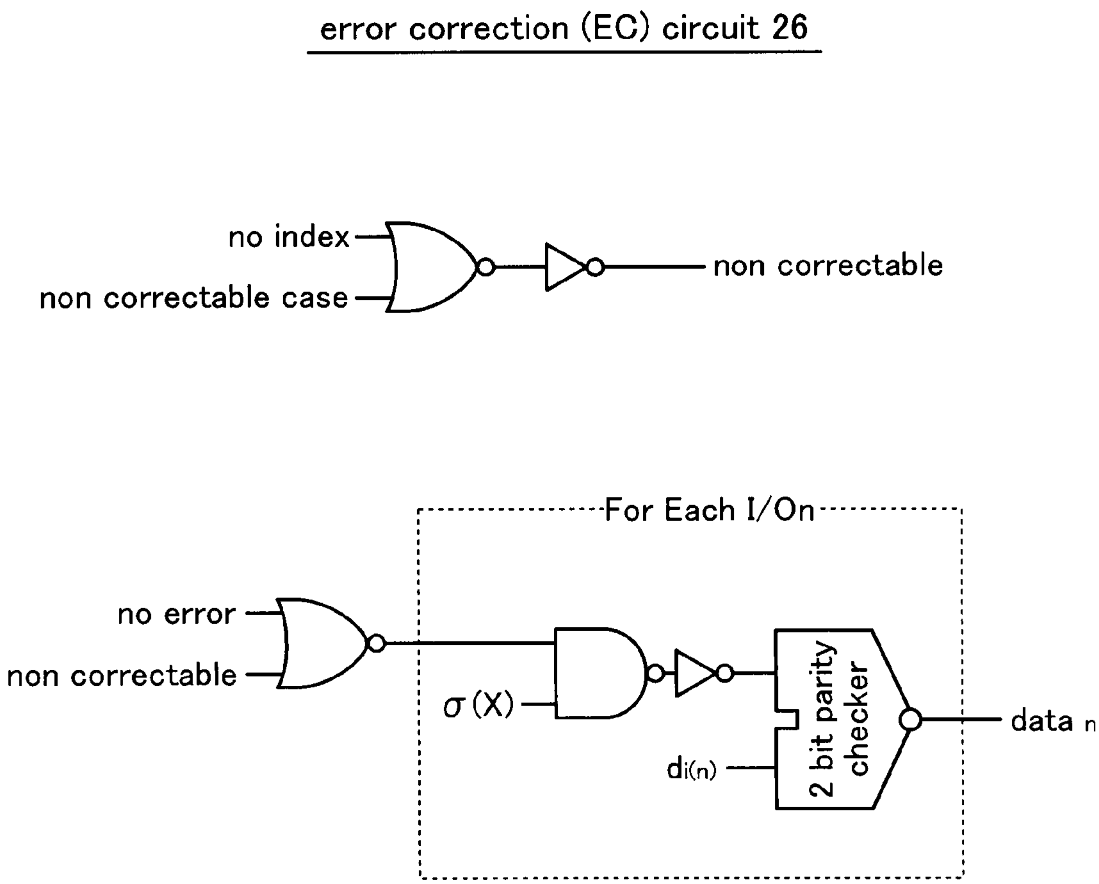
FIG. 95 shows the error correction (EC) part.

FIG. 95 shows the error correction part 26 for correcting error(s) at error bit location(s). Except that it is no need of error-correction or error-correction is impossible, bit data "di(n)" read out of the memory at terminal IOn that is coincide with the index $\sigma(X)$ designating the error bit location is inverted in 2-bit PC, so that error-corrected data is obtained. In case it is no need of error-correction or error-correction is impossible, "non correctable" will be output for designating that the errors are not correctable.

[Method of Testing the 4EC-EW-BCH System]

A large capacitive memory stores in general such a data quantity that is fourth power of the data bit number "h" dealt in the ECC system or more. For example, in case of h=255, the memory is usually formed as 16G bit one. In consideration of this point, n case the ECC system satisfies the condition of: it does not generate errors; and it is bale to notice that there is no error or there are non correctable errors, it becomes possible to substitute an ECC system test for the memory cell test. This leads to the test cost reduction of the memory.

A test method of the ECC system will be explained with reference to FIG. 96. As described in the embodiment, input f(x) is encoded to h-degree polynomial $f(x)x^{4n}+r(x)$. In this test system, the encoded polynomial is not written in the memory core, but test-use error data e(x) is added to the encoded polynomial, and it is tested that the ECC system corrects error(s). That is, externally supplied (or internally generated) test data e(x) is added to the encoded data of the externally supplied data f(x), and input to the ECC system. Data f(x) is restored and compared with the original input data.

The number of test patterns of the test data e(x), i.e., test number, is $h^4$ in case of 4EC-EW-BCH system. For example, in case of h=255, the test number becomes about 4G. This is less than that of a normal memory test, in which all bits are sequentially subjected to a test sequence by several bits in parallel. In this test, it becomes high-seed test because there is no need of read/write operation for the memory, and the test time will be greatly reduced.

Assuming that the ECC system is complete, even if memory cell test is not performed, correctable errors are corrected, and the system notices "non correctable" when there are non-correctable errors. Therefore, users may cope with the "non-correctable" state to, for example, exclude the error bit portion of data. To make this possible, it is necessary to output "non correctable" signal, which designates externally that correctable errors are generated.

Figure 97:
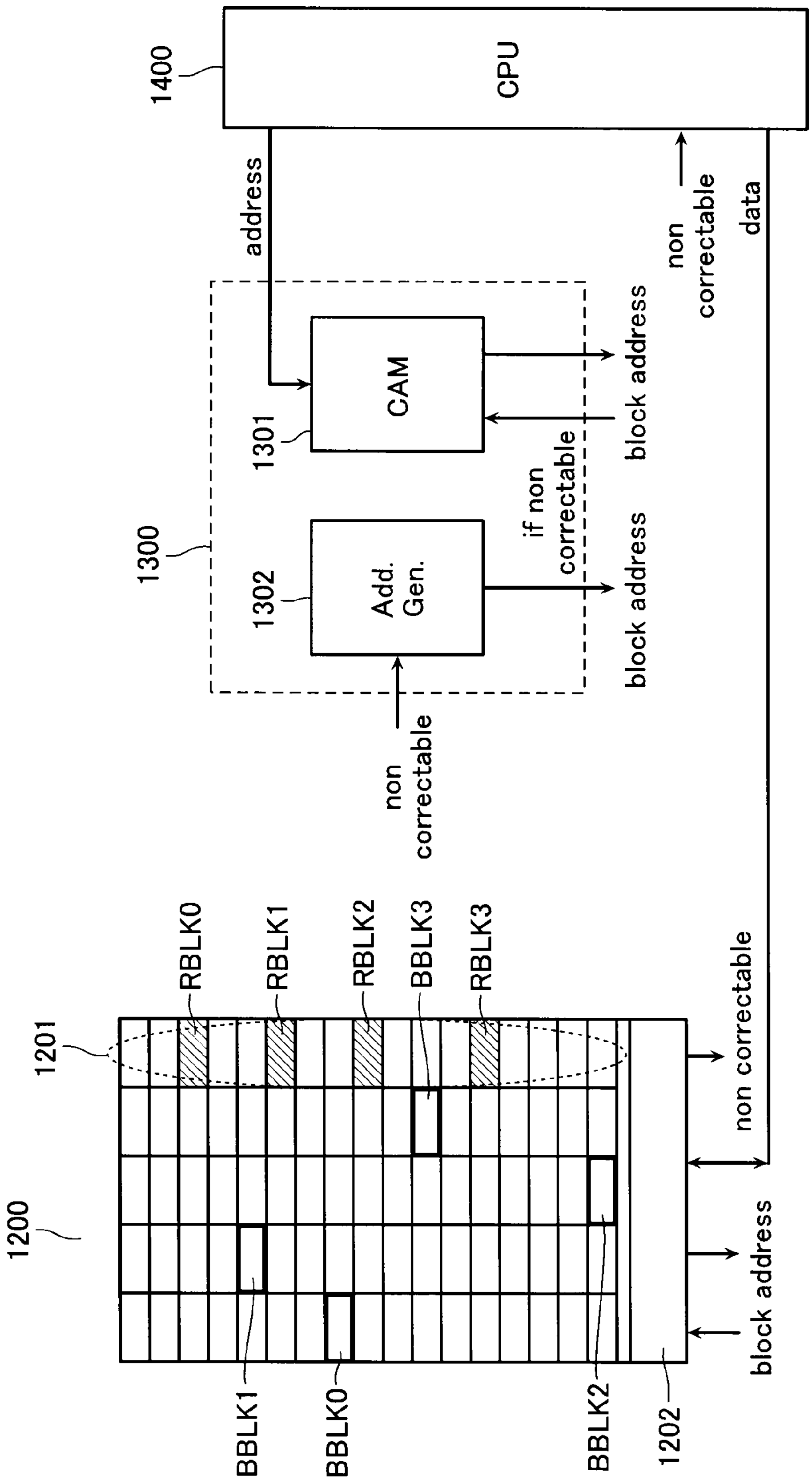

FIG. 97 shows a memory system configuration, in which file memory 1200 has an on-chip ECC circuit configured to be able to output "non correctable", and the memory 1200 is made to be test-free. That is, this memory system is formed to be able to replace a defective array with a redundancy cell array by use of the ECC system without the normal wafer test.

File memory 1200 is formed in such a manner that the address space of the memory cell array is divided into blocks each corresponding to a data quantity used in one cycle ECC. Although the address space division is shown like the physical division, it is a logical one. Note here that it is permissible that the logical blocks correspond to the physical blocks.

In the memory cell array, there is prepared a redundant array area 1201, which includes some redundant blocks, i.e., a replacing block area used for replacing blocks, in which non correctable errors are generated at a test time or a normal busy time, with redundant blocks. The on-chip ECC circuit 1202 performs error-detection and error-correction for each block, and generates "non correctable" when error correction is impossible.

In the system, contents addressable memory (CAM) 1301 is prepared for generating address of the file memory 1200 with a key address supplied from CPU 1400 in a host device. This CAM 1301 is configured to output the input address as it is to the file memory 1200 when there is no address corresponding to the key.

There is further prepared address generating circuit 1302, which generates sequentially redundant block addresses of the redundant array area 1201 of the file memory 1200 when receiving the signal "non correctable" generated at a test time or a busy time. As described later, addresses to be replaced to the redundant block addresses within those sequentially generated from the address generating circuit 1302 will be written into CAM 1301. Thereinafter, CAM 1301 generates the stored redundant block addresses in place of the defective block addresses when they are sent from CPU 1400. Therefore, CAM 1301 and address generating circuit 1302 constitute a memory controller 1300.

The operation of this system will be explained in detail below. At an initial test time, test data is written into all blocks in the file memory 1200 from CPU 1400. This test data is, for example, all "1" data or all "0" data, or preferably set at such a data pattern that easily generates errors as being specific in this memory.

Then sequentially generate read addresses via CPU 1400, and access the file memory 1200. The read addresses are input to CAM 1301 in the memory controller 1300. At the beginning, the input addresses are passed through CAM 1301 and sent to the file memory 1200. In case there is not generated "non correctable" from the file memory 1200, i.e., in case it is error correctable even if there are errors, CAM 1301 is not written.

When an address sent from CPU coincides with an initial bad block address, and ECC circuit 1200 outputs signal "non correctable", address generating circuit 1302 is activated to generate a redundant block address in the redundant array area 1201. The redundant block address is sent to file memory 1200 and CAM 1301 simultaneously. At this time, CPU 1400 receives the "non correctable" and temporally stop the address transmitting.

CAM 1301 stores the redundant block address sent from address generating circuit 1302 with the address sent from CPU, which is dealt with a key address. When the file memory is accessed with the redundant block address, and "non correctable" is output again, address generating circuit 1302 generates the following redundant block address to be stored in CAM 1301.

The above-described operation will be repeated in such a range that replaceable redundant block addresses are obtained. As a result, initial bad block addresses and the corresponding redundant block addresses to be replaced with the initial bad block addresses are written into CAM 1301.

For example as shown in FIG. 97, assuming that there are initial bad blocks BBLK0-3 in the file memory 1200, addresses of the redundant block PBLK0-3 to be accessed in place of the initial bad blocks are stored in CAM 1301. Thereinafter, accessing of CPU is performed via CAM 1301, and the initial bad block access is avoided, so that the redundant blocks are accessed.

In case CAM 1301 is a volatile memory such as DRAM and the like, it is in need of performing the initial test at every power-on time. If the address storing portion of CAM 1301 is formed of a non-volatile memory like the file memory 1200. There is no need of performing the initial test at every power-on time. In this case, the correspondence of the key addresses and redundant block addresses obtained at the initial test time may be written into the non-volatile memory at a time after the initial test.

In case a bad block is generated during the memory is used, and "non correctable" is output, it is possible to deal with it as similar to the above-described process. That is, address generating circuit 1302 is activated to generate a redundant block address, which is written into CAM 1301 as a to-be-replaced address. Hereinafter, accessing to the bad block is switched to the redundant block address with CAM 1301. Whether newly generated bad block address data is to be output to the external or not, it is judged by the program of CPU 1400.

The above-described defect relieving scheme is not limited such a case that the redundant cell array is prepared independently of the normal accessed memory cell array. The scheme is also effective in such a case that there is not prepared a specific redundant cell array. In this case also, the correspondence between the bad block addresses and replaceable block addresses to be accesses in place of the bad block addresses is written into CAM. As a result, it becomes possible to access so as to avoid the bad block. Note here that the replaceable block address stored to be used in place of the bad block addresses will be excluded from the normal accessing.

Figure 98:
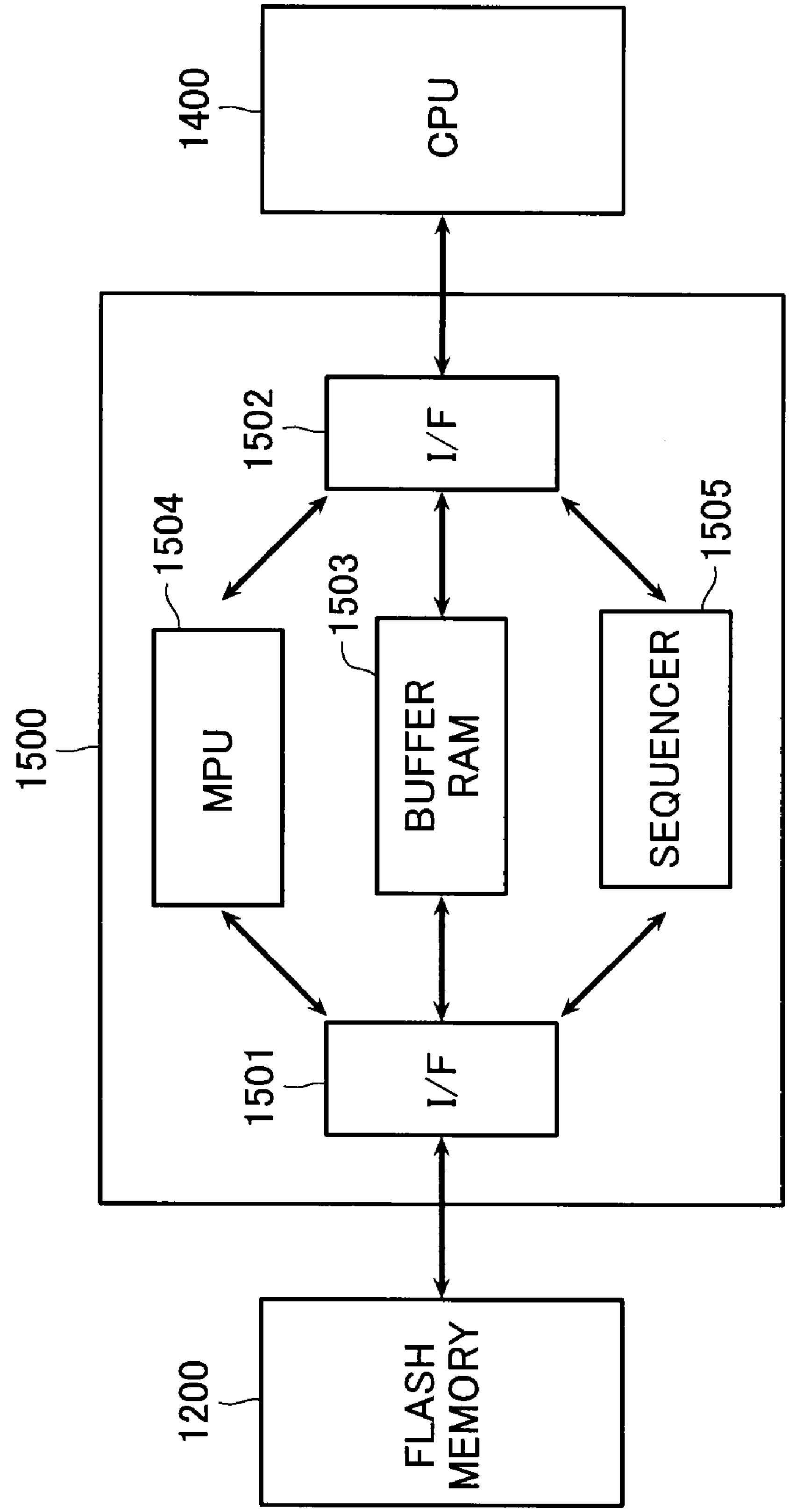
FIG. 98 shows another memory system, to which the function of FIG. 97 is adapted.

In a field of the NAND-type flash memory, as shown in FIG. 98, it is known that flash memory 1200 and memory controller 1500 are mounted collectively on a package, thereby constituting a memory system. The memory controller 1500 includes interfaces 1501 and 1502, buffer DRAM 1503, hardware sequencer 1505, MPU 1504 and the like. It is permissible that the memory controller 1500 is an optional function attached to the memory system controller 1400. Further, it is effective that the ECC circuit is installed in the memory controller 1500.

As described above, testing fully the ECC circuit, without testing the flash memory itself, it becomes possible to such an address replacement control that the redundant blocks are used in place of bad blocks. Therefore, it becomes possible to constitute a memory system with a high reliability.

Figure 96:
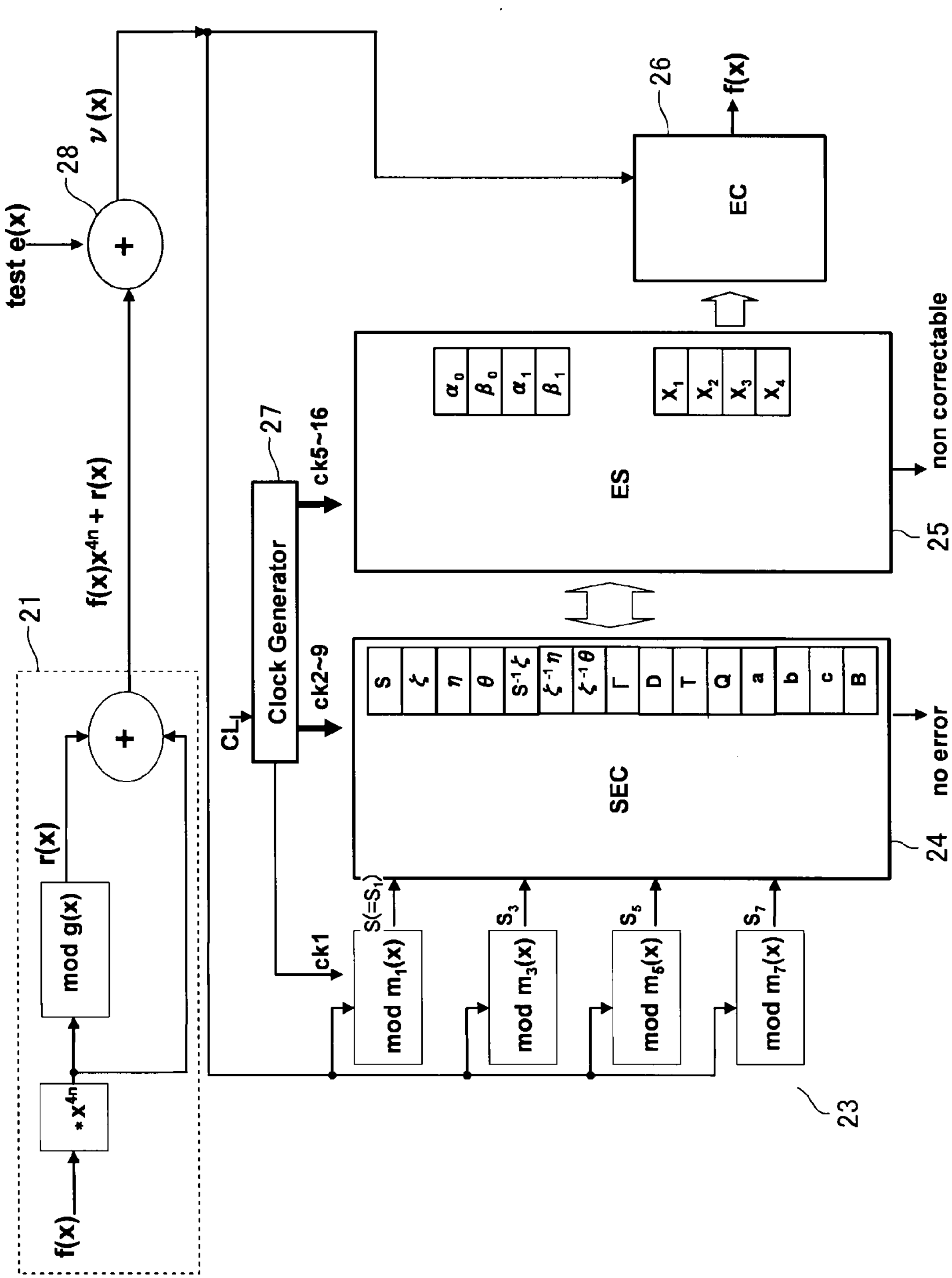
FIG. 96 shows a test system of testing the ECC system.

The test method explained with reference to FIGS. 96 and 97 is not limited to the 4-bit error correctable ECC system. For example, it is effective to other on-chip ECC systems, which are able to correct 2-bit or more errors in such a way as to: divide an error location searching equation into two or more factor equations each being separated into an unknown part and a syndrome part; and compare solution candidate's index with syndrome's index, each being previously obtained as a table, thereby obtaining error locations.

The maximum number of errors is four in such a range that high speed error searching is performed with decoders by use of tables. According to the embodiment described above, 4-bit error correction will be perfectly done within an operating time of several decades [ns], and the reliability of a large capacitive file memory and the like will be achieved without reducing the performance.

Additionally, if the ECC system is subjected to the operation test, it becomes possible to use only error correctable areas in the file memory. Therefore, there will be provides a large capacitive memory, which is useful to reduce the test cost.

[Outline of 4EC-EW-BCH System in this Embodiment]

(a) There has been achieved a high speed ECC system, which is installed in a memory to be 4-bit error correctable in such a manner as to perform the operation in a real time on the data read/write path. In this system, the error searching polynomial is divided into a product of low degree polynomial's factors with coefficient parameters introduced, and the coefficient parameters are searched from syndromes, and then the factor polynomials are solved. In every stage, the equation is divided into an unknown part and a syndrome part by use of a variable conversion, and the solution will be searched via a high speed matching operation process between the previously calculated solution candidate and the syndrome operation result. The high speed calculation of the matching operation is achieved by use of the relationship between the expression indexes of the finite field elements. In addition, there is provided a test method of the ECC system, in which an error pattern is added to the input data, and it is confirmed that the error correction is performed. As a result, it becomes possible to use the memory without testing the memory itself.

(b) In the 4-bit error correctable ECC system, an error location searching equation is transformed to the product of two factor equations. The dividing coefficient parameters are calculated from syndromes, and the factor equations are solved, whereby error locations are output.

(c) An ECC system is installed in a memory to be correctable up to 4-bits for each cluster of data by use of the elements of finite field GF(256). The system takes notice to the external of the memory that errors are not correctable when there are generated 5-bit errors or more.

(d) An ECC system is installed in a memory to be correctable up to a certain number of bits for each cluster of data by use of the elements of finite field GF(256). The system takes notice to the external of the memory that errors are not correctable when there are generated errors more than the certain number. In addition, there is prepared a test path, in which an error data pattern is added externally to the input code data to be written into the memory, and the error correction is confirmed without writing the code data into the memory.

(e) A cluster of memory data areas may be defined as a defective area, which is unusable. As a result, the memory data becomes highly reliable.

This invention is not limited to the above-described embodiment. It will be understood by those skilled in the art that various changes in form and detail may be made without departing from the spirit, scope, and teaching of the invention.

What is claimed is:

1. A memory device with an error detection and correction system formed therein, the error detection and correction system being configured to detect and correct errors in read out data by use of a BCH code, wherein the error detection and correction system is 4-bit error correctable, and searches error locations in such a way as to:

calculate syndromes based on the read out data;

calculate an error location searching biquadratic equation so that coefficients of the error location searching biquadratic equation correspond to the calculated syndromes;

divide the error location searching biquadratic equation into two or more factor equations;

convert the factor equations to have unknown parts and syndrome parts separated from each other for solving them; and compare indexes of solution candidates of the factor equations with those of the syndromes, corresponding relationships between both of the indexes being previously obtained as a table, thereby obtaining error locations.

2. The memory device according to claim 1, wherein the error detection and correction system comprises:

an encoding part configured to generate check bits based on the information bits expressed by the coefficients of information polynomial f(x), the check bits being expressed by the coefficients of surplus r(x) obtained by dividing the information polynomial f(x) by code generating polynomial $g(x)=m_1(x)m_3(x)m_5(x)m_7(x)$ (where $m_1(x)$, $m_3(x)$, $m_5(x)$ and $m_7(x)$ are primitive irreducible polynomials);

a syndrome calculation part configured to calculate syndromes $S(=S_1)$, $S_3$, $S_5$ and $S_7$ based on the read out data of a memory cell array storing data bits formed of the information bits and the check bits;

a syndrome element calculation part configured to calculate so as to express the coefficients of the error location searching biquadratic equation corresponding to the read out data with the syndromes, the error location searching biquadratic equation being defined as $(x-X_1)(x-X_2)(x-X_3)(x-X_4)=x^4+Sx^3+Dx^2+Tx+Q=0$ (where, $X_1$, $X_2$, $X_3$ and $X_4$ are unknown numbers; and D, T and Q are coefficient parameters introduced for solving the equation);

an error searching part configured to search error-bit locations by solving 2nd and 3rd factor equations obtained by dividing the error location searching biquadratic equation based on the calculation result in the syndrome element calculation part; and an error correction part configured to correct an error-bit.

3. The memory device according to claim 2, wherein in case of calculating congruences of mod $(2^n-1)$ between the indexes of the solution candidates and those of the syndromes in the syndrome element calculation part, each of the congruence of mod $(2^n-1)$ is divided into two factor congruences of mod (G1) and mod (G2) (where, G1 and G2 are factors of $(2^n-1)$, which are prime to each other), and the two factor congruences are solved simultaneously in parallel.

4. The memory device according to claim 3, wherein in case of $2^n-1=255$, factors G1=17 and G2=15 are selected.

5. The memory device according to claim 2, wherein in case of calculating congruences of mod $(2^n-1)$ between the indexes of the solution candidates and those of the syndromes in the error searching part, each the congruence of mod $(2^n-1)$ is divided into two factor congruences of mod (G1) and mod (G2) (where, G1 and G2 are factors of $(2^n-1)$, which are prime to each other), and the two factor congruences are solved simultaneously in parallel.

6. The memory device according to claim 5, wherein in case of $2^n-1=255$, factors G1=17 and G2=15 are selected.

7. The memory device according to claim 1, wherein the error detection and correction system has such a function as to generate a non-correctable signal for non-correctable errors, and a contents addressable memory is so attached to the memory device as to store a corresponding relationship between a bad block address of the memory device and a to-be-replaced block address, and send the to-be-replaced block address to the memory device in place of the bad block address when it is accessed.

8. The memory device according to claim 7, comprising a memory cell array, and a redundant cell array with redundant blocks arranged to be replaced with bad blocks in the memory cell array, and wherein the contents addressable memory stores the corresponding relationships between bad block addresses and redundant block addresses to be replaced with the bad block addresses, and sends a redundant block address to the memory device in place of a bad block address when it is accessed.

9. The memory device according to claim 1, wherein the memory device is one selected from a NAND-type flash memory, a resistance change memory and a phase change memory.

10. A method of testing a memory device with an error detection and correction system formed therein, the error detection and correction system being configured to detect and correct errors in read out data by use of a BCH code, comprising:

adding an error data pattern to an information data code to be input to the memory device:

passing the information data code with the error data pattern added through the error detection and correction system without writing it into a memory core; and testing whether the information data code with the error data pattern added is corrected or not, wherein the error detection and correction system is n-bit ($n \geqq 2$) error correctable, and searches error locations in such a way as to:

calculate syndromes based on the read out data;

calculate an error location searching biquadratic equation so that coefficients of the error location searching biquadratic equation correspond to the calculated syndromes;

divide the n-th degree error location searching equation into two or more factor equations each being separated into an unknown part and a syndrome part; and compare indexes of solution candidates of the factor equation with those of the syndromes, corresponding relationships between both of the indexes being previously obtained as a table, thereby obtaining error locations.

11. The method according to claim 10, wherein the memory device is one selected from a NAND-type flash memory, a resistance change memory and a phase change memory.

12. A method of testing a memory device with an error detection and correction system formed therein, the error detection and correction system being configured to detect and correct errors in read out data by use of a BCH code, comprising:

adding an error data pattern to an information data code to be input to the memory device;

passing the information data code with the error data pattern added through the error detection and correction system without writing it into a memory core; and testing whether the information data code with the error data pattern added is corrected or not, wherein the error detection and correction system is 4-bit error correctable, and searches error locations in such a way as to:

calculate syndromes based on the read out data;

calculate an error location searching biquadratic equation so that coefficients of the error location searching biquadratic equation correspond to the calculated syndromes;

divide the error location searching biquadratic equation into two or more factor equations each being separated into an unknown part and a syndrome part; and compare indexes of solution candidates of the factor equations with those of the syndromes, corresponding relationships between both of the indexes being previously obtained as a table, thereby obtaining error locations.

13. The method according to claim 12, wherein the memory device is one selected from a NAND-type flash memory, a resistance change memory and a phase change memory.

* * * * *